(12) United States Patent
Chae et al.

(10) Patent No.: US 11,355,482 B2
(45) Date of Patent: Jun. 7, 2022

(54) LIGHT EMITTING DIODE FOR DISPLAY AND DISPLAY APPARATUS HAVING THE SAME

(71) Applicant: Seoul Viosys Co., Ltd., Ansan-si (KR)

(72) Inventors: Jong Hyeon Chae, Ansan-si (KR); Chang Yeon Kim, Ansan-si (KR); Ho Joon Lee, Ansan-si (KR); Seong Gyu Jang, Ansan-si (KR); Chung Hoon Lee, Ansan-si (KR); Dae Sung Cho, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/200,036

(22) Filed: Nov. 26, 2018

(65) Prior Publication Data

US 2019/0164945 A1 May 30, 2019

Related U.S. Application Data

(60) Provisional application No. 62/590,830, filed on Nov. 27, 2017, provisional application No. 62/595,415, (Continued)

(51) Int. Cl.
*H01L 25/13* (2006.01)
*H01L 25/075* (2006.01)
(Continued)

(52) U.S. Cl.
CPC .......... *H01L 25/13* (2013.01); *H01L 25/0756* (2013.01); *H01L 27/156* (2013.01);
(Continued)

(58) Field of Classification Search
None
See application file for complete search history.

(56) References Cited

U.S. PATENT DOCUMENTS

| 5,583,349 A | 12/1996 | Norman et al. |
| 5,696,389 A | 12/1997 | Ishikawa et al. |
| (Continued) | | |

FOREIGN PATENT DOCUMENTS

| CN | 102593303 | 7/2012 |
| EP | 1482566 | 12/2004 |
| (Continued) | | |

OTHER PUBLICATIONS

Written Opinion of the International Searching Authority dated Mar. 6, 2019, issued in International Application No. PCT/KR2018/014728.
(Continued)

*Primary Examiner* — Nishath Yasmeen
(74) *Attorney, Agent, or Firm* — H.C. Park & Associates, PLC

(57) ABSTRACT

A light emitting diode pixel for a display including a first LED sub-unit, a second LED sub-unit disposed on a portion of the first LED sub-unit, a third LED sub-unit disposed on a portion of the second LED sub-unit, and a reflective electrode disposed adjacent to the first LED sub-unit, in which each of the first to third LED sub-units comprises an n-type semiconductor layer and a p-type semiconductor layer, each of the n-type semiconductor layers of the first, second, and third LED stacks is electrically connected to the reflective electrode, and the first LED sub-unit, the second LED sub-unit, and the third LED sub-unit are configured to be independently driven.

20 Claims, 112 Drawing Sheets

Related U.S. Application Data filed on Dec. 6, 2017, provisional application No. 62/597,614, filed on Dec. 12, 2017, provisional application No. 62/598,223, filed on Dec. 13, 2017, provisional application No. 62/621,492, filed on Jan. 24, 2018, provisional application No. 62/624,639, filed on Jan. 31, 2018, provisional application No. 62/624,667, filed on Jan. 31, 2018.

(51) Int. Cl.
  *H01L 33/00* (2010.01)
  *H01L 27/15* (2006.01)
  *H01L 33/40* (2010.01)
  *H01L 33/50* (2010.01)
  *H01L 33/62* (2010.01)
  *H01L 33/38* (2010.01)

(52) U.S. Cl.
  CPC ........ *H01L 33/0093* (2020.05); *H01L 33/405* (2013.01); *H01L 33/50* (2013.01); *H01L 33/62* (2013.01); *H01L 25/0753* (2013.01); *H01L 33/38* (2013.01)

(56) References Cited

U.S. PATENT DOCUMENTS

| | | |
|---|---|---|
| 5,703,436 A | 12/1997 | Forrest et al. |
| 5,739,552 A * | 4/1998 | Kimura ............... H01L 25/0756 257/103 |
| 6,046,543 A | 4/2000 | Bulovic et al. |
| 6,100,103 A | 8/2000 | Shim et al. |
| 6,365,270 B2 | 4/2002 | Forrest et al. |
| 6,717,358 B1 | 4/2004 | Liao et al. |
| 6,934,309 B2 | 8/2005 | Nishikawa et al. |
| 7,282,741 B2 | 10/2007 | Kim et al. |
| 7,570,310 B2 | 8/2009 | Harada et al. |
| 7,732,803 B2 | 6/2010 | Shum et al. |
| 7,745,986 B2 | 6/2010 | Ito et al. |
| 8,017,955 B2 | 9/2011 | Wang et al. |
| 8,022,421 B2 * | 9/2011 | Hsueh ............... H01L 27/15 257/89 |
| 8,035,115 B2 * | 10/2011 | Ogihara ............... H01L 24/24 257/88 |
| 8,089,074 B2 * | 1/2012 | Kim ............... H01L 27/153 257/79 |
| 8,283,191 B2 | 10/2012 | Rode et al. |
| 8,324,803 B2 | 12/2012 | Forrest et al. |
| 8,436,346 B2 | 5/2013 | Ushikubo et al. |
| 8,466,542 B2 | 6/2013 | Kriman et al. |
| 8,546,836 B2 | 10/2013 | Kamiya et al. |
| 8,563,144 B2 | 10/2013 | Kim et al. |
| 8,618,551 B2 | 12/2013 | Nishikawa et al. |
| 8,624,274 B2 * | 1/2014 | Hsueh ............... H01L 27/15 257/89 |
| 8,766,295 B2 | 7/2014 | Kim |
| 8,835,948 B2 * | 9/2014 | Chang ............... H01L 25/0756 257/90 |
| 8,884,316 B2 | 11/2014 | Weaver et al. |
| 9,006,752 B2 | 4/2015 | So et al. |
| 9,018,834 B2 | 4/2015 | Ide et al. |
| 9,052,096 B2 | 6/2015 | Nishimura et al. |
| 9,076,929 B2 | 7/2015 | Katsuno et al. |
| 9,099,631 B2 | 8/2015 | Yang et al. |
| 9,136,498 B2 | 9/2015 | Skipor |
| 9,142,748 B2 | 9/2015 | Ohmae et al. |
| 9,153,750 B2 | 10/2015 | Seo et al. |
| 9,252,380 B2 | 2/2016 | Seo et al. |
| 9,281,446 B2 | 3/2016 | Suh et al. |
| 9,312,249 B2 | 4/2016 | Choi et al. |
| 9,337,400 B2 * | 5/2016 | Hashimoto ............... H01L 33/382 |
| 9,406,908 B2 | 8/2016 | Kim et al. |
| 9,419,031 B1 | 8/2016 | Or-Bach et al. |
| 9,443,833 B2 | 9/2016 | Oraw |
| 9,515,278 B2 | 12/2016 | Suzuki et al. |
| 9,559,263 B2 | 1/2017 | Matsui et al. |
| 9,577,012 B2 | 2/2017 | Ooki et al. |
| 9,748,313 B2 | 8/2017 | Tsuji et al. |
| 9,786,817 B2 | 10/2017 | Kim et al. |
| 9,786,859 B2 | 10/2017 | Yamae et al. |
| 9,847,051 B2 | 12/2017 | Choi et al. |
| 9,853,187 B2 | 12/2017 | Kim |
| 9,893,233 B2 | 2/2018 | Kong et al. |
| 9,905,725 B2 | 2/2018 | Lee |
| 9,960,212 B2 | 5/2018 | Gee et al. |
| 9,960,390 B2 | 5/2018 | Höfle et al. |
| 9,966,369 B2 | 5/2018 | Kim et al. |
| 10,056,535 B2 | 8/2018 | Chang et al. |
| 10,069,036 B2 | 9/2018 | Atanackovic |
| 10,079,265 B1 | 9/2018 | Wu et al. |
| 10,134,813 B2 | 11/2018 | Choi |
| 10,170,666 B2 | 1/2019 | Cha et al. |
| 10,205,058 B2 | 2/2019 | Lee |
| 10,304,811 B2 | 5/2019 | Zhang et al. |
| 10,326,056 B2 | 6/2019 | Jung et al. |
| 10,381,519 B2 | 8/2019 | Seo et al. |
| 10,418,577 B2 | 9/2019 | Yoo et al. |
| 10,475,957 B2 | 11/2019 | Cha et al. |
| 10,559,557 B2 | 2/2020 | Chang et al. |
| 10,686,149 B2 | 6/2020 | Park et al. |
| 10,811,475 B2 | 10/2020 | Zhang et al. |
| 2002/0154259 A1 | 10/2002 | Freidhoff et al. |
| 2003/0213967 A1 | 11/2003 | Forrest et al. |
| 2004/0232433 A1 | 11/2004 | Doverspike et al. |
| 2005/0067627 A1 | 3/2005 | Shen et al. |
| 2005/0140278 A1 | 6/2005 | Kato |
| 2005/0264550 A1 | 12/2005 | Ohshima et al. |
| 2006/0027820 A1 | 2/2006 | Cao |
| 2006/0231852 A1 | 10/2006 | Kususe et al. |
| 2007/0069220 A1 | 3/2007 | Ogihara |
| 2007/0170444 A1 * | 7/2007 | Cao ............... H01L 21/00 257/89 |
| 2007/0222922 A1 | 9/2007 | Jin et al. |
| 2008/0068315 A1 | 3/2008 | Kurosaki et al. |
| 2008/0099770 A1 | 5/2008 | Mendendorp et al. |
| 2008/0128728 A1 | 6/2008 | Nemchuk et al. |
| 2008/0251799 A1 * | 10/2008 | Ikezawa ............... H01L 25/0756 257/89 |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0272989 A1 | 11/2009 | Shum et al. |
| 2010/0045175 A1 | 2/2010 | Mathai et al. |
| 2010/0051975 A1 | 3/2010 | Suzuki et al. |
| 2010/0065867 A1 | 3/2010 | Unno |
| 2010/0084668 A1 | 4/2010 | Choi et al. |
| 2010/0144073 A1 | 6/2010 | Louwsma et al. |
| 2010/0224860 A1 | 9/2010 | Ibbetson et al. |
| 2010/0276706 A1 | 11/2010 | Herrmann |
| 2011/0057211 A1 | 3/2011 | Lee et al. |
| 2011/0086486 A1 | 4/2011 | Lee et al. |
| 2011/0156114 A1 | 6/2011 | Park et al. |
| 2011/0204376 A1 | 8/2011 | Su et al. |
| 2012/0094414 A1 | 4/2012 | Or-Bach et al. |
| 2012/0223875 A1 | 9/2012 | Lau et al. |
| 2012/0236532 A1 | 9/2012 | Koo et al. |
| 2012/0305959 A1 | 12/2012 | Yu et al. |
| 2013/0056717 A1 | 3/2013 | Ishihara et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0191243 A1 | 7/2014 | Singh et al. |
| 2014/0284633 A1 | 9/2014 | Tsay et al. |
| 2015/0001572 A1 * | 1/2015 | Katsuno ............... H01L 33/382 257/99 |
| 2015/0221627 A1 | 8/2015 | Nielson et al. |
| 2015/0340348 A1 | 11/2015 | Katsuno et al. |
| 2015/0362165 A1 | 12/2015 | Chu et al. |
| 2016/0005375 A1 | 1/2016 | Naijo et al. |
| 2016/0043290 A1 | 2/2016 | Sogo et al. |
| 2016/0099384 A1 | 4/2016 | Kim et al. |
| 2016/0155378 A1 | 6/2016 | Hack et al. |
| 2016/0155892 A1 | 6/2016 | Li et al. |

(56) References Cited

U.S. PATENT DOCUMENTS

| | | | |
|---|---|---|---|
| 2016/0163940 | A1 | 6/2016 | Huang et al. |
| 2016/0315068 | A1 | 10/2016 | Lee et al. |
| 2016/0322293 | A1 | 11/2016 | Kimura et al. |
| 2016/0336482 | A1 | 11/2016 | Lu et al. |
| 2016/0359143 | A1 | 12/2016 | Osawa et al. |
| 2017/0012173 | A1 | 1/2017 | Lee et al. |
| 2017/0025593 | A1 | 1/2017 | Bower et al. |
| 2017/0062680 | A1 | 3/2017 | Yoo et al. |
| 2017/0064785 | A1 | 3/2017 | Kim et al. |
| 2017/0069612 | A1 | 3/2017 | Zhang et al. |
| 2017/0084876 | A1 | 3/2017 | Suzuki |
| 2017/0104035 | A1 | 4/2017 | Lee et al. |
| 2017/0117259 | A1 | 4/2017 | Xu |
| 2017/0133357 | A1 | 5/2017 | Kuo et al. |
| 2017/0162746 | A1 | 6/2017 | Cha et al. |
| 2017/0194298 | A1 | 7/2017 | Negley et al. |
| 2017/0194535 | A1 | 7/2017 | Park et al. |
| 2017/0213502 | A1 | 7/2017 | Henry et al. |
| 2017/0236866 | A1 | 8/2017 | Lee et al. |
| 2017/0250329 | A1 | 8/2017 | Takeya et al. |
| 2017/0286044 | A1 | 10/2017 | Kim et al. |
| 2017/0288088 | A1 | 10/2017 | Won Cheol |
| 2017/0288093 | A1* | 10/2017 | Cha ................... H01L 25/0756 |
| 2017/0331009 | A1 | 11/2017 | Shioji |
| 2017/0331021 | A1 | 11/2017 | Chae et al. |
| 2017/0338275 | A1 | 11/2017 | Banna et al. |
| 2017/0345801 | A1 | 11/2017 | Lin et al. |
| 2018/0083170 | A1 | 3/2018 | Shepherd |
| 2018/0151548 | A1 | 5/2018 | Pfeuffer et al. |
| 2018/0156965 | A1 | 6/2018 | El-Ghoroury et al. |
| 2018/0166499 | A1 | 6/2018 | Pfeuffer et al. |
| 2018/0233492 | A1 | 8/2018 | Liu et al. |
| 2018/0240952 | A1 | 8/2018 | Moon et al. |
| 2018/0283642 | A1 | 10/2018 | Liao et al. |
| 2019/0053347 | A1 | 2/2019 | Lee et al. |
| 2019/0074324 | A1 | 3/2019 | Kim et al. |
| 2019/0097088 | A1 | 3/2019 | Huppmann et al. |
| 2019/0148612 | A1 | 5/2019 | Lee et al. |
| 2019/0165207 | A1 | 5/2019 | Kim et al. |
| 2019/0181181 | A1 | 6/2019 | Yeon et al. |
| 2019/0229149 | A1 | 7/2019 | Yoo |
| 2019/0267436 | A1 | 8/2019 | Zhang et al. |
| 2019/0333964 | A1 | 10/2019 | Lee et al. |
| 2020/0063920 | A1 | 2/2020 | Vampola |
| 2020/0212017 | A1 | 7/2020 | Oh et al. |
| 2020/0212262 | A1 | 7/2020 | Jang et al. |

FOREIGN PATENT DOCUMENTS

| | | |
|---|---|---|
| EP | 3122158 | 1/2017 |
| JP | H0613655 | 1/1994 |
| JP | 2005072323 | 3/2005 |
| JP | 2007-057667 | 3/2007 |
| JP | 20077-057667 | 3/2007 |
| JP | 2012-195529 | 10/2012 |
| JP | 2012-209264 | 10/2012 |
| JP | 2016-039361 | 3/2016 |
| KR | 10-2006-0095690 | 9/2006 |
| KR | 10-2007-0089172 | 8/2007 |
| KR | 10-2008-0054626 | 6/2008 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2017153123 | 9/2017 |

OTHER PUBLICATIONS

Written Opinion of the International Searching Authority dated Mar. 6, 2019, issued in International Application No. PCT/KR2018/014734.
Takatoshi Tsujimura et al. Development of a color-tunable polychromatic organic-light-emitting-diode device for roll-to-roll manufacturing. Journal of the Society for Information Display, vol. 24, issue 4, Apr. 14, 2016, pp. 262-269.
Ex Parte Quayle Action issued on Nov. 19, 2019, in U.S. Appl. No. 16/198,796.
Notice of Reasons for Refusal dated Sep. 14, 2021, in Japanese Patent Application No. 2020-532747.
Notice of Allowance dated Mar. 2, 2020, in U.S. Appl. No. 16/198,784.
Notice of Allowance dated Feb. 13, 2020, in U.S. Appl. No. 15/198,796.
Non-Final Office Action dated Jan. 9, 2620, in U.S. Appl. No. 16/673,184.
Written Opinion of the International Searching Authority dated Apr. 9, 2019, issued in International Application No. PCT/KR2018/916474.
Written Opinien of the International Searching Authority dated Apr. 3, 2019, issued in International Application No. PCT/KR2018/015288.
Takatoshi Tsujimura et al. Development of a color-tunable polychromatic organic-light-emitting-diode device for roll-to-roll manufacturing Journal of the Society For Information Display, vol. 24, issue 4, Apr. 14, 2016, pp. 262-239.
International Search Report dated Apr. 3, 2019, issued in International Application No. PCT/KR2918/016482.
Written Opinion ofhe International Searching Authority dated Apr. 3, 2019, issued in International Application No. PCT/KR2018/016482.
Extended European Search Report dated Oct. 5, 2021, in European Patent Application No. 1882087.2.
Extended European Search Report dated Sep. 14, 2021, in European Patent Application No. 18881496.6.
Notice of Reasons for Refusal drafted Sep. 14, 2021, in Japanese Patent Application No. 2020-532747.
Written Opinion of the International Search Authority dated Feb. 26, 2019, issued in Internaitonal Application No. PCT/KR2018/014671.
Written Opinion of the International Search Authority dated Mar. 6, 2019, issued in International Application No. PCT/KR2018/014728.
Written Opinion of the International Searching Authority dated Mar. 6, 2019, issued in International No. PCT/KR2018/014734.
International Search Report dated Mar. 6, 2019, issued in International Applicaation No. PCT/KR2018/014672.
Final Office dated Dec. 24, 2021, in U.S. Appl. No. 16/198,873.
Ex Parte Qualye Action dated Nov. 19, 2019, in U.S. Appl. No. 16/198,796.
Final Office Action dated May 29, 2020, in U.S. Appl. No. 16/198,850.
Non-Final Office Action dated Jan. 9, 2020, in U.S. Appl. No. 16/673,184.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 29, 2021, in European Patent Application No. 18891199.4.
Extended European Search Report dated Oct. 5, 2021, in European Patent Application No. 18882087.2.
Extended European Search Report dated Sep. 14, 2021, in European Patent Application No. 1881496.6.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.

(56) References Cited

OTHER PUBLICATIONS

Notice of Allowance dated Nov. 7, 2019, in U.S. Appl. No. 16/207,881.
Non-Final Office Action dated Oct. 24, 2019, in U.S. Appl. No. 16/228,621.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action dated Nov. 19, 2019, in U.S. Appl. No. 16/198,796.
Non-Final Office Action dated Oct. 31, 2019, in U.S. Appl. No. 16/198,850.
Final Office Action for U.S. Appl. No. 16/673,184, dated Jul. 23, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Non-Final Office Action dated Jun. 10, 2021, in U.S. Appl. No. 16/198,873.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Notice of Allowance dated Feb. 17, 2022, in U.S. Appl. No. 16/915,384.
Non-Final Office Action dated Mar. 18, 2021 in U.S. Appl. No. 16/228,601.
Final Office Action dated Apr. 21, 2021, in U.S. Appl. No. 16/198,784.
Non-Final Office Action dated Apr. 7, 2021, in U.S. Appl. No. 16/915,384.
Non-Final Office Action dated Apr. 15, 2021, in U.S. Appl. No. 16/673,184.
Final Office Action dated Nov. 12, 2021, in U.S. Appl. No. 16/673,184.
Final Office Action dated Dec. 2, 2021, in U.S. Appl. No. 16/228,621.
Notice of Allowance dated Dec. 9, 2021, in U.S. Appl. No. 16/915,384.
Notice of Allowance dated Sep. 14, 2021, in U.S. Appl. No. 16/899,522.
Final Office Action dated Sep. 30, 2021, in U.S. Appl. No. 16/198,850.
Final Office Action dated Sep. 30, 2021, in U.S. Appl. No. 16/228,601.
Final Office Action dated Sep. 27, 2021, in U.S. Appl. No. 16/915,384.
Final Office Action dated May 29, 2020, in U.S. Appl. No. 16/196,850.
Notice of Allowance dated Mar. 31, 2020, in U.S. Appl. No. 16/234,541.
Notice of Allowance dated Apr. 9, 2020, in U.S. Appl. No. 16/198,792.
Non-Final Office Action dated Apr. 15, 2020, in U.S. Appl. No. 16/198,873.
Final Office Action dated Apr. 20, 2020, in U.S. Appl. No. 16/228,621.
Notice of Allowance dated Mar. 12, 2020, in U.S. Appl. No. 16/198,784.
Non-Final Office Action dated Mar. 23, 2020, in U.S. Appl. No. 16/219,716.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of color-tunable polychromatic organic-light-emitting-diode device for roll-to-roll manufacturing. Journal of Society for Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
Notice of Allowance dated Feb. 10, 2020, in U.S. Appl. No. 16/198,796.
Non-Final Office Action dated Mar. 5, 2020, in U.S. Appl. No. 16/228,601.
Notice of Allowance for U.S. Appl. No. 16/236,737 dated Oct. 28, 2020.
Non-Final Office Action for U.S. Appl. No. 16/198,784 dated Nov. 19, 2020.
Non-Final Office Action for U.S. Appl. No. 16/228,621 dated Sep. 29, 2020.
Final Office Action for U.S. Appl. No. 16/198,873 dated Oct. 15, 2020.
Non-Final Office Action dated Jun. 24, 2020, in U.S. Appl. No. 16/236,737.
Final Office Action dated Jun. 25, 2020, in U.S. Appl. No. 16/228,601.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Appliation No. PCT/KR2018/014728.
International Searching Report dated Mar. 6, 2019, issued in International Application No. PCT/KR2018/014734.
Written Opinion of the International Searching Authority dated Mar. 6, 2019, issued in International Application PCT/KR2018/014734.
International Search Report dated Mar. 6, 2019, issued in International Application No. PCT/KR2018/014672.

(56) References Cited

OTHER PUBLICATIONS

Written Opinion of the International Searching Authority dated Mar. 6, 2019, issued in International Application No. PCT/KR2018/014672.

* cited by examiner

LIGHT EMITTING DIODE FOR DISPLAY AND DISPLAY APPARATUS HAVING THE SAME

CROSS-REFERENCE TO RELATED APPLICATIONS

This application claims priority from and the benefit of U.S. Provisional Patent Application No. 62/590,830, filed on Nov. 27, 2017, U.S. Provisional Patent Application No. 62/595,415, filed on Dec. 6, 2017, U.S. Provisional Application No. 62/597,614, filed on Dec. 12, 2017, U.S. Provisional Patent Application No. 62/598,223, filed on Dec. 13, 2017, U.S. Provisional Patent Application No. 62/621,492, filed on Jan. 24, 2018, U.S. Provisional Patent Application No. 62/624,639, filed on Jan. 31, 2018, and U.S. Provisional Patent Application No. 62/624,667, filed on Jan. 31, 2018, each of which are incorporated by reference for all purposes as if fully set forth herein.

BACKGROUND

Field

Exemplary implementations of the invention relate generally to a light emitting device for a display and a display apparatus, and, more specifically, to a micro light emitting device having a stacked structure and a display apparatus having the same.

Discussion of the Background

As an inorganic light source, light emitting diodes (LEDs) have been used in various fields, such as displays, vehicular lamps, general lighting, and the like. With advantages of long lifespan, low power consumption, and high response speed, light emitting diodes have been rapidly replacing existing light sources.

Light emitting diodes have been mainly used as a backlight light source in a display apparatus. However, a micro-LED display has been recently developed as a next generation display that is capable of implementing an image directly using the light emitting diodes.

In general, a display apparatus implements various colors by using mixed colors of blue, green, and red light. The display apparatus includes pixels each having subpixels that correspond to blue, green, and red colors, and a color of a certain pixel may be determined based on the colors of the sub-pixels therein, and an image can be displayed through combination of the pixels.

In a micro-LED display, micro-LEDs corresponding to each subpixel are arranged on a two-dimensional plane. Therefore, a large number of micro-LEDs are required to be disposed on one substrate. The micro-LED has a very small size with a surface area of about 10,000 square μm or less, and thus, there are various problems due to this small size. In particular, it is difficult to mount the micro-LEDs on a display panel due to its small size, especially as over hundreds of thousands or millions are required, and it is also difficult to replace defective micro-LEDs with new micro-LED.

The subpixels are typically arranged in a two-dimensional plane in a display, and thus, a relatively large area is occupied by one pixel including the subpixels of blue, green, and red colors. However, reducing the area of each subpixel to arrange the subpixels in a limited area may deteriorate the brightness of a pixel due to reduced luminous area.

In addition, there is typically a significant difference in visibility with respect to blue, green, and red colors. In particular, visibility of green color is generally much higher than visibility of red color. As such, brightness differences may occur depending upon the color of light emitted, even when a light emitting diode emits the same radiant flux of light. In order to reduce the difference in brightness due to visibility, the area of an LED that emits light having a low visibility color may need to be increased, which may increase the area of a subpixel including the same.

While the brightness difference may be reduced by regulating current density applied to each LED, such regulation may increase the operating complexity of a display. As such, there are needs for a display apparatus using micro-LEDs that are capable of emitting light having similar brightness without significantly changing the area occupied by the micro-LEDs in a two-dimensional plane, or changing the current density applied to the micro-LEDs.

The above information disclosed in this Background section is only for understanding of the background of the inventive concepts, and, therefore, it may contain information that does not constitute prior art.

SUMMARY

Light emitting diodes and a display constructed according to the principles and some exemplary implementations of the invention are capable of increasing the luminous area of each subpixel without increasing a pixel area.

Light emitting diodes and a display constructed according to the principles and some exemplary implementations of the invention are capable manufacturing a plurality of pixels substantially simultaneously to obviate the process of individually mounting the pixels a display panel.

Light emitting diodes and a display constructed according to the principles and some exemplary implementations of the invention are capable of adjusting emission of light in consideration of visibility.

In accordance with one exemplary embodiment of the invention, a light emitting diode stack for a display includes: a support substrate; a first LED stack disposed on the support substrate; a second LED stack disposed on the first LED stack; a third LED stack disposed on the second LED stack; a conductive growth substrate coupled to the second LED stack or the third LED stack; a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein light generated from the first LED stack is emitted outside through the second LED stack, the third LED stack and the conductive growth substrate, and light generated from the second LED stack is emitted outside through the third LED stack and the conductive growth substrate.

In accordance with another exemplary embodiment of the invention, a display apparatus includes a plurality of pixels arranged on a support substrate, each of the pixels including: a first LED stack disposed on the support substrate; a second LED stack disposed on the first LED stack; a third LED stack disposed on the second LED stack; a conductive growth substrate coupled to the second LED stack or the third LED stack; a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein light generated from the first LED stack is emitted outside through the second LED stack, the third LED stack and the conductive growth substrate, and light generated from the second LED stack is emitted outside through the third LED stack and the conductive growth substrate.

In accordance with one exemplary embodiment of the invention, a light emitting diode stack for a display includes: a first LED stack including a first conductivity type semiconductor layer and a second conductivity type semiconductor layer; a second LED stack disposed on the first LED stack; a third LED stack disposed on the second LED stack; an ohmic electrode disposed at an opposite side of the second LED stack and forming ohmic contact with the first conductivity type semiconductor layer of the first LED stack; and a reflective electrode disposed at the opposite side of the second LED stack and forming ohmic contact with the second conductivity type semiconductor layer of the first LED stack, wherein light generated from the first LED stack is emitted outside through the second LED stack and the third LED stack, and light generated from the second LED stack is emitted outside through the third LED stack.

In accordance with another exemplary embodiment of the invention, a display apparatus includes a plurality of pixels arranged on a support substrate, each of the pixels including: a first LED stack disposed on the support substrate and including a first conductivity type semiconductor layer and a second conductivity type semiconductor layer; a second LED stack disposed on the first LED stack; a third LED stack disposed on the second LED stack; an ohmic electrode interposed between the substrate and the first conductivity type semiconductor layer of the first LED stack and forming ohmic contact with the first conductivity type semiconductor layer of the first LED stack; and a reflective electrode interposed between the substrate and the second conductivity type semiconductor layer of the first LED stack and forming ohmic contact with the second conductivity type semiconductor layer of the first LED stack, wherein light generated from the first LED stack is emitted outside through the second LED stack and the third LED stack, and light generated from the second LED stack is emitted outside through the third LED stack.

In accordance with one exemplary embodiment of the invention, a light emitting diode pixel for a display includes: a first LED sub-unit; a second LED sub-unit disposed on a portion of the first LED sub-unit; a third LED sub-unit disposed on a portion of the second LED sub-unit; and a reflective electrode disposed adjacent to the first LED sub-unit, in which each of the first to third LED sub-units include an n-type semiconductor layer and a p-type semiconductor layer, each of the n-type semiconductor layers of the first to third LED sub-units are electrically connected to the reflective electrode, and the first LED sub-unit, the second LED sub-unit, and the third LED sub-unit are configured to be independently driven. The first, second, and third sub-units may include a first LED stack, a second LED stack, and a third LED stack, respectively.

In accordance with another exemplary embodiment of the invention, a display apparatus includes a plurality of pixels arranged on a support substrate, each of the pixels including: a first LED sub-unit; a second LED sub-unit disposed on a portion of the first LED sub-unit; a third LED sub-unit disposed on a portion of the second LED sub-unit; and a reflective electrode disposed adjacent to the first LED sub-unit, in which each of the first to third LED sub-units include an n-type semiconductor layer and a p-type semiconductor layer, each of the n-type semiconductor layers of the first to third LED sub-units are electrically connected to the reflective electrode, and the first LED sub-unit, the second LED sub-unit, and the third LED sub-unit are configured to be independently driven. The first, second, and third sub-units may include a first LED stack, a second LED stack, and a third LED stack, respectively.

In accordance with one exemplary embodiment of the invention, a light emitting diode stack for a display includes: a first-1 LED stack; a first-2 LED stack disposed on the first-1 LED stack; a second LED stack disposed on the first-2 LED stack; and a third LED stack disposed on the second LED stack, wherein the first-1 LED stack and the first-2 LED stack are adapted to emit red light, the second LED stack is adapted to emit green light, and the third LED stack is adapted to emit blue light.

In accordance with another exemplary embodiment of the invention, a display apparatus includes a plurality of pixels arranged on a support substrate, each of the pixels including: a first-1 LED stack disposed on the support substrate; a first-2 LED stack disposed on the first-1 LED stack; a second LED stack disposed on the first-2 LED stack; and a third LED stack disposed on the second LED stack, wherein the first-1 LED stack and the first-2 LED stack are adapted to emit red light, the second LED stack is adapted to emit green light, and the third LED stack is adapted to emit blue light.

In accordance with a further exemplary embodiment of the invention, a light emitting diode stack for a display includes, a first-1 LED stack; a first-2 LED stack disposed on the first-1 LED stack; a second LED stack disposed on the first-2 LED stack; and a third LED stack disposed on the second LED stack, wherein the first-1 LED stack and the first-2 LED stack includes AlGaInP-based well layers, the second LED stack is adapted to emit light having a shorter wavelength than the first-1 and first-2 LED stacks, and the third LED stack is adapted to emit light having a shorter wavelength than the second LED stack.

In accordance with one exemplary embodiment of the invention, a light emitting diode stack for a display includes: a first LED stack; a second LED stack disposed on the first LED stack; and a third LED stack disposed on the second LED stack, wherein the first LED stack has a multi junction LED stack structure.

In accordance with another exemplary embodiment of the invention, a display apparatus includes a plurality of pixels arranged on a support substrate, each of the pixels including: a first LED stack disposed on the support substrate; a second LED stack disposed on the first LED stack; and a third LED stack disposed on the second LED stack, wherein the first LED stack has a multi junction LED stack structure.

In accordance with one exemplary embodiment of the invention, a light emitting diode stack for a display is provided. The light emitting diode stack includes: a support substrate; a first LED stack disposed on the support substrate; a second LED stack disposed on the first LED stack; a third LED stack disposed on the second LED stack; a conductive growth substrate coupled to the second LED stack or the third LED stack; a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein light generated from the first LED stack is emitted outside through the second LED stack, the third LED stack and the conductive growth substrate, and light generated from the second LED stack is emitted outside through the third LED stack and the conductive growth substrate.

With the structure wherein the first to third LED stacks are stacked one above another, the light emitting diode stack can increase a luminous area of each subpixel without increasing a pixel area. In addition, with the first and second color filters, the light emitting diode stack allows light generated from the first LED stack to be emitted outside through the second LED stack and the third LED stack, and allows light generated from the second LED stack to be emitted outside through the third LED stack, while preventing light generated from the second LED stack to enter the first LED stack and preventing light generated from the third LED stack to enter the second LED stack, thereby improving luminous efficacy.

Furthermore, the growth substrate for the second LED stack or the third LED stack may remain instead of being removed, thereby enabling simplification of a manufacturing process. However, it should be understood that the exemplary embodiments are not limited thereto. In other exemplary embodiments, the growth substrate may be removed.

Particularly, the light emitting diode stack may include conductive growth substrates coupled to the second LED stack and the third LED stack, respectively.

In the meantime, the first, second and third LED stacks may be sequentially disposed to emit light having gradually decreasing wavelengths in the stated order. For example, the first, second and third LED stacks may emit red light, green light and blue light, respectively. Since the first, second and third LED stacks emit light having gradually decreasing wavelengths in the stated order, it is possible to prevent interference of light between the LED stacks.

Each of the first color filter and the second color filter may be a low pass filter, a band pass filter, or a band stop filter. In particular, each of the first color filter and the second color filter may include insulation layers having different indices of refraction. With the structure wherein the first and second color filters include the insulation layers, the light emitting diode stack can have stability in terms of structure and can exhibit good luminous efficacy. For example, each of the first color filter and the second color filter may be a band stop filter including a distributed Bragg reflector.

The conductive growth substrate may be a Si-doped GaN-based substrate. The GaN-based substrate used as the growth substrate can reduce dislocation density of the second LED stack or the third LED stack grown thereon. The second LED stack or the third LED stack may have a dislocation density of, for example, $10^3$ to $10^7/cm^2$. As a result, luminous efficacy of the second LED stack or the third LED stack can be improved.

The first LED stack, the second LED stack and the third LED stack may be sequentially stacked on the support substrate via a first bonding layer, a second bonding layer and a third bonding layer. The first bonding layer, the second bonding layer and the third bonding layer may be a transparent inorganic insulation layer, a transparent organic insulation layer, or a transparent conductive layer.

In one exemplary embodiment, the light emitting diode stack for a display may further include: a first bonding layer interposed between the support substrate and the first LED stack; a second bonding layer interposed between the first LED stack and the first color filter; and a third bonding layer interposed between the second LED stack and the second color filter, wherein the second bonding layer transmits light generated from the first LED stack and the third bonding layer transmits light generated from the first and second LED stacks. With the first to third bonding layers, the first LED stack, the second LED stack and the third LED stack may be bonded to each other while allowing light to be emitted outside through the second bonding layer and the third bonding layer, thereby preventing light loss.

The first to third LED stacks may be independently driven. To this end, the light emitting diode stack may be provided with electrodes having various structures.

In one exemplary embodiment, the light emitting diode stack for a display may further include: a first-p reflective electrode interposed between the first bonding layer and the first LED stack and forming ohmic contact with a p-type semiconductor layer of the first LED stack; a second-p transparent electrode interposed between the first color filter and the second LED stack and forming ohmic contact with a p-type semiconductor layer of the second LED stack; and a third-p transparent electrode interposed between the second color filter and the third LED stack and forming ohmic contact with a p-type semiconductor layer of the third LED stack, wherein light generated from the first LED stack is emitted outside through the second-p transparent electrode and the third-p transparent electrode and light generated from the second LED stack is emitted outside through the third-p transparent electrode. The first-p reflective electrode, the second-p transparent electrode and the third-p transparent electrode may assist in current spreading in the light emitting diode stack. Furthermore, the first-p reflective electrode may reflect light generated from the first LED stack to be emitted outside, thereby improving luminous efficacy, and the second-p transparent electrode and the third-p transparent electrode transmit light generated from the LED stacks, thereby preventing light loss.

The second bonding layer may adjoin an n-type semiconductor layer of the first LED stack and the third bonding layer may adjoin the conductive growth substrate coupled to the second LED stack.

In other exemplary embodiments, the light emitting diode stack for a display may further include: a first bonding layer interposed between the support substrate and the first LED stack; a second bonding layer interposed between the first color filter and the second LED stack; and a third bonding layer interposed between the second LED stack and the second color filter, wherein the second bonding layer and the third bonding layer transmit light generated from the first LED stack and the second LED stack.

In addition, the light emitting diode stack for a display may further include: a first-n reflective electrode interposed between the first bonding layer and the first LED stack and forming ohmic contact with an n-type semiconductor layer of the first LED stack; a first-p transparent electrode interposed between the first LED stack and the first color filter and forming ohmic contact with the p-type semiconductor layer of the first LED stack; a second-p transparent electrode interposed between the second LED stack and the third bonding layer and forming ohmic contact with the p-type semiconductor layer of the second LED stack; and a third-p transparent electrode interposed between the second color filter and the third LED stack and forming ohmic contact with the p-type semiconductor layer of the third LED stack, wherein light generated from the first LED stack is emitted outside through the first-p transparent electrode, the second-p transparent electrode and the third-p transparent electrode, and light generated from the second LED stack is emitted outside through the second-p transparent electrode and the third-p transparent electrode.

In accordance with another exemplary embodiment of the invention, a display apparatus is provided. The display apparatus includes: a plurality of pixels arranged on a support substrate, each of the pixels including: a first LED stack disposed on the support substrate; a second LED stack disposed on the first LED stack; a third LED stack disposed on the second LED stack; a conductive growth substrate coupled to the second LED stack or the third LED stack; a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein light generated from the first LED stack is emitted outside through the second LED stack, the third LED stack and the conductive growth substrate, and light generated from the second LED stack is emitted outside through the third LED stack and the conductive growth substrate.

Further, the display apparatus may include conductive growth substrates coupled to the second LED stack and the third LED stack, respectively.

Each of the first color filter and the second color filter may be a low pass filter, a band pass filter or a band stop filter.

The conductive growth substrate may be a Si-doped GaN-based substrate.

In each pixel, p-type semiconductor layers of the first, second and third LED stacks may be electrically connected to a common line and n-type semiconductor layers thereof may be electrically connected to different lines. For example, the common line may be a data line and the different lines may be scan lines.

The display apparatus may further include: a lower insulation layer covering side surfaces of the first, second and third LED stacks, wherein the lower insulation layer may include openings for electrical connection.

The lower insulation layer may include a distributed Bragg reflector reflecting red, green and blue light.

In one exemplary embodiment, the display apparatus may further include a reflective electrode interposed between the support substrate and the first LED stack. The reflective electrode may be continuously disposed over the plurality of pixels to be used as the common line.

In another exemplary embodiment, the display apparatus may further include reflective electrodes interposed between the support substrate and the first LED stack. Each of the reflective electrodes may be restrictively placed in each pixel region.

The display apparatus may further include: a first bonding layer interposed between the support substrate and the first LED stack; a second bonding layer interposed between the first LED stack and the second LED stack; and a third bonding layer interposed between the second LED stack and the second color filter, wherein the second bonding layer transmits light generated from the first LED stack and the third bonding layer transmits light generated from the first and second LED stacks.

The first bonding layer, the second bonding layer and the third bonding layer may be a transparent inorganic insulation layer, a transparent organic insulation layer, or a transparent conductive layer.

In each pixel, the first to third LED stacks may be independently driven.

Embodiments of the invention provide a light emitting stacked structure having a simple structure and capable of being simply manufactured.

Embodiments of the invention provide a display device having the light emitting stacked structure.

Embodiments of the invention may provide a light emitting stacked structure including a plurality of epitaxial stacks that is sequentially stacked one on another and emits color lights having different wavelength bands from each other. Each of the epitaxial stacks may emit a corresponding color light among the color lights in an upward direction, light emitting areas of the epitaxial stacks overlap with each other, and an epitaxial stack disposed at a lowermost end among the epitaxial stacks comprises a concave-convex portion disposed on an upper surface thereof.

Each of the epitaxial stacks may be independently driven.

The color lights respectively emitted from the epitaxial stacks may have different energy bands from each other, and the energy band of the color lights emitted from the epitaxial stacks become higher from the epitaxial stack disposed at the lowermost end to an epitaxial stack disposed at an uppermost end among the epitaxial stacks.

The color light emitted from a lower epitaxial stack in two epitaxial stacks disposed adjacent to each other among the epitaxial stacks may travel passing through an upper epitaxial stack in the two epitaxial stacks. The epitaxial stack may transmit about 80% or more of the color light from the epitaxial stack disposed thereunder.

The epitaxial stacks may include a first epitaxial stack disposed on a substrate to emit a first color light, a second epitaxial stack disposed on the first epitaxial stack to emit a second color light having a wavelength band different from the first color light, and a third epitaxial stack disposed on the second epitaxial stack to emit a third color light having a wavelength band different from the first and second color lights.

The first, second, and third color lights may be a red light, a green light, and a blue light, respectively.

The light emitting stacked structure may further include a first wavelength pass filter disposed between the first epitaxial stack and the second epitaxial stack.

The light emitting stacked structure may further include a second wavelength pass filter disposed between the second epitaxial stack and the third epitaxial stack.

Each of the first, second, and third epitaxial stacks may include a p-type semiconductor layer disposed on the substrate, an active layer disposed on the p-type semiconductor layer, and an n-type semiconductor layer disposed on the active layer.

The n-type semiconductor layer of at least one of the second and third epitaxial stacks may include the concave-convex portion disposed thereon.

The light emitting stacked structure may further include first, second, and third p-type electrodes respectively connected to the p-type semiconductor layers of the first, second, and third epitaxial stacks.

The first p-type electrode may be disposed between the substrate and the first epitaxial stack.

The second p-type electrode may be disposed between the first epitaxial stack and the second epitaxial stack. The second p-type electrode may include a transparent conductive material.

The third p-type electrode may be disposed between the second epitaxial stack and the third epitaxial stack. The third p-type electrode may include a transparent conductive material.

The first, second, and third p-type electrodes may substantially cover the first, second, and third epitaxial stacks, respectively.

The light emitting stacked structure may further include an insulating layer that covers the third epitaxial stack and includes first contact holes defined therethrough to expose upper surfaces of the second and third p-type electrodes and second contact holes defined therethrough to expose upper surfaces of the second and third n-type semiconductor layers.

The first and second contact holes may be defined in a peripheral area.

The light emitting stacked structure may further include a data line to apply a common voltage to the first, second, and third p-type electrodes of the first, second, and third epitaxial stacks. The data line is connected to the first p-type electrode between the substrate and the first epitaxial stack and connected to the second p-type electrode and the third p-type electrode through the first contact holes.

The light emitting stacked structure may further include first, second, and third signal lines that respectively apply signals to the first, second, and third n-type semiconductor layers of the first, second, and third epitaxial stacks. The first signal line may be connected to the first n-type semiconductor layer between the substrate and the first epitaxial stack, the second signal line may be connected to the second n-type semiconductor layer through the second contact hole, and the third signal line may be connected to the third n-type semiconductor layer through the second contact hole.

Embodiments of the invention may provide a display device to which the light emitting stacked structure is applied. The display device includes a plurality of pixels. Each pixel includes a plurality of epitaxial stacks that is sequentially stacked one on another and emits color lights having different wavelength bands from each other. Each of the epitaxial stacks emits a corresponding color light among the color lights in an upward direction, light emitting areas of the epitaxial stacks overlap with each other, and an epitaxial stack disposed at a lowermost end among the epitaxial stacks may include a concave-convex portion disposed on an upper surface thereof.

The display device may further include a line part electrically connected to the pixel to apply a light emitting signal to the pixel.

The line part may include a plurality of data lines extending in a first direction and connected to first semiconductor layers of the first, second, and third epitaxial stacks and a plurality of signal lines extending in a second direction crossing the first direction and respectively connected to second semiconductor layers of the first, second, and third epitaxial stacks.

The display device may be driven in a passive matrix manner or an active matrix manner.

According to the above, the light emitting stacked structure may have simple structure and may be simply manufactured. In addition, the display device may include the light emitting stacked structure.

Embodiments of the invention provides a light emitting stacked structure having a simple structure and capable of being simply manufactured.

Embodiments of the invention may provide a light emitting stacked structure including a first epitaxial stack emitting a first color light, a second epitaxial stack disposed on the first epitaxial stack to emit a second color light different from the first color light, and an electrode part disposed on the second epitaxial stack and electrically connected to the first and second epitaxial stacks. A light emitting area of the first epitaxial stack may overlap with a light emitting area of the second epitaxial stack, and the first and second epitaxial stacks may emit the first and second color lights in a downward direction.

The first color light may have a wavelength shorter than a wavelength of the second color light.

The first color light may be a blue light, and the second color light may be a red light.

The first and second epitaxial stacks may be driven independently of each other.

At least one of the first epitaxial stack and the second epitaxial stack may include a concave-convex portion disposed on a lower surface thereof.

The light emitting stacked structure may further include an adhesive layer disposed between the first epitaxial stack and the second epitaxial stack.

The light emitting stacked structure may further include a long wavelength pass filter disposed between the first epitaxial stack and the adhesive layer.

The first epitaxial stack may include an n-type semiconductor layer, an active layer disposed on the n-type semiconductor layer, a p-type semiconductor layer disposed on the active layer, and a first p-type contact electrode disposed on the p-type semiconductor layer.

The first p-type contact electrode may include a transparent conductive material.

The light emitting stacked structure may further include a peripheral area disposed adjacent to the light emitting area when viewed in a plan view, and the first p-type contact electrode may be disposed to overlap with the light emitting area.

The second epitaxial stack may include a second n-type semiconductor layer, an active layer of the second epitaxial stack disposed on the second n-type semiconductor layer, a p-type semiconductor layer of the second epitaxial stack disposed on the active layer of the second epitaxial stack, a second n-type contact electrode disposed on the second n-type semiconductor layer, and a second p-type contact electrode disposed on the p-type semiconductor layer of the second epitaxial stack.

The second p-type contact electrode may include a reflection material.

The electrode part may include a common electrode connected to the first p-type contact electrode and the second p-type contact electrode, a first signal electrode connected to the n-type semiconductor layer of the first epitaxial stack, and a second signal electrode connected to the second n-type semiconductor layer.

A first contact hole may be defined through the second epitaxial stack, the active layer of the first epitaxial stack, and the p-type semiconductor layer of the first epitaxial stack to expose an upper surface of the n-type semiconductor layer of the first epitaxial stack, and the first signal electrode may be connected to the n-type semiconductor layer of the first epitaxial stack through the first contact hole.

A third contact hole may be defined through the second epitaxial stack to expose an upper surface of the first p-type contact electrode, and the common electrode may be connected to the first p-type contact electrode through the third contact hole.

The light emitting stacked structure may further include a first insulating layer covering the second epitaxial stack, a second contact hole may be defined through the first insulating layer to expose an upper surface of the second n-type contact electrode, and the second signal electrode may be connected to the second n-type contact electrode through the second contact hole.

The light emitting stacked structure may further include a second insulating layer disposed on the first insulating layer, a fourth contact hole may be defined through the second insulating layer to expose an upper surface of the second p-type contact electrode, and the common electrode may be connected to the second p-type contact electrode through the fourth contact hole.

At least one of the n-type semiconductor layer of the first epitaxial stack and the second n-type semiconductor layer may include a concave-convex portion disposed on a lower surface thereof.

The light emitting stacked structure may further include a substrate disposed on a lower surface of the first epitaxial stack.

The light emitting stacked structure may further include a light conversion layer disposed on a lower surface of the first epitaxial stack.

Embodiments of the invention may provide a lighting device including a printed circuit board and the above-mentioned light emitting stacked structure mounted on the printed circuit board.

In accordance with one exemplary embodiment of the invention, a light emitting diode stack for a display is provided. The light emitting diode stack includes: a first LED stack including a first conductivity type semiconductor layer and a second conductivity type semiconductor layer; a second LED stack disposed on the first LED stack; a third LED stack disposed on the second LED stack; an ohmic electrode disposed at an opposite side of the second LED stack and forming ohmic contact with the first conductivity type semiconductor layer of the first LED stack; and a reflective electrode disposed at the opposite side of the second LED stack and forming ohmic contact with the second conductivity type semiconductor layer of the first LED stack, wherein light generated from the first LED stack is emitted outside through the second LED stack and the third LED stack, and light generated from the second LED stack is emitted outside through the third LED stack.

With the structure wherein the first to third LED stacks are stacked one above another, the light emitting diode stack can increase a luminous area of each subpixel without increasing a pixel area. Light generated from the first LED stack may be emitted outside through the second LED stack and the third LED stack, and light generated from the second LED stack may be emitted outside through the third LED stack, thereby improving luminous efficacy.

The first LED stack may emit light having a longer wavelength than the second and third LED stacks, and the second LED stack may emit light having a longer wavelength than the third LED stack. For example, the first, second and third LED stacks may emit red light, green light and blue light, respectively. Since the first, second and third LED stacks emit light having gradually decreasing wavelengths in the stated order, it is possible to prevent interference of light between the LED stacks.

The light emitting diode stack for a display may further include: a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack. With the first and second color filters, the light emitting diode stack can prevent light generated from the second LED stack from entering the first LED stack and light generated from the third LED stack from entering the second LED stack, thereby further improving luminous efficacy.

Each of the first color filter and the second color filter may be a low pass filter, a band pass filter, or a band stop filter. In particular, each of the first color filter and the second color filter may include insulation layers having different indices of refraction. With the structure wherein the first and second color filters include the insulation layers, the light emitting diode stack can have stability in terms of structure and can exhibit good luminous efficacy.

The light emitting diode stack for a display may further include: an interconnection line disposed under the first LED stack to be insulated from the reflective electrode and connected to the ohmic electrode. The interconnection line may be electrically connected to the first conductivity type semiconductor layer of the first LED stack to be used as a scan line or a data line in a display apparatus.

The light emitting diode stack for a display may further include: an insulation layer interposed between the reflective electrode and the interconnection line to insulate the interconnection line from the reflective electrode.

The light emitting diode stack for a display may further include: a support substrate; a first bonding layer interposed between the support substrate and the first LED stack; a second bonding layer interposed between the first LED stack and the second LED stack; and a third bonding layer interposed between the second LED stack and the third LED stack, wherein the second bonding layer transmits light generated from the first LED stack and the third bonding layer transmits light generated from the first and second LED stacks.

The first bonding layer may adjoin the interconnection line.

The light emitting diode stack for a display may further include: a second-p transparent electrode forming ohmic contact with a p-type semiconductor layer of the second LED stack; and a third-p transparent electrode forming ohmic contact with a p-type semiconductor layer of the third LED stack. The light emitting diode stack can achieve current spreading through the second-p transparent electrode and the third-p transparent electrode, which allow light generated from the corresponding LED stacks to pass therethrough, thereby preventing light loss.

In one exemplary embodiment, the light emitting diode stack for a display may further include: a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein the first color filter may be disposed on the second bonding layer and the second color filter may be disposed on the third bonding layer.

In accordance with another exemplary embodiment of the invention, a display apparatus is provided. The display apparatus includes: a plurality of pixels arranged on a support substrate, each of the pixels including: a first LED stack disposed on the support substrate and including a first conductivity type semiconductor layer and a second conductivity type semiconductor layer; a second LED stack disposed on the first LED stack; a third LED stack disposed on the second LED stack; an ohmic electrode interposed between the substrate and the first conductivity type semiconductor layer of the first LED stack and forming ohmic contact with the first conductivity type semiconductor layer of the first LED stack; and a reflective electrode interposed between the substrate and the second conductivity type semiconductor layer of the first LED stack and forming ohmic contact with the second conductivity type semiconductor layer of the first LED stack, wherein light generated from the first LED stack is emitted outside through the second LED stack and the third LED stack, and light generated from the second LED stack is emitted outside through the third LED stack.

The first LED stack may emit light having a longer wavelength than the second and third LED stacks, and the second LED stack may emit light having a longer wavelength than the third LED stack.

The display apparatus may further include: an interconnection line interposed between the support substrate and the first LED stack to be insulated from the reflective electrode and connected to the ohmic electrode.

The display apparatus may further include: an insulation layer interposed between the reflective electrode and the interconnection line to insulate the interconnection line from the reflective electrode.

The display apparatus may further include: a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack.

Each of the first color filter and the second color filter may be a low pass filter, a band pass filter or a band stop filter.

In each pixel, p-type semiconductor layers of the first, second and third LED stacks may be electrically connected to a common line and n-type semiconductor layers thereof may be electrically connected to different lines. The interconnection line may be a line connected to an n-type semiconductor layer of the first LED stack.

The common line may be a data line and the different lines may be scan lines. Alternatively, the n-type semiconductor layers of the first, second and third LED stacks may be electrically connected to a common line and the p-type semiconductor layers thereof may be electrically connected to different lines.

The reflective electrode may be continuously disposed over the plurality of pixels to be used as the common line.

The display apparatus may further include: a lower insulation layer covering side surfaces of the first, second and third LED stacks, wherein the lower insulation layer may include openings that expose the reflective electrode, the second LED stack and the third LED stack.

The lower insulation layer may include a distributed Bragg reflector reflecting red, green and blue light.

In accordance with one exemplary embodiment of the invention, a light emitting diode pixel for a display includes: a first LED stack; a second LED stack disposed in some region on the first LED stack; a third LED stack disposed in some region on the second LED stack; and a reflective electrode disposed at a lower side of the first LED stack, wherein each of the first to third LED stacks includes an n-type semiconductor layer and a p-type semiconductor layer, all of the n-type semiconductor layers of the first to third LED stacks are electrically connected to the reflective electrode, and the first LED stack, the second LED stack and the third LED stack are independently driven.

With the structure wherein the first to third LED stacks may be disposed to overlap each other, the first to third LED stacks may be manufactured at the wafer level through wafer bonding, thereby eliminating a need for individual mounting of the first to third LED stacks.

In addition, since the second LED stack is disposed in some region on the first LED stack and the third LED stack is disposed in some region on the second LED stack, the light emitting diode pixel can reduce light loss caused by absorption of light emitted from the first LED stack and the second LED stack by the second LED stack or the third LED stack.

In addition, since the n-type semiconductor layers of the first to third LED stacks are electrically connected to the reflective electrode, it is possible to provide a pixel in which cathodes of the first to third LED stacks are electrically connected to a common line.

The first to third LED stacks emit light having different wavelengths, respectively. In some exemplary embodiments, the first LED stack may emit light having a longer wavelength than the second LED stack and the second LED stack may emit light having a longer wavelength than the third LED stack. For example, the first, second and third LED stacks may emit red light, green light and blue light, respectively.

The p-type semiconductor layers of the first to third LED stacks may be disposed on the n-type semiconductor layers thereof, respectively, and the reflective electrode may form ohmic contact with the n-type semiconductor layer of the first LED stack.

The light emitting diode pixel may further include: a first color filter interposed between the first LED stack and the second LED stack; and a second color filter interposed between the second LED stack and the third LED stack. The first color filter may transmit light generated from the first LED stack while reflecting light generated from the second LED stack, and the second color filter may transmit light generated from the second LED stack while reflecting light generated from the third LED stack.

The first color filter may adjoin the n-type semiconductor layer of the second LED stack, and the second color filter may adjoin the n-type semiconductor layer of the third LED stack.

The light emitting diode pixel may further include: a second bonding layer interposed between the first LED stack and the first color filter; and a third bonding layer interposed between the second LED stack and the second color filter. The second bonding layer may transmit light generated from the first LED stack and the third bonding layer may transmit light generated from the second LED stack.

The light emitting diode pixel may further include: a first-2 ohmic electrode contacting the p-type semiconductor layer of the first LED stack; a second-1 ohmic electrode contacting the n-type semiconductor layer of the second LED stack; a second-2 ohmic electrode contacting the p-type semiconductor layer of the second LED stack; a third-1 ohmic electrode contacting the n-type semiconductor layer of the third LED stack; and a third-2 ohmic electrode contacting the p-type semiconductor layer of the third LED stack. In addition, the first-2 ohmic electrode may contact the p-type semiconductor layer outside some region of the first LED stack, and the second-1 ohmic electrode and the second-2 ohmic electrode may contact the n-type and p-type semiconductor layers outside some region of the second LED stack, respectively.

Further, the third-1 ohmic electrode may contact the n-type semiconductor layer on the n-type semiconductor layer of the third LED stack, and the third-2 ohmic electrode may contact the p-type semiconductor layer on the p-type semiconductor layer of the third LED stack.

The light emitting diode pixel may further include connecting portions electrically connecting the second-1 ohmic electrode and the third-1 ohmic electrode to the reflective electrode, respectively. Accordingly, the n-type semiconductor layer of the second LED stack and the p-type semiconductor layer of the third LED stack are electrically connected to the reflective electrode through the ohmic electrodes and the connecting portions.

In the meantime, an area of the first LED stack region excluding some region of the first LED stack, an area of the second LED stack region excluding some region of the second LED stack, and an area of the third LED stack region may be different from one another. Since the first to third LED stacks emit light having different visibility, it is possible to increase luminous intensity of light having lower visibility above luminous intensity of light having higher visibility through adjustment of the areas of the first to third LED stacks.

In accordance with another exemplary embodiment of the invention, a display apparatus is provided. The display apparatus includes a plurality of pixels arranged on a support substrate, each of the pixels including: a first LED stack; a second LED stack disposed in some region on the first LED stack; a third LED stack disposed in some region on the second LED stack; and a reflective electrode disposed at a lower side of the first LED stack, wherein each of the first to third LED stacks includes an n-type semiconductor layer and a p-type semiconductor layer, all of the n-type semiconductor layers of the first to third LED stacks are electrically connected to the reflective electrode, and the first LED stack, the second LED stack and the third LED stack can be independently driven.

The first LED stack, the second LED stack and the third LED stack may emit light having different wavelengths, respectively.

The n-type semiconductor layer of the first LED stack, the n-type semiconductor layer of the second LED stack and the n-type semiconductor layer of the third LED stack may be electrically connected to a common line, and the p-type semiconductor layer of the first LED stack, the p-type semiconductor layer of the second LED stack and the p-type semiconductor layer of the third LED stack may be electrically connected to different lines. Accordingly, the first LED stack, the second LED stack, and the third LED stack can be independently driven.

On the other hand, the p-type semiconductor layers of the first to third LED stacks may be disposed on the n-type semiconductor layers thereof, respectively, and the reflective electrode may form ohmic contact with the n-type semiconductor layer of the first LED stack.

Each of the pixels may further include: a first color filter interposed between the first LED stack and the second LED stack; and a second color filter interposed between the second LED stack and the third LED stack, wherein the first color filter transmits light generated from the first LED stack while reflecting light generated from the second LED stack, and the second color filter transmits light generated from the second LED stack while reflecting light generated from the third LED stack.

Each of the pixels may further include: a first bonding layer interposed between the support substrate and the reflective electrode; a second bonding layer interposed between the first LED stack and the first color filter; and a third bonding layer interposed between the second LED stack and the second color filter.

Each of the pixels may further include: a first-2 ohmic electrode contacting the p-type semiconductor layer of the first LED stack; a second-1 ohmic electrode contacting the n-type semiconductor layer of the second LED stack; a second-2 ohmic electrode contacting the p-type semiconductor layer of the second LED stack; a third-1 ohmic electrode contacting the n-type semiconductor layer of the third LED stack; and a third-2 ohmic electrode contacting the p-type semiconductor layer of the third LED stack. In addition, the first-2 ohmic electrode may contact the p-type semiconductor layer outside some region of the first LED stack, and the second-1 ohmic electrode and the second-2 ohmic electrode may contact the n-type and p-type semiconductor layers outside some region of the second LED stack, respectively.

Furthermore, the third-1 ohmic electrode may contact the n-type semiconductor layer on the n-type semiconductor layer of the third LED stack, and the third-2 ohmic electrode may contact the p-type semiconductor layer on the p-type semiconductor layer of the third LED stack.

Each of the pixels may further include: connecting portions electrically connecting the second-1 ohmic electrode and the third-1 ohmic electrode to the reflective electrode, respectively.

In the meantime, an area of the first LED stack region excluding some region of the first LED stack, an area of the second LED stack region excluding some region of the second LED stack, and an area of the third LED stack region may be different from one another. For example, the area of the first LED stack region excluding some region of the first LED stack may be larger than the area of the second LED stack region excluding some region of the second LED stack and the area of the third LED stack region may be different from one another.

In accordance with one exemplary embodiment of the invention, a light emitting diode stack for a display includes: a support substrate; a first-1 LED stack disposed on the support substrate; a first-2 LED stack disposed on the first-1 LED stack; a second LED stack disposed on the first-2 LED stack; and a third LED stack disposed on the second LED stack, wherein the first-1 LED stack and the first-2 LED stack are adapted to emit red light, the second LED stack is adapted to emit green light, and the third LED stack is adapted to emit blue light.

With the structure wherein the first to third LED stacks are stacked one above another, the light emitting diode stack can increase a luminous area of each subpixel without increasing a pixel area. In addition, with the structure wherein the first-1 LED stack is disposed to overlap the first-2 LED stack, the light emitting diode stack can increase brightness of red light without increasing the area occupied thereby in a two-dimensional plane.

In one exemplary embodiment, the light emitting diode stack may further include a first-1 upper ohmic contact layer forming ohmic contact with an upper surface of the first-1 LED stack; and a first-2 lower ohmic contact layer forming ohmic contact with a lower surface of the first-2 LED stack. The first-1 upper ohmic contact layer and the first-2 lower ohmic contact layer may be electrically connected to each other.

The light emitting diode stack may further include: a first-1 lower ohmic contact layer forming ohmic contact with a lower surface of the first-1 LED stack; and a first-2 upper ohmic contact layer forming ohmic contact with an upper surface of the first-2 LED stack, wherein the first-1 LED stack and the first-2 LED stack may be connected to each other in series between the first-1 lower ohmic contact layer and the first-2 upper ohmic contact layer.

The first-1 lower ohmic contact layer may include a reflective layer reflecting light generated from the first-1 LED stack. As a result, luminous efficacy of the first-1 LED stack can be improved.

The light emitting diode stack may further include a second bonding layer interposed between the first-1 LED stack and the first-2 LED stack. The second bonding layer may be a transparent conductive layer. By adopting the transparent conductive layer as the bonding layer, the first-1 LED stack and the first-2 LED stack can be easily electrically connected to each other.

In some exemplary embodiments, the light emitting diode stack may further include: a first-1 upper ohmic contact layer forming ohmic contact with an upper surface of the first-1 LED stack; a first-2 lower ohmic contact layer forming ohmic contact with a lower surface of the first-2 LED stack; and a second bonding layer interposed between the first-1 LED stack and the first-2 LED stack, wherein the first-1 upper ohmic contact layer may be insulated from the first-2 lower ohmic contact layer by the second bonding layer. Here, the second bonding layer may be formed of an insulating material.

The light emitting diode stack may further include: a first-1 lower ohmic contact layer forming ohmic contact with a lower surface of the first-1 LED stack; and a first-2 upper ohmic contact layer forming ohmic contact with an upper surface of the first-2 LED stack, wherein the first-1 lower ohmic contact layer may be electrically connected to the first-2 lower ohmic contact layer and the first-2 upper ohmic contact layer may be electrically connected to the first-1 upper ohmic contact layer. Accordingly, the first-1 LED stack may be connected to the first-2 LED stack in parallel.

The light emitting diode stack may further include: a first color filter interposed between the first-2 LED stack and the second LED stack and transmitting light generated from the first-1 and first-2 LED stacks while reflecting light generated from the second LED stack; and a second color filter interposed between the second LED stack and the third LED stack and transmitting light generated from the first-1, first-2 and second LED stacks while reflecting light generated from the third LED stack.

The light generated from the first-1 and first-2 LED stacks may be emitted outside through the second LED stack and the third LED stack, and the light generated from the second LED stack may be emitted outside through the third LED stack.

With the first and second color filters, the light emitting diode stack can prevent light generated from the second LED stack from entering the first-2 LED stack and can prevent light generated from the third LED stack from entering the second LED stack, thereby reducing light loss.

In other exemplary embodiments, the second LED stack may be disposed in some region on the first-2 LED stack and the third LED stack may be disposed in some region on the second LED stack. Accordingly, some light generated from the first-1 and first-2 LED stacks may be emitted outside without passing through the second LED stack and some light generated from the second LED stack may also be emitted outside without passing through the third LED stack.

The light emitting diode stack may further include: a support substrate disposed at a lower side of the first-1 LED stack; a first bonding layer interposed between the support substrate and the first-1 LED stack; a third bonding layer interposed between the first-2 LED stack and the first color filter; and a fourth bonding layer interposed between the second LED stack and the second color filter, wherein the third bonding layer transmits light generated from the first-1 and first-2 LED stacks, and the fourth bonding layer transmits light generated from the first-1, first-2 and second LED stacks.

The light emitting diode stack may further include: a second transparent electrode interposed between the first color filter and the second LED stack and forming ohmic contact with the second LED stack; and a third transparent electrode interposed between the second color filter and the third LED stack and forming ohmic contact with the third LED stack.

The second transparent electrode and the third transparent electrode may assist in current spreading in the second LED stack and the third LED stack.

In accordance with another exemplary embodiment of the invention, a display apparatus includes: a plurality of pixels arranged on a support substrate, each of the pixels including, a first-1 LED stack disposed on the support substrate; a first-2 LED stack disposed on the first-1 LED stack; a second LED stack disposed on the first-2 LED stack; and a third LED stack disposed on the second LED stack, wherein the first-1 LED stack and the first-2 LED stack are adapted to emit red light, the second LED stack is adapted to emit green light, and the third LED stack is adapted to emit blue light.

Each of the pixels may be adapted to emit red light using the first-1 LED stack and the first-2 LED stack overlapping each other, thereby increasing brightness of red light within each pixel without increasing the area of a subpixel.

In one exemplary embodiment, the first-1 LED stack and the first-2 LED stack may be connected to each other in series. Furthermore, in each pixel, p-type semiconductor layers of the first-1, second and third LED stacks may be electrically connected to a common line, and n-type semiconductor layers of the first-2, second and third LED stacks may be electrically connected to different lines.

In another exemplary embodiment, the first-1 LED stack and the first-2 LED stack may be connected to each other in parallel. Furthermore, in each pixel, p-type semiconductor layers of the first-1, first-2, second and third LED stacks may be electrically connected to a common line, n-type semiconductor layers of the first-1, second and third LED stacks may be electrically connected to different lines, and an n-type semiconductor layer of the first-2 LED stack may be electrically connected to the n-type semiconductor layer of the first-1 LED stack.

The display apparatus may further include: a lower insulation layer covering side surfaces of the first-1, first-2, second and third stacks, wherein the lower insulation layer may include openings exposing at least part of the first-2, second and third LED stacks.

The display apparatus may further include a reflective electrode interposed between the support substrate and the first-1 LED stack. The reflective electrode may be continuously disposed over the plurality of pixels.

The display apparatus may further include: a first color filter interposed between the first-2 LED stack and the second LED stack and transmitting light generated from the first-1 and first-2 LED stacks while reflecting light generated from the second LED stack; and a second color filter interposed between the second LED stack and the third LED stack and transmitting light generated from the first-1, first-2 and second LED stacks while reflecting light generated from the third LED stack.

The light generated from the first-1 and first-2 LED stacks may be emitted outside through the second LED stack and the third LED stack, and the light generated from the second LED stack may be emitted outside through the third LED stack.

In other exemplary embodiments, the second LED stack may be disposed in some region on the first-2 LED stack and the third LED stack may be disposed in some region on the second LED stack. Accordingly, some light generated from the first-1 and first-2 LED stacks may be emitted outside without passing through the second LED stack and some light generated from the second LED stack may also be emitted outside without passing through the third LED stack.

In each pixel, the second and third LED stacks may be driven independently of the first-1 and first-2 LED stacks, and the first-1 LED stack and the first-2 LED stack may be driven together.

In accordance with one exemplary embodiment of the invention, a light emitting diode stack for a display is provided. The light emitting diode stack includes: a first LED stack; a second LED stack disposed on the first LED stack; and a third LED stack disposed on the second LED stack, wherein the first LED stack has a multi junction LED stack structure.

With the structure wherein the first to third LED stacks are stacked one above another, the light emitting diode stack can increase a luminous area of each subpixel without increasing a pixel area. In addition, by adopting the first LED stack having the multi junction LED stack structure, the light emitting diode stack can increase brightness of the first LED stack without increasing a luminous area and current density.

Herein, the term "LED stack" means a stack of semiconductor layers capable of emitting light. In addition, the multi junction LED stack structure means an LED stack formed by tunnel junction of at least two LED stacks.

The first LED stack may include a first-1 LED stack; a first-2 LED stack; and a tunnel junction layer interposed between the first-1 LED stack and the first-2 LED stack, and each of the first-1 LED stack and the first-2 LED stack includes an n-type semiconductor layer, an active layer and a p-type semiconductor layer.

The first LED stack may include AlGaInP-based semiconductor layers.

The first LED stack may emit red light having a longer wavelength than the second and third LED stacks, and the second LED stack may emit red light having a longer wavelength than the third LED stack. The first-1 LED stack may emit light having the same wavelength as or a wavelength near to that of the first-2 LED stack. For example, the first, second and third LED stacks may emit red light, green light and blue light, respectively.

Furthermore, light generated from the first LED stack may be emitted outside through the second LED stack and the third LED stack, and light generated from the second LED stack may be emitted outside through the third LED stack.

In other exemplary embodiments, the second LED stack may be disposed in some region on the first LED stack and the third LED stack may also be disposed in some region on the second LED stack. Accordingly, at least part of the light generated from the first LED stack may be emitted outside without passing through the second LED stack and at least part of the light generated from the second LED stack may be emitted outside without passing through the third LED stack.

The light emitting diode stack may further include: a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack.

With the first and second color filters, the light emitting diode stack allows the light generated from the first LED stack to be emitted outside through the second LED stack and the third LED stack, and allows the light generated from the second LED stack to be emitted outside through the third LED stack, while preventing the light generated from the second LED stack from entering the first LED stack and preventing the light generated from the third LED stack from entering the second LED stack, thereby improving luminous efficacy.

Each of the first color filter and the second color filter may be a low pass filter, a band pass filter, or a band stop filter. In particular, each of the first color filter and the second color filter may include a distributed Bragg reflector. With the structure wherein the first and second color filters include the distributed Bragg reflectors, the light emitting diode stack can have stability in terms of structure and can exhibit good luminous efficacy.

The light emitting diode stack may further include: a second bonding layer interposed between the first LED stack and the first color filter; and a third bonding layer interposed between the second LED stack and the second color filter, wherein the second bonding layer transmits light generated from the first LED stack and the third bonding layer transmits light generated from the first LED stack and the second LED stack.

With the second and third bonding layers, the first LED stack, the second LED stack and the third LED stack may be bonded to each other while allowing light to be emitted outside through the second bonding layer and the third bonding layer, thereby preventing light loss.

The light emitting diode stack may further include: a support substrate disposed at a lower side of the first LED stack; and a first bonding layer interposed between the support substrate and the first LED stack.

The light emitting diode stack may further include: a first reflective electrode interposed between the first bonding layer and the first LED stack and forming ohmic contact with a p-type semiconductor layer of the first LED stack.

The first reflective electrode may reflect light generated from the first LED stack, thereby improving luminous efficacy of the first LED stack.

The light emitting diode stack may further include a first ohmic electrode forming ohmic contact with an upper surface of the first LED stack.

The light emitting diode stack may further include: a second transparent electrode interposed between the first color filter and the second LED stack and forming ohmic contact with a p-type semiconductor layer of the second LED stack; and a third transparent electrode interposed between the second color filter and the third LED stack and forming ohmic contact with a p-type semiconductor layer of the third LED stack, wherein light generated from the first LED stack is emitted outside through the second transparent electrode and the third transparent electrode, and light generated from the second LED stack is emitted outside through the third transparent electrode.

In accordance with another exemplary embodiment of the invention, a display apparatus is provided. The display apparatus includes: a plurality of pixels arranged on a support substrate, each of the pixels including: a first LED stack disposed on the support substrate; a second LED stack disposed on the first LED stack; and a third LED stack disposed on the second LED stack, wherein the first LED stack has a multi junction LED stack structure.

With the multi junction LED stack structure, the first LED stack can have improved brightness.

The first LED stack may include: a first-1 LED stack; a first-2 LED stack; and a tunnel junction layer interposed between the first-1 LED stack and the first-2 LED stack, and each of the first-1 LED stack and the first-2 LED stack includes an n-type semiconductor layer, an active layer, and a p-type semiconductor layer.

The first LED stack may include AlGaInP-based semiconductor layers.

The display apparatus may further include: a first color filter interposed between the first LED stack and the second LED stack and transmitting light generated from the first LED stack while reflecting light generated from the second LED stack; and a second color filter interposed between the second LED stack and the third LED stack and transmitting light generated from the first and second LED stacks while reflecting light generated from the third LED stack, wherein the light generated from the first LED stack is emitted outside through the second LED stack and the third LED stack, and the light generated from the second LED stack is emitted outside through the third LED stack.

Each of the first color filter and the second color filter may be a low pass filter, a band pass filter or a band stop filter, and may include a distributed Bragg reflector having high reflectivity in a particular wavelength band.

In other exemplary embodiments, the second LED stack may be disposed in some region on the first LED stack and the third LED stack may also be disposed in some region on the second LED stack. Accordingly, at least part of the light generated from the first LED stack may be emitted outside without passing through the second LED stack and at least part of the light generated from the second LED stack may be emitted outside without passing through the third LED stack.

In each pixel, p-type semiconductor layers of the first, second and third LED stacks may be electrically connected to a common line and n-type semiconductor layers thereof may be electrically connected to different lines. For example, the common line may be a data line and the different lines may be scan lines.

The display apparatus may further include: a lower insulation layer covering side surfaces of the first to third LED stacks, wherein the lower insulation layer may include a distributed Bragg reflector reflecting red, green and blue light.

In one exemplary embodiment, the display apparatus may further include a reflective electrode interposed between the first LED stack and the support substrate.

The reflective electrode may be continuously disposed over the plurality of pixels to be used as the common line.

In another exemplary embodiment, the display apparatus may further include reflective electrodes interposed between the support substrate and the first LED stack. Each of the reflective electrodes may be restrictively placed in each pixel region.

The first to third LED stacks in each pixel may be independently driven.

It is to be understood that both the foregoing general description and the following detailed description are exemplary and explanatory and are intended to provide further explanation of the invention as claimed.

DETAILED DESCRIPTION

Figure 1:
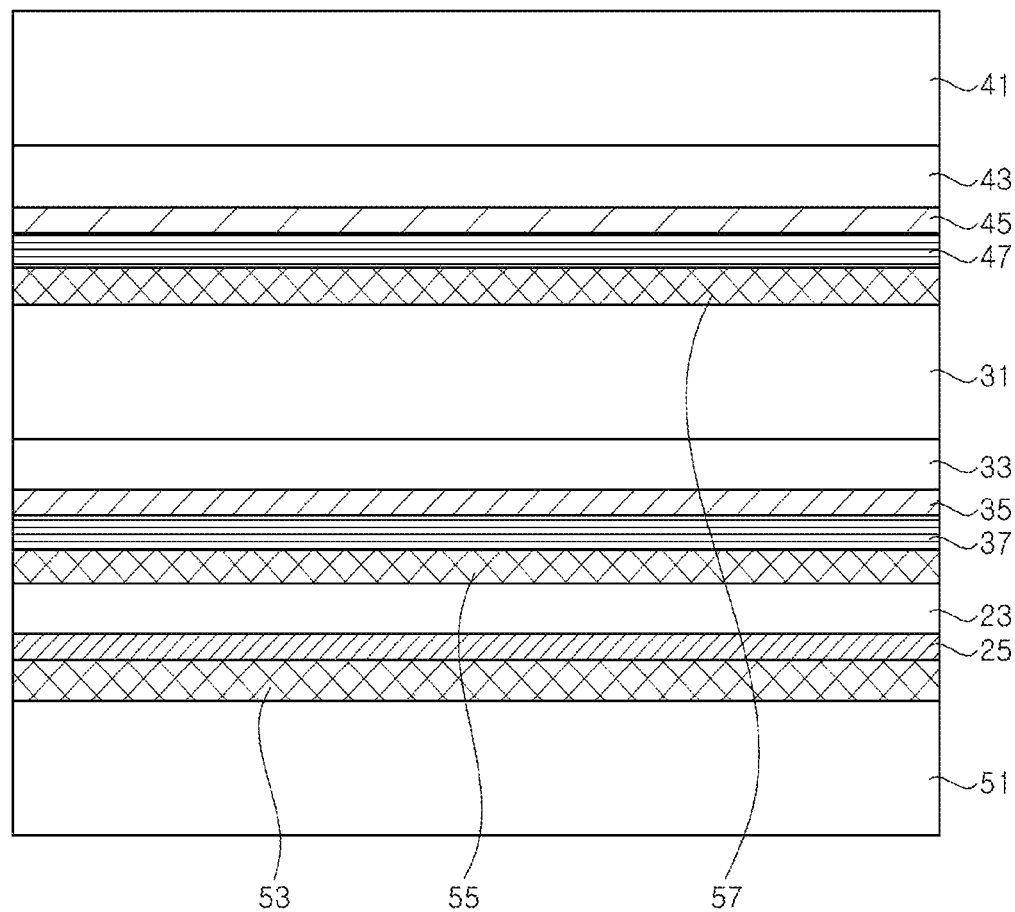
FIG. 1 is a schematic cross-sectional view of a light emitting diode stack for a display according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, a light emitting device or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application.

FIG. 1 is a schematic cross-sectional view of a light emitting diode stack for a display according to an exemplary embodiment.

Referring to FIG. 1, the light emitting diode stack 100 may include a support substrate 51, a second substrate 31, a third substrate 41, a first LED stack 23, a second LED stack 33, a third LED stack 43, a first-p reflective electrode 25, a second-p transparent electrode 35, a third-p transparent electrode 45, a first color filter 37, a second color filter 47, a first bonding layer 53, a second bonding layer 55, and a third bonding layer 57.

The support substrate 51 supports the LED stacks 23, 33, 43. The support substrate 51 may include a circuit on a surface thereof or therein, but is not limited thereto. The support substrate 51 may include, for example, a Si substrate or a Ge substrate.

Each of the first LED stack 23, the second LED stack 33, and the third LED stack 43 includes an n-type semiconductor layer, a p-type semiconductor layer, and an active layer interposed therebetween. The active layer may have a multi-quantum well structure.

According to an exemplary embodiment, the first LED stack 23 may be an inorganic light emitting diode configured to emit red light, the second LED stack 33 may be an inorganic light emitting diode configured to emit green light, and the third LED stack 43 may be an inorganic light emitting diode configured to emit blue light. The first LED stack 23 may include a GaInP-based well layer, and each of the second LED stack 33 and the third LED stack 43 may include a GaInN-based well layer.

Both surfaces of each of the first to third LED stacks 23, 33, 43 are an n-type semiconductor layer and a p-type semiconductor layer, respectively. In the illustrated exemplary embodiment, each of the first to third LED stacks 23, 33, 43 has an n-type upper surface and a p-type lower surface. Since the third LED stack 43 has an n-type upper surface, a roughened surface may be formed on the upper surface of the third LED stack 43 through chemical etching, for example. However, the inventive concepts are not limited thereto, and the semiconductor types of the upper and lower surfaces of each of the LED stacks may be changed.

The first LED stack 23 is disposed near the support substrate 51, the second LED stack 33 is disposed on the first LED stack 23, and the third LED stack 43 is disposed on the second LED stack. Since the first LED stack 23 may emit light having a longer wavelength than the second and third LED stacks 33, 43, light generated from the first LED stack 23 may be emitted to the outside of the light emitting diode stack 100 through the second and third LED stacks 33, 43. In addition, since the second LED stack 33 may emit light having a longer wavelength than the third LED stack 43, light generated from the second LED stack 33 may be emitted to the outside through the third LED stack 43.

The second substrate 31 may be a substrate on which the second LED stack 33 is grown, and may be, for example, a GaN-based substrate. The second substrate 31 is a homogeneous substrate to the second LED stack 33 and is monolithically coupled to the second LED stack 33. The second substrate 31 may be doped with n-type dopants, such as Si, and be used as an n-type semiconductor layer. Since the second substrate 31 is homogeneous to the second LED stack 33, the dislocation density of the second LED stack 33 grown on the second substrate 31 may be reduced, thereby improving luminous efficacy of the second LED stack 33. The second LED stack 33 may have a dislocation density of, for example, about $10^3$ to about $10^7/cm^2$. Since GaN-based semiconductor layers grown on a sapphire substrate generally have a dislocation density of about $10^8/cm^2$ or more, the dislocation density of the second LED stack 33 can be significantly reduced by using the GaN growth substrate.

The third substrate 41 is a substrate on which the third LED stack 43 may be grown, and may be a GaN-based substrate, for example, a GaN substrate. The third substrate 41 is a homogeneous substrate to the third LED stack 43 and is monolithically coupled to the third LED stack 43. The third substrate 41 may be doped with n-type dopants, such as Si, and be used as an n-type semiconductor layer. Since the third substrate is homogeneous to the third LED stack 43, the dislocation density of the third LED stack 43 grown on the third substrate 41 may be reduced, thereby improving luminous efficacy of the third LED stack 43. The third LED stack 43 may have a dislocation density of, for example, about $10^3$ to about $10^7/cm^2$.

Although the light emitting diode stack 100 shown in FIG. 1 includes both the second substrate 31 and the third substrate 41, however, the inventive concepts are not limited thereto. For example, in another exemplary embodiment, one of the second substrate 31 and the third substrate 41 may be omitted. In some exemplary embodiments, both of the second substrate 31 and the third substrate 41 may be removed, which will be described in more detail below with reference to FIG. 13.

The first-p reflective electrode 25 forms ohmic contact with the p-type semiconductor layer of the first LED stack 23 and reflects light generated from the first LED stack 23. For example, the first-p reflective electrode 25 may be formed of Au—Ti or Au—Sn. Furthermore, the first-p reflective electrode 25 may include a diffusion barrier layer.

The second-p transparent electrode 35 forms ohmic contact with the p-type semiconductor layer of the second LED stack 33. The second-p transparent electrode 35 may include a metal layer or a conductive oxide layer transparent to red light and green light.

In addition, the third-p transparent electrode 45 forms ohmic contact with the p-type semiconductor layer of the third LED stack 43. The third-p transparent electrode 45 may include a metal layer or a conducive oxide layer transparent to red light, green light, and blue light.

The first-p reflective electrode 25, the second-p transparent electrode 35, and the third-p transparent electrode 45 may assist in current spreading through ohmic contact with the p-type semiconductor layer of each of the LED stacks.

The first color filter 37 may be interposed between the first LED stack 23 and the second LED stack 33. In addition, the second color filter 47 may be interposed between the second LED stack 33 and the third LED stack 43. The first color filter 37 transmits light generated from the first LED stack 23 while reflecting light generated from the second LED stack 33. The second color filter 47 transmits light generated from the first and second LED stacks 23, 33 while reflecting light generated from the third LED stack 43. As such, light generated from the first LED stack 23 can be emitted to the outside through the second LED stack 33 and the third LED stack 43, and light generated from the second LED stack 33 can be emitted to the outside through the third LED stack 43. Furthermore, light generated from the second LED stack 33 may be prevented from entering the first LED stack 23 and light generated from the third LED stack 43 may be from entering the second LED stack 33 to prevent light loss in the light emitting diode stack 100. Meanwhile, light generated from the first LED stack 23 is emitted to the outside through the second-p transparent electrode 35 and the third-p transparent electrode 45, and light generated from the second LED stack 33 is emitted outside through the third-p transparent electrode 45

In some exemplary embodiments, the first color filter 37 may reflect light generated from the third LED stack 43.

The first and second color filters 37, 47 may be, for example, a low pass filter that allows light in a low frequency band, such as, in a long wavelength band, to pass therethrough, a band pass filter that allows light in a predetermined wavelength band, or a band stop filter that prevents light in a predetermined wavelength band from passing therethrough. In particular, each of the first and second color filters 37, 47 may be a band stop filter including a distributed Bragg reflector (DBR). The distributed Bragg reflector may be formed by alternately stacking insulation layers having different refractive indices one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 53 couples the first LED stack 23 to the support substrate 51. As shown in the drawings, the first-p reflective electrode 25 may adjoin the first bonding layer 53. The first bonding layer 53 may be a light transmissive or opaque layer. The first bonding layer 53 may be, for example, a transparent inorganic insulation layer, a transparent organic insulation layer, or a transparent conductive layer.

The second bonding layer 55 couples the second LED stack 33 to the first LED stack 23. As shown in the drawings, the second bonding layer 55 may adjoin the first LED stack 23 and the first color filter 37. However, the inventive concepts are not limited thereto, and in some exemplary embodiments, a transparent conductive layer may be disposed on the first LED stack 23. The second bonding layer 55 transmits light generated from the first LED stack 23. The second bonding layer 55 may be, for example, a transparent inorganic insulation layer, a transparent organic insulation layer, or a transparent conductive layer, and may be formed of, for example, light transmissive spin-on-glass.

The third bonding layer 57 couples the third LED stack 43 to the second LED stack 33. As shown in the drawings, the third bonding layer 57 may adjoin the second substrate 31 monolithically coupled to the second LED stack 33 and adjoin the second color filter 47. However, the inventive concepts are not limited thereto. For example, when the second substrate 31 is omitted in some exemplary embodiments, the third bonding layer 57 may adjoin the second LED stack 33. As another example, when a transparent conducive layer is disposed on the second LED stack 33 or the second substrate 31, the third bonding layer 57 may adjoin the transparent conductive layer. The third bonding layer 57 transmits light generated from the first LED stack 23 and the second LED stack 33. The third bonding layer 57 may be, for example, a transparent inorganic insulation layer, a transparent organic insulation layer, or a transparent conductive layer, and may be formed of, for example, light transmissive spin-on-glass.

Figure 2A:
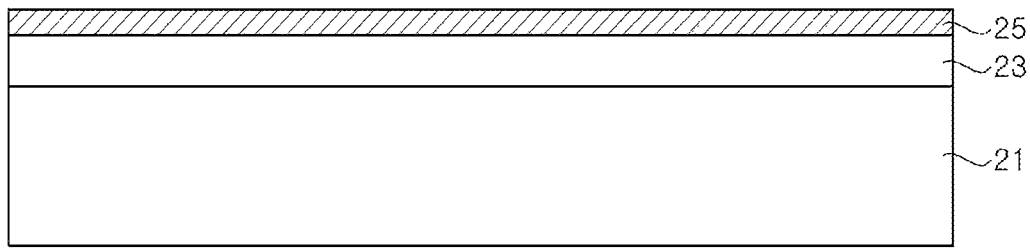
FIG. 2A, FIG. 2B, FIG. 2C are schematic cross-sectional views illustrating a method of manufacturing a light emitting diode stack for a display according to an exemplary embodiment.
Figure 2B:
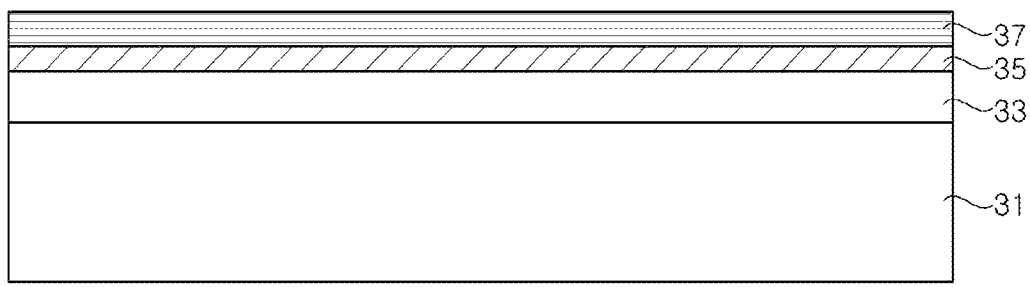
Figure 2C:
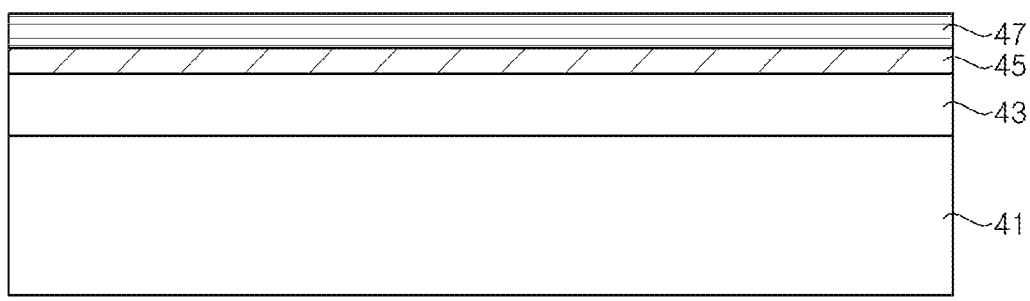

FIGS. 2A, 2B, and 2C are schematic cross-sectional views illustrating a method of manufacturing a light emitting diode stack for a display according to an exemplary embodiment.

Referring to FIG. 2A, first, a first LED stack 23 is grown on a first substrate 21 and a first-p reflective electrode 25 is formed on the first LED stack 23.

The first substrate 21 may be, for example, a GaAs substrate. In addition, the first LED stack 23 may be formed of AlGaInP-based semiconductor layers and include an n-type semiconductor layer, an active layer and a p-type semiconductor layer. The first-p reflective electrode 25 forms ohmic contact with the p-type semiconductor layer.

Referring to FIG. 2B, a second LED stack 33 is grown on a second substrate 31, and a second-p transparent electrode 35 and a first color filter 37 are formed on the second LED stack 33. The second LED stack 33 may be formed of GaN-based semiconductor layers and include a GaInN well layer. The second substrate 31 is a homogeneous substrate to a GaN-based semiconductor layer, and may be, for example, a GaN substrate. Furthermore, the second substrate 31 may be an n-type semiconductor doped with n-type dopants. The composition ratio of GaInN for the second LED stack 33 may be determined such that the second LED stack 33 emits green light, for example. The second-p transparent electrode 35 forms ohmic contact with the p-type semiconductor layer.

Referring to FIG. 2C, a third LED stack 43 is grown on a third substrate 41, and a third-p transparent electrode 45 and a second color filter 47 are formed on the third LED stack 43. The third LED stack 43 may be formed of GaN-based semiconductor layers and include a GaInN well layer. The third substrate 41 is a homogeneous substrate to a GaN-based semiconductor layer, and may be, for example, a GaN substrate. The composition ratio of GaInN for the third LED stack 43 may be determined such that the third LED stack 43 emits blue light, for example. The third-p transparent electrode 45 forms ohmic contact with the p-type semiconductor layer.

A first color filter 37 and a second color filter 47 are substantially the same as those described with reference to FIG. 1, and thus, repeated descriptions thereof will be omitted.

Referring to FIG. 1 and FIGS. 2A, 2B, and 2C, the first LED stack 23 is coupled to the support substrate 51 via a first bonding layer 53. The first bonding layer 53 may be previously formed on the support substrate 51, and the first-p reflective electrode 25 may be disposed to face the support substrate 51 and bonded to the first bonding layer 53. The first substrate 21 is removed from the first LED stack 23 by chemical etching or the like.

Then, the second LED stack 33 is coupled to the first LED stack 23 via a second bonding layer 55. The first color filter 37 is disposed to face the first LED stack 23 and is bonded to the second bonding layer 55. The second bonding layer 55 may be previously formed on the first LED stack 23 and the first color filter 37 may be disposed to face the second bonding layer 55 and bonded to the second bonding layer 55. The thickness of the second substrate 31 used as a growth substrate may reduced through a thinning process. In some exemplary embodiments, the entirety of the second substrate 31 may be removed.

Then, the third LED stack 43 is coupled to the second LED stack 33 via a third bonding layer 57. The second color filter 47 is disposed to face the second substrate 31 and bonded to the third bonding layer 57. The third bonding layer 57 may be previously disposed on the second substrate 31 and the second color filter 47 may be disposed to face the third bonding layer 57 and bonded to the third bonding layer 57. In this manner, a light emitting diode stack for a display, which has the third LED stack 43 exposed to the outside, is provided as shown in FIG. 1. The third substrate 41 may also be subjected to the thinning process, and in some exemplary embodiments, the third substrate 41 may be completely removed.

A display apparatus may be provided by patterning the stack of the first to third LED stacks 23, 33, 43 on the support substrate 51 in pixel units, followed by connecting the first to third LED stacks to one another through interconnection lines. Hereinafter, a display apparatus according to exemplary embodiments will be described.

Figure 3:
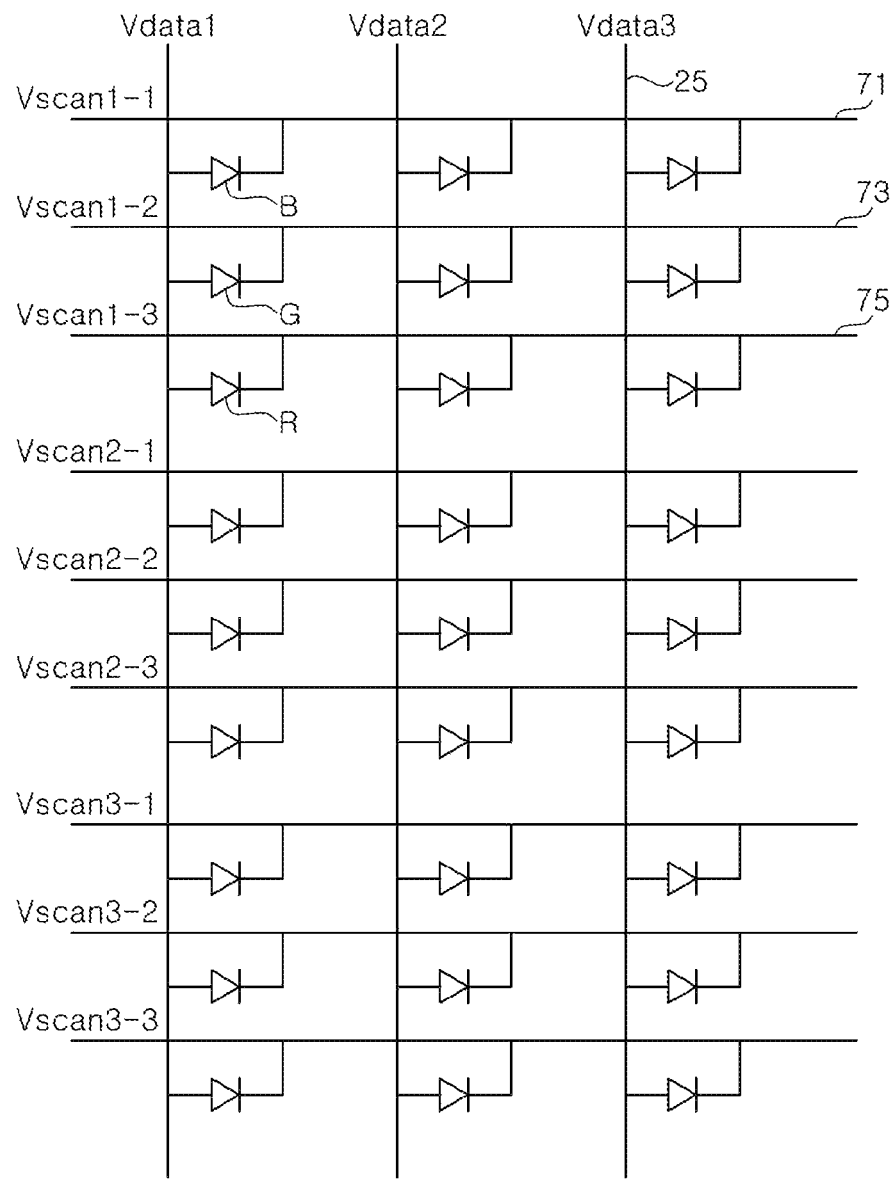
FIG. 3 is a schematic circuit diagram of a display apparatus according to an exemplary embodiment.
Figure 4:
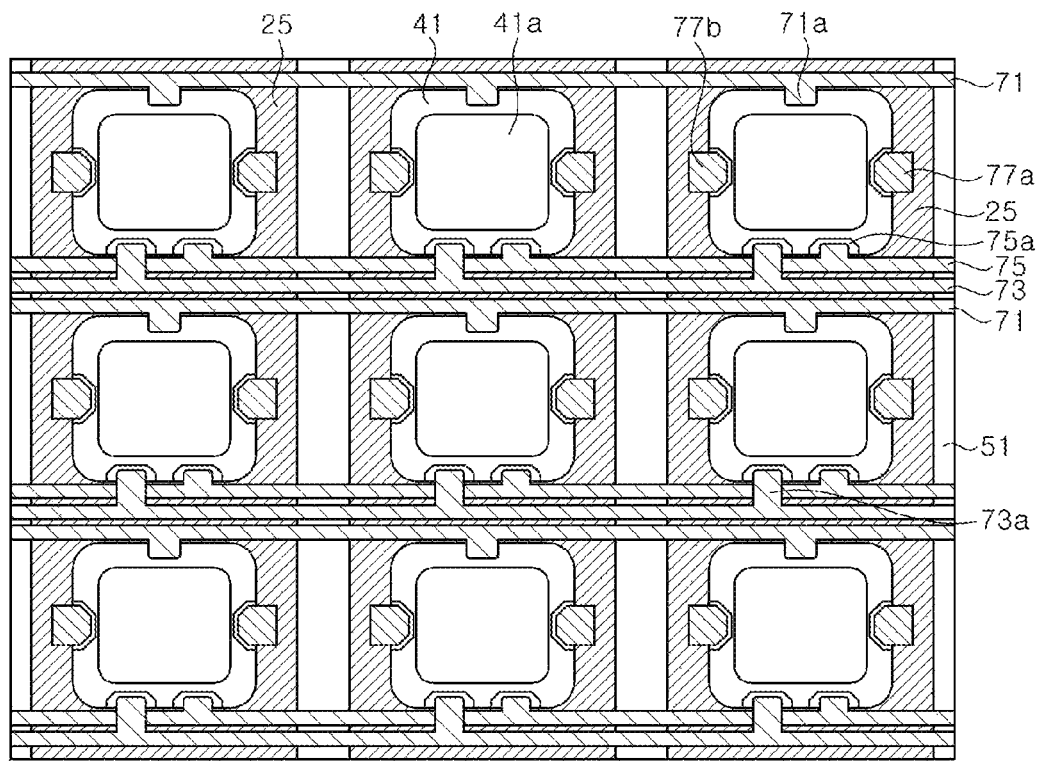
FIG. 4 is a schematic plan view of a display apparatus according to an exemplary embodiment.

FIG. 3 is a schematic circuit diagram of a display apparatus according to an exemplary embodiment, and FIG. 4 is a schematic plan view of a display apparatus according to an exemplary embodiment.

Referring to FIG. 3 and FIG. 4, the display apparatus according to an exemplary embodiment may be implemented to be operated in a passive matrix manner.

The light emitting diode stack for a display may include the first to third LED stacks 23, 33, 43 stacked in the vertical direction as described above with reference to FIG. 1, and one pixel may include three light emitting diodes R, G, B. For example, a first light emitting diode R may correspond to the first LED stack 23, a second light emitting diode G may correspond to the second LED stack 33, and a third light emitting diode B may correspond to the third LED stack 43.

In FIGS. 3 and 4, one pixel includes the first to third light emitting diodes R, G, B, each of which corresponds to a subpixel. Anodes of the first to third light emitting diodes R, G, B are connected to a common line, for example, a data line, and cathodes thereof are connected to different lines, for example, scan lines. For example, in a first pixel, the anodes of the first to third light emitting diodes R, G, B are commonly connected to a data line Vdata1 and the cathodes thereof are connected to scan lines Vscan1-3, Vscan1-2, Vscan1-1, respectively. In this manner, the light emitting diodes R, G, B in each pixel can be independently driven.

In some exemplary embodiments, each of the light emitting diodes R, G, B may be driven by pulse width modulation or by changing the magnitude of electric current to regulate brightness of each subpixel.

Referring back to FIG. 4, a plurality of pixels is formed by patterning the LED stack described with reference to FIG. 1, and each of the pixels is connected to the first-p reflective electrodes 25 and interconnection lines 71, 73, 75. As shown in FIG. 3, the first-p reflective electrode 25 may be used as the data line Vdata and the interconnection lines 71, 73, 75 may be formed as the scan lines, for example.

The pixels may be arranged in a matrix form, in which the anodes of the light emitting diodes R, G, B of each pixel are commonly connected to the first-p reflective electrode 25, and the cathodes thereof are connected to the interconnection lines 71, 73, 75 separated from one another. In this case, the interconnection lines 71, 73, 75 may be used as the scan lines Vscan.

Figure 5:
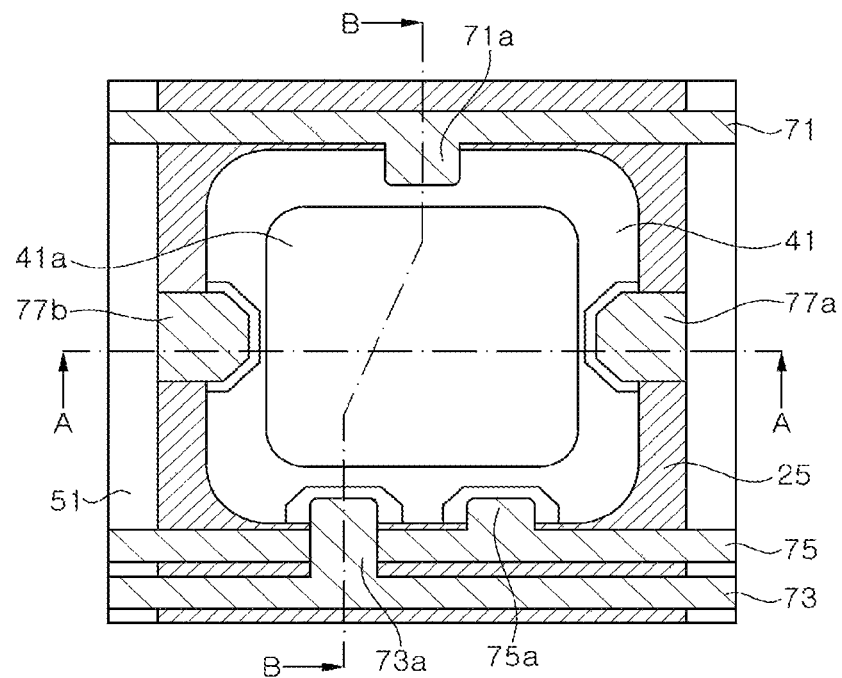
FIG. 5 is an enlarged plan view of one pixel of the display apparatus of FIG. 4 according to an exemplary embodiment.
Figure 6:
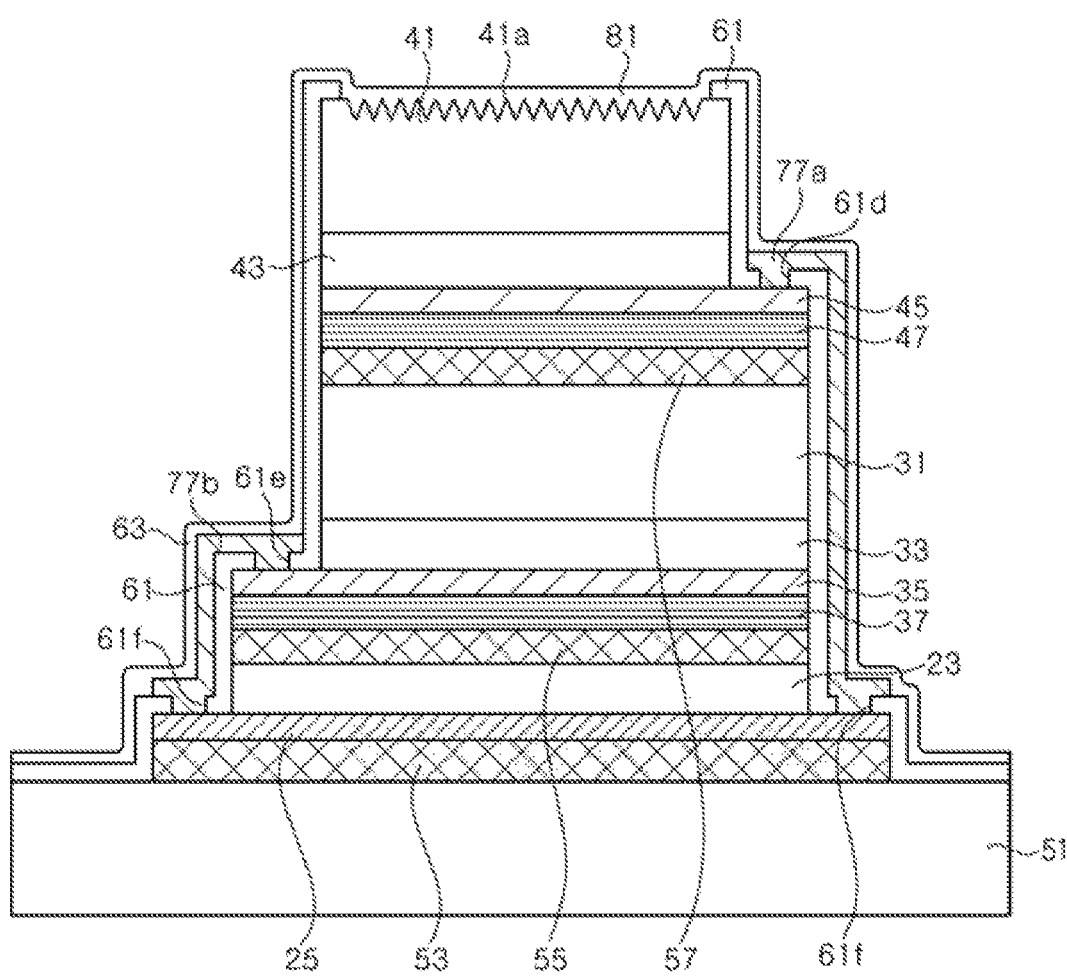
FIG. 6 is a schematic cross-sectional view taken along line A-A of FIG. 5.
Figure 7:
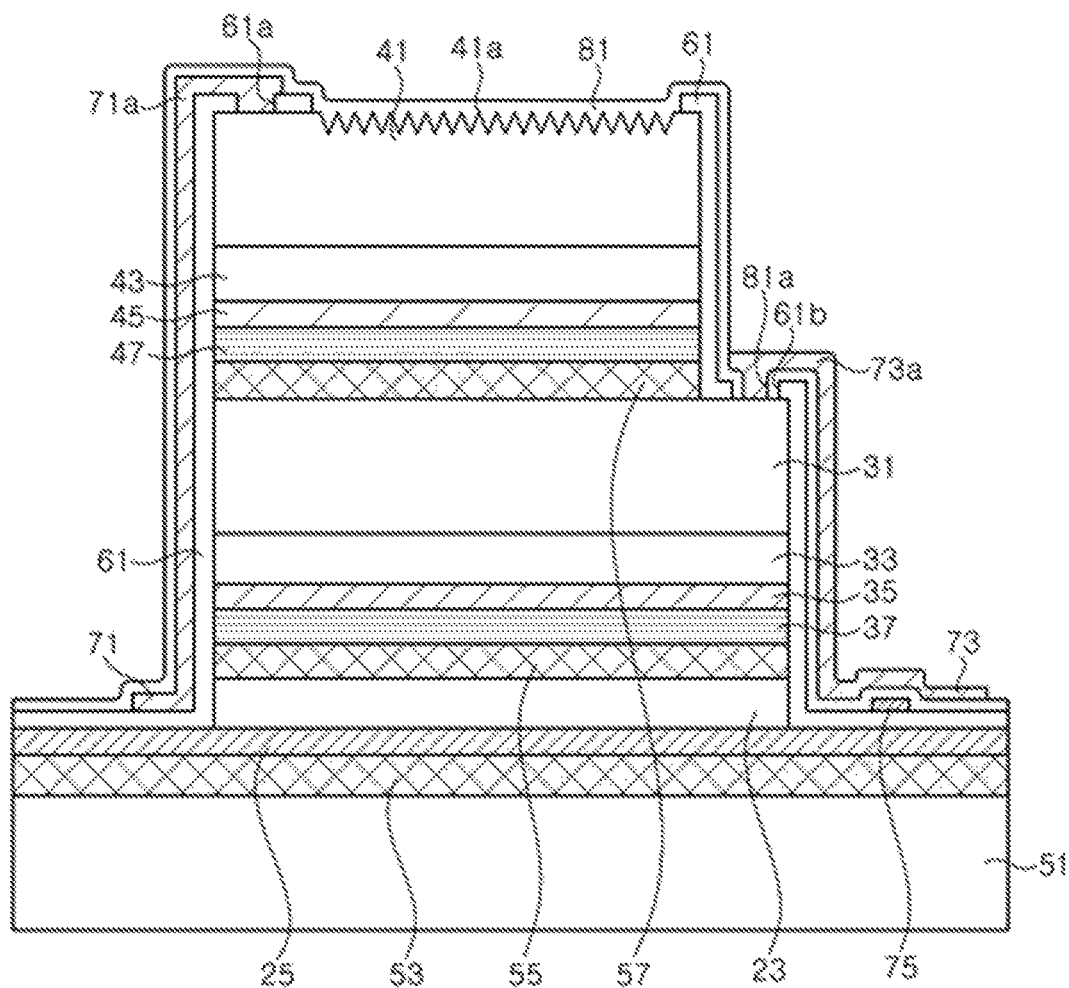
FIG. 7 is a schematic cross-sectional view taken along line B-B of FIG. 5.

FIG. 5 is an enlarged plan view of one pixel of the display apparatus of FIG. 4 according to an exemplary embodiment, FIG. 6 is a schematic cross-sectional view taken along line A-A of FIG. 5, and FIG. 7 is a schematic cross-sectional view taken along line B-B of FIG. 5.

Referring to FIG. 4, FIG. 5, FIG. 6, and FIG. 7, in each pixel, a portion of the first-p reflective electrode 25, a portion of the upper surface of the first LED stack 23, a portion of the second-p transparent electrode 35, a portion of the upper surface of the second substrate 31, a portion of the third-p transparent electrode 45, and the upper surface of the third substrate 41 are exposed to the outside.

The third substrate 41 may have a roughened surface 41a on the upper surface thereof. The roughened surface 41a may be formed over the entirety of the upper surface of the third substrate 41 or in some regions thereof, as shown in the drawings. When the third substrate 41 is removed in some exemplary embodiments, the roughened surface may be formed on the third LED stack 43.

A first insulation layer 61 may cover a side surface of each pixel. The first insulation layer 61 may be formed of a light transmissive material, such as $SiO_2$. In this case, the first insulation layer 61 may cover substantially the entire upper surface of the third substrate 41. Alternatively, the first insulation layer 61 may include a distributed Bragg reflector to reflect light traveling towards the side surfaces of the first to third LED stacks 23, 33, 43. In this case, the first insulation layer 61 at least partially exposes the upper surface of the third substrate 41.

The first insulation layer 61 may include an opening 61a which exposes the upper surface of the third substrate 41, an opening 61b which exposes the upper surface of the second substrate 31, an opening 61c (see FIG. 8H) which exposes an upper surface of the first LED stack 23, an opening 61d which exposes the third-p transparent electrode 45, an opening 61e which exposes the second-p transparent electrode 35, and openings 61f which expose the first-p reflective electrode 25.

The interconnection lines 71, 75 may be formed near the first to third LED stacks 23, 33, 43 on the support substrate 51, and may be disposed on the first insulation layer 61 to be insulated from the first-p reflective electrode 25. A connecting portion 77a may be formed to connect the third-p transparent electrode 45 to the first-p reflective electrode 25, and a connecting portion 77b may be formed to connect the second-p transparent electrode 35 to the first-p reflective electrode 25, such that the anodes of the first LED stack 23, the second LED stack 33, and the third LED stack 43 are commonly connected to the first-p reflective electrode 25.

A connecting portion 71a connects the upper surface of the third substrate 41 to the interconnection line 71, and a connecting portion 75a connects the upper surface of the first LED stack 23 to the interconnection line 75.

A second insulation layer 81 may be disposed on the interconnection lines 71, 75 to cover the upper surface of the third substrate 41. The second insulation layer 81 may have an opening 81a, which partially exposes the upper surface of the second substrate 31.

The interconnection line 73 may be disposed on the second insulation layer 81 and the connecting portion 73a may connect the upper surface of the second substrate 31 to the interconnection line 73. The connecting portion 73a may pass through an upper portion of the interconnection line 75 and is insulated from the interconnection line 75 by the second insulation layer 81.

Although the electrodes of each pixel are described as being connected to the data line and the scan lines, the interconnection lines 71, 75 are described as being formed on the first insulation layer 61, and the interconnection line 73 is described as being formed on the second insulation layer 81 in the illustrated exemplary embodiment, the inventive concepts are not limited thereto. For example, all of the interconnection lines 71, 73, 75 may be formed on the first insulation layer 61 and may be covered by the second insulation layer 81, which may have openings exposing the interconnection line 73. In this case, the connecting portion 73a may connect the upper surface of the second substrate 31 to the interconnection line 73 through the openings of the second insulation layer 81.

Alternatively, the interconnection lines 71, 73, 75 may be formed inside the support substrate 51, and the connecting portions 71a, 73a, 75a formed on the first insulation layer 61 may connect the upper surface of the first LED stack 23 and the upper surfaces of the second and third substrates 31, 41 to the interconnection lines 71, 73, 75.

FIG. 8A to FIG. 8K are schematic plan views illustrating a method of manufacturing a display apparatus according to an exemplary embodiment. The following descriptions will be given with reference to forming the pixel of FIG. 5.

First, the light emitting diode stack 100 of FIG. 1 is prepared.

Figure 8A:
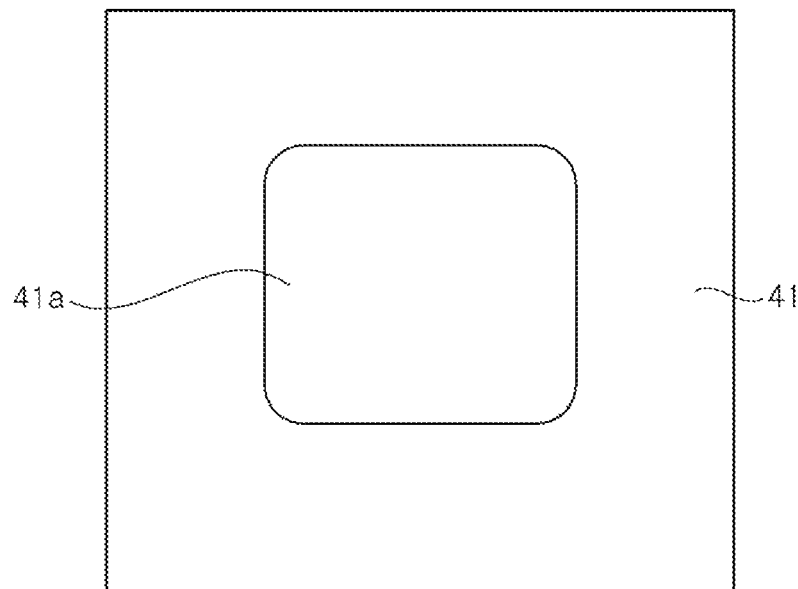
FIGS. 8A, 8B, 8C, 8D, 8E, 8F, 8G, 8H, 8I, 8J, and 8K are schematic plan views illustrating a method of manufacturing a display apparatus according to an exemplary embodiment.

Then, referring to FIG. 8A, a roughened surface 41a may be formed on the upper surface of the third substrate 41. The roughened surface 41a may be formed on the upper surface of the third substrate 41 to correspond to each pixel region. The roughened surface 41a may be formed by chemical etching, for example, photo-enhanced chemical etching (PEC) or the like.

The roughened surface 41a may be partially formed in each pixel region in consideration of a region of the third substrate 41 to be etched in the subsequent process, without being limited thereto. Alternatively, the roughened surface 41a may be formed over the entire upper surface of the third substrate 41.

Figure 8B:
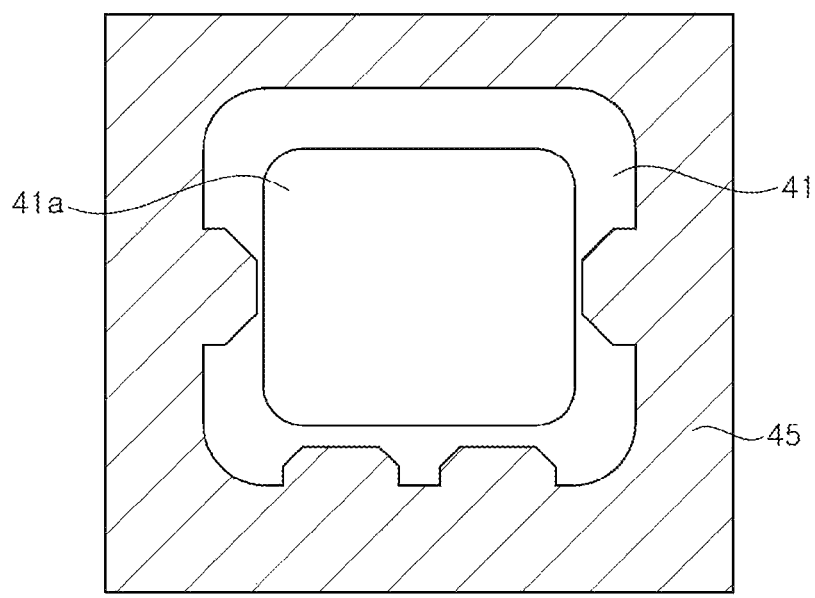

Referring to FIG. 8B, a surrounding region of the third substrate 41 and the third LED stack 43 in each pixel are removed by etching to expose the third-p transparent electrode 45. As shown in the drawings, the third substrate 41 may maintain substantially a rectangular shape or substantially a square shape, as shown in the drawings. A plurality of depressions may be formed along edges of the third substrate 41 and the third LED stack 43. These depressions may be continuously formed on the third substrate 41 and the third LED stack 43.

Figure 8C:
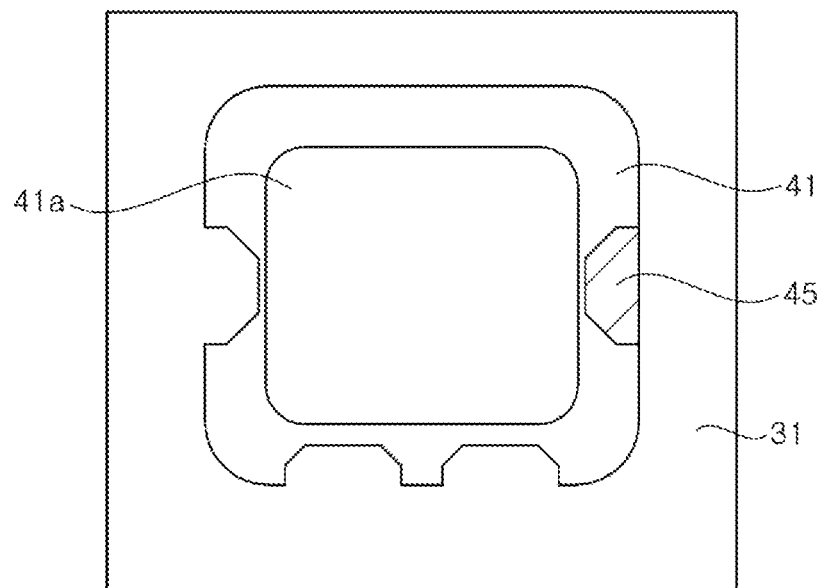

Referring to FIG. 8C, the upper surface of the second substrate 31 is exposed by removing the third-p transparent electrode 45 exposed in other regions excluding a portion of the third-p transparent electrode 45 formed in one depression. Accordingly, the upper surface of the second substrate 31 is exposed around the third substrate 41 and in other depressions excluding the depression in which the third-p transparent electrode 45 is partially remained.

Figure 8D:
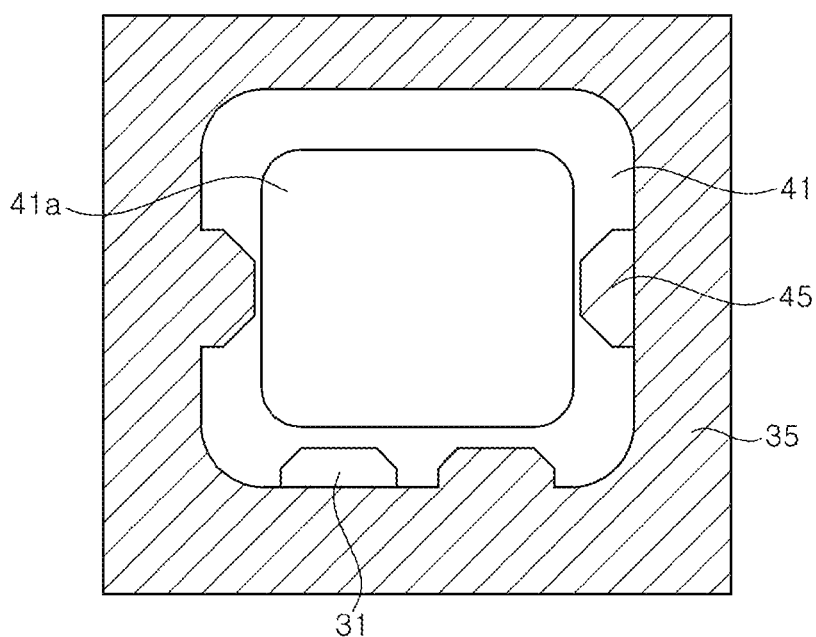

Referring to FIG. 8D, the second-p transparent electrode 35 is exposed by removing the second substrate 31 exposed in other regions excluding a portion of the second substrate 31 formed in one depression, followed by removing the second LED stack 33.

Figure 8E:
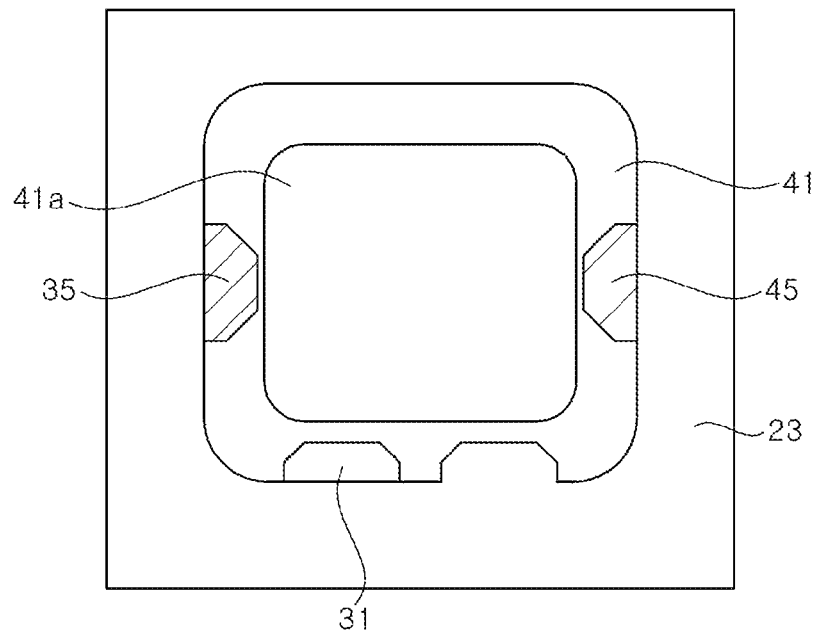

Referring to FIG. 8E, the upper surface of the first LED stack 23 is exposed by removing the second-p transparent electrode 35 exposed in other regions excluding a portion of the second-p transparent electrode 35 formed in one depression. Accordingly, the upper surface of the first LED stack 23 is exposed around the third substrate 41, and the upper surface of the first LED stack 23 is exposed in at least one of the depressions formed in the third substrate 41.

Figure 8F:
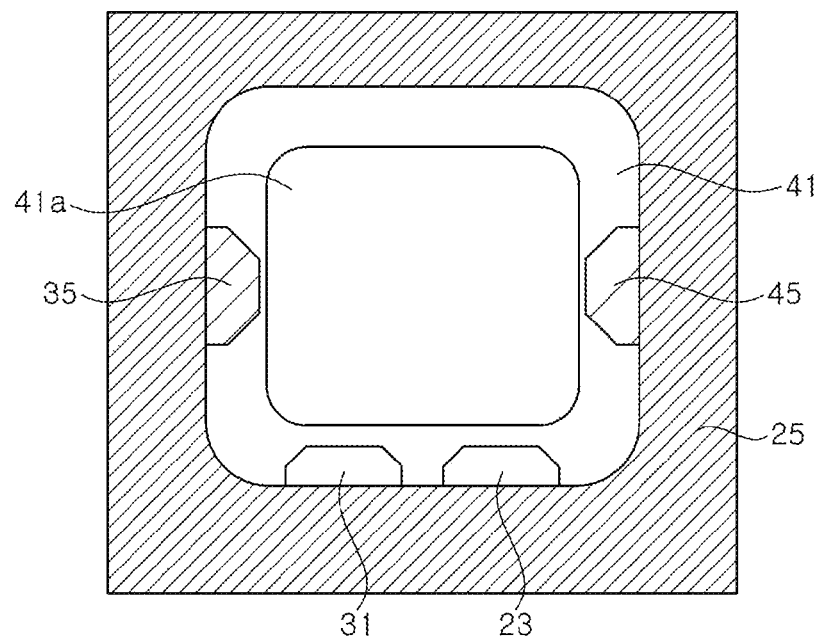

Referring to FIG. 8F, the first-p reflective electrode 25 is exposed by removing an exposed portion of the first LED stack 23 in other regions excluding the first LED stack 23 formed in the depression. The first-p reflective electrode 25 is exposed around the third substrate 41.

Figure 8G:
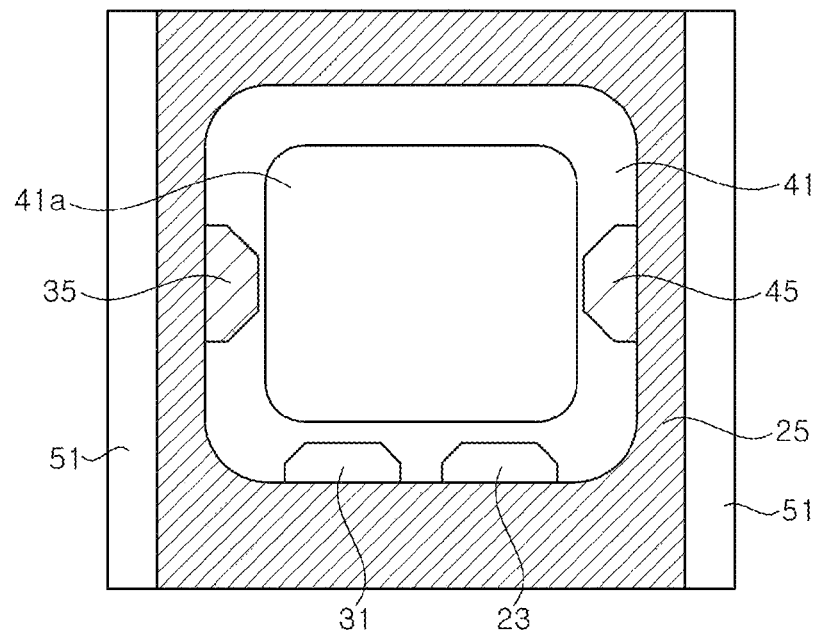

Referring to FIG. 8G, linear interconnection lines are formed by patterning the first-p reflective electrode 25. In this case, the support substrate 51 may be exposed. The first-p reflective electrode 25 may connect adjacent pixels arranged in one row among pixels arranged in a matrix form (see FIG. 4).

Figure 8H:
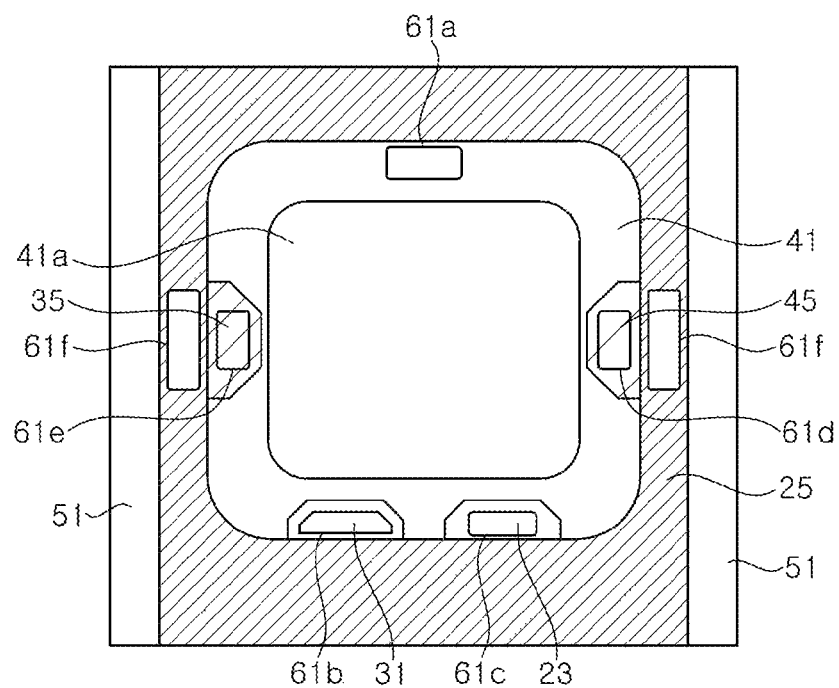

Referring to FIG. 8H, a first insulation layer 61 (see FIG. 6 and FIG. 7) is formed to cover the pixels. The first insulation layer 61 covers the first-p reflective electrode 25, side surfaces of the first to third LED stacks 23, 33, 43, and side surfaces of the second and third substrates 31, 41. In addition, the first insulation layer 61 may at least partially cover the upper surface of the third substrate 41. When the first insulation layer 61 is a transparent layer, such as a $SiO_2$ layer, the first insulation layer 61 may cover substantially the entire upper surface of the third substrate 41. Alternatively, the first insulation layer 61 may include a distributed Bragg reflector. In this case, the first insulation layer 61 may at least partially expose the upper surface of the third substrate 41 to allow light to be emitted to the outside.

The first insulation layer 61 may include an opening 61a which exposes the third substrate 41, an opening 61b which exposes the second substrate 31, an opening 61c which exposes the first LED stack 23, an opening 61d which exposes the third-p transparent electrode 45, an opening 61e which exposes the second-p transparent electrode 35, and an opening 61f which exposes the first-p reflective electrode 25. The opening 61f exposing the first-p reflective electrode 25 may be formed in plural.

Figure 8I:
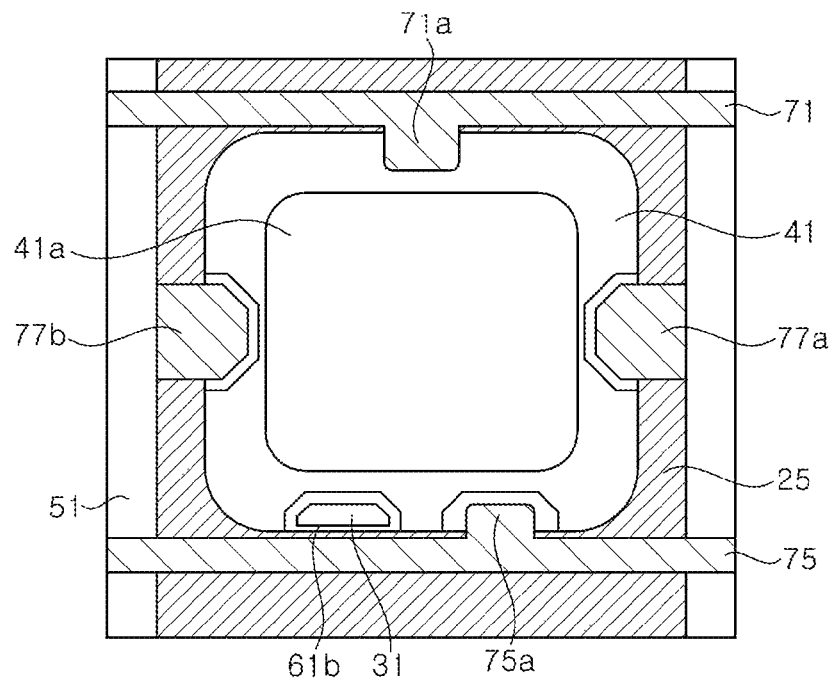

Referring to FIG. 8I, interconnection lines 71, 75 and connecting portions 71a, 75a, 77a, 77b are formed, by a lift-off process, for example. The interconnection lines 71, 75 are insulated from the first-p reflective electrode 25 by the first insulation layer 61. The connecting portion 71a electrically connects the third substrate 41 to the interconnection line 71, and the connecting portion 75a electrically connects the first LED stack 23 to the interconnection line 75. The connecting portion 77a electrically connects the third-p transparent electrode 45 to the first-p reflective electrode 25, and the connecting portion 77b electrically connects the second-p transparent electrode 35 to the first-p reflective electrode 25.

Figure 8J:
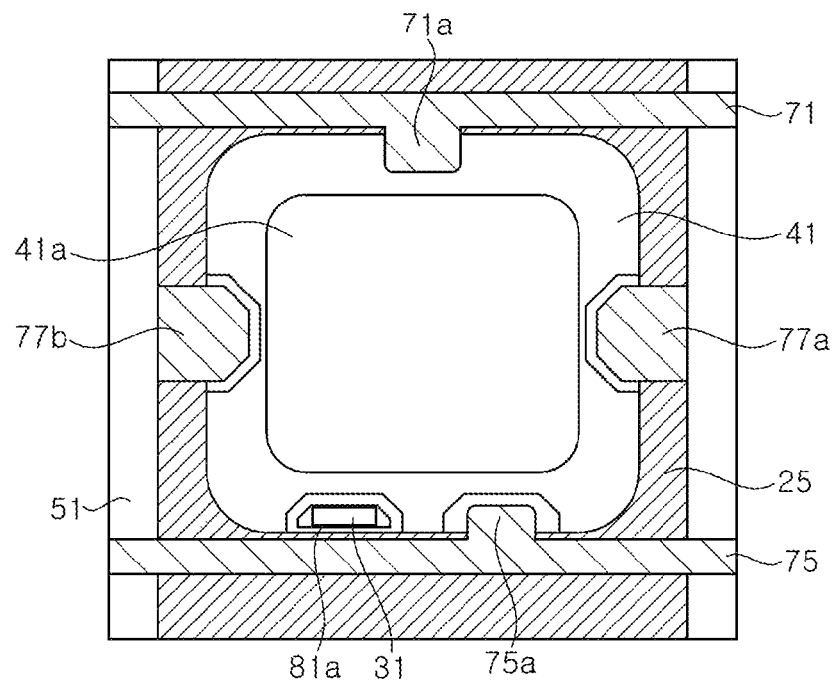

Referring to FIG. 8J, a second insulation layer 81 (see FIG. 6 and FIG. 7) covers the interconnection lines 71, 75 and the connecting portions 71a, 75a, 77a, 77b. The second insulation layer 81 may cover substantially the entire upper surface of the third substrate 41. The second insulation layer 81 has an opening 81a which exposes the upper surface of the second substrate 31. The second insulation layer 81 may be formed of, for example, silicon oxide or silicon nitride, and may include a distributed Bragg reflector. When the second insulation layer 81 includes the distributed Bragg reflector, the second insulation layer 81 is formed to expose at least part of the upper surface of the third substrate 41 to allow light to be emitted to the outside.

Figure 8K:
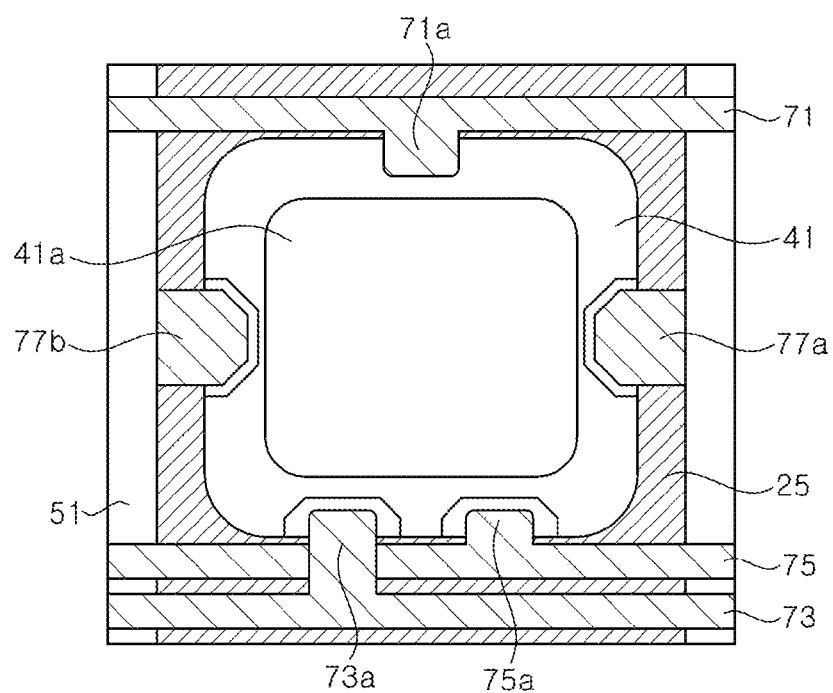

Referring to FIG. 8K, an interconnection line 73 and a connecting portion 73a are formed. An interconnection line 73 and a connecting portion 73a may be formed by a lift-off process or the like. The interconnection line 73 is disposed on the second insulation layer 81 and is insulated from the first-p reflective electrode 25 and the interconnection lines 71, 75. The connecting portion 73a electrically connects the second substrate 31 to the interconnection line 73. The connecting portion 73a may pass through an upper portion of the interconnection line 75 and is insulated from the interconnection line 75 by the second insulation layer 81.

As described above, a pixel region shown in FIG. 5 is provided. In addition, as shown in FIG. 4, a plurality of pixels may be formed on the support substrate 51 and may be connected to one another by the first-p reflective electrode 25 and the interconnection lines 71, 73, 75 to be operated in a passive matrix manner.

Although a method of manufacturing a display apparatus configured to be operated in the passive matrix manner has been exemplarily described above, the inventive concepts are not limited thereto. In some exemplary embodiments, a display apparatus may be manufactured in various ways so as to be operated in the passive matrix manner using the light emitting diode stack shown in FIG. 1.

For example, although the interconnection line 73 is illustrated as being formed on the second insulation layer 81, in some exemplary embodiments, the interconnection line 73 may be formed together with the interconnection lines 71, 75 on the first insulation layer 61, and the connecting portion 73a may be formed on the first insulation layer 61 to connect the second substrate 31 to the interconnection line 73. Alternatively, the interconnection lines 71, 73, 75 may be disposed inside the support substrate 51.

Figure 9:
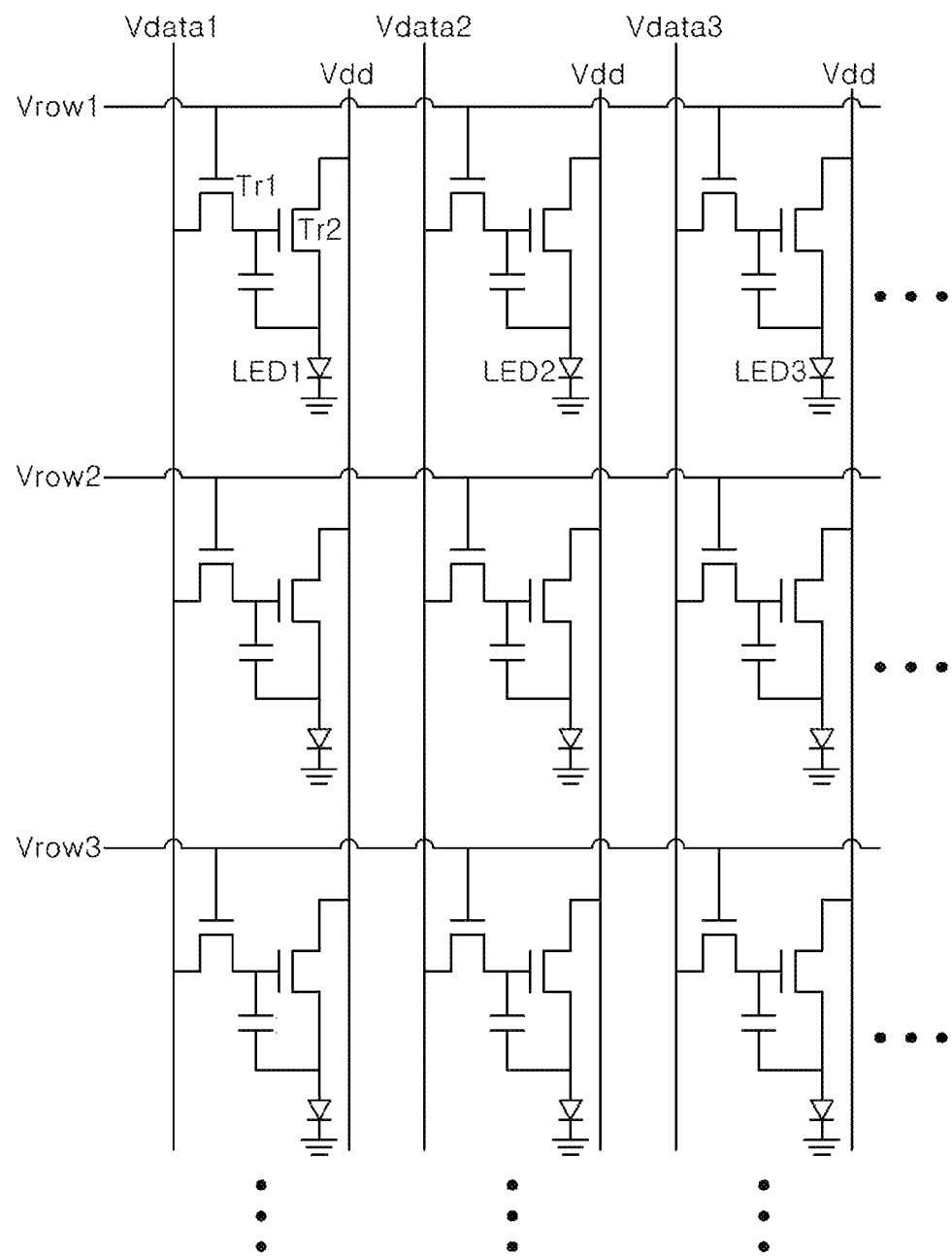
FIG. 9 is a schematic circuit diagram of a display apparatus according to an exemplary embodiment.

FIG. 9 is a schematic circuit diagram of a display apparatus according to an exemplary embodiment. The display apparatus of FIG. 9 may be driven in an active matrix manner.

Referring to FIG. 9, the drive circuit according to an exemplary embodiment includes at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitor is charged according to the values of the data lines Vdata1 to Vdata3. Since a turned-on state of a transistor Tr2 can be maintained by the charged voltage of the capacitor, the voltage of the capacitor can be maintained and applied to the light emitting diodes LED1 to LED3 even when power supplied to the selection line Vrow1 is cut off. In addition, electric current flowing in the light emitting diodes LED1 to LED3 can be changed depending upon the values of the data lines Vdata1 to Vdata3. Electric current can be continuously supplied through current supplies Vdd, thereby enabling continuous light emission.

The transistors Tr1, Tr2 and the capacitor may be formed inside the support substrate 51. For example, thin film transistors formed on a silicon substrate may be used for active matrix driving.

The light emitting diodes LED1 to LED3 may correspond to the first to third LED stacks 23, 33, 43 stacked in one pixel, respectively. The anodes of the first to third LED stacks 23, 33, 43 are connected to the transistor Tr2, and the cathodes thereof are connected to the ground.

Although FIG. 9 exemplarily illustrates a circuit for an active matrix driving of a display apparatus, the inventive concepts are not limited thereto, and various other types of circuits may be used. In addition, although the anodes of the light emitting diodes LED1 to LED3 have been described as being connected to different transistors Tr2, and the cathodes thereof have been described as being ground in FIG. 9, in some exemplary embodiments, the anodes of the light emitting diodes may be connected to current supplies Vdd and the cathodes thereof may be connected to different transistors.

Figure 10:
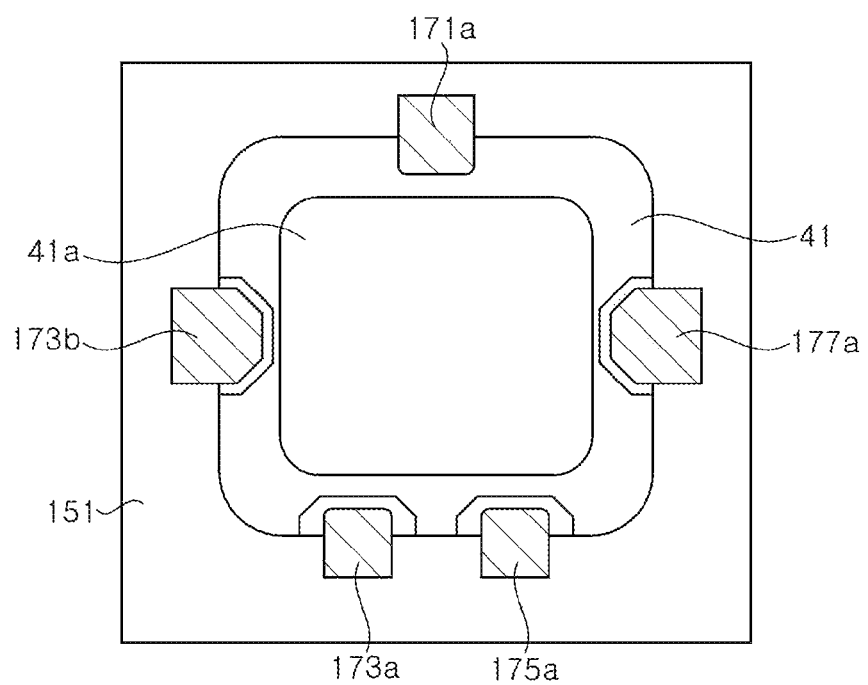
FIG. 10 is a schematic plan view of a display apparatus according to an exemplary embodiment.

FIG. 10 is a schematic plan view of a display apparatus according to an exemplary embodiment. The following descriptions will be given with reference to one pixel among a plurality of pixels arranged on the support substrate 151.

Referring to FIG. 10, the pixels according to an exemplary embodiment are substantially similar to the pixels described with reference to FIG. 4 to FIG. 7 except that the support substrate 151 is a thin film transistor panel including transistors and capacitors, and the first-p reflective electrode 25 is disposed in a lower region of the first LED stack 23.

The cathode of the third LED stack 43 is connected to the support substrate 151 through the connecting portion 171a. For example, as shown in FIG. 9, the cathode of the third LED stack 43 may be connected to the ground through electrical connection to the support substrate 151. The cathodes of the second LED stack 33 and the first LED stack 23 may be connected to the ground through electrical connection to the support substrate 151 via the connecting portions 173a, 175a.

The first-p reflective electrode 25 is connected to the transistors Tr2 (see FIG. 9) inside the support substrate 151. The third-p transparent electrode 45 and the second-p transparent electrode 35 are connected to the transistors Tr2 (see FIG. 9) inside the support substrate 151 through the connecting portions 177a, 173b.

In this manner, the first to third LED stacks 23, 33, 43 are connected to one another, to form a circuit for active matrix driving, as shown in FIG. 9.

Although a circuit and a pixel configuration for active matrix driving have been illustrated, the inventive concepts are not limited thereto, and the circuit for the display apparatus for active matrix driving may be various modified.

In addition, although the first-p reflective electrode 25, the second-p transparent electrode 35, and the third-p transparent electrode 45 described with reference to FIG. 1 have been described as forming ohmic contact with the p-type semiconductor layers of the first LED stack 23, the second LED stack 33, and the third LED stack 43, respectively, each of the second substrate 31 and the third substrate 41 may not be provided with a separate ohmic contact layer. In particular, when the pixels have a small size of 200 μm or less, there is no difficulty in current spreading even without formation of a separate ohmic contact layer in the n-type semiconductor layer. However, in some exemplary embodiments, a transparent electrode layer may be disposed on each of the second substrate 31 and the third substrate 41 to secure current spreading.

In addition, the first to third LED stacks 23, 33, 43 may be connected to one another in various structures.

Figure 11:
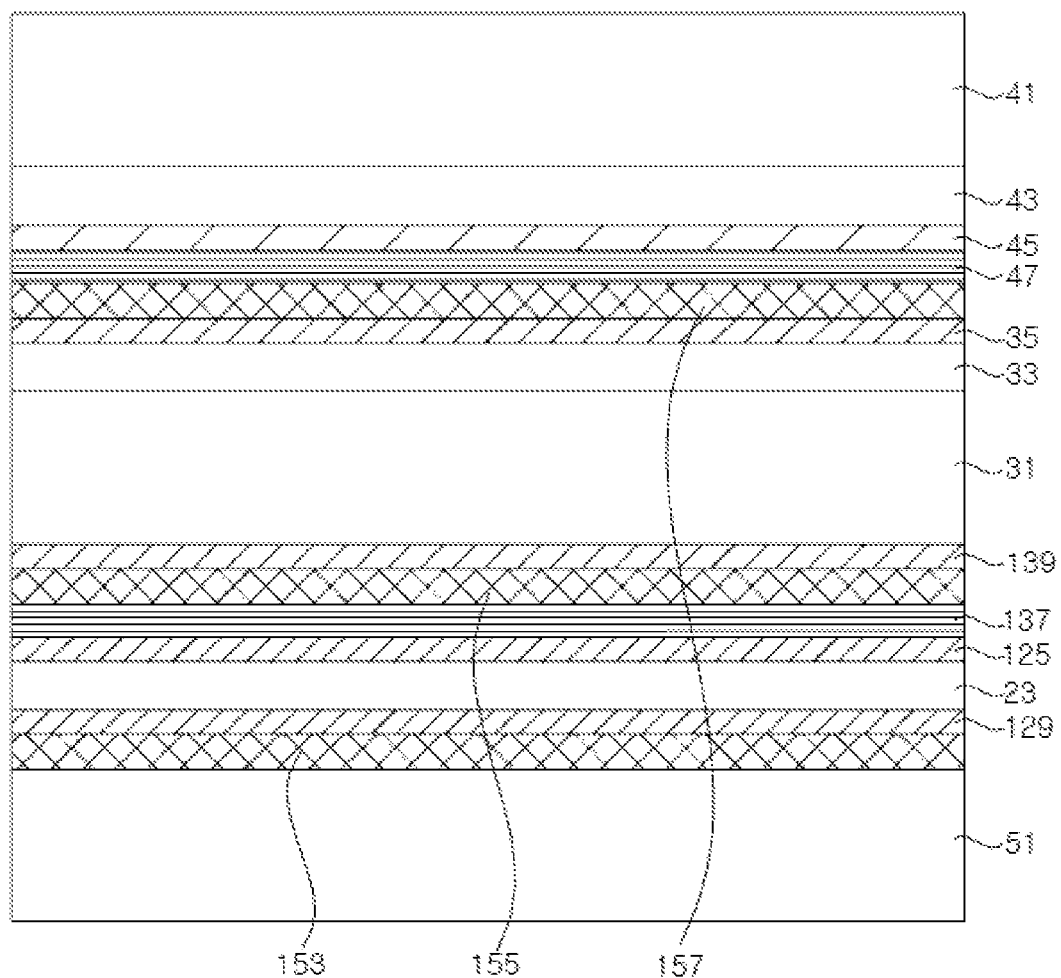
FIG. 11 is a schematic cross-sectional view of a light emitting diode stack for a display according to an exemplary embodiment.

FIG. 11 is a schematic cross-sectional view of a light emitting diode stack for a display according to an exemplary embodiment.

Referring to FIG. 11, a light emitting diode stack 101 includes a support substrate 51, a first LED stack 23, a second LED stack 33, a third LED stack 43, a second substrate 31, a third substrate 41, a second-p transparent electrode 35, a third-p transparent electrode 45, a first color filter 137, a second color filter 47, a first bonding layer 153, a second bonding layer 155, and a third bonding layer 157. In addition, the light emitting diode stack 101 may further include a first-n reflective electrode 129, a first-p transparent electrode 125, and a second-n transparent electrode 139.

The support substrate 51 supports the LED stacks 23, 33, 43. The support substrate 51 may include a circuit on a surface thereof or therein, but is not limited thereto. The support substrate 51 may include, for example, a Si substrate or a Ge substrate.

The first LED stack 23, the second LED stack 33, and the third LED stack 43 are substantially similar to those described with reference to FIG. 1, and thus, repeated descriptions thereof will be omitted to avoid redundancy. However, the light emitting diode stack 101 is different in that each of the first LED stack 23 and the second LED stack 33 has an n-type lower surface and a p-type upper surface. The third LED stack 43 has a p-type lower surface and an n-type upper surface.

The second substrate 31 and the third substrate 41 are substantially similar to those described with reference to FIG. 1, and thus, repeated descriptions thereof will be omitted to avoid redundancy.

Since the first LED stack 23 has the p-type upper surface, the first-p transparent electrode 125 forms ohmic contact with the upper surface of the first LED stack 23. The first-p transparent electrode 125 transmits light generated from the first LED stack 23, for example, red light.

The first-n reflective electrode 129 forms ohmic contact with the lower surface of the first LED stack 23. The first-n reflective electrode 129 forms ohmic contact with the first LED stack 23 and reflects light generated from the first LED stack 23. The first-n reflective electrode 129 may be formed of, for example, Au—Ti or Au—Sn. Furthermore, the first-n reflective electrode 129 may include a diffusive barrier layer.

The second-p transparent electrode 35 forms ohmic contact with the p-type semiconductor layer of the second LED stack 33. Since the second LED stack 33 has the p-type upper surface, the second-p transparent electrode 35 is disposed on the second LED stack 33. The second-p transparent electrode 35 may include a metal layer or a conductive oxide layer transparent to red light and green light.

The second-n transparent electrode 139 may form ohmic contact with the lower surface of the second substrate 31. The second-n transparent electrode 139 may include a metal layer or a conductive oxide layer transparent to red light and green light. The second-n transparent electrode 139 may be partially exposed by patterning the second LED stack 33 and the second substrate 31 to form a connection terminal for electrical connection to the n-type semiconductor layer of the second LED stack 33.

The third-p transparent electrode 45 forms ohmic contact with the p-type semiconductor layer of the third LED stack 43. The third-p transparent electrode 45 may include a metal layer or a conductive oxide layer transparent to red light, green light, and blue light.

The first color filter 137 is interposed between the first LED stack 23 and the second LED stack 33. In addition, the second color filter 47 is interposed between the second LED stack 33 and the third LED stack 43. The first color filter 137 transmits light generated from the first LED stack 23 and reflects light generated from the second LED stack 33. The second color filter 47 transmits light generated from the first and second LED stacks 23, 33 and reflects light generated from the third LED stack 43. Accordingly, light generated from the first LED stack 23 may be emitted to the outside through the second substrate 31, the second LED stack 33, the third LED stack 43, and the third substrate 41, and light generated from the second LED stack 33 may be emitted to the outside through the third LED stack 43 and the third substrate 41. Furthermore, the light emitting diode stack 101 can prevent light generated from the second LED stack 33 from entering the first LED stack 23 or prevent light generated from the third LED stack 43 from entering the second LED stack 33, thereby preventing light loss. Light generated from the first LED stack 23 is emitted to the outside through the first-p transparent electrode 125, the second-n transparent electrode 139, the second-p transparent electrode 35, and the third-p transparent electrode 45. Further, light generated from the second LED stack 33 is emitted to the outside through the second-p transparent electrode 35 and the third-p transparent electrode 45.

In some exemplary embodiments, the first color filter 137 may reflect light generated from the third LED stack 43.

The first and second color filters 137, 47 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 137, 47 may be a band stop filter including a distributed Bragg reflector (DBR). The distributed Bragg reflector may be formed by alternately stacking insulation layers having different refractive indices one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 153 couples the first LED stack 23 to the support substrate 51. As shown in the drawings, the first-n reflective electrode 129 may adjoin the first bonding layer 153. The first bonding layer 153 may be a light transmissive or opaque layer. The first bonding layer 153 may be, for example, a transparent inorganic insulation layer, a transparent organic insulation layer, or a transparent conductive layer.

The second bonding layer 155 couples the second LED stack 33 to the first LED stack 23. As shown in the drawings, the second bonding layer 155 may be disposed on the first color filter 137 and adjoin the second-n transparent electrode 139. The second bonding layer 155 transmits light generated from the first LED stack 23. The second bonding layer 155 may be, for example, a transparent inorganic insulation layer, a transparent organic insulation layer, or a transparent conductive layer, and may be formed of, for example, light transmissive spin-on-glass.

The third bonding layer 157 couples the third LED stack 43 to the second LED stack 33. As shown in the drawings, the third bonding layer 157 may adjoin the second-p transparent electrode 35 and the second color filter 47. The third bonding layer 157 transmits light generated from the first LED stack 23 and the second LED stack 33. The third bonding layer 157 may be, for example, a transparent inorganic insulation layer, a transparent organic insulation layer, or a transparent conductive layer, and may be formed of, for example, light transmissive spin-on-glass.

FIG. 12A to FIG. 12F are schematic cross-sectional views illustrating a method of manufacturing a light emitting diode stack for a display according to an exemplary embodiment.

Figure 12A:
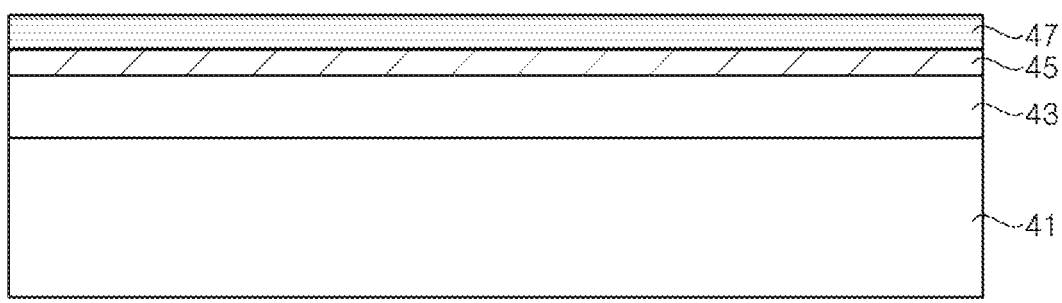
FIGS. 12A, 12B, 12C, 12D, 12E, and 12F are schematic cross-sectional views illustrating a method of manufacturing a light emitting diode stack for a display according to an exemplary embodiment.

Referring to FIG. 12A, first, a third LED stack 43 is grown on a third substrate 41, and a third-p transparent electrode 45 and a second color filter 47 are formed on the third LED stack 43. The third LED stack 43 is formed of GaN-based semiconductor layers and may include a GaInN well layer.

The third substrate 41 is a homogeneous substrate to a GaN-based semiconductor layer, and may be, for example, a GaN substrate doped with n-type dopants. The composition ratio of GaInN for the third LED stack 43 may be determined such that the third LED stack 43 emits blue light, for example. The third-p transparent electrode 45 forms ohmic contact with the p-type semiconductor layer.

Figure 12B:
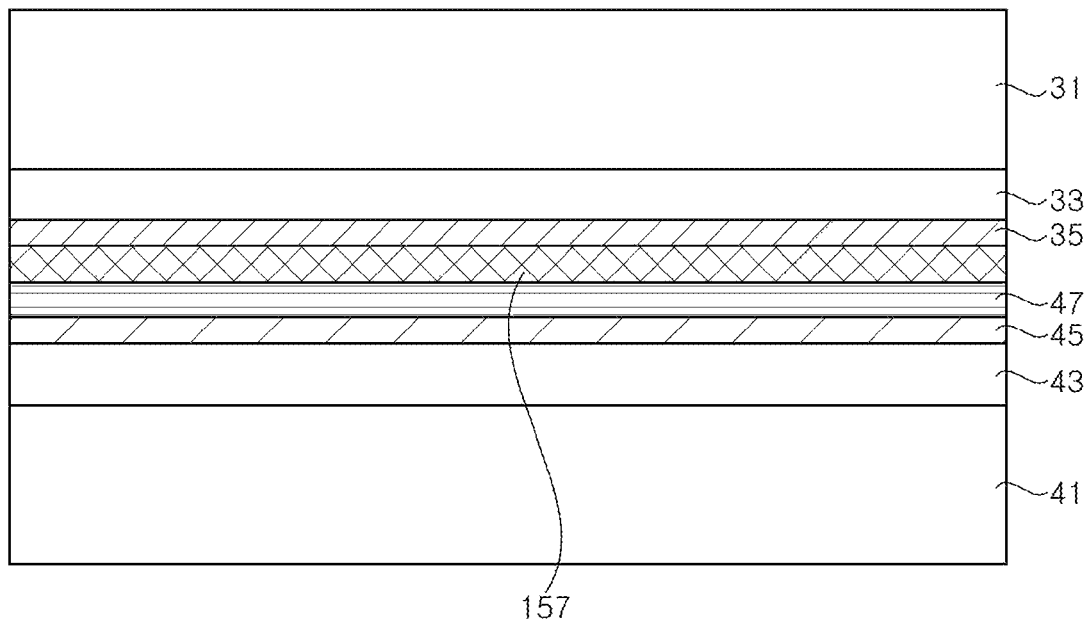

Referring to FIG. 12B, a second LED stack 33 is grown on a second substrate 31 and a second-p transparent electrode 35 is formed on the second LED stack 33. The second LED stack 33 may be formed of GaN-based semiconductor layers and may include a GaInN well layer. The second substrate 31 is a homogeneous substrate to a GaN-based semiconductor layer and may be, for example, a GaN substrate doped with n-type dopants. The composition ratio of GaInN for the second LED stack 33 may be determined such that the second LED stack 33 emits green light, for example. The second-p transparent electrode 35 forms ohmic contact with the p-type semiconductor layer.

TA third bonding layer 157 is provided to the second color filter 47, and the second-p transparent electrode 35 disposed on the second substrate 31 adjoins the third bonding layer 157. The third bonding layer 157 may be formed of, for example, spin-on-glass. Accordingly, the second LED stack 33 is coupled to the third LED stack 43.

Figure 12C:
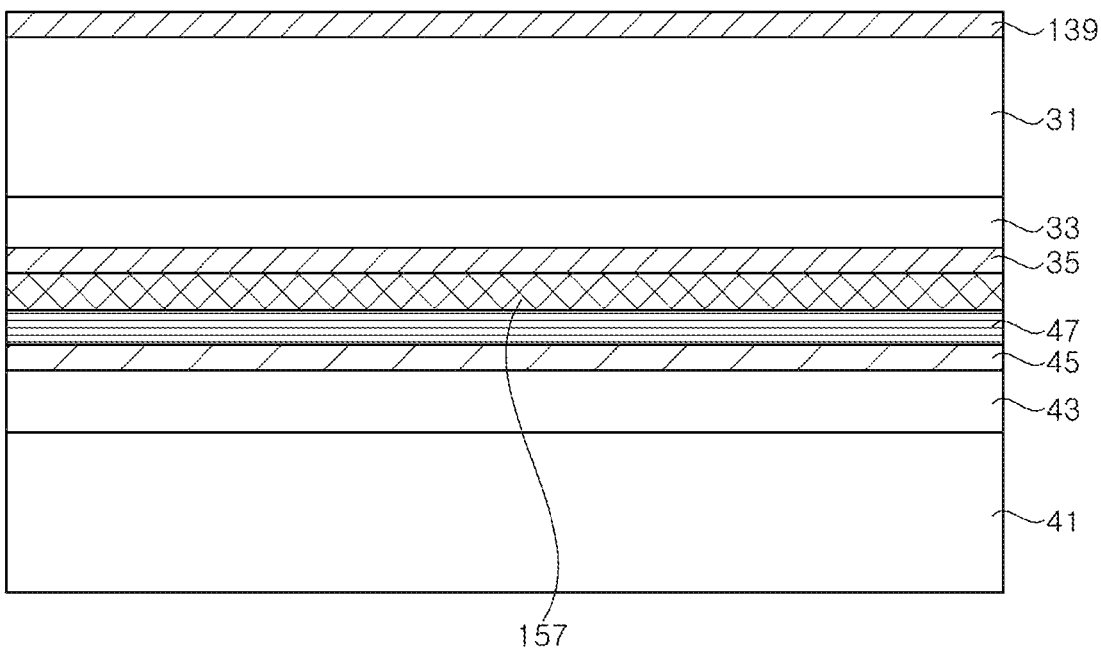

Referring to FIG. 12C, a second-n transparent electrode 139 may be formed on the second substrate 31. The second-n transparent electrode 139 forms ohmic contact with the second substrate 31. The second-n transparent electrode 139 may include of a metal layer or a conductive oxide layer. In some exemplary embodiments, the second-n transparent electrode 139 may be omitted.

Figure 12D:
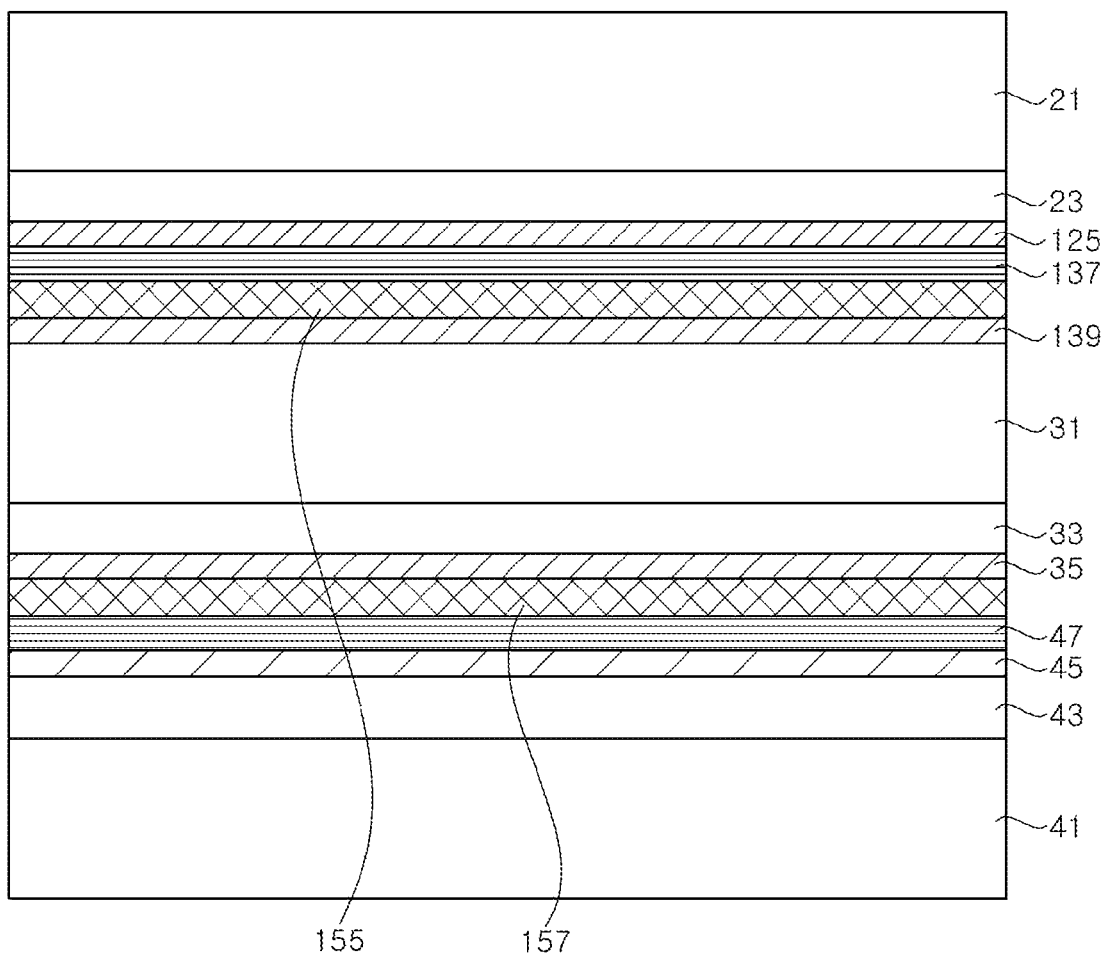

Referring to FIG. 12D, a first LED stack 23 is grown on a first substrate 21, a first-p transparent electrode 125 is formed on the first LED stack 23, and a first color filter 137 is formed on the first-p transparent electrode 125.

The first substrate 21 may be, for example, a GaAs substrate. In addition, the first LED stack 23 is formed of AlGaInP-based semiconductor layers and includes an n-type semiconductor layer, an active layer, and a p-type semiconductor layer. The first-p transparent electrode 125 forms ohmic contact with the p-type semiconductor layer.

The first color filter 137 is substantially the same as those described with reference to FIG. 1, and thus, repeated descriptions thereof will be omitted to avoid redundancy.

Then, a second bonding layer 155 is provided to the second-n transparent electrode 139 and the first substrate 21 is disposed thereon, such that the first color filter 137 disposed on the first substrate 21 adjoins the second bonding layer 155. The second bonding layer 155 may be formed of, for example, spin-on-glass. Accordingly, the first LED stack 23 is coupled to the second LED stack 33.

Figure 12E:
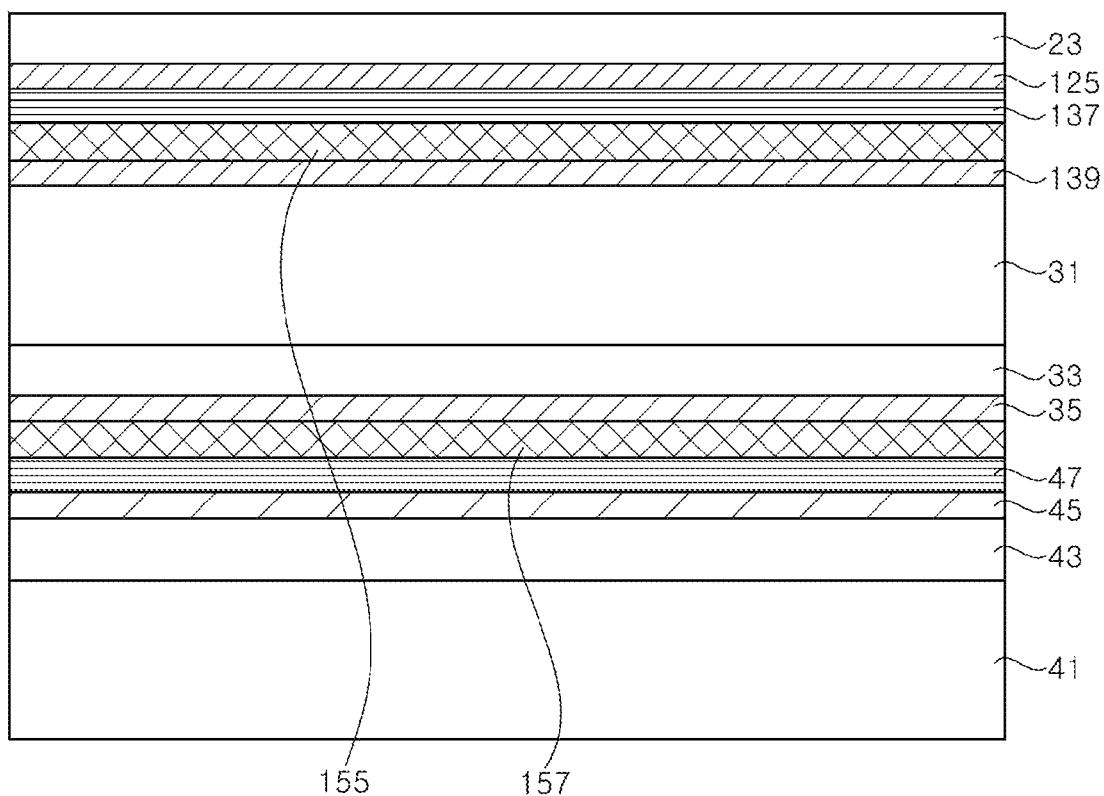

Referring to FIG. 12E, after the first LED stack 23 is bonded to the second LED stack 33, the first substrate 21 is removed from the first LED stack 23 by chemical etching or the like. In this manner, the first LED stack 23 is exposed.

Figure 12F:
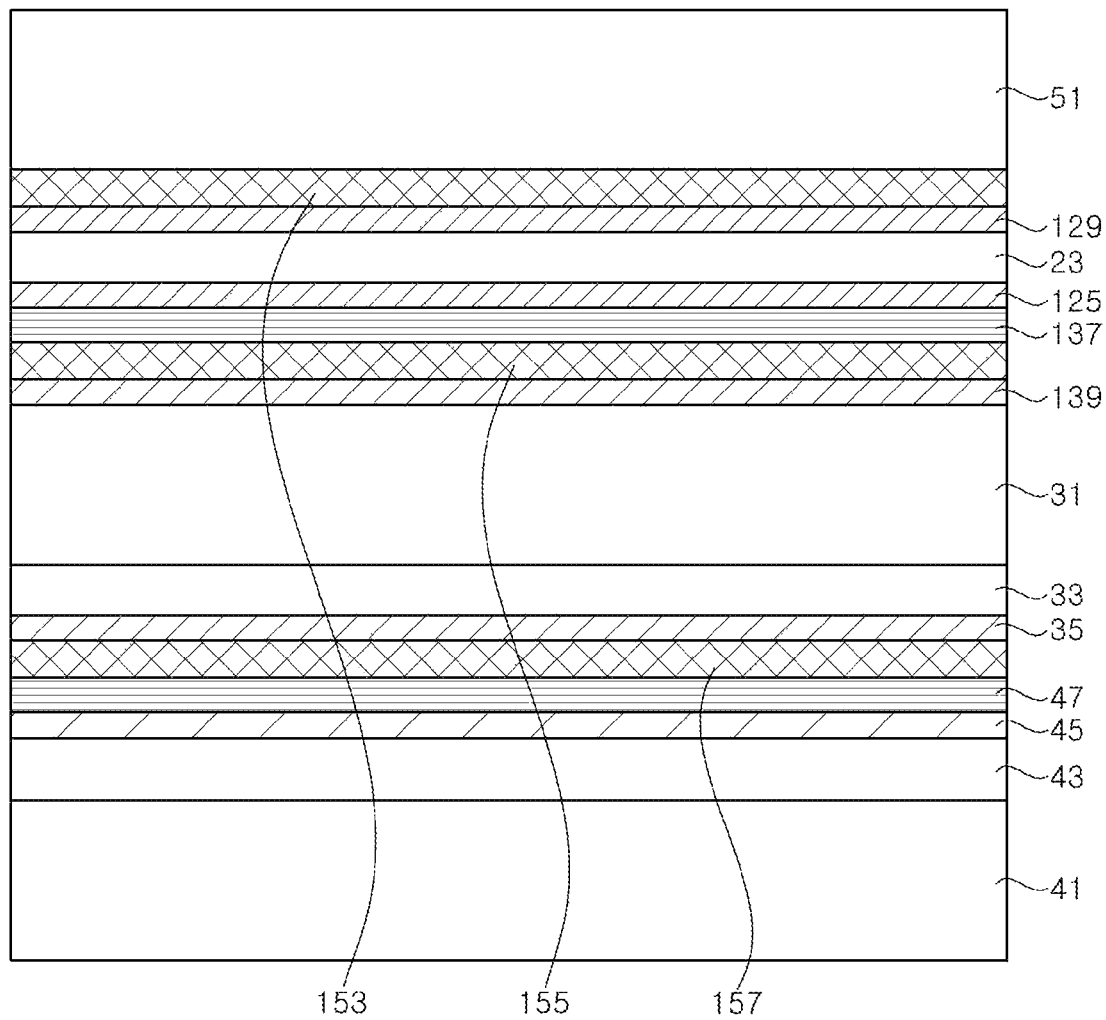

Referring to FIG. 12F, a first-n reflective electrode 129 is formed on the exposed first LED stack 23. The first-n reflective electrode 129 includes a metal layer, which reflects light generated from the first LED stack 23.

Then, a first bonding layer 153 is disposed on the first-n reflective electrode 129 and the support substrate 51 is boned thereto. In this manner, the light emitting diode stack 101 with the third substrate 41 exposed to the outside is provided, as shown in FIG. 11.

A display apparatus may be provided by patterning the first to third LED stacks 23, 33, 43 disposed on the support substrate 51 of the light emitting diode stack 101 in pixel units, followed by connecting the first to third LED stacks to one another through interconnection lines.

Figure 13:
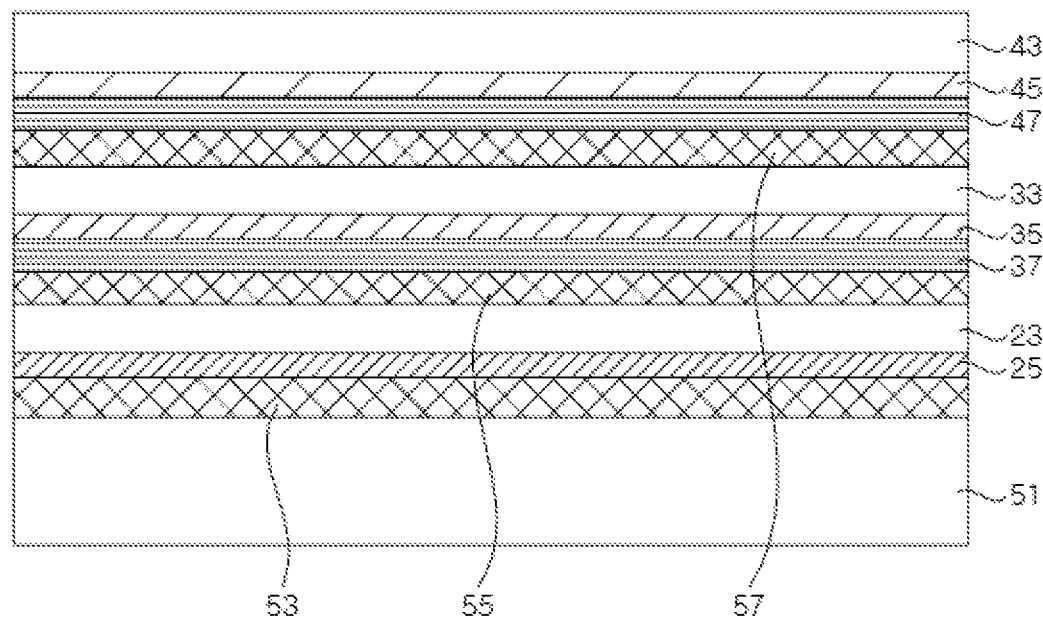
FIG. 13 is a schematic cross-sectional view of a light emitting diode stack for a display according to an exemplary embodiment.

FIG. 13 is a schematic cross-sectional view of a light emitting diode stack for a display according to an exemplary embodiment.

Referring to FIG. 13, the light emitting diode stack 102 according to the illustrated exemplary embodiment is generally similar to the light emitting diode stack 100 described with reference to FIG. 1, except that the second substrate 31 and the third substrate 41 are removed. The second substrate 31 and the third substrate 41 are removed from the second LED stack 33 and the third LED stack 43 after being used as growth substrates for the second LED stack 33 and the third LED stack 43, respectively. Each of the second LED stack 33 and the third LED stack 43 is grown on a homogeneous GaN-based substrate, thereby having a reduced dislocation density of about $10^3$ to about $10^7/cm^2$.

Since the second substrate 31 and the third substrate 41 are removed, interconnection lines electrically connected to the second and third substrates 31, 41 in FIG. 11 may be electrically connected to the second LED stack 33 and the third LED stack 43, respectively. In addition, a roughened surface 41a may be formed on the upper surface of the third LED stack 43.

Figure 14:
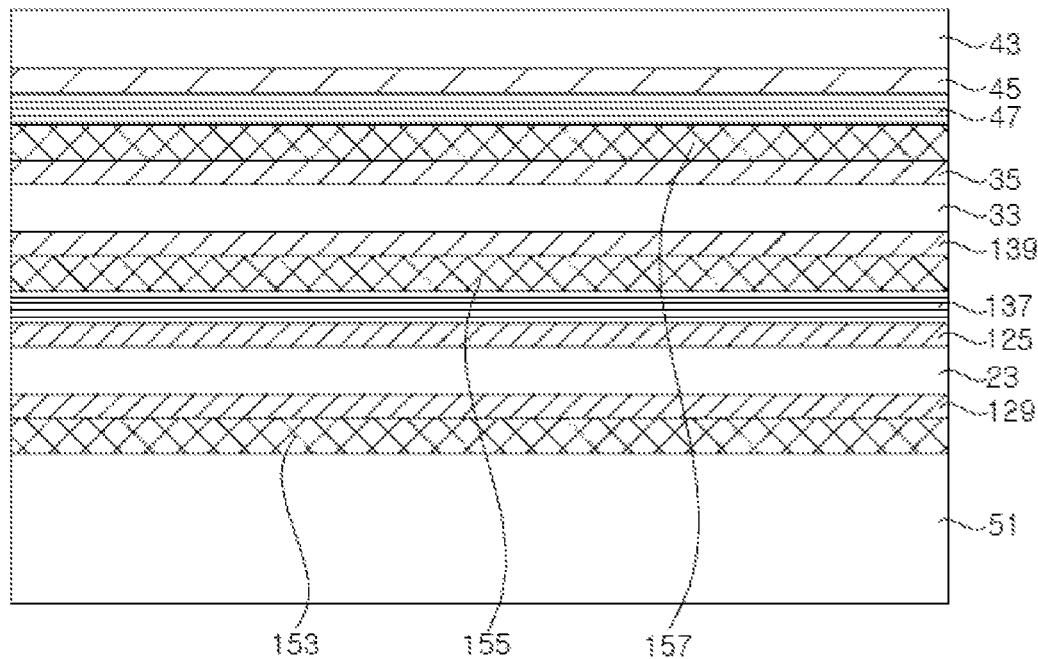
FIG. 14 is a schematic cross-sectional view of a light emitting diode stack for a display according to an exemplary embodiment.

FIG. 14 is a schematic cross-sectional view of a light emitting diode stack for a display according to an exemplary embodiment.

Referring to FIG. 14, the light emitting diode stack 103 according to the illustrated exemplary embodiment is generally similar to the light emitting diode stack 101 described with reference to FIG. 11, except that the second substrate 31 and the third substrate 41 are removed. The second substrate 31 and the third substrate 41 are removed from the second LED stack 33 and the third LED stack 43 after being used as growth substrates for the second LED stack 33 and the third LED stack 43, respectively. Each of the second LED stack 33 and the third LED stack 43 is grown on a homogeneous GaN-based substrate, thereby having a reduced dislocation density of about $10^3$ to about $10^7/cm^2$.

Since the second substrate 31 and the third substrate 41 are removed, interconnection lines electrically connected to the second and third substrates 31, 41 in FIG. 11 may be electrically connected to the second LED stack 33 and the third LED stack 43, respectively. In addition, a roughened surface 41a may be formed on the upper surface of the third LED stack 43.

According to the exemplary embodiments, since a plurality of pixels are formed at the wafer level using the light emitting diode stack 100, 101, 102, 103 for a display, an individual mounting process of light emitting diodes may be obviated. In addition, the light emitting diode stack according to the exemplary embodiments has the structure in which the first to third LED stacks 23, 33, and 43 are stacked in the vertical direction, thereby securing an area for subpixels in a limited pixel area. Furthermore, the light emitting diode stack according to the exemplary embodiments allows light generated from the first LED stack 23, the second LED stack 33, and the third LED stack 43 to be emitted outside therethrough, thereby reducing light loss. Furthermore, each of the second LED stack 33 and the third LED stack 43 may be grown on a homogeneous substrate to reduce dislocation density thereof, thereby improving luminous efficacy. Furthermore, the second substrate 31 and the third substrate 41 may be remained on the second LED stack 33 and the third LED stack 43, respectively, instead of being removed therefrom, thereby simplifying the process of manufacturing a light emitting diode stack.

Figure 15:
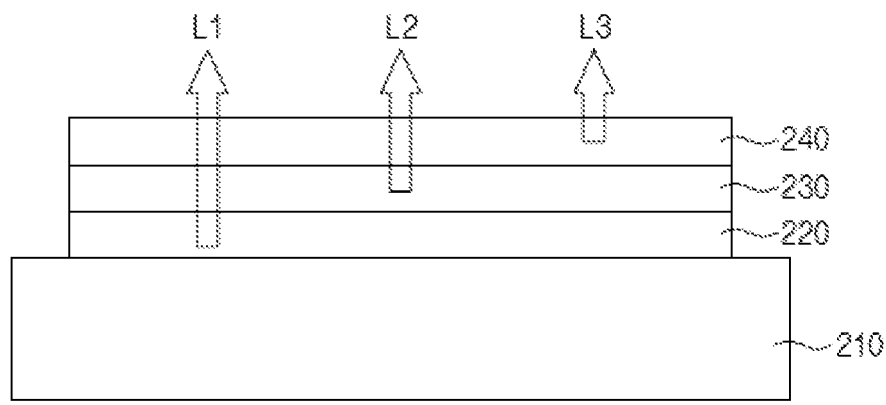
FIG. 15 is a cross-sectional view of a light emitting stacked structure according to an exemplary embodiment.

FIG. 15 is a cross-sectional view of a light emitting stacked structure according to an exemplary embodiment.

Referring to FIG. 15, the light emitting stacked structure according to an exemplary embodiment includes a plurality of epitaxial stacks stacked one over another. The epitaxial stacks are disposed on a substrate 210.

The substrate 210 is substantially flat (or has a plate shape) provided with a front surface and a rear surface.

The substrate 210 may have various shapes, each being provided with a front surface on which the epitaxial stacks are mounted. The substrate 210 may include an insulating material. As the material for the substrate 210, a glass, a quartz, a silicon, an organic polymer, or an organic-inorganic composite material may be used. However, the inventive concepts are not limited to a particular material of the substrate 210, as long as the material has an insulating property. In an exemplary embodiment, a line part may be further disposed on the substrate 210 to apply a light emitting signal and a common voltage to each of the epitaxial stack. In particular, when each of the epitaxial stack is operated by an active matrix method, a driving device including a thin film transistor may be further disposed on the substrate in addition to the line part. To this end, the substrate 210 may be provided as a printed circuit board or a composite substrate formed by forming the line part and/or the driving device on the glass, quartz, silicon, organic polymer, or organic-inorganic composite material.

The epitaxial stacks are sequentially stacked on the front surface of the substrate 210.

In an exemplary embodiment, two or more epitaxial stacks may be provided, and the epitaxial stacks emit light having different wavelength bands from each other. In particular, the epitaxial stack is provided in plural, and the epitaxial stacks have different energy bands from each other. In the illustrated exemplary embodiment, three epitaxial stacks are sequentially stacked on the substrate 210. Hereinafter, three layers sequentially stacked on the substrate 210 will be referred to as first, second, and third epitaxial stacks 220, 230, and 240, respectively.

Each of the epitaxial stacks may emit a color light in a visible light band among lights of various wavelength bands. In an exemplary embodiment, light emitted from the epitaxial stack disposed at a lowermost end may be the color light having the longest wavelength with the lowest energy band, and the wavelength of the color light emitted from the epitaxial stacks may become shorter from the bottom to the top of the epitaxial stacks. Light emitted from the epitaxial stack disposed at an uppermost end may be the color light having the shortest wavelength with the highest energy band. For example, the first epitaxial stack 220 emits a first color light L1, the second epitaxial stack 230 emits a second color light L2, and the third epitaxial stack 240 emits a third color light L3. The first, second, and third color lights L1, L2, and L3 may be different color lights from each other, and the first, second, and third color lights L1, L2, and L3 may be the color lights having different wavelength bands from each other, which are sequentially shortened. More particular, the first, second, and third color lights L1, L2, and L3 may have different wavelength bands from each other and may be color lights of a shorter wavelength band having a higher energy from the first color light L1 to the third color light L3.

In an exemplary embodiment, the first color light L1 may be a red light, the second color light L2 may be a green light, and the third color light L3 may be a blue light.

Each epitaxial stack emits light in a direction to which the front surface of the substrate 210 faces. In this case, light emitted from one epitaxial stack passes through another epitaxial stack disposed on an optical path of light emitted from the one epitaxial stack. The direction to which the front surface of the substrate 210 faces indicates a direction in which the first, second, and third epitaxial stacks 220, 230, and 240 are stacked.

Hereinafter, the direction to which the front surface of the substrate 210 faces will be referred to as a "front surface direction" or an "upward direction", and a direction to which the rear surface of the substrate 210 faces will be referred to as a "rear surface direction" or a "downward direction". However, terms of "upward" and "downward" indicate directions relative to each other, and thus may vary depending on an arrangement or a stacked direction of the light emitting stacked structure.

Each epitaxial stack emits light to the upward direction and transmits most of light emitted from the epitaxial stack disposed thereunder. In particular, light emitted from the first epitaxial stack 220 travels in the front surface direction after passing through the second epitaxial stack 230 and the third epitaxial stack 240, and light emitted from the second epitaxial stack 230 travels in the front surface direction after passing through the third epitaxial stack 240. To this end, at least a portion, or substantially the entire portion of other epitaxial stacks except for the epitaxial stack disposed at the lowermost end may be formed of a light transmitting material. As used herein, the term "light transmitting material" may refer to not only a light transmitting material that transmits all light but also a light transmitting material that transmits light having a predetermined wavelength or a portion of light having a predetermined wavelength. In an exemplary embodiment, each epitaxial stack may transmit about 60% or more of light from the epitaxial stack disposed thereunder. According to another exemplary embodiment, each epitaxial stack may transmit about 80% or more of light from the epitaxial stack disposed thereunder, and according to another exemplary embodiment, each epitaxial stack may transmit about 90% or more of light from the epitaxial stack disposed thereunder.

In the light emitting stacked structure according to an exemplary embodiment, the epitaxial stacks may be independently driven since signal lines that respectively apply light emitting signals to the epitaxial stacks are independently connected to the epitaxial stacks, and may display various colors depending on whether light is emitted from each epitaxial stack. In addition, since the epitaxial stacks that emit lights having difference wavelengths are formed to be overlapped with each other, the light emitting stacked structure may be formed in a narrow area.

Figure 16:
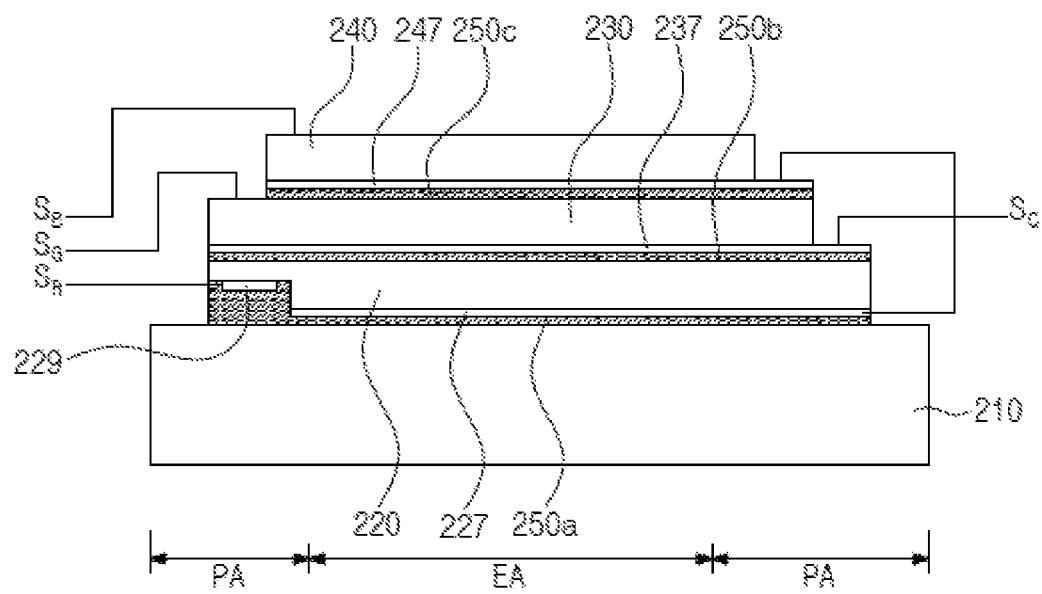
FIG. 16 is a cross-sectional view of a light emitting stacked structure according to an exemplary embodiment.
Figure 17A:
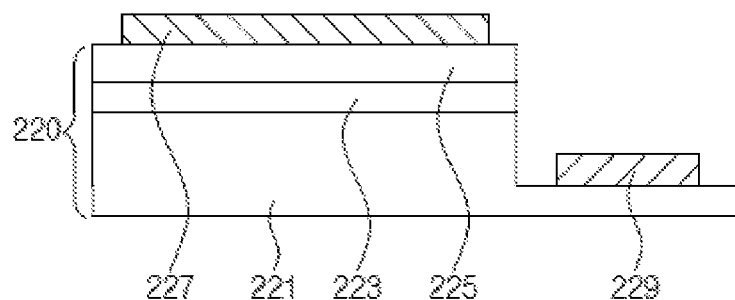
FIGS. 17A, 17B, and 17C are cross-sectional views of each epitaxial stack of FIG. 16.
Figure 17B:
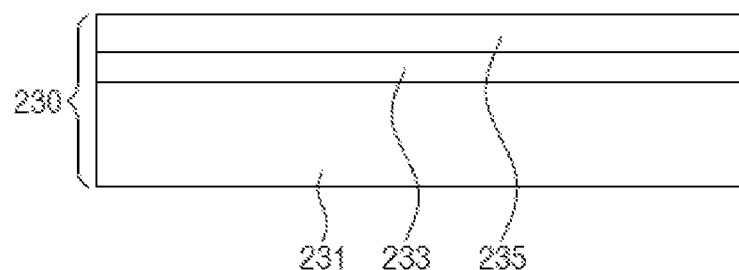
Figure 17C:
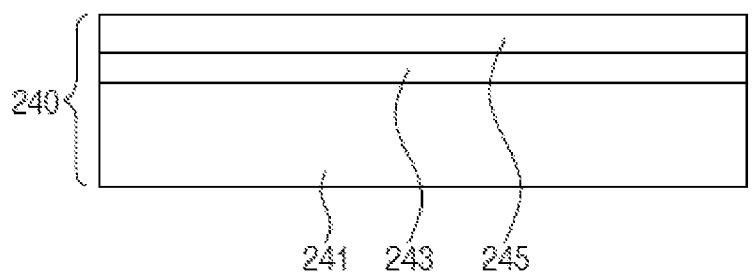

FIG. 16 is a cross-sectional view of a light emitting stacked structure according to an exemplary embodiment. FIGS. 17A to 17C are cross-sectional views of each epitaxial stack of FIG. 16.

Referring to FIG. 16, the light emitting stacked structure includes a light emitting area EA and a peripheral area PA disposed adjacent to the light emitting area EA.

The light emitting area EA is an area in which lights are emitted from the first, second, and third epitaxial stacks 220, 230, 240 to the upward direction. Light emitting areas EA of the first, second, and third epitaxial stacks 220, 230, and 240 overlap with each other, and thus, the light emitting areas EA of the first, second, and third epitaxial stacks 220, 230, and 240 may have substantially the same area as each other.

The peripheral area PA is an area in which the line part connected to the first, second, and third epitaxial stacks 220, 230, and 240 may be disposed. Lights may be emitted from the first, second, and third epitaxial stacks 220, 230, and 240 disposed in the peripheral area PA. However, although not shown in figures, various additional components may be disposed in the peripheral area PA in addition to the line part, such as a separate blocking layer and a reflection layer, which may prevent light from exiting to the outside. Accordingly, light may not exit through the peripheral area PA.

Each of the first, second, and third epitaxial stacks 220, 230, and 240 is disposed on the substrate 210 with a corresponding adhesive layer among first, second, and third adhesive layers 250a, 250b, and 250c interposed therebetween. The first, second, and third adhesive layers 250a, 250b, and 250c may include a non-conductive material and a light transmitting material. For example, the first, second, and third adhesive layers 250a, 250b, and 250c may include an optically clear adhesive (OCA). The material for the first, second, and third adhesive layers 250a, 250b, and 250c is not particularly limited as long as the material of the first, second, and third adhesive layers 250a, 250b, and 250c is optically clear and stably attaches each epitaxial stack. For example, the first, second, and third adhesive layers 250a, 250b, and 250c may include an organic material, such as an epoxy-based polymer like SU-8, various resists, parylene, poly(methyl methacrylate) (PMMA), and benzocyclobutene (BCB), and an inorganic material, such as silicon oxide, aluminum oxide, and molten glass. In some exemplary embodiments, a conductive oxide may be used as the adhesive layer as needed, and in this case, the conductive oxide may be insulated from other components. When the organic material or the molten glass of the inorganic materials is used as the adhesive layer, the first, second, and third epitaxial stacks 220, 230, and 240 and the substrate 210 may be attached to each other by coating the material on an adhesive side of the first, second, and third epitaxial stacks 220, 230, and 240 and the substrate 210, and applying a high temperature and a high pressure to the material under a high vacuum state. When the inorganic material (except for the molten glass) is used as the adhesive layer, the first, second, and third epitaxial stacks 220, 230, and 240 and the substrate 210 may be attached to each other by depositing the material on the adhesive side of the first, second, and third epitaxial stacks 220, 230, and 240 and the substrate 210, planarizing the material using a chemical-mechanical planarization (CMP) process, performing a plasma treatment on a surface of the material, and attaching under the high vacuum state, for example.

Referring to FIGS. 17A to 17C, the first, second, and third epitaxial stacks 220, 230, and 240 include first semiconductor layers 221, 231, and 241, active layers 223, 233, and 243, and second semiconductor layers 225, 235, and 245, which are sequentially stacked. In FIGS. 17A to 17C, the first semiconductor layers 221, 231, and 241, the active layers 223, 233, and 243, and the second semiconductor layers 225, 235, and 245 are sequentially stacked in the upward direction, however, the first, second, and third epitaxial stacks 220, 230, and 240 of FIGS. 17A to 17C are shown upside down in FIG. 16. In particular, the first, second, and third epitaxial stacks 220, 230, and 240 shown in FIG. 16 are arranged in order of the second semiconductor layers 225, 235, and 245, the active layers 223, 233, and 243, and the first semiconductor layers 221, 231, and 241 in the upward direction.

Referring to FIG. 17A, the first semiconductor layer 221, the active layer 223, and the second semiconductor layer 225 of the first epitaxial stack 220 may include a semiconductor material that emits red light, for example. As the semiconductor material that emits red light, aluminum gallium arsenide (AlGaAs), gallium arsenide phosphide (GaAsP), aluminum gallium indium phosphide (AlGaInP), and gallium phosphide (GaP) may be used. However, the semiconductor material that emits red light is not limited thereto, and various other materials may be used.

The first semiconductor layer 221 may be a semiconductor layer that includes a first conductive type impurity, and the second semiconductor layer 225 may be a semiconductor layer that includes a second conductive type impurity. The first conductive type and the second conductive type have opposite polarities from each other. When the first conductive type is an n-type, the second conductive type is a p-type, and when the first conductive type is the p-type, the second conductive type is the n-type. Hereinafter, a structure having the n-type semiconductor layer, the active layer, and the p-type semiconductor layer sequentially formed one over another will be described as an example, and the first semiconductor layer 221 may be referred to as the "n-type semiconductor layer", and the second semiconductor layer 225 may be referred to as the "p-type semiconductor layer". In some exemplary embodiments, however, the first semiconductor layer 221 and the second semiconductor layer 225 may be the p-type semiconductor layer and the n-type semiconductor layer, respectively.

A mesa is formed in the first epitaxial stack 220 by removing a portion of the n-type semiconductor layer 221, the active layer 223, and the p-type semiconductor layer 225. A first n-type contact electrode 229 is disposed on an upper surface of the exposed n-type semiconductor layer 221, and a first p-type contact electrode 227 is disposed on the p-type semiconductor layer 225 on which the mesa is formed.

The first n-type contact electrode 229 and the first p-type contact electrode 227 may have a single-layer structure or a multi-layer structure of a metal material. For example, the first n-type contact electrode 229 and the first p-type contact electrode 227 may include a metal material, such as Al, Ti, Cr, Au, Ag, Ti, Sn, Ni, Cr, W, Cu, or an alloy thereof. In particular, the first p-type contact electrode 227 may include a metal material having high reflectance to reflect light emitted from the first epitaxial stack 220 towards the upward direction to improve light emission efficiency.

Since the first epitaxial stack 220 is reversed and disposed on the substrate 210 with the first adhesive layer 250a interposed therebetween, the first n-type contact electrode 229 and the first p-type contact electrode 227 are disposed between the substrate 210 and the second adhesive layer 250b, as shown in FIG. 16. The first p-type contact electrode 227 overlaps with the light emitting area EA and reflects light emitted from the active layer 223 of the first epitaxial stack 220 to the upward direction.

Referring to FIG. 17B, the second epitaxial stack 230 includes the n-type semiconductor layer 231, the active layer 233, and the p-type semiconductor layer 235, which are sequentially stacked. The n-type semiconductor layer 231, the active layer 233, and the p-type semiconductor layer 235 may include a semiconductor material that emits green light, for example. As the semiconductor material that emits green light, indium gallium nitride (InGaN), gallium nitride (GaN), gallium phosphide (GaP), aluminum gallium indium phosphide (AlGaInP), and aluminum gallium phosphide (AlGaP) may be used. However, the semiconductor material that emits green light is not limited thereto, and various other materials may be used.

Referring back to FIG. 16, a second p-type contact electrode 237 is disposed on the p-type semiconductor layer 235 of the second epitaxial stack 230. In FIG. 16, since the second epitaxial stack 230 corresponds to the reversed second epitaxial stack 230 of FIG. 17B, the second p-type contact electrode 237 is disposed between the first epitaxial stack 220 and the second epitaxial stack 230, in more detail, between the second adhesive layer 250b and the second epitaxial stack 230.

The second p-type contact electrode 237 may include a transparent conductive material, e.g., a transparent conductive oxide (TCO), and may have a thickness of about 2000 angstroms to about 2 micrometers.

Referring to FIG. 17C, the third epitaxial stack 240 includes the n-type semiconductor layer 241, the active layer 243, and the p-type semiconductor layer 245, which are sequentially stacked. The n-type semiconductor layer 241, the active layer 243, and the p-type semiconductor layer 245 may include a semiconductor material that emits blue light, for example. As the semiconductor material that emits blue light, gallium nitride (GaN), indium gallium nitride (InGaN), and zinc selenide (ZnSe) may be used. However, the semiconductor material that emits blue light is not limited thereto, and various other materials may be used.

Referring back to FIG. 16, a third p-type contact electrode 247 is disposed on the p-type semiconductor layer 245 of the third epitaxial stack 240. In FIG. 16, since the third epitaxial stack 240 corresponds to the reversed third epitaxial stack 240 of FIG. 17C, the third p-type contact electrode 247 is disposed between the second epitaxial stack 230 and the third epitaxial stack 240, in more detail, between the third adhesive layer 250c and the third epitaxial stack 240.

In an exemplary embodiment, each of the n-type semiconductor layers 221, 231, and 241 and each of the p-type semiconductor layers 225, 235, and 245 of the first, second, and third epitaxial stacks 220, 230, and 240 have a single-layer structure. However, in some exemplary embodiments, each of the n-type semiconductor layers 221, 231, and 241 and each of the p-type semiconductor layers 225, 235, and 245 of the first, second, and third epitaxial stacks 220, 230, and 240 may have a multi-layer structure and may include a superlattice layer. The active layers 223, 233, and 243 of the first, second, and third epitaxial stacks 220, 230, and 240 may have a single quantum well structure or a multiple quantum well structure.

In the illustrated exemplary embodiment, the second and third p-type contact electrodes 237 and 247 are disposed to overlap with the light emitting area EA. The second and third p-type contact electrodes 237 and 247 may include a transparent conductive material to transmit light from the epitaxial stack disposed thereunder. For example, each of the second and third p-type contact electrodes 237 and 247 may include a transparent conductive oxide (TCO). The transparent conductive oxide may include tin oxide (SnO), indium oxide (InO$_2$), zinc oxide (ZnO), indium tin oxide (ITO), and indium tin zinc oxide (ITZO). The transparent conductive oxide may be deposited by a chemical vapor deposition (CVD) or a physical vapor deposition (PVD) using an evaporator or a sputter. The second and third p-type contact electrodes 237 and 247 may have a sufficient thickness to function as an etch stopper in the following manufacturing process within a predetermined transmittance range.

In the illustrated exemplary embodiment, the first, second, and third p-type contact electrodes 227, 237, and 247 may be connected to a common line. The common line is a line to which a common voltage is applied. In addition, common signal lines may be respectively connected to the first n-type contact electrode 229 and the p-type semiconductor layers 235 and 245 of the second and third epitaxial stacks 230 and 240. In the illustrated exemplary embodiment, the common voltage Sc is applied to the first p-type contact electrode 227, the second p-type contact electrode 237, and the third p-type contact electrode 247 through the common line, and the light emitting signal is applied to the first n-type contact electrode 229, the n-type semiconductor layer 231 of the second epitaxial stack 230, and the n-type semiconductor layer 241 of the third epitaxial stack 240 through a light emitting signal line. Accordingly, the light emission of the first, second, and third epitaxial stacks 220, 230, and 240 is controlled. The light emitting signal includes first, second, and third light emitting signals $S_R$, $S_G$, and $S_B$ respectively corresponding to the first, second, and third epitaxial stacks 220, 230, and 240, and the first, second, and third light emitting signals $S_R$, $S_G$, and $S_B$ are signals respectively corresponding to the light emissions of the red light, the green light, and the blue light.

In the illustrated exemplary embodiment, the common voltage is applied to the p-type semiconductor layer of the first, second, and third epitaxial stacks 220, 230, and 240, and the light emitting signal is applied to the n-type semiconductor layer of the first, second, and third epitaxial stacks 220, 230, and 240. However, inventive concepts are not limited thereto. In some exemplary embodiments, the common voltage may be applied to the n-type semiconductor layer of the first, second, and third epitaxial stacks 220, 230, and 240, and the light emitting signal may be applied to the p-type semiconductor layer of the first, second, and third epitaxial stacks 220, 230, and 240. This structure may be implemented by forming each epitaxial stack in the order of the p-type semiconductor layer, the active layer, and the n-type semiconductor layer, which has the reversed stacked sequence of the n-type semiconductor, the active layer, and the p-type semiconductor illustrated in FIG. 16. In this case, the first, second, and third epitaxial stacks 220, 230, and 240 are driven in response to the light emitting signal applied thereto. In particular, the first epitaxial stack 220 is driven in response to the first light emitting signal $S_R$, the second epitaxial stack 230 is driven in response to the second light emitting signal $S_G$, and the third epitaxial stack 240 is driven in response to the third light emitting signal $S_B$. In this case, the first, second and third light emitting signals $S_R$, $S_G$, and $S_B$ are independently applied to the first, second, and third epitaxial stacks 220, 230, and 240, and thus, the first, second, and third epitaxial stacks 220, 230, and 240 are independently driven. The light emitting stacked structure may provide lights of various colors by combination of the first, second, and third color lights emitted from the first, second, and third epitaxial stacks to the upward direction.

When displaying colors, the light emitting stacked structure having the above-described structure provides different color lights through areas overlapped with each other, rather than providing different color lights through different areas on a plane, and thus, the size of a light emitting element may be reduced and facilitate integration. In general, conventional light emitting elements that emit different color lights, e.g., red, green, and blue lights, are disposed to be spaced apart from each other on a plane to implement a full color display. Accordingly, an area occupied by the conventional light emitting elements is relatively large since the light emitting elements are disposed to be spaced apart from each other on a plane. However, the light emitting elements according to exemplary embodiments that emit different color lights are disposed in the same area to overlap with each other to form the light emitting stacked structure, and thus, the full color display may be implemented through an area that is significantly smaller than that in the conventional light emitting elements. Therefore, a high-resolution display device may be manufactured in a small area.

Further, even when a conventional light emitting device were manufactured in a stacked manner, the conventional light emitting device is manufactured by individually forming a contact part in each light emitting element, e.g., by forming light emitting elements individually, and separately connecting the light emitting elements to each other using a wiring, which increases structural complexity of the light emitting device as well as manufacturing complexity thereof. However, the light emitting stacked structure according to the exemplary embodiment is manufactured by sequentially stacking plural epitaxial stacks on one substrate, forming the contact part in the epitaxial stacks through a minimal process, and connecting the line part to the epitaxial stacks. In addition, since one light emitting stacked structure is mounted in the exemplary embodiments, rather than mounting a plurality of conventional light emitting elements, the manufacturing method of the display device may be simplified as compared to the conventional display device manufacturing method that separately manufactures the light emitting elements of individual colors and mounts the light emitting elements individually.

The light emitting stacked structure according to the exemplary embodiments may further include various components to provide the color lights with high purity and high efficiency. For example, the light emitting stacked structure may include a wavelength pass filter to prevent light having a relatively short wavelength from traveling to the epitaxial stack that emits light having a relatively long wavelength.

Figure 18:
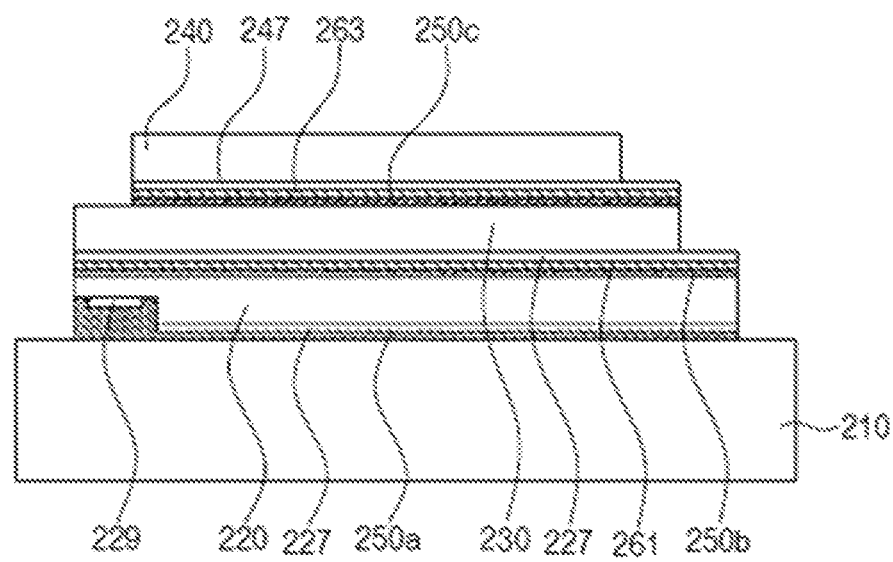
FIG. 18 is a cross-sectional view of a light emitting stacked structure according to an exemplary embodiment.

In the following exemplary embodiments, since the light emitting stacked structure includes elements that are substantially the same as those already discussed above, different features will be mainly described in order to avoid redundancy. FIG. 18 is a cross-sectional view of a light emitting stacked structure according to an exemplary embodiment.

Referring to FIG. 18, the light emitting stacked structure according to an exemplary embodiment may include a first wavelength pass filter 261 disposed between the first epitaxial stack 220 and the second epitaxial stack 230.

The first wavelength pass filter 261 selectively transmits light having a predetermined wavelength. The first wavelength pass filter 261 may transmit the first color light emitted from the first epitaxial stack 220 and may block or reflect lights except for the first color light. Accordingly, the first color light emitted from the first epitaxial stack 220 may travel in the upward direction, and the second and third color lights respectively emitted from the second and third epitaxial stacks 230 and 240 may not travel toward the first epitaxial stack 220 and may be reflected or blocked by the first wavelength pass filter 261.

The second and third color lights have relatively shorter wavelength and relatively higher energy than those of the first color light. As such, when the second and third color lights are incident into the first epitaxial stack 220, an additional light emission may be induced in the first epitaxial stack 220. In the illustrated exemplary embodiment, the second and third color lights may be prevented from being incident into the first epitaxial stack 220 by the first wavelength pass filter 261.

In the illustrated exemplary embodiment, a second wavelength pass filter 263 may be disposed between the second epitaxial stack 230 and the third epitaxial stack 240. The second wavelength pass filter 263 may transmit the first and second color lights respectively emitted from the first and second epitaxial stacks 220 and 230, and may block or reflect lights except for the first and second color lights. Accordingly, the first and second color lights respectively emitted from the first and second epitaxial stacks 220 and 230 may travel in the upward direction, and the third color light emitted from the third epitaxial stack 240 may not travel toward the first and second epitaxial stacks 220 and 230, and may be reflected or blocked by the second wavelength pass filter 263.

The third color light has a relatively shorter wavelength and a relatively higher energy than those of the first and second color lights. As such, when the third color light is incident into the first and second epitaxial stacks 220 and 230, an additional light emission may be induced in the first and second epitaxial stacks 220 and 230. In the illustrated exemplary embodiment, the third color light may be prevented from being incident into the first and second epitaxial stacks 220 and 230 by the second wavelength pass filter 263.

The light emitting stacked structure according to the illustrated exemplary embodiment may further include various components to provide high efficiency uniform light. For example, the light emitting stacked structure may include various concave-convex portions on a light emitting surface.

Figure 19:
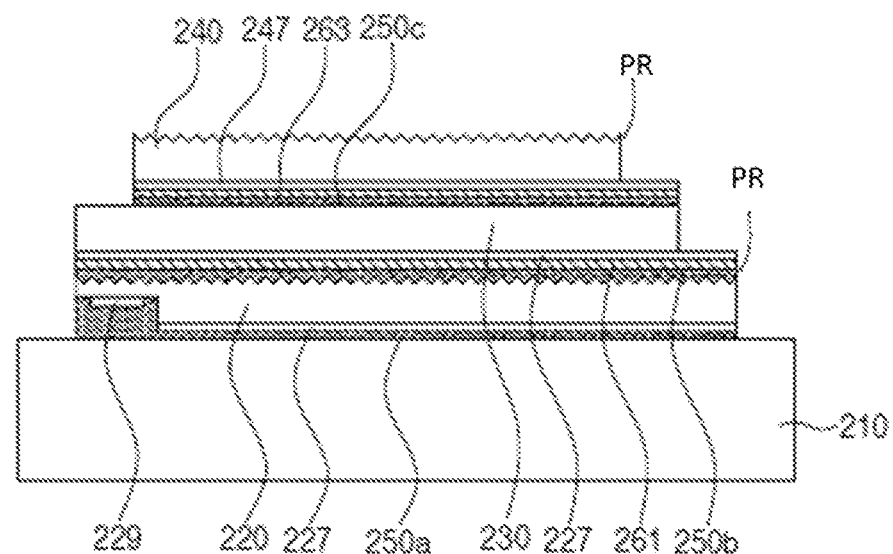
FIGS. 19 and 20 are cross-sectional views of a light emitting stacked structure according to exemplary embodiments.
Figure 20:
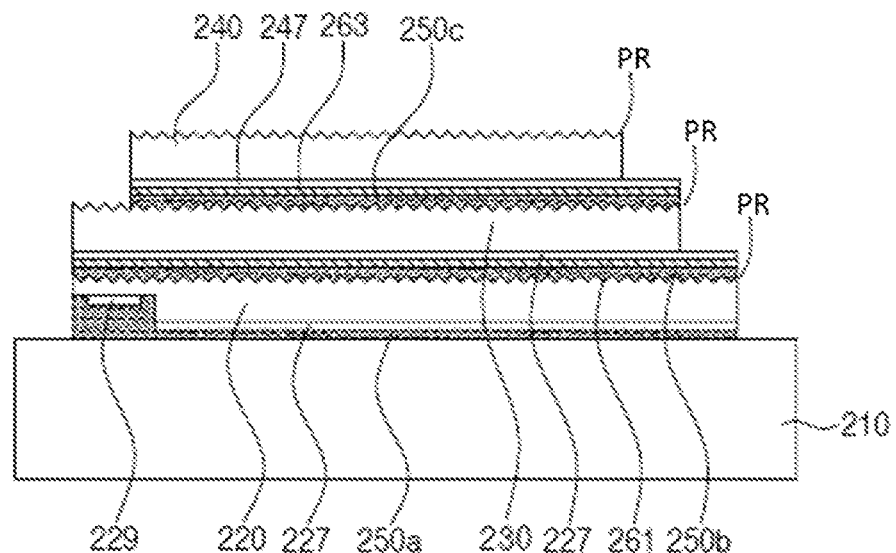

FIGS. 19 and 20 are cross-sectional views of a light emitting stacked structure according to exemplary embodiments.

The light emitting stacked structure according to an exemplary embodiment may include a concave-convex portion PR formed on an upper surface of at least one n-type semiconductor layer among the n-type semiconductor layers 221, 231, and 241 of the first, second, and third epitaxial stacks 220, 230, and 240. In an exemplary embodiment, the concave-convex portion PR of each epitaxial stack may be selectively formed. For example, the concave-convex portion PR may be disposed on the first and third epitaxial stacks 220 and 240 as shown in FIG. 19, and the concave-convex portion PR may be disposed on the first, second, and third epitaxial stacks 220, 230, and 240 as shown in FIG. 20. The concave-convex portion PR of each epitaxial stack may be disposed on the n-type semiconductor layers 221, 231, and 241 respectively corresponding to the light emitting surfaces of the first, second, and third epitaxial stacks 220, 230, and 240.

The concave-convex portion PR may improve light emitting efficiency. The concavo-convex portion PR may be provided in various shapes, such as substantially a polygonal pyramid shape, substantially a hemispherical shape, or a surface having a roughness, on which concavo-convex portions are randomly arranged. The concave-convex portion PR may be textured through various etching processes or may be formed using a patterned sapphire substrate.

The first, second, and third color lights from the first, second, and third epitaxial stacks 220, 230, and 240 may have a difference in intensity, and the intensity difference may cause a difference in visibility. In an exemplary embodiment, the light emitting efficiency may be improved by the concave-convex portion PR selectively formed on the light emitting surfaces of the first, second, and third epitaxial stacks 220, 230, and 240, which may reduce the difference in intensity between the first, second, and third color lights. Since the color light corresponding to red and/or blue colors has a lower visibility lower than the color light corresponding to green color, the difference in visibility may be reduced by texturing the first epitaxial stack 220 and/or the third epitaxial stack 240. In particular, red color light may have a relatively lower intensity because the red color light is provided from a lowermost portion of the light emitting stacked structure. In this case, when the concave-convex portion PR is formed on the first epitaxial stack 220, the light efficiency thereof may be improved.

The light emitting stacked structure having the above-described structure may be formed as a light emitting element capable of displaying various colors, which may be employed in a display device as a pixel. In the following descriptions, a display device that employs the light emitting stacked structure having the above-described structure will be described.

Figure 21:
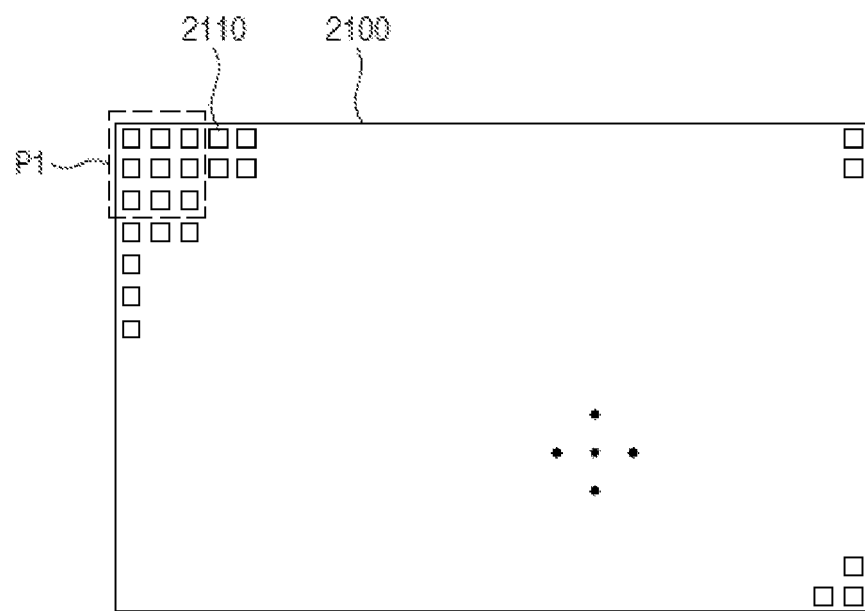
FIG. 21 is a plan view of a display device according to an exemplary embodiment.
Figure 22:
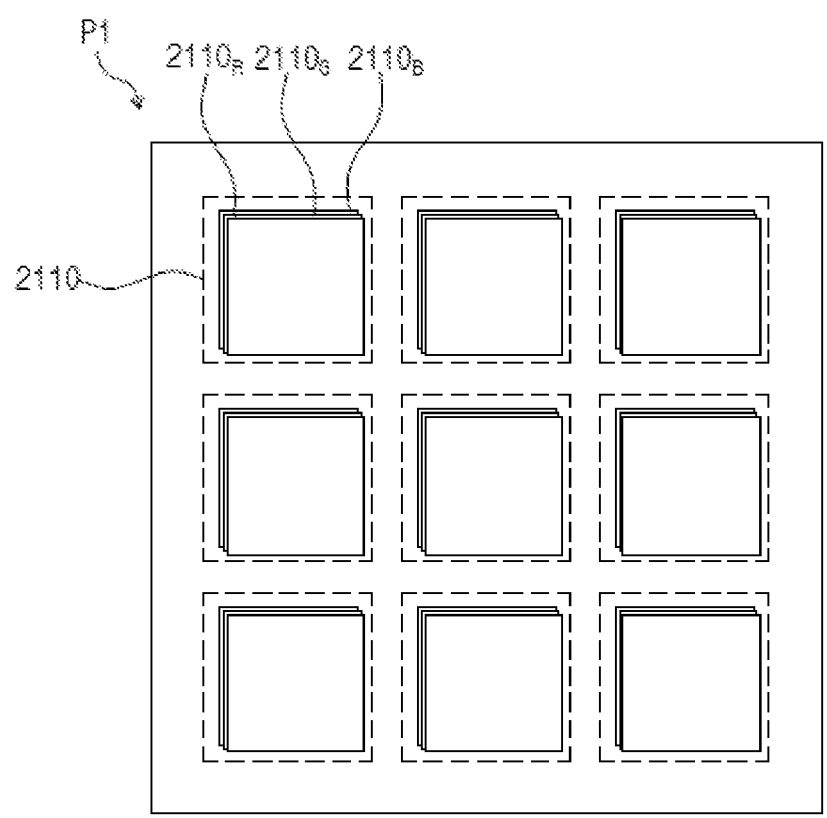
FIG. 22 is an enlarged plan view of portion P1 of FIG. 21.

FIG. 21 is a plan view of a display device according to an exemplary embodiment, and FIG. 22 is an enlarged plan view of portion P1 of FIG. 21.

Referring to FIGS. 21 and 22, the display device 2100 according to an exemplary embodiment may display arbitrary visual information, such as a text, a video, a photograph, and a 2- or 3-dimensional image.

The display device 2100 may have various shapes, such as a closed polygonal shape with straight sides like a rectangular shape, a circular or oval shape with a curved side, and a semi-circular or semi-oval shape with a straight side and a curved side. FIG. 21 exemplarily shows the display device having substantially a rectangular shape.

The display device 2100 includes a plurality of pixels 2110 that display an image. Each pixel 2110 may be a minimum unit that displays the image. Each pixel 2110 may include the light emitting stacked structure having the above-described structure and may emit a white light and/or a color light.

In an exemplary embodiment, each pixel 2110 includes a first sub-pixel $2110_R$ emitting red color light, a second sub-pixel $2110_G$ emitting green color light, and a third sub-pixel $2110_E$ emitting blue color light. The first, second, and third sub-pixels $2110_R$, $2110_G$, and $2110_E$ may respectively correspond to the first, second, and third epitaxial stacks 220, 230, and 240 of the light emitting stacked structure described above.

The pixels 2110 are arranged in a matrix form. As used herein, the pixels 2110 being arranged in the matrix form may refer that the pixels 2110 are arranged exactly in line along rows or columns, as well as that the pixels 2110 are arranged along the rows or columns as a whole while detailed locations of the pixels 2110 may be changed, e.g., in a zigzag form.

Figure 23:
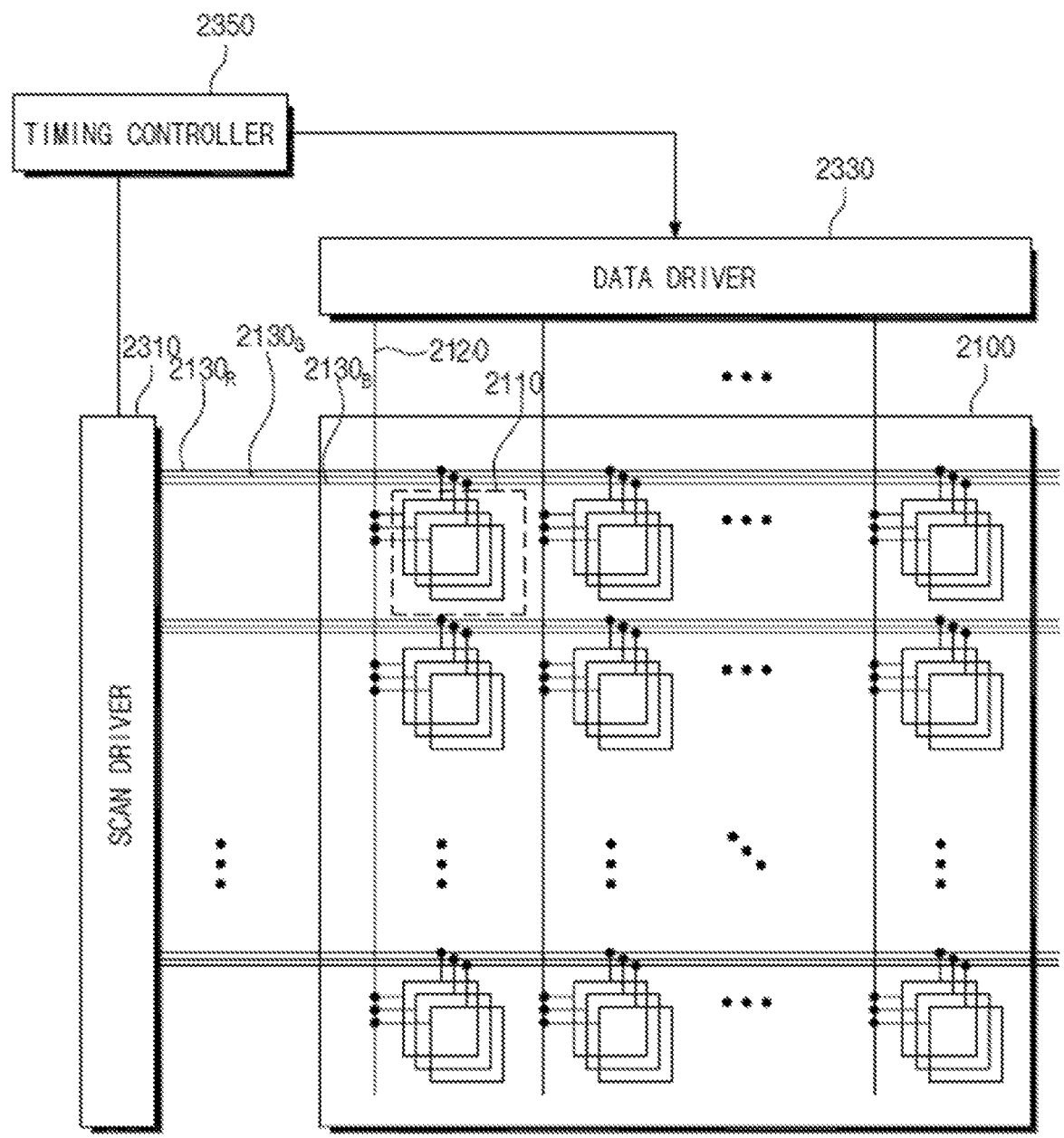
FIG. 23 is a block diagram of a display device according to an exemplary embodiment.

FIG. 23 is a block diagram of a display device according to an exemplary embodiment.

Referring to FIG. 23, the display device 2100 according to an exemplary embodiment includes a timing controller 2350, a scan driver 2310, a data driver 2330, a line part, and the pixels. When each pixel includes a plurality of sub-pixels, each sub-pixel is individually connected to the scan driver 2310 and the data driver 2330 through the line part.

The timing controller 2350 receives various control signals and image data for driving the display device 2100 from an external source (e.g., a system that transmits the image data). The timing controller 2350 rearranges the received image data and applies the rearranged image data to the data driver 2330. In addition, the timing controller 2350 generates scan control signals and data control signals for driving the scan driver 2310 and the data driver 2330, and applies the generated scan control signals and the data control signals to the scan driver 2310 and the data driver 2330, respectively.

The scan driver 2310 receives the scan control signals from the timing controller 2350 and generates scan signals in response to the scan control signals.

The data driver 2330 receives the data control signals and the image data from the timing controller 2350 and generates data signals in response to the data control signals.

The line part includes a plurality of signal lines. In particular, the line part includes scan lines 2130 that connect the scan driver 2310 and the sub-pixels, and data lines 2120 that connect the data driver 2330 and the sub-pixels. The scan lines 2130 may be connected to the sub-pixels, respectively. FIG. 23 exemplarily shows first, second, and third sub-scan lines $2130_R$, $2130_G$, and $2130_B$ respectively connected to the sub-pixels.

In addition, the line part may further include lines that connect the timing controller 2350 and the scan driver 2310, the data driver 2330, or other components to each other to transmit signals.

The scan lines 2130 apply the scan signals generated by the scan driver 2310 to the sub-pixels. The data signals generated by the data driver 2330 are applied to the data lines 2120.

The sub-pixels are connected to the scan lines 2130 and the data lines 2120. The sub-pixels selectively emit light in response to the data signals provided from the data lines 2120 when the scan signals from the scan lines 2310 are applied thereto. For example, each of the sub-pixels emits light having a brightness corresponding to the data signal applied thereto during each frame period. The sub-pixels, to which the data signals corresponding to a black brightness are applied, do not emit the light during corresponding frame period, and thus, a black color is displayed.

In an exemplary embodiment, the sub-pixels may be driven in a passive or active matrix manner. When the display device is driven in the active matrix manner, the display device 2100 may be driven by being further supplied with first and second pixel power sources in addition to the scan signals and the data signals.

Figure 24:
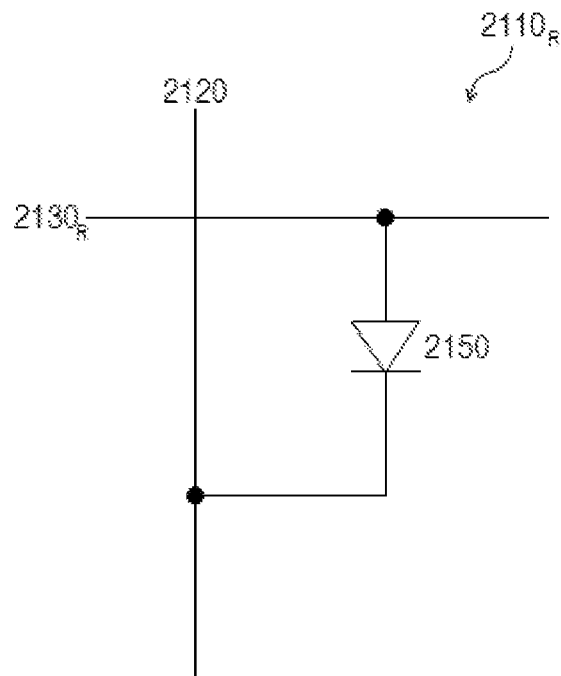
FIG. 24 is a circuit diagram of one sub-pixel for a passive matrix type display device according to an exemplary embodiment.

FIG. 24 is a circuit diagram of one sub-pixel for a passive matrix type display device according to an exemplary embodiment. The sub-pixel may be one of the sub-pixels, e.g., the red sub-pixel, the green sub-pixel, and the blue sub-pixel, and the sub-pixel will be described with reference to the first sub-pixel $2110_R$.

Referring to FIG. 24, the first sub-pixel $2110_R$ includes a light emitting element 2150 connected between the scan line $2130_R$ and the data line 2120. The light emitting element 2150 corresponds to the first epitaxial stack 220. When a voltage equal to or greater than a threshold voltage is applied to between the p-type semiconductor layer and the n-type semiconductor layer, the first epitaxial stack 220 emits light having a brightness corresponding to a level of the voltage applied thereto. In particular, the light emission of the first sub-pixel $2110_R$ may be controlled by controlling a voltage of the scan signal applied to the scan line $2130_R$ and/or a voltage of the data signal applied to the data line 2120.

Figure 25:
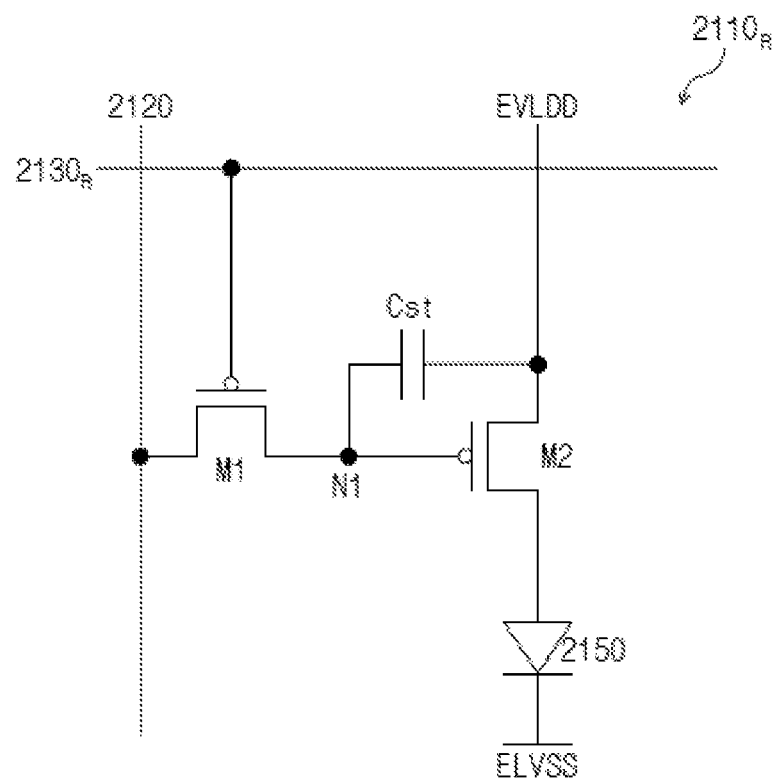
FIG. 25 is a circuit diagram of a first sub-pixel for an active matrix type display device according to an exemplary embodiment.

FIG. 25 is a circuit diagram of a first sub-pixel $2110_R$ for an active matrix type display device according to an exemplary embodiment. When the display device is the active matrix type display device, the first sub-pixel $2110_R$ may be driven by being further supplied with first and second pixel power sources ELVDD and ELVSS in addition to the scan signals and the data signals.

Referring to FIG. 25, the first sub-pixel $2110_R$ includes one or more light emitting elements 2150 and a transistor part connected to the light emitting element 2150.

The light emitting element 2150 may correspond to the first epitaxial stack 220. The p-type semiconductor layer of the light emitting element 2150 may be connected to the first pixel power source ELVDD via the transistor part, and the n-type semiconductor layer of the light emitting element 2150 may be connected to the second pixel power source ELVSS. The first pixel power source ELVDD and the second pixel power source ELVSS may have different electric potentials from each other. For example, the second pixel power source ELVSS may have the electric potential lower than the electric potential of the first pixel power source ELVDD by the threshold voltage of the light emitting element 2150 or more. Each of the light emitting elements 2150 emits light having a brightness corresponding to a driving current controlled by the transistor part.

According to an exemplary embodiment, the transistor part includes first and second transistors M1 and M2 and a storage capacitor Cst. However, the inventive concepts are not limited thereto, and a configuration of the transistor part may be variously modified from that shown in FIG. 25.

The first transistor M1 (e.g., switching transistor) includes a source electrode connected to the data line 2120, a drain electrode connected to a first node N1, and a gate electrode connected to the scan line $2130_R$. The first transistor M1 is turned on to electrically connect the data line 2120 and the first node N1 when the scan signal having the voltage sufficient to turn on the first transistor M1 is provided through the scan line $2130_R$. In this case, the data signal of the corresponding frame is applied to the data line 2120, and thus the data signal is applied to the first node N1. The storage capacitor Cst is charged with the data signal applied to the first node N1.

The second transistor M2 (e.g., driving transistor) includes a source electrode connected to the first pixel power source ELVDD, a drain electrode connected to the p-type semiconductor layer of the light emitting element 2150, and a gate electrode connected to the first node N1. The second transistor M2 controls the amount of the driving current supplied to the light emitting element 2150 in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1 and maintains the charged voltage until a data signal of a next frame is provided.

FIG. 25 exemplarily shows the transistor part including two transistors. However, the inventive concepts are not limited to a particular number of the transistors included in the transistor part, and the configuration of the transistor part may be changed in various ways. For example, the transistor part may include more transistors and more capacitors. In addition, FIG. 25 does not show the configurations of the first and second transistors, the storage capacitor, and the lines in detail, however, the first and second transistors, the storage capacitor, and the lines may be changed in various ways within the scope of implementing the circuit according to the exemplary embodiments.

The above-described pixel may be changed in various ways within the scope of the inventive concepts and may be implemented as the following structure.

Figure 26:
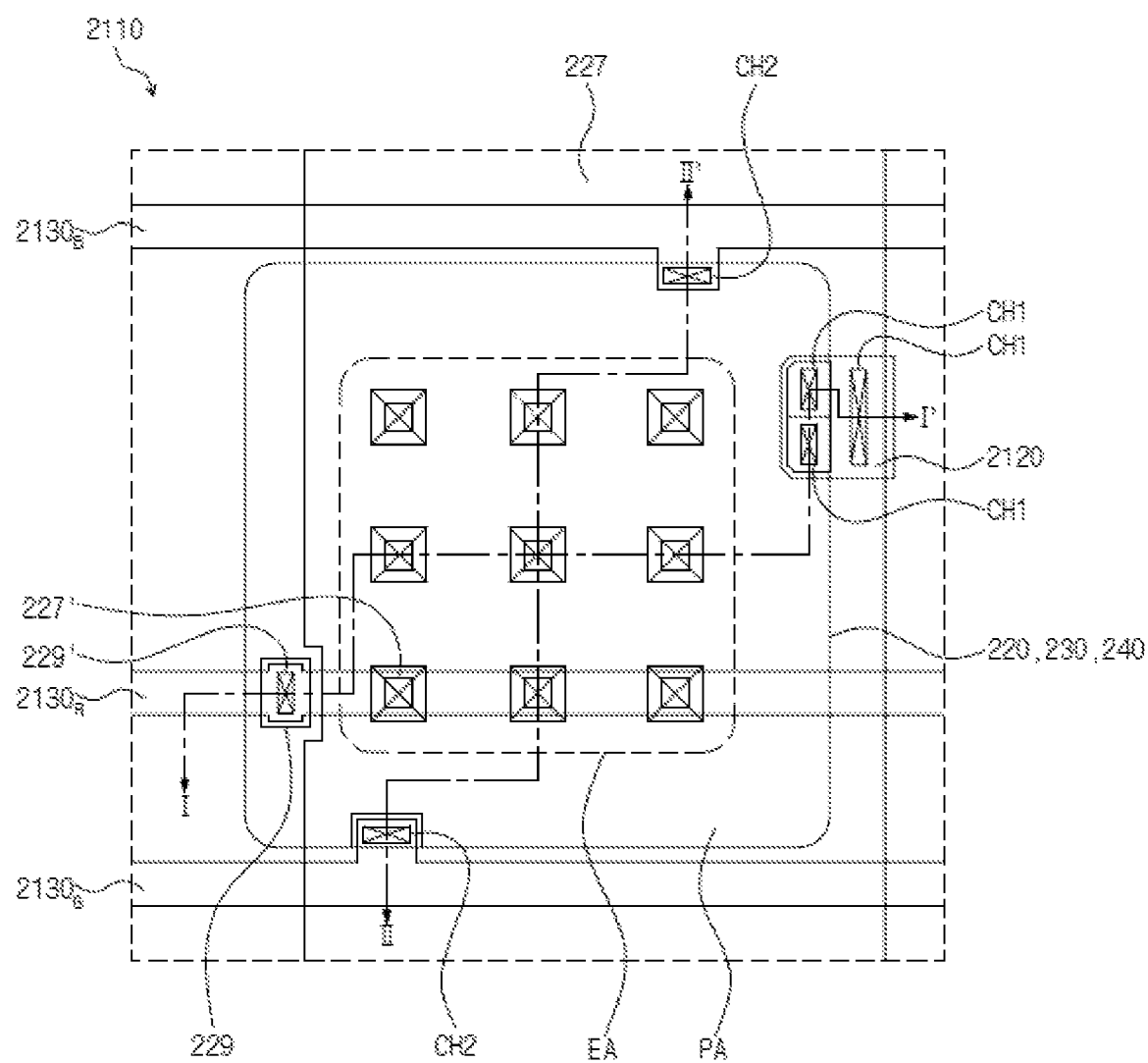
FIG. 26 is a plan view of a pixel according to an exemplary embodiment.
Figure 27A:
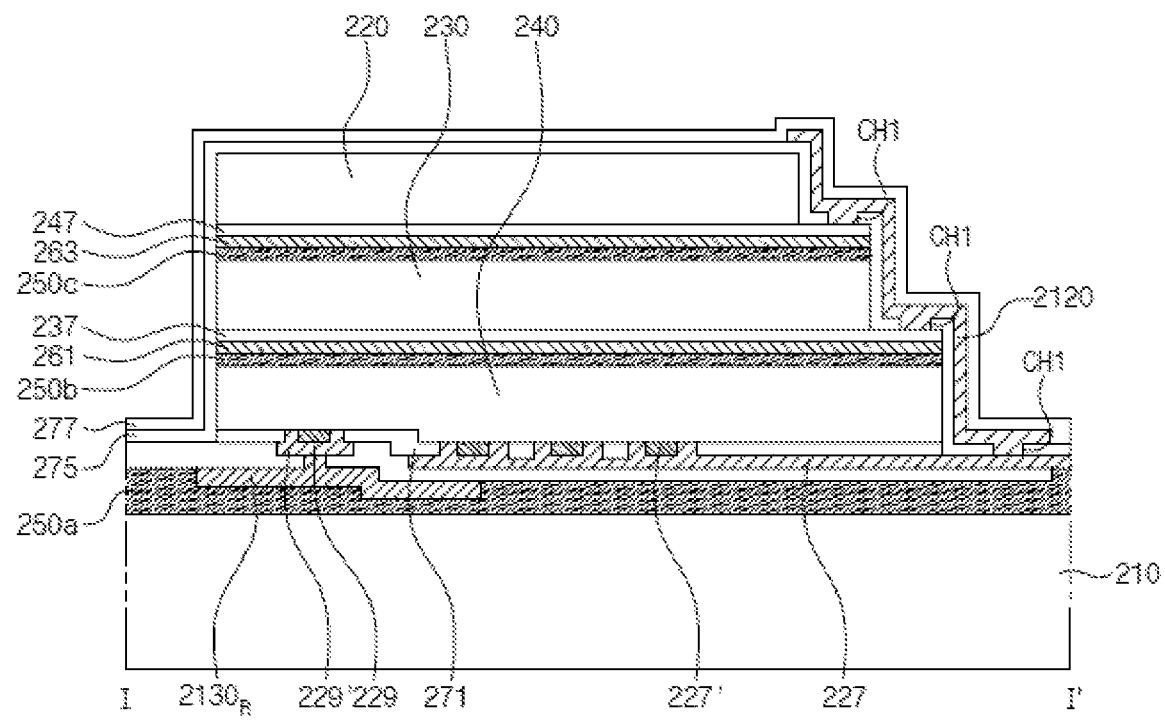
FIGS. 27A and 27B are cross-sectional views respectively taken along lines I-I' and II-II' of FIG. 26.
Figure 27B:
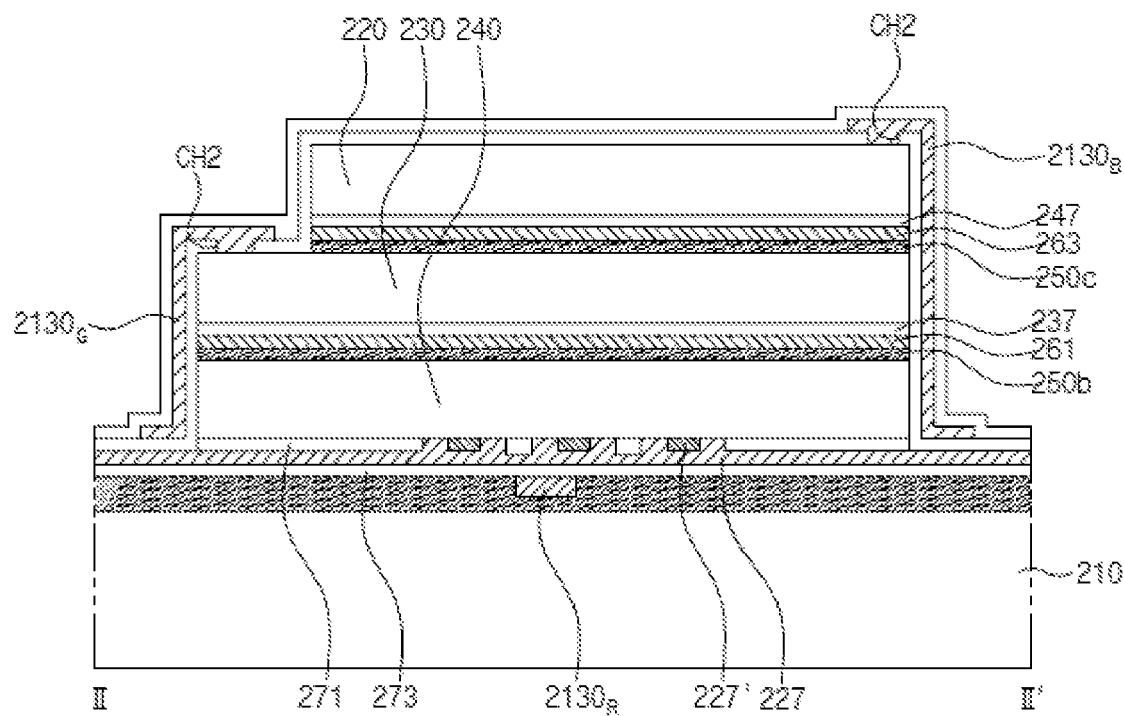

FIG. 26 is a plan view of a pixel according to an exemplary embodiment, and FIGS. 27A and 27B are cross-sectional views respectively taken along lines I-I' and II-II' of FIG. 26.

Referring to FIGS. 26, 27A, and 27B, the pixel 2110 according to an exemplary embodiment includes the light emitting area EA and the peripheral area PA. The epitaxial stacks are stacked in the light emitting area EA. In the illustrated exemplary embodiment, the epitaxial stacks include the first, second, and third epitaxial stacks 220, 230, and 240.

The first, second, and third epitaxial stacks 220, 230, and 240 are connected to the first, second, and third sub-scan lines $2130_R$, $2130_G$, and $2130_B$ and the data line 2120. The first, second, and third sub-scan lines $2130_R$, $2130_G$, and $2130_B$ may extend substantially in a first direction, e.g., a horizontal direction as shown in FIG. 26. The data line 2120 is connected to the first p-type contact electrode 227 through a first contact hole CH1, and the first p-type contact electrode 227 may substantially function as the data line 2120. Accordingly, hereinafter, the first p-type contact electrode 227 may be referred to as the data line 2120. The data line 2120 may extend substantially in a second direction, e.g., a vertical direction as shown in FIG. 26, that crosses the first, second, and third sub-scan lines $2130_R$, $2130_G$, and $2130_B$. However, the directions in which the first, second, and third sub-scan lines $2130_R$, $2130_G$, and $2130_B$ and the data line 2120 extend are not limited thereto, and may be changed in various ways depending on the arrangement of the pixels.

The first sub-scan line $2130_R$ and the data line 2120, in detail, the first p-type contact electrode 227, are connected to the first epitaxial stack 220. The data line 2120 and the second sub-scan line $2130_G$ are connected to the second epitaxial stack 230 through first and second contact holes CH1 and CH2, respectively. The data line 2120 and the third sub-scan line $2130_B$ are connected to the third epitaxial stack 240 through the first and second contact holes CH1 and CH2, respectively. In the illustrated exemplary embodiment, the first and second contact holes CH1 and CH2 are formed in the peripheral area PA.

The adhesive layer, the contact electrode, and the wavelength pass filter are disposed between the substrate 210 and the first epitaxial stack 220, between the first epitaxial stack 220 and the second epitaxial stack 230, and between the second epitaxial stack 230 and the third epitaxial stack 240. Hereinafter, the pixel 2110 according to the illustrated exemplary embodiment will be described according to the stacking order.

According to an exemplary embodiment, the first epitaxial stack 220 having a mesa structure is disposed on the substrate 210 with the first adhesive layer 250a interposed therebetween.

A first insulating layer 271 is disposed on a lower surface, i.e., a surface facing the substrate 210, of the first epitaxial stack 220. The first insulating layer 271 is provided with a plurality of contact holes defined therethrough. The first n-type contact electrode 229 that makes contact with the n-type semiconductor layer of the first epitaxial stack 220 is disposed in the contact hole corresponding to the peripheral area PA, and the first p-type contact electrode 227 that makes contact with the p-type semiconductor layer of the first epitaxial stack 220 is disposed in the contact hole corresponding to the light emitting area EA. First and second ohmic electrodes 229' and 227' may be disposed on areas, in which the first n-type contact electrode 229 and the first p-type contact electrode 227 are formed, for the ohmic contact with the first p-type contact electrode 227 and the first n-type contact electrode 229, respectively. The first and second ohmic electrodes 229' and 227' for making the ohmic contact may include various materials. In an exemplary embodiment, the second ohmic electrode 227' corresponding to a p-type ohmic electrode may include Au(Zn) or Au(Be). In this case, since the material for the second ohmic electrode 227' has a reflectivity lower than that of Ag, Al, and Au, an additional reflection electrode may be further disposed. As the material for the additional reflection electrode, Ag or Au may be used, and a layer including Ti, Ni, Cr, or Ta may be disposed as the adhesive layer to adhere adjacent components. In this case, the adhesive layer may be deposited thinly on upper and lower surfaces of the reflection electrode including Ag or Au.

The first p-type contact electrode 227 overlaps with the light emitting area EA and is provided to cover substantially the entire light emitting area EA when viewed in a plan view. The first p-type contact electrode 227 may include a material having a reflexibility to reflect light in the first epitaxial stack 220. In this case, the first insulating layer 271 may be formed to have the reflexibility, such that the reflection of light in the first epitaxial stack 220 is easily performed. For example, the first insulating layer 271 may have an omni-directional reflector (ODR) structure.

A second insulating layer 273 is disposed between the first p-type contact electrode 227 and the substrate 210. The second insulating layer 273 covers the lower surface of the first epitaxial stack 220, on which the first p-type contact electrode 227 is formed, and has a contact hole through which the first n-type contact electrode 229 is exposed. The first sub-scan line $2130_R$ is disposed between the second insulating layer 273 and the substrate 210 to apply the scan signal to the first n-type contact electrode 229.

The second adhesive layer 250b is disposed on the first epitaxial stack 220, and the first wavelength pass filter 261, the second p-type contact electrode 237, and the second epitaxial stack 230 are sequentially disposed on the second adhesive layer 250b. The second epitaxial stack 230 includes the p-type semiconductor layer, the active layer, and the n-type semiconductor layer, which are sequentially stacked in the upward direction from the bottom of the second epitaxial stack 230.

In the illustrated exemplary embodiment, the first wavelength pass filter 261 and the second p-type contact electrode 237 may have substantially the same area as the first epitaxial stack 220, and the second epitaxial stack 230 may have an area smaller than the first epitaxial stack 220. Since the second epitaxial stack 230 has a smaller area than the first epitaxial stack 220, a portion of the second p-type contact electrode 237 may be exposed.

The third adhesive layer 250c is disposed on the second epitaxial stack 230, and the second wavelength pass filter 263, the third p-type contact electrode 247, and the third epitaxial stack 240 are sequentially disposed on the third adhesive layer 250c. The third epitaxial stack 240 includes the p-type semiconductor layer, the active layer, and the n-type semiconductor layer, which are sequentially stacked in the upward direction from the bottom of the third epitaxial stack 240.

The third epitaxial stack 240 may have an area smaller than the second epitaxial stack 230. The third epitaxial stack 240 may have an area smaller than the third p-type contact electrode 247, and thus, a portion of the upper surface of the third p-type contact electrode 247 may be exposed. In addition, the third p-type contact electrode 247 may have a smaller area than the second epitaxial stack 230, and thus, a portion of the upper surface of the second epitaxial stack 230 may be exposed.

A third insulating layer 275 is disposed on the third epitaxial stack 240 to cover the stacked structure of the first, second, and third epitaxial stacks 220, 230, and 240. The third insulating layer 275 may include various organic/inorganic insulating materials, without being limited thereto. For example, the third insulating layer 275 may include an inorganic insulating material, such as silicon nitride or silicon oxide, or an organic insulating material, such as polyimide.

The third insulating layer 275 includes the first contact holes CH1 through which upper surfaces of the first, second, and third p-type contact electrodes 227, 237, and 247 are exposed, and the second contact holes CH2 through which upper surfaces of the n-type semiconductor layer of the second and third epitaxial stacks 230 and 240 are exposed.

The data line 2120 and the second and third sub-scan lines $2130_G$, and $2130_B$ are disposed on the third insulating layer 275. The data line 2120 is simultaneously connected to the first, second, and third p-type contact electrodes 227, 237, and 247 through the first contact holes CH1 formed through the third insulating layer 275. Each of the second and third sub-scan lines $2130_G$ and $2130_B$ are respectively connected to the n-type semiconductor layer of the second epitaxial stack 230 and the n-type semiconductor layer of the third epitaxial stack 240 through the second contact holes CH2.

In the illustrated exemplary embodiment, the second sub-scan line $2130_G$ may make direct contact with and may be electrically connected to the n-type semiconductor layer of the second epitaxial stack 230, and the third sub-scan line $2130_B$ may make direct contact with and may be electrically connected to the n-type semiconductor layer of the third epitaxial stack 240. However, according to another exemplary embodiment, a second n-type contact electrode may be further disposed between the second sub-scan line $2130_G$ and the n-type semiconductor layer of the second epitaxial stack 230, and the second sub-scan line $2130_G$ and the n-type semiconductor layer of the second epitaxial stack 230 may be electrically connected to each other by the second n-type contact electrode. In addition, a third n-type contact electrode may be further disposed between the third sub-scan line $2130_B$ and the n-type semiconductor layer of the third epitaxial stack 240, and the third sub-scan line $2130_B$ and the n-type semiconductor layer of the third epitaxial stack 240 may be electrically connected to each other by the third n-type contact electrode.

A fourth insulating layer 277 is disposed on the data line 2120 and the first, second, and third sub-scan lines $2130_R$, $2130_G$, and $2130_B$ to cover the data line 2120 and the first, second, and third sub-scan lines $2130_R$, $2130_G$, and $2130_B$. In addition, the fourth insulating layer 277 may include various organic/inorganic insulating materials, without being limited thereto.

In an exemplary embodiment, the concave-convex portion may be selectively disposed on the upper surfaces of the first, second, and third epitaxial stacks 220, 230, and 240, e.g., the upper surface of the n-type semiconductor layer of each of the first, second, and third epitaxial stacks 220, 230, and 240. Each concave-convex portion may be disposed only in an area corresponding to the light emitting area EA or may be disposed on substantially the entire upper surface of each n-type semiconductor layer. Accordingly, the second and third sub-scan lines $2130_G$ and $2130_B$ may make contact with and may be electrically connected to the n-type semiconductor layer on which the concave-convex portion PR is not disposed, or to the n-type semiconductor layer on which the concave-convex portion PR is disposed.

In addition, in an exemplary embodiment, a non-light transmitting layer may be further disposed on the fourth insulating layer 277 corresponding to a side surface of the pixel. The non-light transmitting layer may function as a light blocking layer to prevent light from the first, second, and third epitaxial stacks 220, 230, and 240 from exiting to the side surface of the pixel, and may include a material that absorbs or reflects light.

The non-light transmitting layer is not particularly limited as long as the non-light transmitting layer absorbs or reflects light to block the transmission of light. For example, the non-light transmitting layer may be a distributed Bragg reflector (DBR) dielectric mirror, a metal reflection layer formed on an insulating layer, or a black-colored organic polymer layer. When the metal reflection layer is used as the non-light transmitting layer, the metal reflection layer may be in a floating state, in which the metal reflection layer is electrically insulated from components of other pixels.

Due to the non-light transmitting layer disposed on the side surface of the pixel, light exiting from a specific pixel may be prevented from exerting an influence to a pixel adjacent thereto or from mixing with light exiting from the adjacent pixel.

The pixel having the above-described structure may be manufactured by sequentially stacking the first, second, and third epitaxial stacks on the substrate, and hereinafter, the pixel will be described in detail with reference to FIGS. 28 and 29A to 29L.

Figure 28:
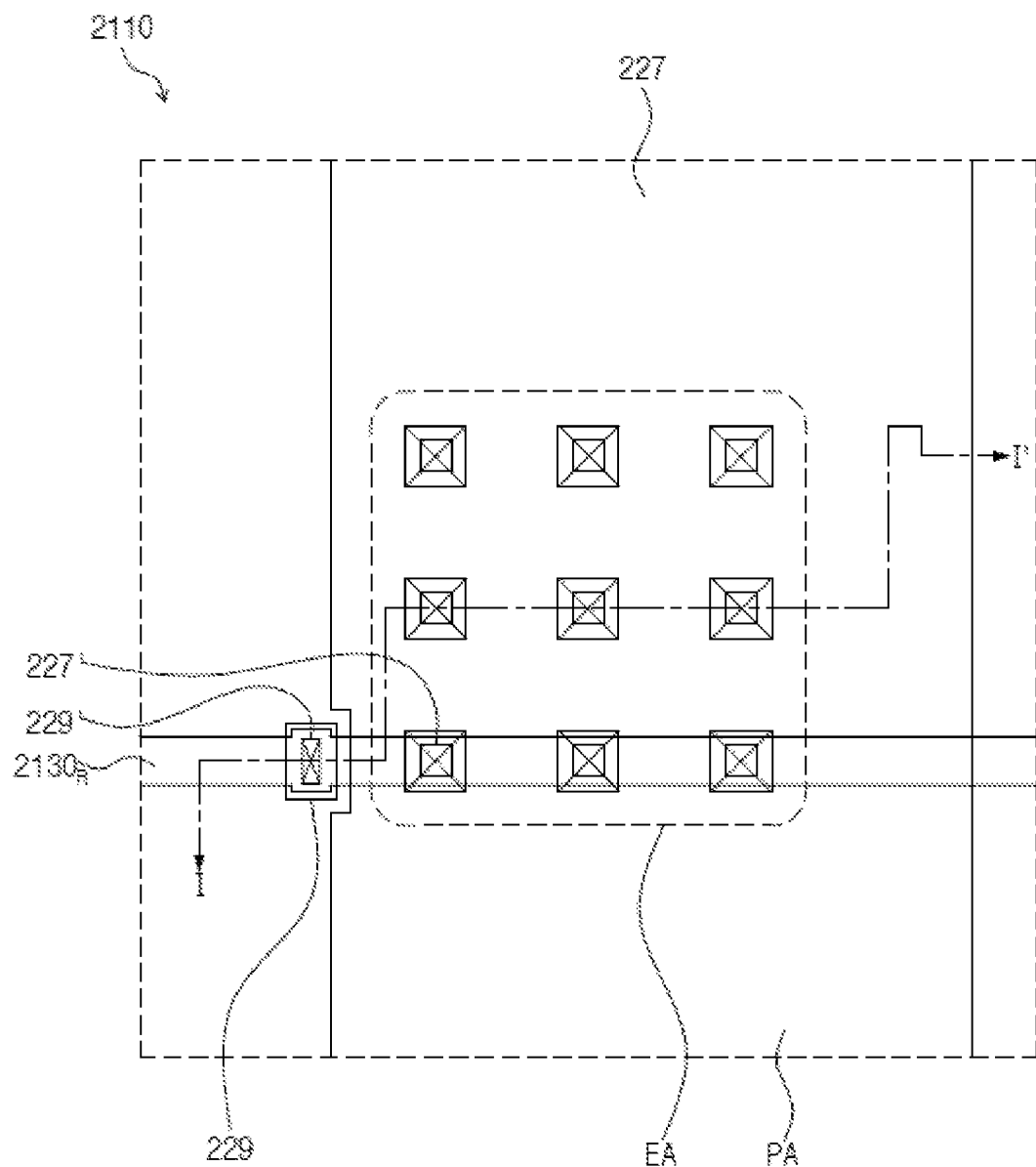
FIG. 28 is a plan view of a substrate on which first to third epitaxial stacks are stacked.

FIG. 28 is a plan view of a substrate on which first to third epitaxial stacks are stacked, and FIGS. 29A to 29L are cross-sectional views taken along line I-I' of FIG. 28, sequentially showing processes of stacking the first to third epitaxial stacks on the substrate according to an exemplary embodiment.

Figure 29A:
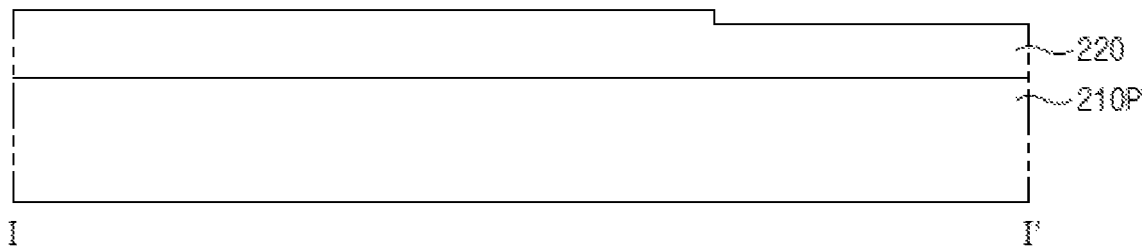
FIGS. 29A, 29B, 29C, 29D, 29E, 29F, 29G, 29H, 29I, 29J, 29K, and 29L are cross-sectional views taken along line I-I' of FIG. 28, sequentially showing processes of stacking the first to third epitaxial stacks on the substrate according to an exemplary embodiment.

Referring to FIGS. 28 and 29A, the first epitaxial stack 220 is formed on a first initial substrate 210$p$. In an exemplary embodiment, the first initial substrate 210$p$ may be made of semiconductor, e.g., a gallium arsenide (GaAs), that may be used to form the first epitaxial stack 220 thereon. The first epitaxial stack 220 is manufactured by forming the n-type semiconductor layer, the active layer, and the p-type semiconductor layer on the first initial substrate 210$p$, and removing portions of the n-type semiconductor layer, the active layer, and the p-type semiconductor layer to form a mesa structure.

Figure 29B:
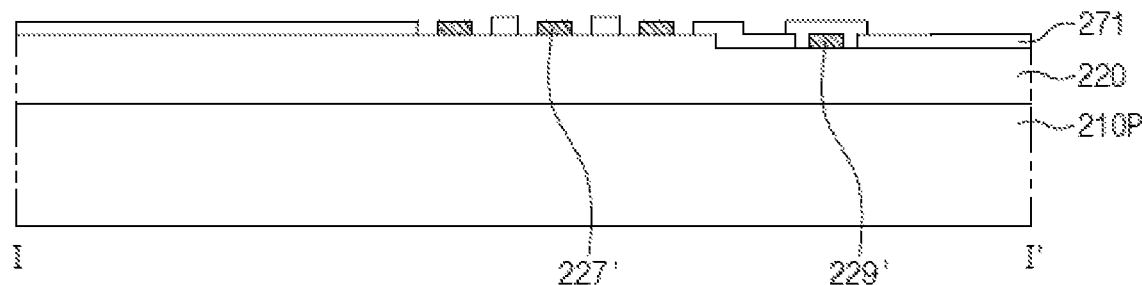

Referring to FIGS. 28 and 29B, the first insulating layer 271 is formed on the first initial substrate 210$p$, and contact holes are formed through the first insulating layer 271 to partially expose the p-type semiconductor layer and the n-type semiconductor layer. The contact hole defined above the p-type semiconductor layer may be provided in plural. The ohmic electrodes 227' and 229' may be respectively formed on the p-type semiconductor layer and the n-type semiconductor layer, which are exposed through the contact holes.

Figure 29C:
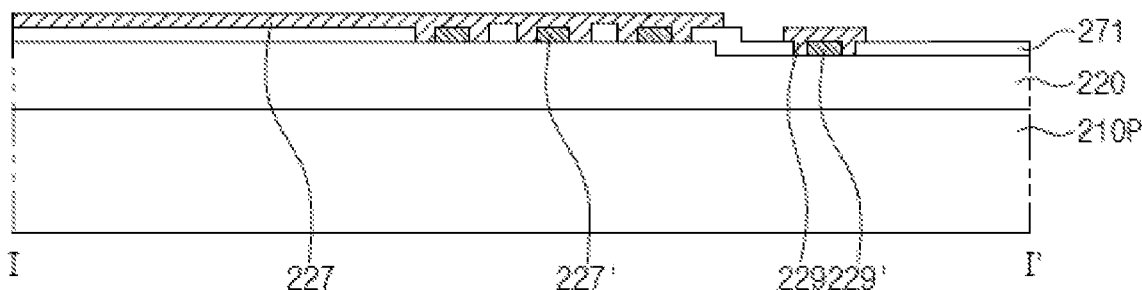

Referring to FIGS. 28 and 29C, the first n-type contact electrode 229 and the first p-type contact electrode 227 are formed on the first initial substrate 210$p$ on which the ohmic electrodes 227' and 229' are formed. The first n-type contact electrode 229 is formed on the n-type semiconductor layer, and the first p-type contact electrode 227 is formed on the p-type semiconductor layer. The first n-type contact electrode 229 and the first p-type contact electrode 227 may be formed of a reflection material.

Figure 29D:
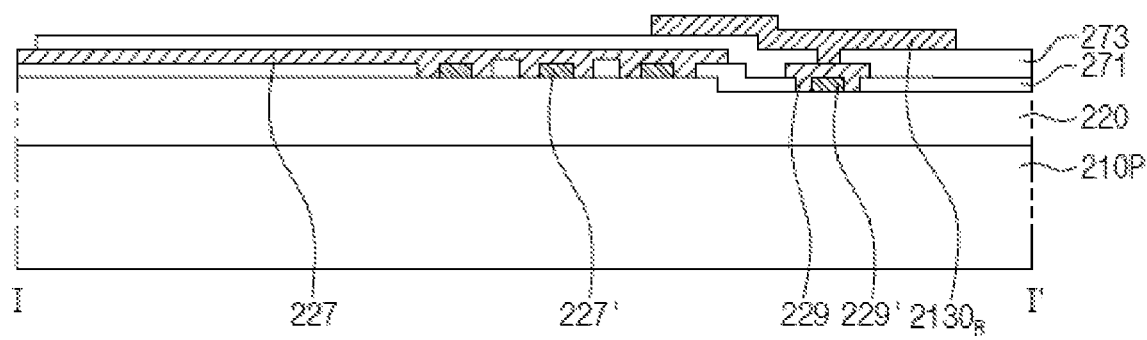

Referring to FIGS. 28 and 29D, the second insulating layer 273 is formed on the first initial substrate 210$p$ on which the first n-type contact electrode 229 and the first p-type contact electrode 227 are formed, and the first sub-scan line 2130R is formed on the second insulating layer 273. The contact hole is formed through the second insulating layer 273 at a position corresponding to the first n-type contact electrode 229, and the first sub-scan line 2130$_R$ is connected to the first n-type contact electrode 229 through the contact hole formed at the position corresponding to the first n-type contact electrode 229.

Figure 29E:
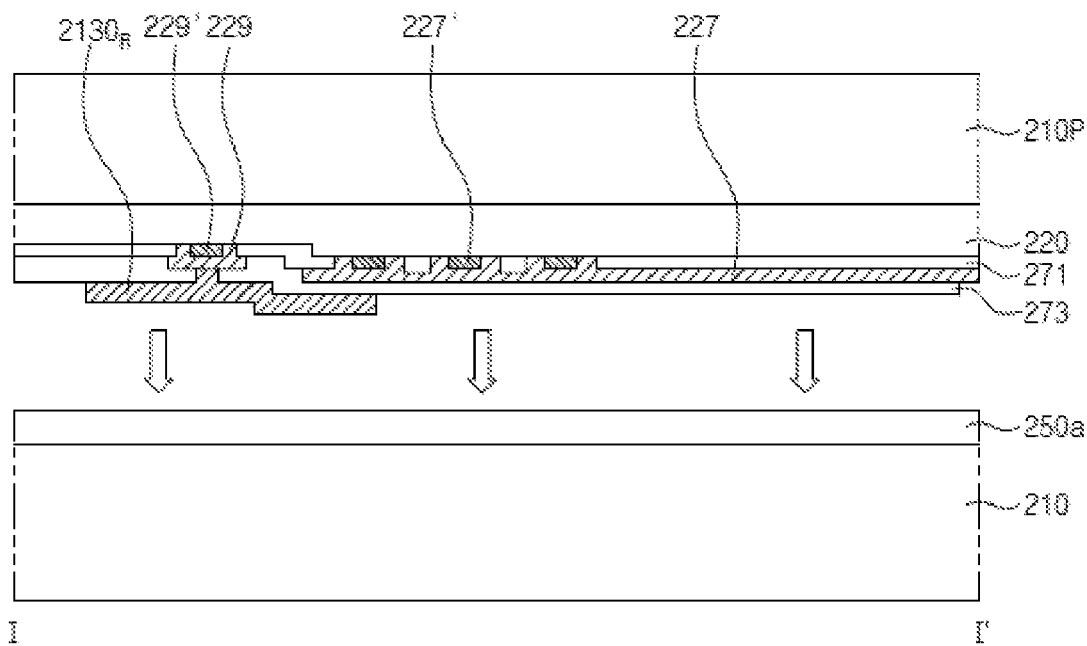

Referring to FIGS. 28 and 29E, the first epitaxial stack 220 formed on the first initial substrate 210$p$ is inversely attached to the substrate 210 with the first adhesive layer 250$a$ interposed therebetween.

Figure 29F:
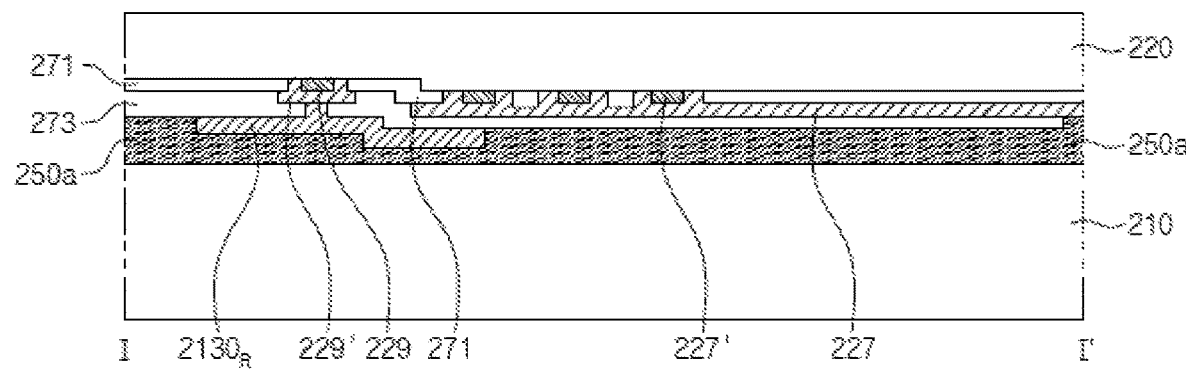

Referring to FIGS. 28 and 29F, the first initial substrate 210$p$ is removed after the first epitaxial stack 220 is attached to the substrate 210. The first initial substrate 210$p$ may be removed by various methods, such as a wet etch process, a dry etch process, a physical removal process, or a laser lift-off process. In some exemplary embodiments, after the first initial substrate 210$p$ is removed, the concave-convex portion PR may be formed on the upper surface (n-type semiconductor layer) of the first epitaxial stack 220. The concave-convex portion PR may be textured through various etching processes. For example, the concave-convex portion PR may be formed through various processes, such as a dry etch process using a microphotography, a wet etch process using crystal properties, a texturing process using a physical method such as a sandblast, an ion beam etch process, or a texturing process using an etching rate difference of block copolymer, or the like.

Figure 29G:
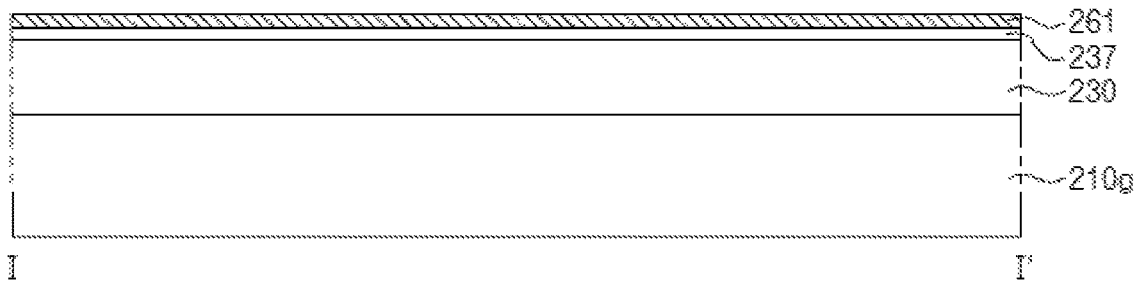

Referring to FIGS. 28 and 29G, the second epitaxial stack 230 is formed on a second initial substrate 210$g$. The second initial substrate 210$g$ may be a sapphire substrate. The second epitaxial stack 230 is manufactured by forming the n-type semiconductor layer, the active layer, and the p-type semiconductor layer on the second initial substrate 210$g$. The second p-type contact electrode 237 and the first wavelength pass filter 261 may be further formed on the second epitaxial stack 230.

Figure 29H:
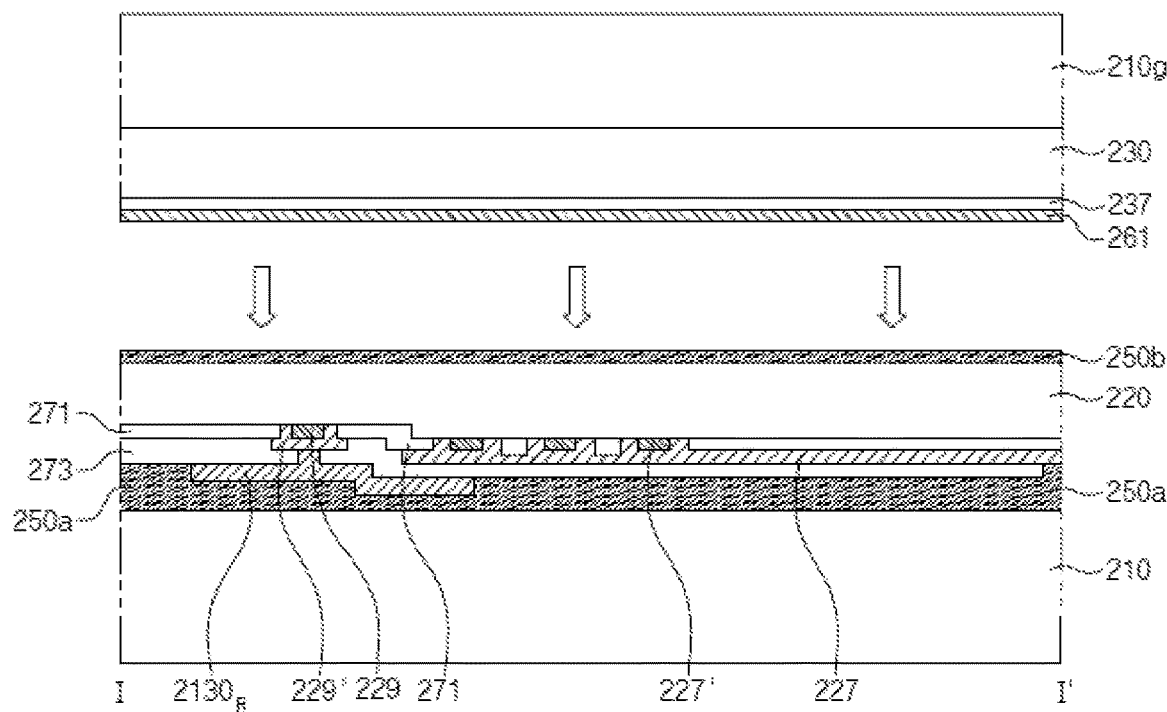

Referring to FIGS. 28 and 29H, the second epitaxial stack 230 formed on the second initial substrate 210$g$ is inversely attached to the first epitaxial stack 220 with the second adhesive layer 250$b$ interposed therebetween.

Figure 29I:
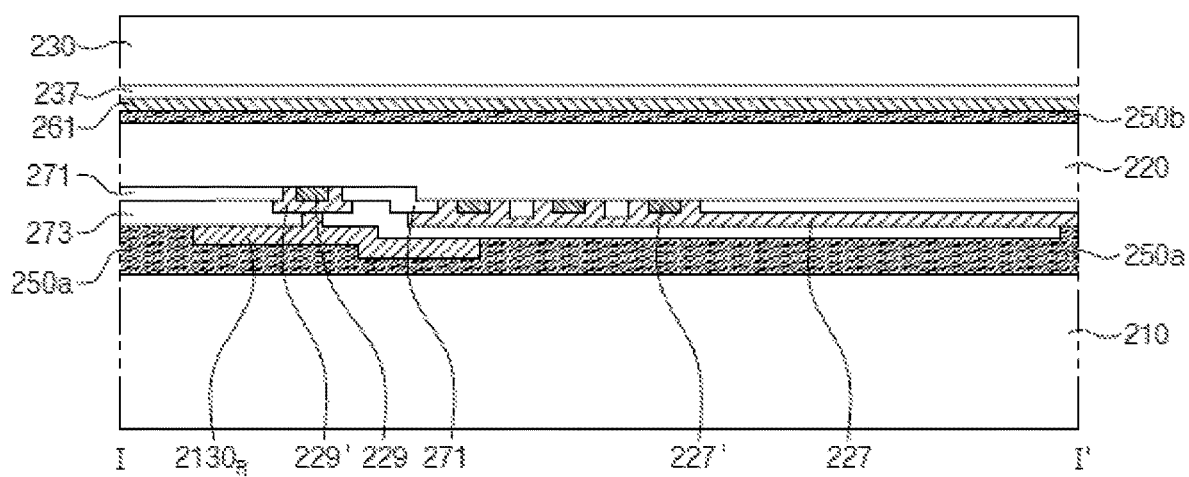

Referring to FIGS. 28 and 29I, the second initial substrate 210$g$ is removed after the second epitaxial stack 230 is attached to the first epitaxial stack 220.

In some exemplary embodiments, after the second initial substrate 210$g$ is removed, the concave-convex portion PR may be formed on the upper surface (n-type semiconductor layer) of the second epitaxial stack 230. The concave-convex portion PR may be textured through various etching processes or may be formed using the patterned sapphire substrate as the second initial substrate 210$g$. The second initial substrate 210$g$ may be removed by various methods. For example, when the second initial substrate 210$g$ is the sapphire substrate, the sapphire substrate may be removed by a laser lift-off process, a stress lift-off process, a chemical lift-off process, or a physical polishing process, or the like.

Figure 29J:
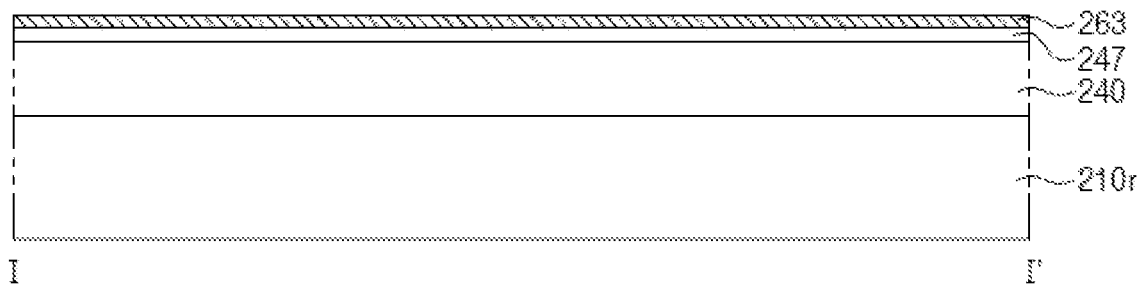

Referring to FIGS. 28 and 29J, the third epitaxial stack 240 is formed on a third initial substrate 210$r$. The third initial substrate 210$r$ may be a sapphire substrate. The third epitaxial stack 240 is manufactured by forming the n-type semiconductor layer, the active layer, and the p-type semiconductor layer on the third initial substrate 210$r$. The third p-type contact electrode 247 and the second wavelength pass filter 263 may be further formed on the third epitaxial stack 240.

Figure 29K:
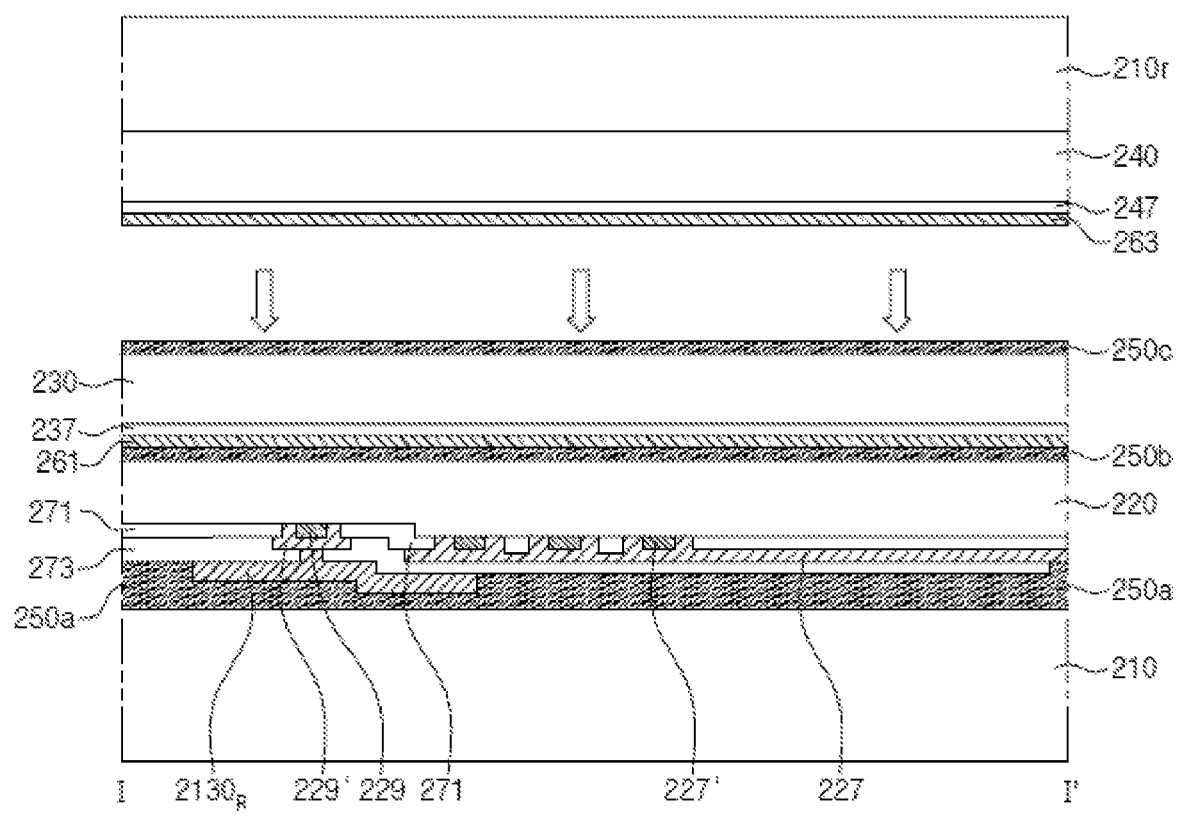

Referring to FIGS. 28 and 29K, the third epitaxial stack 240 formed on the third initial substrate 210r is inversely attached to the second epitaxial stack 230 with the third adhesive layer 250c interposed therebetween.

Figure 29L:
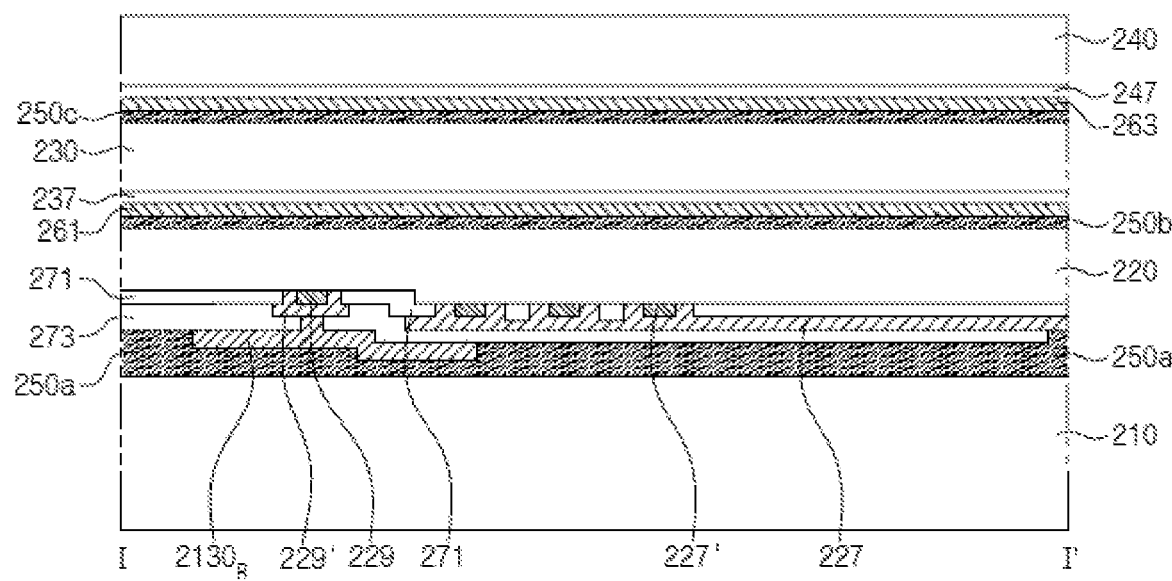

Referring to FIGS. 28 and 29L, the third initial substrate 210r is removed after the third epitaxial stack 240 is attached to the second epitaxial stack 230, and thus, the first, second, and third epitaxial stacks 220, 230, and 240 are stacked on the substrate 210. In some exemplary embodiments, after the third initial substrate 210r is removed, the concave-convex portion PR may be formed on the upper surface (n-type semiconductor layer) of the third epitaxial stack 240. The concave-convex portion PR may be textured through various etching processes or may be formed using the patterned sapphire substrate as the third initial substrate 210r.

Through the above-described processes, the first epitaxial stack 220 is connected to the first sub-scan line $2130_R$ and the data line, e.g., the first p-type contact electrode 227, however, the second and third epitaxial stacks 230 and 240 are not connected to the second and third sub-scan lines $2130_G$ and $2130_B$ and the data lines 2120. Accordingly, processes for connecting the second and third epitaxial stacks 230 and 240 to the second and third sub-scan lines $2130_G$ and $2130_B$ and the data lines 2120 are performed.

FIGS. 30A to 35A are plan views sequentially showing processes for connecting the second and third epitaxial stacks 230 and 240 to the second and third sub-scan lines $2130_G$ and $2130_B$ and the data lines 2120, and FIGS. 30B to 35B are cross-sectional views taken along lines I-I', IIa-IIa', and IIb-IIb' of FIGS. 30A to 35A, respectively.

Figure 30A:
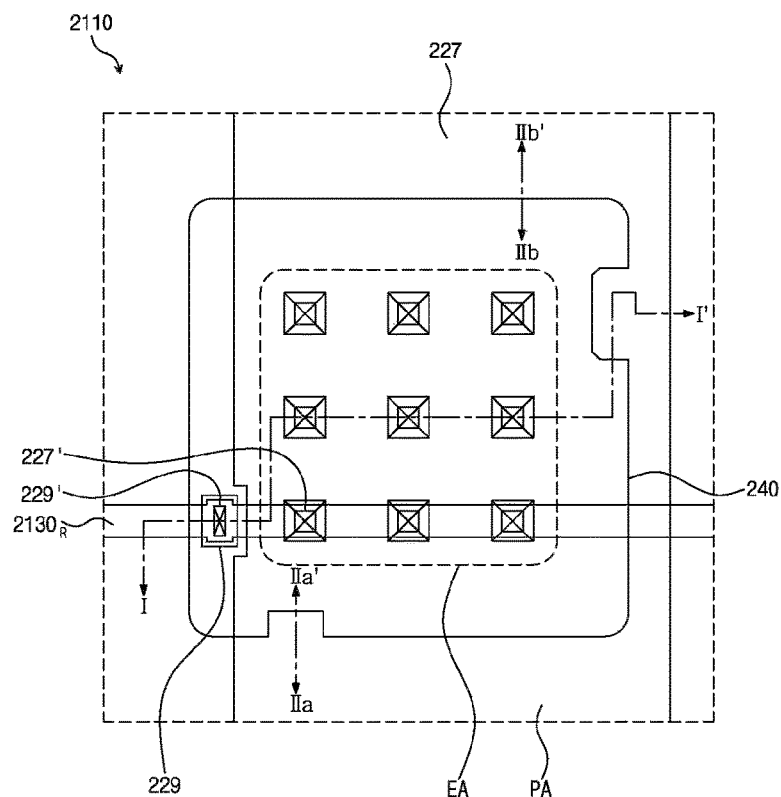
FIGS. 30A, 31A, 32A, 33A, 34A, and 35A are plan views sequentially showing processes of connecting second and third epitaxial stacks to second and third sub-scan lines and a data line.
Figure 30B:
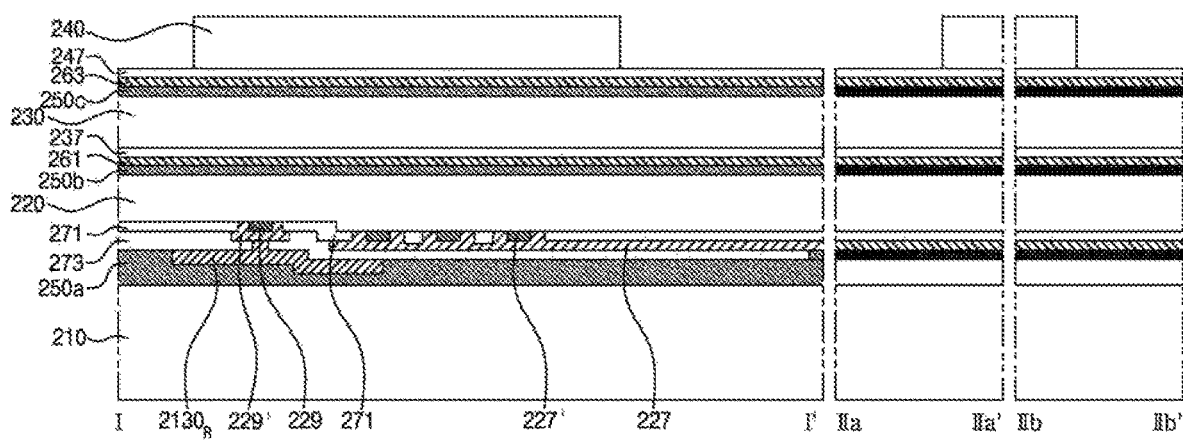
FIGS. 30B, 31B, 32B, 33B, 34B, and 35B are cross-sectional views taken along lines I-I', IIa-IIa', and IIb-IIb' of FIGS. 30A, 31A, 32A, 33A, 34A, and 35A, respectively.

Referring to FIGS. 30A and 30B, a portion of the third epitaxial stack 240 is removed such that a portion of the upper surface of the third p-type contact electrode 247 is exposed to the outside. The third p-type contact electrode 247 may function as an etch stopper when the third epitaxial stack 240 is etched.

Figure 31A:
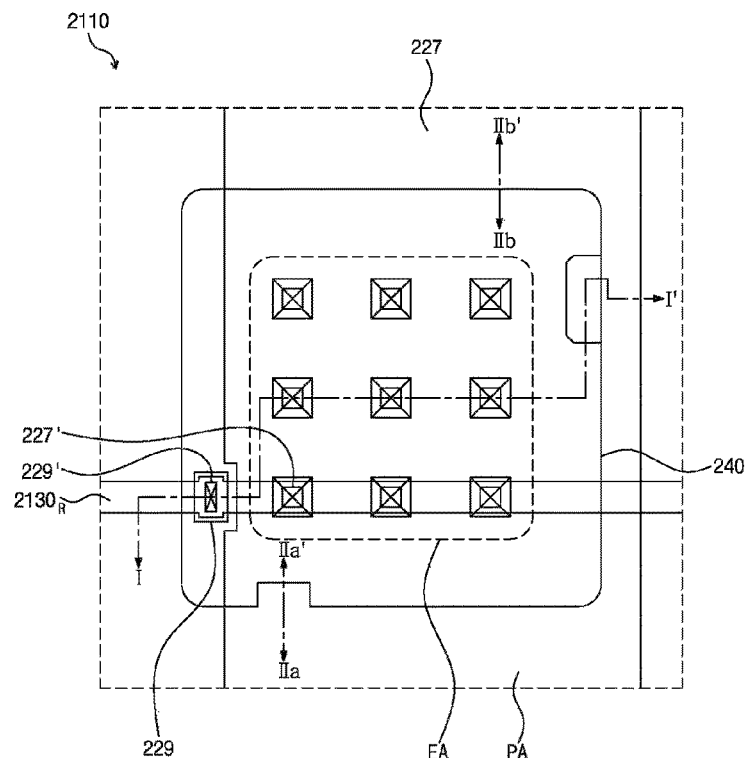
Figure 31B:
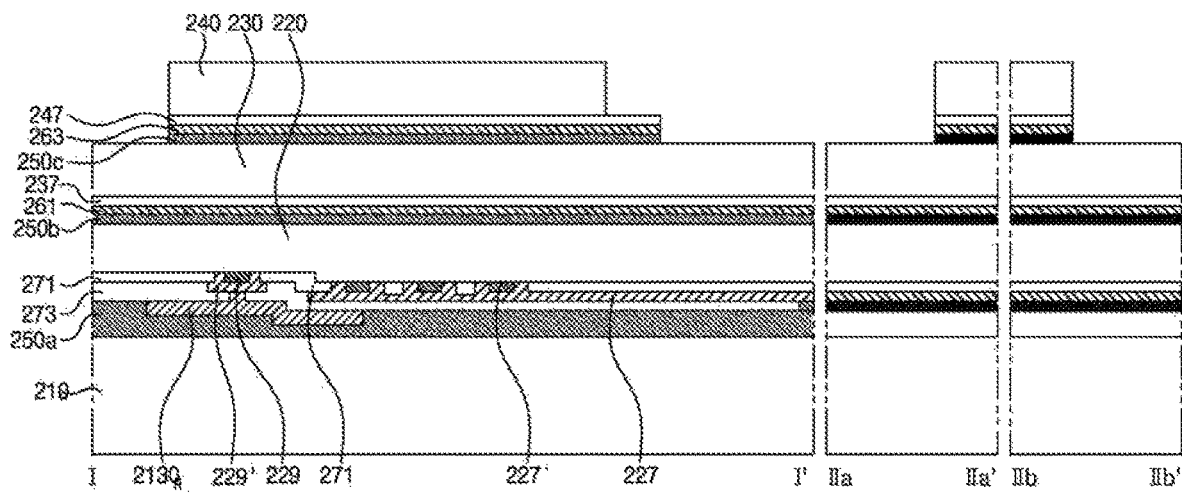

Referring to FIGS. 31A and 31B, portions of the third p-type contact electrode 247, the second wavelength pass filter 263, and the third adhesive layer 250c are etched. Accordingly, a portion of the upper surface of the second epitaxial stack 230 is exposed to the outside. In this case, contact areas to which the third p-type contact electrode 247 and the data line 2120 are to be connected are not etched.

Figure 32A:
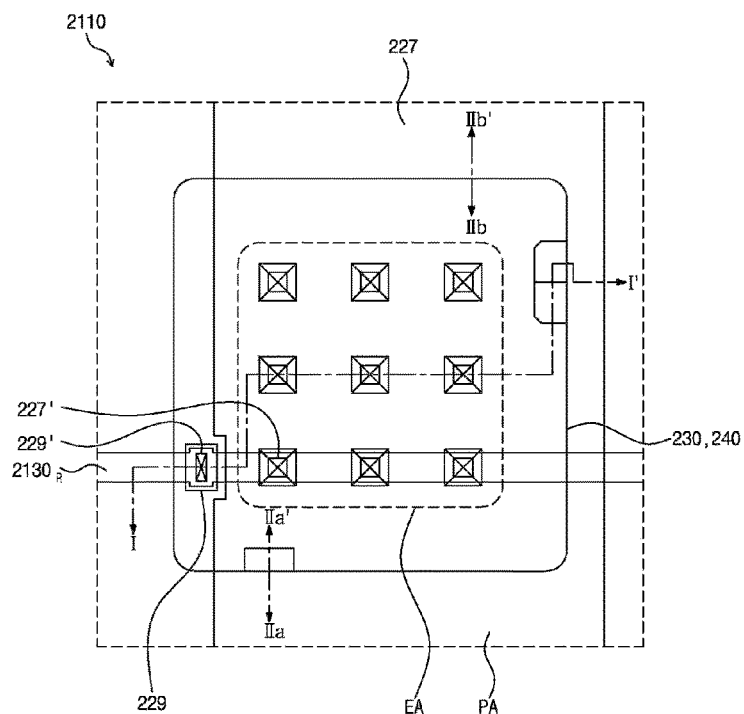
Figure 32B:
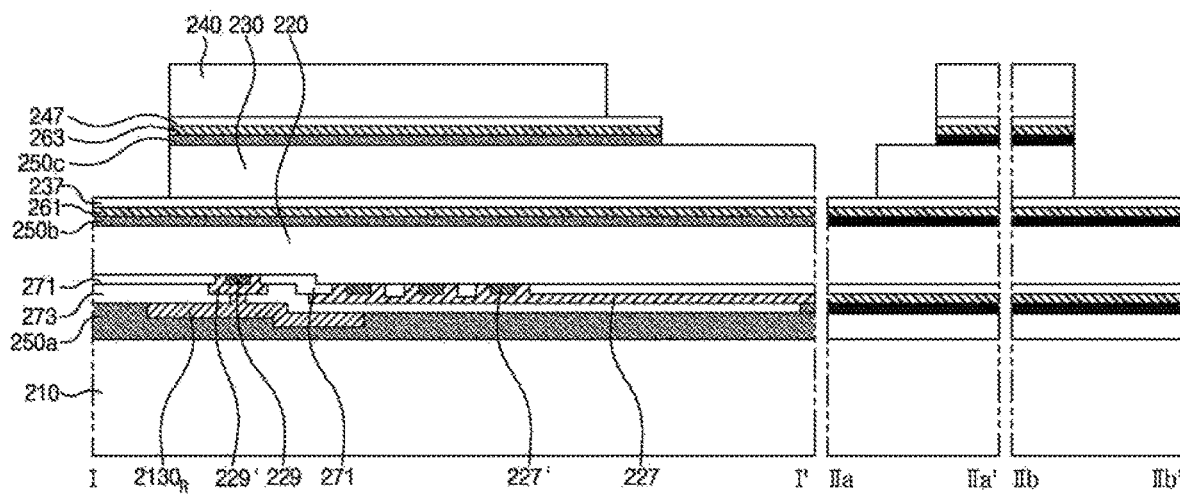

Referring to FIGS. 32A and 32B, a portion of the second epitaxial stack 230 is removed to expose a portion of the upper surface of the second p-type contact electrode 237. The second p-type contact electrode 237 may function as an etch stopper when the second epitaxial stack 230 is etched.

Figure 33A:
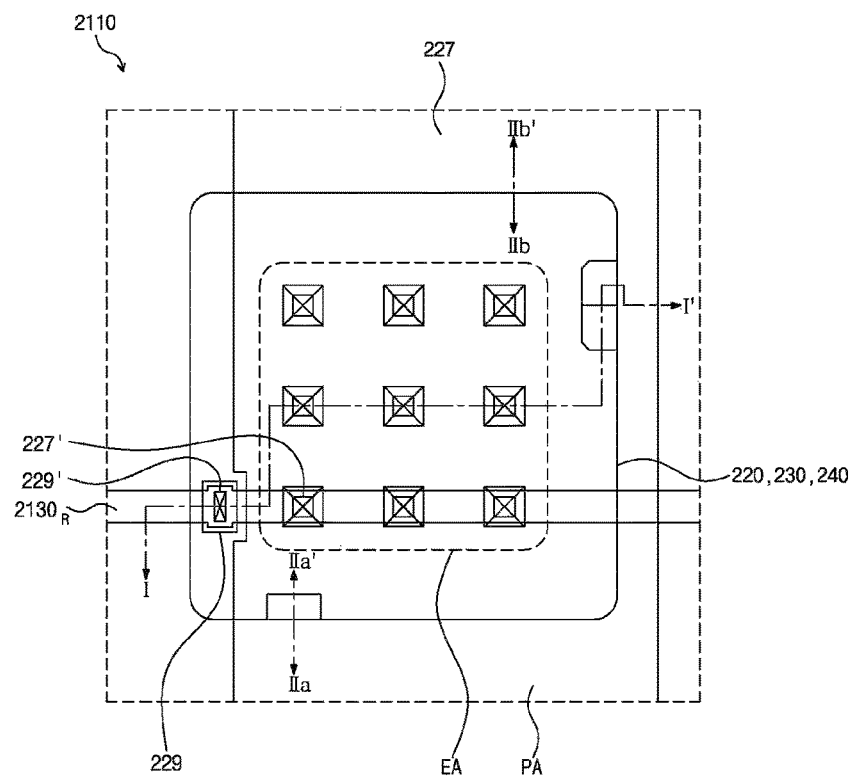
Figure 33B:
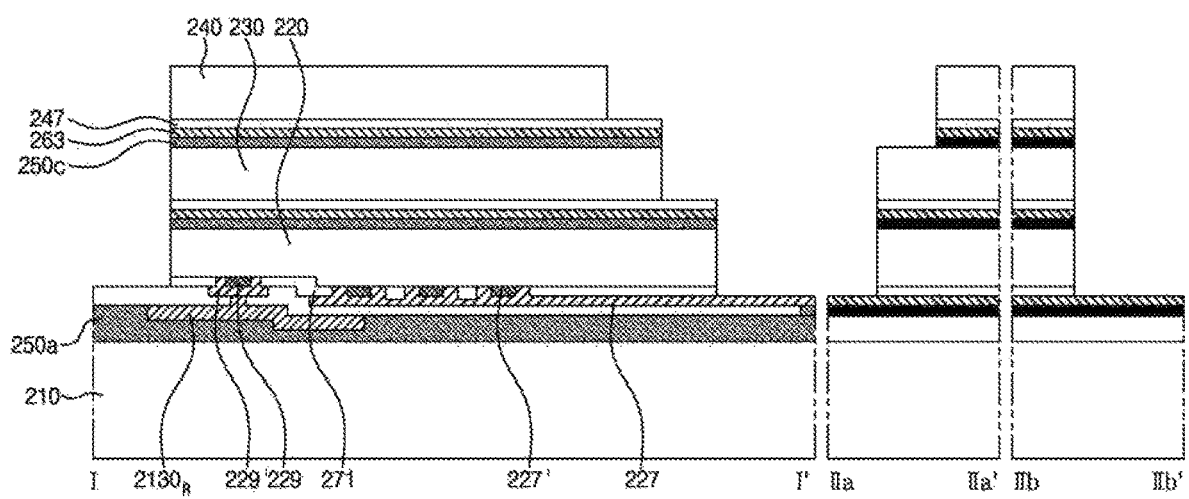

Referring to FIGS. 33A and 33B, portions of the second p-type contact electrode 237, the first wavelength pass filter 261, the second adhesive layer 250b, the first epitaxial stack 220, and the first insulating layer 271 are etched. Therefore, portions of the second insulating layer 273 and the first p-type contact electrode 227 are exposed to the outside. In this case, contact areas to which the second p-type contact electrode 237 and the data line 2120 are to be connected are not etched.

Figure 34A:
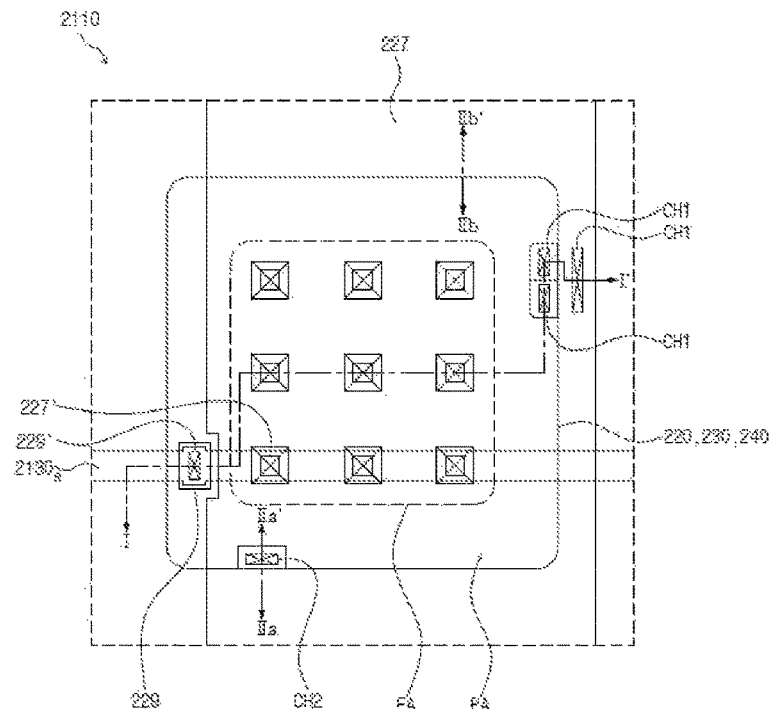
Figure 34B:
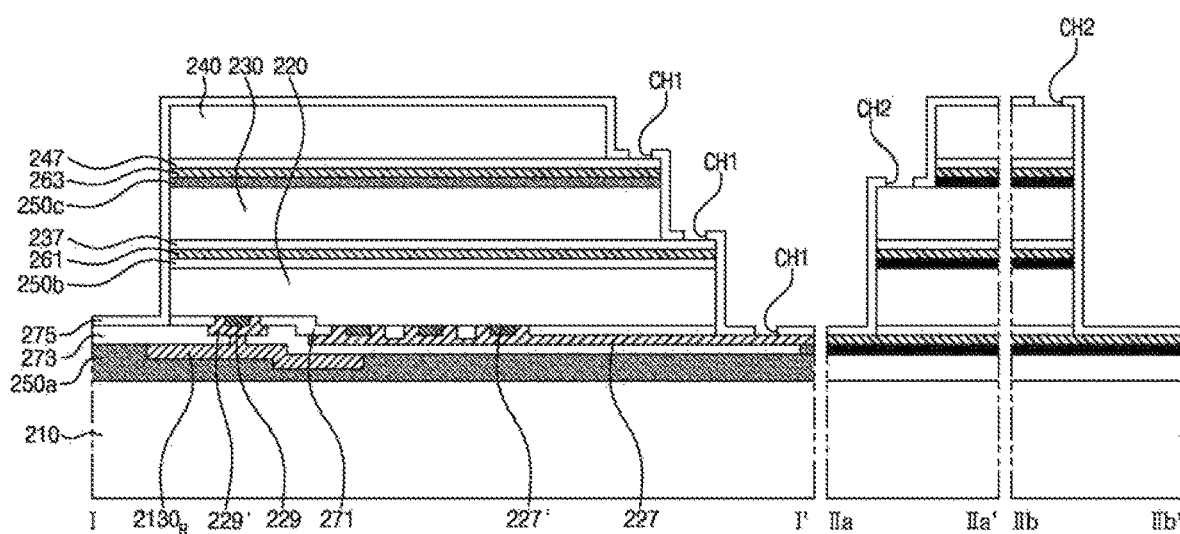

Referring to FIGS. 34A and 34B, the third insulating layer 275 through which the first and second contact holes CH1 and CH2 are formed is formed on the substrate 210. The portions to which the data line 2120 is to be connected, e.g., the portions of the upper surfaces of the first, second, and third p-type contact electrodes 227, 237, and 247, are exposed through the first contact holes CH1. The portions to which the second and third sub-scan lines $2130_G$ and $2130_B$ are to be connected, e.g., the portions of the upper surfaces of the n-type semiconductor layers of the second and third epitaxial stacks 230 and 240, are exposed through the second contact holes CH2.

Figure 35A:
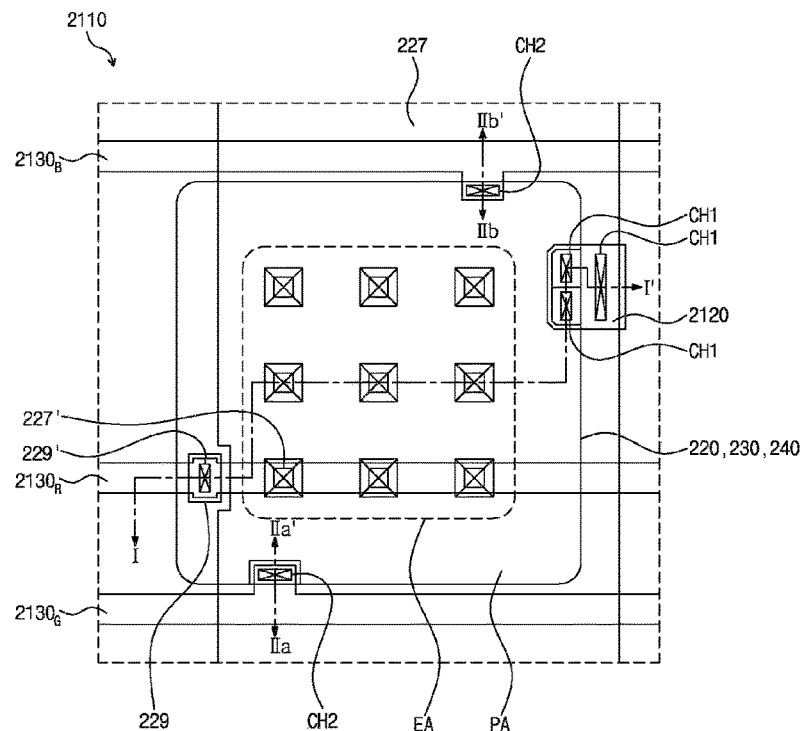
Figure 35B:
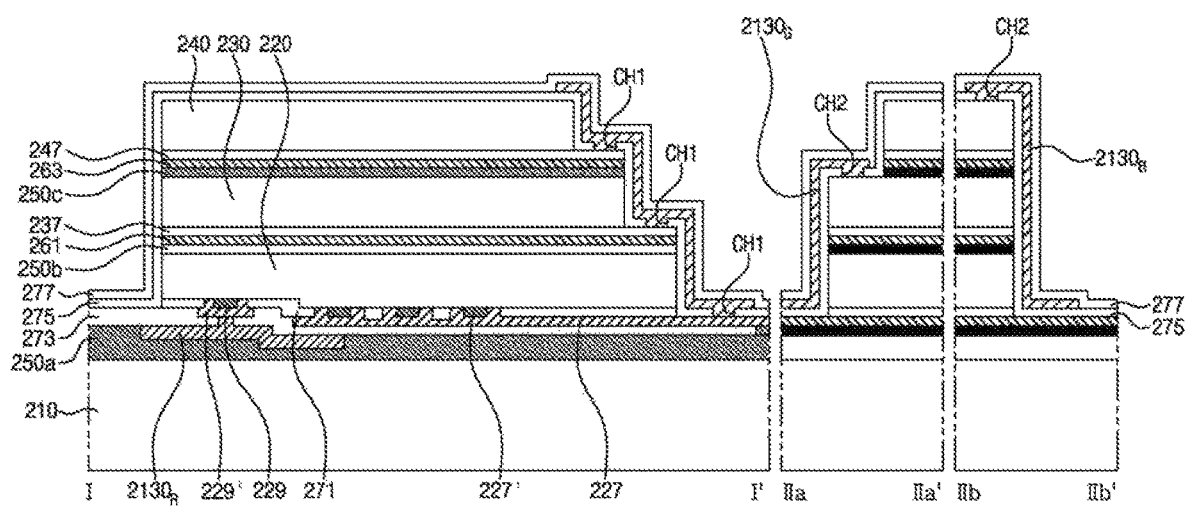

Referring to FIGS. 35A and 35B, the second and third sub-scan lines $2130_G$ and $2130_B$ and the data line 2120 are formed on the substrate 210, on which the first and second contact holes CH1 and CH2 are formed. The second and third sub-scan lines $2130_G$ and $2130_B$ and the data line 2120 may be formed by forming a metal layer on the substrate 210 and patterning the metal layer. The second and third sub-scan lines $2130_G$ and $2130_B$ are respectively connected to the second and third n-type semiconductor layers through the second contact holes CH2, and the data line 2120 is connected to the first, second, and third p-type contact electrodes 227, 237, and 247 through the first contact holes CH1.

The fourth insulating layer 277 is formed on the substrate 210 on which the second and third sub-scan lines 2130G and 2130B and the data line 2120 are formed.

In some exemplary embodiments, a non-light transmitting layer may be further disposed on the third insulating layer 275 or the fourth insulating layer 277 corresponding to the side surface of the pixel. The non-light transmitting layer may be formed by the DBR dielectric mirror, the metal reflection layer formed on the insulating layer, or the organic polymer. When the metal reflection layer is used as the non-light transmitting layer, the metal reflection layer may be in the floating state in which the metal reflection layer is electrically insulated from components of other pixels.

As described above, the display device according to the exemplary embodiments may be manufactured by sequentially stacking the plural epitaxial stacks and substantially simultaneously forming the line part and the contact structure in the epitaxial stacks.

Figure 36A:
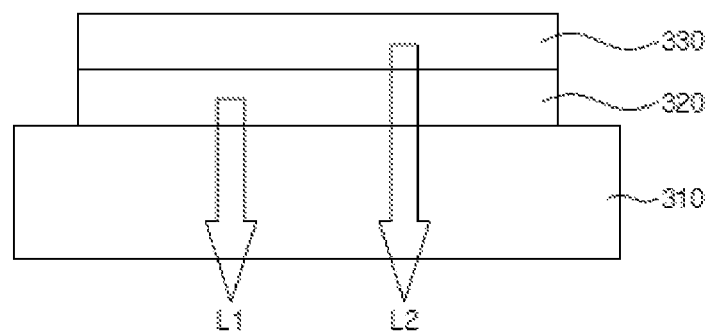
FIGS. 36A, 36B, and 36C are cross-sectional views of a light emitting stacked structure according to an exemplary embodiment.
Figure 36B:
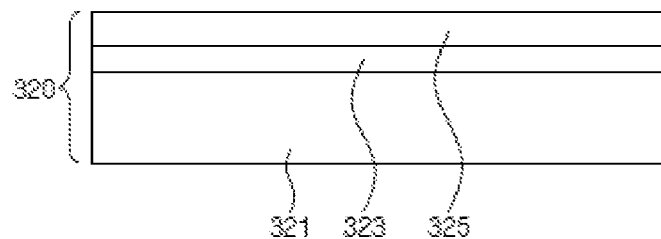
Figure 36C:
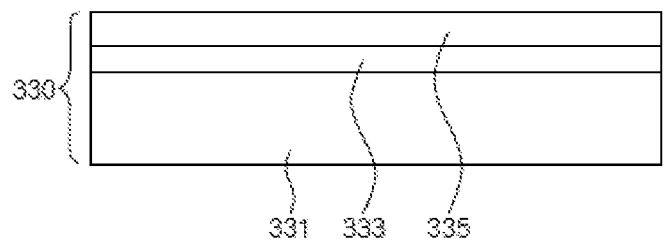

FIGS. 36A to 36C are cross-sectional views of a light emitting stacked structure according to an exemplary embodiment.

Referring to FIGS. 36A to 36C, the light emitting stacked structure according to an exemplary embodiment includes two epitaxial stacks sequentially stacked, e.g., a first epitaxial stack 320 and a second epitaxial stack 330. The first and second epitaxial stacks 320 and 330 are disposed on a substrate 310.

The substrate 310 has substantially a plate shape providing a front surface and a rear surface.

The substrate 310 may be formed of a light transmitting insulating material. As used herein, the substrate 310 having "light transmitting" property may refer that the substrate 310 is transparent to transmit substantially the entirely light, the substrate 310 is semi-transparent to transmit only light having a specific wavelength, or the substrate 310 is partially transparent to transmit only a portion of light having the specific wavelength.

As the material for the substrate 310, one of growth substrates on which the epitaxial stack disposed on the substrate 310, e.g., the first epitaxial stack 320, is grown may be used. In this case, the substrate 310 may be a sapphire substrate, however, the inventive concepts are not limited thereto. In particular, the substrate 310 may include various transparent insulating materials in addition to those forming the sapphire substrate, as long as the materials have transparent and insulating properties and are capable of forming an epitaxial stack on an upper surface of the substrate 310. For example, as the material for the substrate 310, a glass, a quartz, an organic polymer, or an organic-inorganic composite material may be used. In an exemplary embodiment, a line part may be further disposed on the substrate 310 to apply a light emitting signal and a common voltage to each of the epitaxial stacks. To this end, the substrate 310 may be provided as a printed circuit board or a composite substrate formed by forming the line part and/or a driving device on the glass, quartz, silicon, organic polymer, or organic-inorganic composite material. The first epitaxial stack 320 includes an n-type semiconductor layer 321, an active layer 323, and a p-type semiconductor layer 325, which are sequentially stacked. In the illustrated exemplary embodiment, the n-type semiconductor layer 321 and the p-type semiconductor layer 325 may have a single-layer structure, a multi-layer structure, or a superlattice layer. In addition, the active layer 323 may have a single quantum well structure or a multiple quantum well structure. The second epitaxial stack 330 also includes an n-type semiconductor layer 331, an active layer 333, and a p-type semiconductor layer 335, which are sequentially stacked. In the illustrated exemplary embodiment, the n-type semiconductor layer 331 and the p-type semiconductor layer 335 may have a single-layer structure, a multi-layer structure, or a superlattice layer. In addition, the active layer 333 may have a single quantum well structure or a multiple quantum well structure.

The n-type semiconductor layer 331, the active layer 333, and the p-type semiconductor layer 335 of the second epitaxial stack 330 may include a semiconductor material that emits red light, for example.

As the semiconductor material that emits red light, aluminum gallium arsenide (AlGaAs), gallium arsenide phosphide (GaAsP), aluminum gallium indium phosphide (AlGaInP), and gallium phosphide (GaP) may be used. However, the semiconductor material that emits red light is not limited thereto, and various other materials may be used. In some exemplary embodiments, when the semiconductor layer emits other color lights, semiconductor materials corresponding to the other color lights may be selected.

The first and second epitaxial stacks 320 and 330 are sequentially stacked on the front surface of the substrate 310, and each of the first and second epitaxial stacks 320 and 330 emits light. The first epitaxial stack 320 emits the color light having a relatively shorter wavelength and a relatively higher energy band than those of the second epitaxial stack 330, and the second epitaxial stack 330 emits the color light having a relatively longer wavelength and a relatively lower energy band than those of the first epitaxial stack 320.

In an exemplary embodiment, the first and second epitaxial stacks 320 and 330 may emit light having different wavelength bands from each other. That is, the epitaxial stack is provided in plural, and the epitaxial stacks have different energy bands from each other. Each of the epitaxial stacks may emit a color light in a visible light band among lights of various wavelength bands. For example, the first epitaxial stack 320 may emit a first color light L1, and the second epitaxial stack 330 may emit a second color light L2.

The first and second lights L1 and L2 may be different color lights from each other. The first and second color lights L1 and L2 may be the color lights having different wavelength bands from each other, which are sequentially lengthened. In an exemplary embodiment, each of the first and second color lights L1 and L2 may show a color of a predetermined wavelength band and may be selected to display white color when the first and second color lights L1 and L2 are mixed with each other. For example, the first color light L1 may be blue light, and the second color light L2 may be red light. As another example, the first color light L1 may be blue light, and the second color light L2 may be yellow light. As another example, the first color light L1 may be blue light, and the second color light L2 may be green light. When the first and second color lights L1 and L2 are mixed with each other, a mixed light of the first and second color lights L1 and L2 may have approximate white color. However, there may be differences in color temperatures and in color coordinates according to the intensity differences of the first and second color lights L1 and L2.

Hereinafter, the first color light L1 will be described as blue light, and the second color light L2 will be described as red light according to an exemplary embodiment.

Each epitaxial stack emits light to a rear surface direction of the substrate 310. The rear surface direction corresponds to an opposite direction in which the first and second epitaxial stacks 320 and 330 are stacked. Hereinafter, a direction in which the front surface of the substrate 310 faces will be referred to as a "front surface direction" or an "upward direction", and a direction in which the rear surface of the substrate 310 faces will be referred to as the "rear surface direction" or a "downward direction". However, terms of "upward" and "downward" may indicate directions relative to each other and may vary depending on an arrangement or a stacked direction of the light emitting stacked structure.

Each of the first and second epitaxial stacks 320 and 330 emits light to the downward direction. That is, the first epitaxial stack 320 emits light toward the substrate 310 disposed thereunder, and the second epitaxial stack 330 emits light toward the first epitaxial stack 320 and the substrate 310, which are disposed thereunder. In this case, the first epitaxial stack 320 transmits most of light emitted from the second epitaxial stack 330 disposed thereon. To this end, at least a portion, or substantially the entire portion of the first epitaxial stack 320 may be formed of a light transmitting material. As used herein, the term "light transmitting material" indicates not only includes a material that transmit substantially the entire light, but also a material that transmit light having a predetermined wavelength or a portion of light having the predetermined wavelength. In an exemplary embodiment, the first epitaxial stack 320 may transmit about 60% or more of the light from the second epitaxial stack 330 disposed thereon. According to another exemplary embodiment, the first epitaxial stack 320 may transmit about 80% or more of the light from the second epitaxial stack 330 disposed thereon. According to another exemplary embodiment, the first epitaxial stack 320 may transmit about 90% or more of the light from the second epitaxial stack 330 disposed thereon.

In the light emitting stacked structure having the above-described structure according to an exemplary embodiment, the first and second epitaxial stacks 320 and 330 may be independently driven since signal lines that respectively apply light emitting signals to the first and second epitaxial stacks 320 and 330 are independently connected to the first and second epitaxial stacks 320 and 330, and may display the color light and the white light having various color temperatures depending on whether each epitaxial stack emits light. In addition, since the first and second epitaxial stacks 320 and 330 that emit light having different wavelengths are formed to be overlapped with each other, the light emitting stacked structure may be formed in a narrow area.

As such, the light emitting stacked structure according to an exemplary embodiment may implement white light close to sunlight and may also emit light having various colors depending on a user's demand.

Figure 37A:
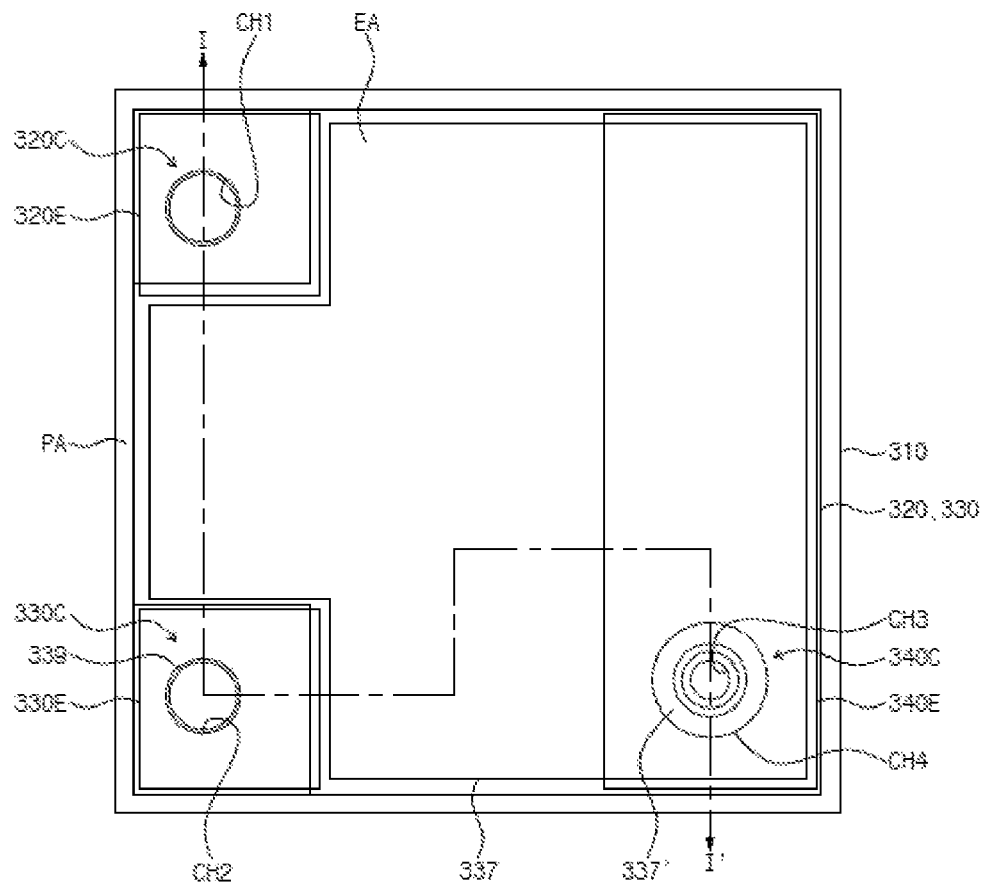
FIG. 37A is a plan view of a light emitting stacked structure according to an exemplary embodiment.

FIG. 37A is a plan view of a light emitting stacked structure according to an exemplary embodiment, and FIG.

37B is a cross-sectional view taken along line I-I' of FIG. 37A. Hereinafter, a structure of the light emitting stacked structure in a plane will be described reference to FIG. 37A, and then the structure of the light emitting stacked structure in a cross-section will be described with reference to FIG. 37B.

Figure 37B:
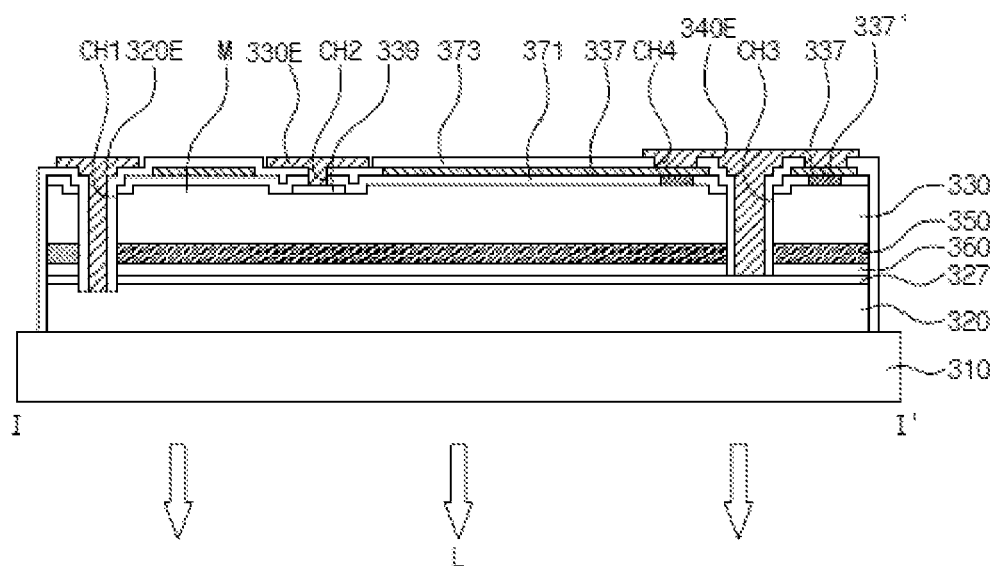
FIG. 37B is a cross-sectional view taken along line I-I' of FIG. 37A.

Referring to FIGS. 37A and 37B, the light emitting stacked structure according to an exemplary embodiment may have a substantially rectangular shape, however, the shape of the light emitting stacked structure is not limited thereto.

In an exemplary embodiment, the light emitting stacked structure includes a light emitting area EA and a peripheral area PA when viewed in a plan view. The first and second epitaxial stacks 320 and 330 are stacked in the light emitting area EA of the light emitting stacked structure. The peripheral area PA may be disposed adjacent to at least one side of the light emitting area EA. In an exemplary embodiment, the peripheral area PA is provided to surround the light emitting area EA. A contact part is disposed in the peripheral area PA to electrically connect the first and second epitaxial stacks 320 and 330 to the wirings. The contact part is an area in which a contact hole is defined through at least a portion of the first and second epitaxial stacks 320 and 330. The contact part includes first, second, and third contact parts 320C, 330C, and 340C. The first contact part 320C may supply the light emitting signal to the first epitaxial stack 320, the second contact part 330C may supply the light emitting signal to the second epitaxial stack 330, and the third contact part 340C may supply the common voltage to the first and second epitaxial stacks 320 and 330. In an exemplary embodiment, for an electrical connection to an electrode part with the wirings, a first contact hole CH1 is defined in the first contact part 320C, a second contact hole CH2 is defined in the second contact part 330C, and third and fourth contact holes CH3 and CH4 are defined in the third contact part 340C.

In the illustrated exemplary embodiment, the contact part may be disposed at a position corresponding to each corner of the substantially rectangular shape. In particular, when the light emitting stacked structure has a substantially quadrangular shape, the first contact part 320C, the second contact part 330C, and the third contact part 340C may be located at three corners among four corners of the quadrangular shape, such that the light emitting area is placed at a center portion. However, the position of the contact part is not limited thereto, and may be changed in various ways. For example, in some exemplary embodiments, the contact part may be located at a center of a side of the quadrangular shape or inside the quadrangular shape.

In the illustrated exemplary embodiment, the first and second epitaxial stacks 320 and 330 may overlap with each other when viewed in a plan view. The first and second epitaxial stacks 320 and 330 may completely overlap with each other in the light emitting area EA, but may not completely overlap with each other in the peripheral area to make contact with the electrode part.

Each of the first and second epitaxial stacks 320 and 330 includes the electrode part to apply the light emitting signal to the first and second epitaxial stacks 320 and 330.

The electrode part includes a first signal electrode 320E, a second signal electrode 330E, and a common electrode 340E.

The first signal electrode 320E, the second signal electrode 330E, and the common electrode 340E are spaced apart from each other when viewed in a plan view. The first signal electrode 320E, the second signal electrode 330E, and the common electrode 340E are disposed at positions respectively corresponding to the first contact part 320C, the second contact part 330C, and the third contact part 340C.

In this case, each of the first signal electrode 320E, the second signal electrode 330E, and the common electrode 340E may be disposed only in the peripheral area PA or may be disposed over the peripheral area PA and the light emitting area EA. Since the light emitting stacked structure according to an exemplary embodiment emits light L toward the downward direction, the first signal electrode 320E, the second signal electrode 330E, and the common electrode 340E, which are formed on the light emitting stacked structure, are not disposed on a light path, and thus, the first signal electrode 320E, the second signal electrode 330E, and the common electrode 340E may not be provided to cover the light emitting area EA. In the illustrated exemplary embodiment, the first signal electrode 320E and the second signal electrode 330E are disposed in the peripheral area PA, and the common electrode 340E has an area wider than the first and second signal electrodes 320E and 330E, and is disposed on the peripheral area PA and a portion of the light emitting area EA.

The first signal electrode 320E and the common electrode 340E are connected to the first epitaxial stack 320. The second signal electrode 330E and the common electrode 340E are connected to the second epitaxial stack 330. The first signal electrode 320E is connected to the first epitaxial stack 320 through the first contact hole CH1, and the common electrode 340E is connected to the first epitaxial stack 320 through the third contact hole CH3. The second signal electrode 330E is connected to the second epitaxial stack 330 through the second contact hole CH2, and the common electrode 340E is connected to the second epitaxial stack 330 through the fourth contact hole CH4.

Hereinafter, the light emitting stacked structure will be described according to its stacking order with reference to FIGS. 37A and 37B.

According to an exemplary embodiment, the first epitaxial stack 320 is disposed on the substrate 310.

A first p-type contact electrode 327 is disposed on the first epitaxial stack 320. In detail, the first p-type contact electrode 327 is provided to make contact with a p-type semiconductor layer of the first epitaxial stack 320. The first p-type contact electrode 327 may include a transparent conductive material, e.g., a transparent conductive oxide (TCO), and may have a thickness of about 2000 angstroms to about 2 micrometers. The transparent conductive oxide may include tin oxide (SnO), indium oxide ($InO_2$), zinc oxide (ZnO), indium tin oxide (ITO), and indium tin zinc oxide (ITZO). The transparent conductive oxide may be deposited by a chemical vapor deposition (CVD) or a physical vapor deposition (PVD) using an evaporator or a sputter, for example. The material of the first p-type contact electrode 327 is not limited thereto.

In the illustrated exemplary embodiment, a long wavelength pass filter 360 may be disposed on the first p-type contact electrode 327. The long wavelength pass filter 360 may be a component to provide the color light with high purity and high efficiency, and may be selectively employed in the light emitting stacked structure. The long wavelength pass filter 360 is used to block light having a relatively shorter wavelength traveling towards the epitaxial stack that emits light having a relatively longer wavelength.

In an exemplary embodiment, the long wavelength pass filter 360 selectively transmits light having a predetermined wavelength. The long wavelength pass filter 360 may transmit the second color light emitted from the second epitaxial stack 330 and may block or reflect light except for the second color light. Accordingly, the second color light emitted from the second epitaxial stack 330 may travel in the downward direction, and the first color light emitted from the first epitaxial stack 320 may not travel toward the second epitaxial stack 330 and may be reflected or blocked by the long wavelength pass filter 360.

The first color light has relatively shorter wavelength and relatively higher energy than the second color light. When the first color light is incident into the second epitaxial stack 330, an additional light emission may be caused in the second epitaxial stack 330 by the first color light. In the illustrated exemplary embodiment, the first color light may be prevented from being incident into the second epitaxial stack 330 by the long wavelength pass filter 360.

The long wavelength pass filter 360 may be disposed in the light emitting area EA and the peripheral area PA, however, in some exemplary embodiments, the long wavelength pass filter 360 may not be disposed in the peripheral area PA.

The second epitaxial stack 330 is disposed on the first epitaxial stack 320 on which the first p-type contact electrode 327 is disposed with an adhesive layer 350 interposed therebetween.

The adhesive layer 350 may include a non-conductive material and may include a light transmitting material. For example, the adhesive layer 350 may include an optically clear adhesive (OCA). The material for the adhesive layer 350 is not particularly limited as long as the material for the adhesive layer 350 is optically clear and stably attaches each epitaxial stack. For example, the adhesive layers 350 may include an organic material, such as an epoxy-based polymer like SU-8, various resists, parylene, poly(methyl methacrylate) (PMMA), and benzocyclobutene (BCB), and an inorganic material, such as silicon oxide, aluminum oxide, and molten glass. In addition, a conductive oxide may be used as the adhesive layer in some exemplary embodiments, and in this case, the conductive oxide may be insulated from other components. When the organic material is used as the adhesive layer, and molten glass of the inorganic materials is used as the adhesive layer, the first and second epitaxial stacks 320 and 330 are attached to each other by coating the material on an adhesive side of the first and second epitaxial stacks 320 and 330, and applying high temperature and high pressure to the material under a high vacuum state. When the inorganic material (except for the molten glass) is used as the adhesive layer, the first and second epitaxial stacks 320 and 330 are attached to each other by depositing the inorganic material on the adhesive side of the first and second epitaxial stacks 320 and 330, planarizing the inorganic material using a chemical-mechanical planarization (CMP) process, performing a plasma treatment on a surface of the inorganic material, and attaching the first and second epitaxial stacks 320 and 330 under the high vacuum state, for example.

The second epitaxial stack 330 is disposed on the adhesive layer 350.

A mesa M is formed in the second epitaxial stack 330 by removing a portion of the n-type semiconductor layer, the active layer, and the p-type semiconductor layer thereof. A portion of the semiconductor layer, such as a portion of the n-type semiconductor layer and the active layer, is removed from a portion in which the mesa M is not formed, and thus, an upper surface of the n-type semiconductor layer is exposed. An area in which the mesa M is disposed may overlap with the light emitting area EA, and an area in which the mesa M is not disposed may overlap with the peripheral area PA, particularly, with the contact part.

A second n-type contact electrode 339 is disposed on the exposed upper surface of the n-type semiconductor layer. A second p-type contact electrode 337 is disposed above the p-type semiconductor layer on which the mesa is formed with an ohmic electrode 337' and a first insulating layer 371 interposed therebetween.

The first insulating layer 371 covers an upper surface of the second epitaxial stack 330, and includes a contact hole defined therethrough to correspond to a portion at which the ohmic electrode 337' is disposed. The ohmic electrode 337' may be disposed to correspond to the area in which the third contact part 340C is disposed, and may have various shapes, for example, a substantially donut shape as shown in FIG. 37A.

The ohmic electrode 337' may be used for an ohmic contact and may include various materials. In an exemplary embodiment, the ohmic electrode 337' may include Au(Zn) or Au(Be). In this case, since the material for the ohmic electrode 337' has a reflectivity lower than that of Ag, Al, and Au, an additional reflection electrode may be further disposed. As the material for the additional reflection electrode, Ag or Au may be used, and a layer including Ti, Ni, Cr, or Ta may be disposed as the adhesive layer for adhesion to adjacent components. In this case, the adhesive layer may be deposited thinly on upper and lower surfaces of the reflection electrode including Ag or Au.

The second p-type contact electrode 337 is disposed on the first insulating layer 371. The second p-type contact electrode 337 may overlap with the light emitting area EA and may be provided to cover substantially the entire light emitting area EA when viewed in a plan view. The second p-type contact electrode 337 may include a material having a reflexibility to reflect light from the second epitaxial stack 330 to the downward direction. As the material having the reflexibility for the second p-type contact electrode 337, various reflective metals, e.g., Ag, Al, and Au, may be used, and a layer including Ti, Ni, Cr, or Ta may be disposed as the adhesive layer for adhesion to adjacent components.

In particular, when the second epitaxial stack 330 emits red light, the second p-type contact electrode 337 may include a material having high reflectivity in the wavelength band of the red light. For example, the second p-type contact electrode 337 may include "Au" having high reflectivity in the wavelength band of red light, and in this case, since "Au" absorbs blue light that may be leaked from a bottom of the second p-type contact electrode 337, a color interference may be reduced or prevented.

In an exemplary embodiment, the first insulating layer 371 may be formed to have reflexibility, such that the reflection of light from the second epitaxial stack 330 is easily performed. For example, the first insulating layer 371 may have an omni-directional reflector (ODR) structure.

A second insulating layer 373 is disposed above the first insulating layer 371 on which the second p-type contact electrode 337 is disposed. The second insulating layer 373 covers the upper surface of the second epitaxial stack 330 and a side surface of each component disposed under the second insulating layer 373.

In an exemplary embodiment, the second insulating layer 373 may also have reflexibility. In addition, in some exemplary embodiments, a non-light transmitting layer may be further disposed on a side portion of the second insulating layer 373 corresponding to the side surface of the light emitting stacked structure. The non-light transmitting layer may function as a light blocking layer to prevent light from the first and second epitaxial stacks 320 and 330 from exiting through the side surface of the light emitting stacked structure, and may include a material that absorbs or reflects light.

The non-light transmitting layer is not particularly limited as long as the non-light transmitting layer absorbs or reflects light to block the transmission of light. In an exemplary embodiment, the non-light transmitting layer may be a distributed Bragg reflector (DBR) dielectric mirror, a metal reflection layer formed on an insulating layer, or a black-colored organic polymer layer. When the metal reflection layer is used as the non-light transmitting layer, the metal reflection layer may be in a floating state, in which the metal reflection layer is electrically insulated from components of other light emitting stacked structure.

Due to the non-light transmitting layer disposed on the side surface of the light emitting stacked structure, light exiting from a specific light emitting stacked structure may be prevented from exerting an influence to a light emitting stacked structure adjacent thereto or from mixing with light exiting from the adjacent light emitting stacked structure.

The first and second signal electrodes 320E and 330E and the common electrode 340E are disposed on the second insulating layer 373. The first and second signal electrodes 320E and 330E and the common electrode 340E may have a single or multi-layer metal. For example, the first and second signal electrodes 320E and 330E and the common electrode 340E may include various materials including a metal of Al, Ti, Cr, Ni, Au, Ag, Sn, W, and Cu or an alloy thereof.

The first and second signal electrodes 320E and 330E and the common electrode 340E are respectively connected to corresponding components through the first, second, third, and fourth contact holes CH1, CH2, CH3, and CH4 defined thereunder.

The first signal electrode 320E is connected to the n-type semiconductor layer of the first epitaxial stack 320 through the first contact hole CH1. The first contact hole CH1 is defined by penetrating portions of the second insulating layer 373, the first insulating layer 371, the second epitaxial stack 330, the adhesive layer 350, the long wavelength pass filter 360, the first p-type contact electrode 327, and the first epitaxial stack 320 from the above. In particular, since the portions of the p-type semiconductor layer and the active layer of the first epitaxial stack 320 are removed, and the upper surface of the n-type semiconductor layer of the first epitaxial stack 320 is exposed, the first signal electrode 320E is connected to the n-type semiconductor layer of the first epitaxial stack 320 through the first contact hole CH1.

The second signal electrode 330E is connected to the n-type semiconductor layer of the second epitaxial stack 330 through the second contact hole CH2. The second contact hole CH2 is defined by penetrating portions of the second insulating layer 373 and the first insulating layer 371 from the above. Accordingly, the upper surface of the n-type semiconductor layer of the second epitaxial stack 330 is exposed through the second contact hole CH2, and the second signal electrode 330E is connected to the n-type semiconductor layer of the second epitaxial stack 330 through the second contact hole CH2.

The common electrode 340E is connected to the first p-type contact electrode 327 of the first epitaxial stack 320 through the third contact hole CH3. The third contact hole CH3 is defined by penetrating portions of the second insulating layer 373, the first insulating layer 371, the second epitaxial stack 330, the adhesive layer 350, and the long wavelength pass filter 360 from the above. Accordingly, the upper surface of the first p-type contact electrode 327 is exposed, and the common electrode 340E is connected to the first p-type contact electrode 327 through the third contact hole CH3.

In addition, the common electrode 340E is connected to the second p-type contact electrode 337 of the second epitaxial stack 330 through the fourth contact hole CH4. The fourth contact hole CH4 is defined by penetrating portion of the second insulating layer 373. Accordingly, the upper surface of the second p-type contact electrode 337 is exposed, and the common electrode 340E is connected to the second p-type contact electrode 337 through the fourth contact hole CH4.

The light emitting stacked structure having the above structure emits light to the downward direction using the light emission from the first and second epitaxial stacks 320 and 330. In this case, separated driving signals may be applied to the first and second epitaxial stacks 320 and 330 through the first and second signal electrodes 320E and 330E, and thus, the light emissions of the first and second epitaxial stacks 320 and 330 may be independently controlled. In particular, whether the first epitaxial stack 320 emits light or not may be determined by the light emitting signal and the common voltage applied to the first epitaxial stack 320 respectively through the first signal electrode 320E and the common electrode 340E. In addition, whether the second epitaxial stack 330 emits light or not may be determined by the light emitting signal and the common voltage applied to the second epitaxial stack 330 respectively through the second signal electrode 330E and the common electrode 340E. As such, the light emissions of the first epitaxial stack 320 and the second epitaxial stack 330 may be controlled individually depending on a signal applied onto the first signal electrode 320E and a signal applied onto the second signal electrode 330E.

In the illustrated exemplary embodiment, the common voltage is described as being applied to the p-type semiconductor layer of the first and second epitaxial stacks 320 and 330, and the light emitting signal is described as being applied to the n-type semiconductor layer of the first and second epitaxial stacks 320 and 330. However, the inventive concepts are not limited thereto. According to another exemplary embodiment, the common voltage may be applied to the n-type semiconductor layer of the first and second epitaxial stacks 320 and 330, and the light emitting signal may be applied to the p-type semiconductor layer of the first and second epitaxial stacks 320 and 330. This structure may be implemented by arranging components of each epitaxial stack in the reversed order of the p-type semiconductor layer, the active layer, and the n-type semiconductor layer, as compared to those of the illustrated exemplary embodiment, which has the stacked sequence of the n-type semiconductor layer, the active layer, and the p-type semiconductor layer.

Accordingly, the light emitting stacked structure according to exemplary embodiments may provide white light having different color temperatures depending on each operation mode by individually driving the first and second epitaxial stacks. In particular, since the current applied to the first and second epitaxial stacks is individually controlled, the color temperature may be finely controlled. Therefore, when the light emitting stacked structure according to an exemplary embodiment is applied to the lighting device, light may be controlled according to a user's sensibility. In addition, white light may be generated by mixing the color lights with each other in various ways using lights from the first and second epitaxial stacks, and thus, white light having a high color rendering index and a wide correlated color temperature may be implemented.

In addition, when displaying the colors, the light emitting stacked structure having the above-described structure provides different color lights through areas overlapped with each other, rather than providing the different color lights through different areas on a plane, and thus, a light emitting element may be formed to have a reduced size which may facilitate integration. For example, conventional light emitting elements that emit different color lights, e.g., red and blue lights, are generally disposed to be spaced apart from each other on a plane to implement white light. Accordingly, an area occupied by the conventional light emitting elements is relatively large since light emitting elements are disposed to be spaced apart from each other on the plane. On the other hand, the light emitting elements according to exemplary embodiments that emit the different color lights are disposed in the same area to overlap with each other by forming the light emitting stacked structure, and thus, white light may be implemented through an area that is significantly smaller than that of the conventional light emitting elements. Therefore, a display device including the light emitting stacked structure according to an exemplary embodiment may be manufactured to have a high resolution in a small area.

Further, even when a conventional light emitting element was to be manufactured in a stacked manner, the conventional light emitting element is manufactured by individually forming a contact part in each light emitting element, e.g., by forming light emitting elements individually and separately connecting the light emitting elements to each other using a wiring. As such, the structure of the light emitting device may become complex, as well as increasing manufacturing complexity of the light emitting device. However, the light emitting stacked structure according to the exemplary embodiments is manufactured by sequentially stacking plural epitaxial stacks on one substrate, and connecting the line part to the epitaxial stacks through a minimal process, and thus, the structure and the manufacturing method of the light emitting stacked structure may be simplified.

The light emitting stacked structure having the above-described structure may be manufactured by sequentially stacking the first and second epitaxial stacks on the substrate, which will be described in more detail below. The light emitting stacked structure according to an exemplary embodiment may be manufactured individually, or a plurality of light emitting stacked structures may be substantially simultaneously formed using a substrate having wide area. In this case, a recess portion may be formed to electrically and physically separate adjacent light emitting stacked structures from each other, and each light emitting stacked structure may be separated as a single light emitting stacked structure by cutting away a portion that corresponds to the recess portion in a final process.

In the following exemplary embodiments, one light emitting stacked structure is exemplarily shown. When the plural light emitting stacked structures are formed, a portion corresponding to an outermost line shown in the drawings corresponds to an edge of the substrate and to a boundary between adjacent light emitting stacked structures.

FIGS. 38A, 39A, 40A, 41A, 42A, and 43A are plan views sequentially showing a manufacturing method of a light emitting stacked structure according to an exemplary embodiment, and FIGS. 38B, 39B, 40B to 40G, 41B to 41D, 42B, and 43B are cross-sectional views respectively taken along lines I-I of FIGS. 38A, 39A, 40A, 41A, 42A, and 43A.

The light emitting stacked structure according to an exemplary embodiment may be manufactured by forming the first epitaxial stack 320 on the substrate 310, forming the second epitaxial stack 330 on a separate temporary substrate, forming the second epitaxial stack 330 on the first epitaxial stack 320, and forming the electrode part that connects the first and second epitaxial stacks 320 and 330. Hereinafter, the manufacturing of the light emitting stacked structure will be described in the order of forming the second epitaxial stack 330 on the temporary substrate and forming the second epitaxial stack 330 on the first epitaxial stack 320.

Figure 38A:
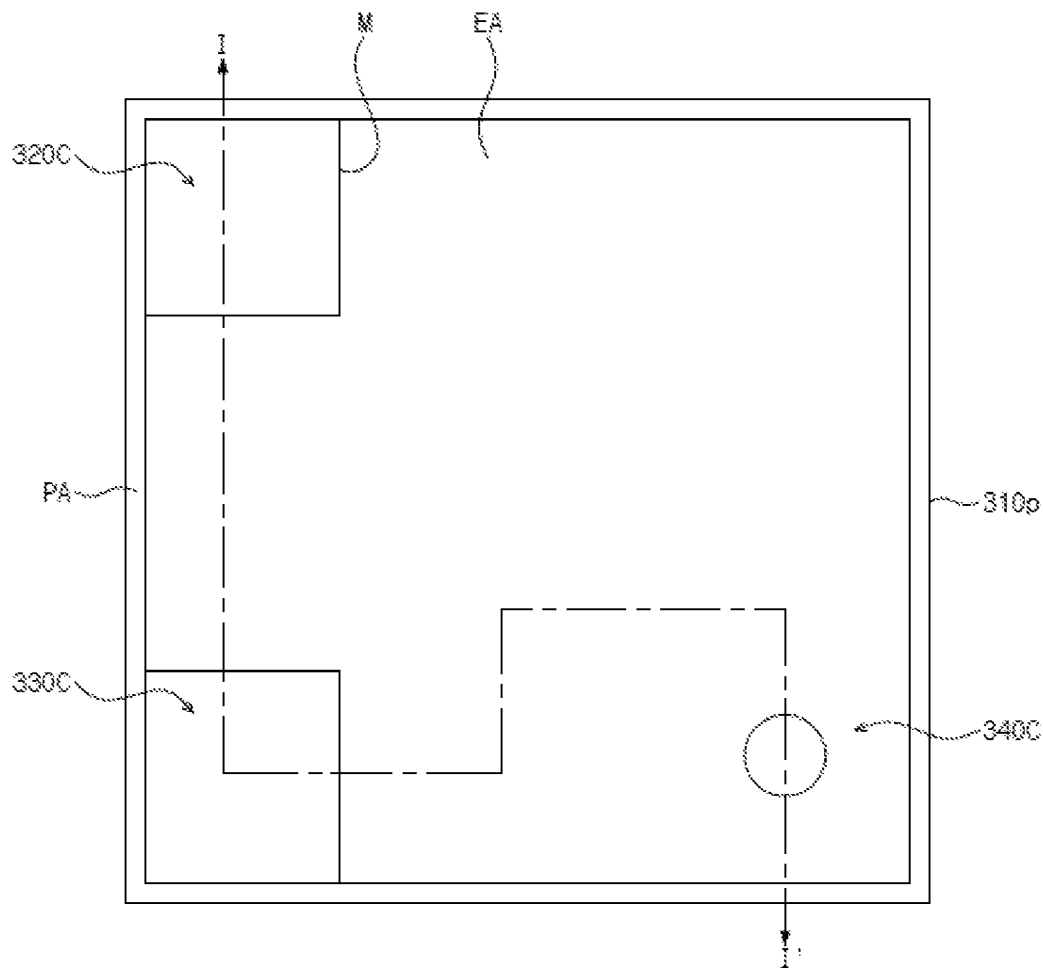
FIGS. 38A, 39A, 40A, 41A, 42A, and 43A are plan views sequentially showing a manufacturing method of a light emitting stacked structure according to an exemplary embodiment.
Figure 38B:
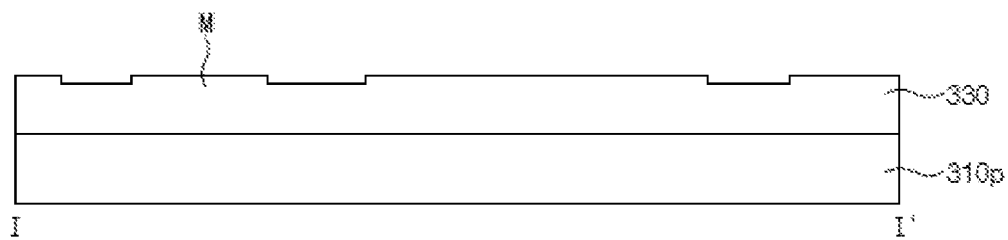
FIGS. 38B, 39B, 40B, 40C, 40D, 40E, 40F, 40G, 41B, 41C, 41D, 42B, and 43B are cross-sectional views respectively taken along lines I-I of FIGS. 38A, 39A, 40A, 41A, 42A, and 43A.

Referring to FIGS. 38A and 38B, the second epitaxial stack 330 is disposed on a first temporary substrate 310p.

The first temporary substrate 310p may be a semiconductor substrate 310 to form the second epitaxial stack 330. The first temporary substrate 310p may be chosen in consideration of the semiconductor layer to be formed thereon. For example, when the second epitaxial stack 330 includes the semiconductor layer emitting red light, the first temporary substrate 310p may be a gallium arsenide (GaAs) substrate. The second epitaxial stack 330 is manufactured by forming the n-type semiconductor layer, the active layer, and the p-type semiconductor layer on the first temporary substrate 310p. Portions of the active layer and the p-type semiconductor layer may be removed to form the mesa structure M. Since the mesa structure M is formed, the upper surface of the n-type semiconductor layer of the second epitaxial stack 330 is exposed.

Figure 39A:
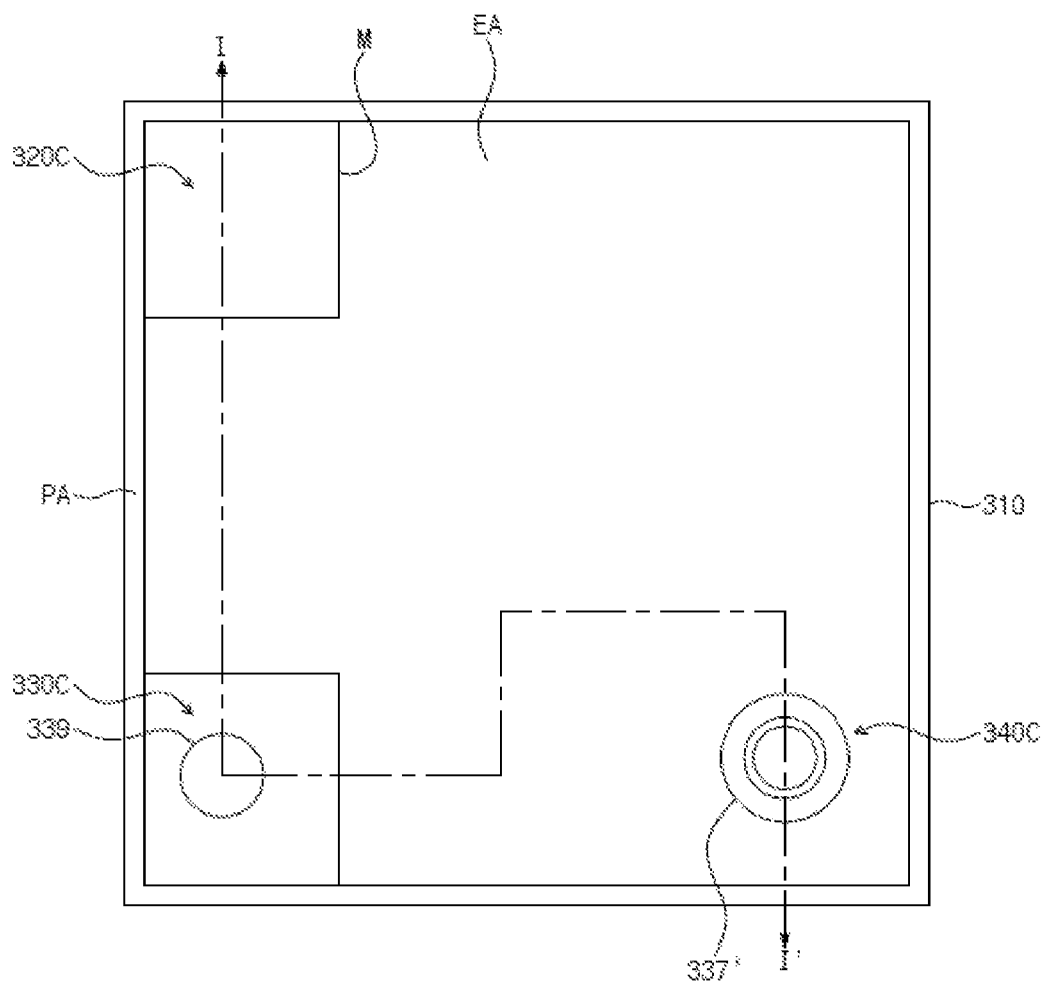
Figure 39B:
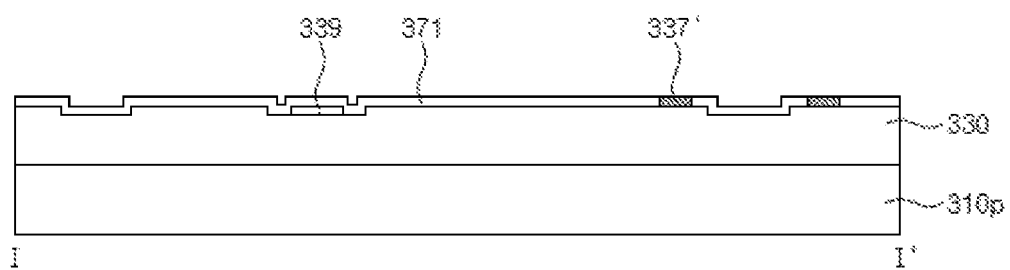

Referring to FIGS. 39A and 39B, the second n-type contact electrode 339, the ohmic electrode 337', and the first insulating layer 371 are formed on the second epitaxial stack 330 on which the mesa structure M is formed. The second n-type contact electrode 339 is disposed in an area corresponding to the second contact part 330C, and the ohmic electrode 337' is disposed in an area corresponding to the third contact part 340C. The contact hole, through which the upper surface of the p-type semiconductor layer of the second epitaxial stack 330 is exposed, is formed on the first insulating layer 371, and the ohmic electrode 337' is formed in the contact hole.

Figure 40A:
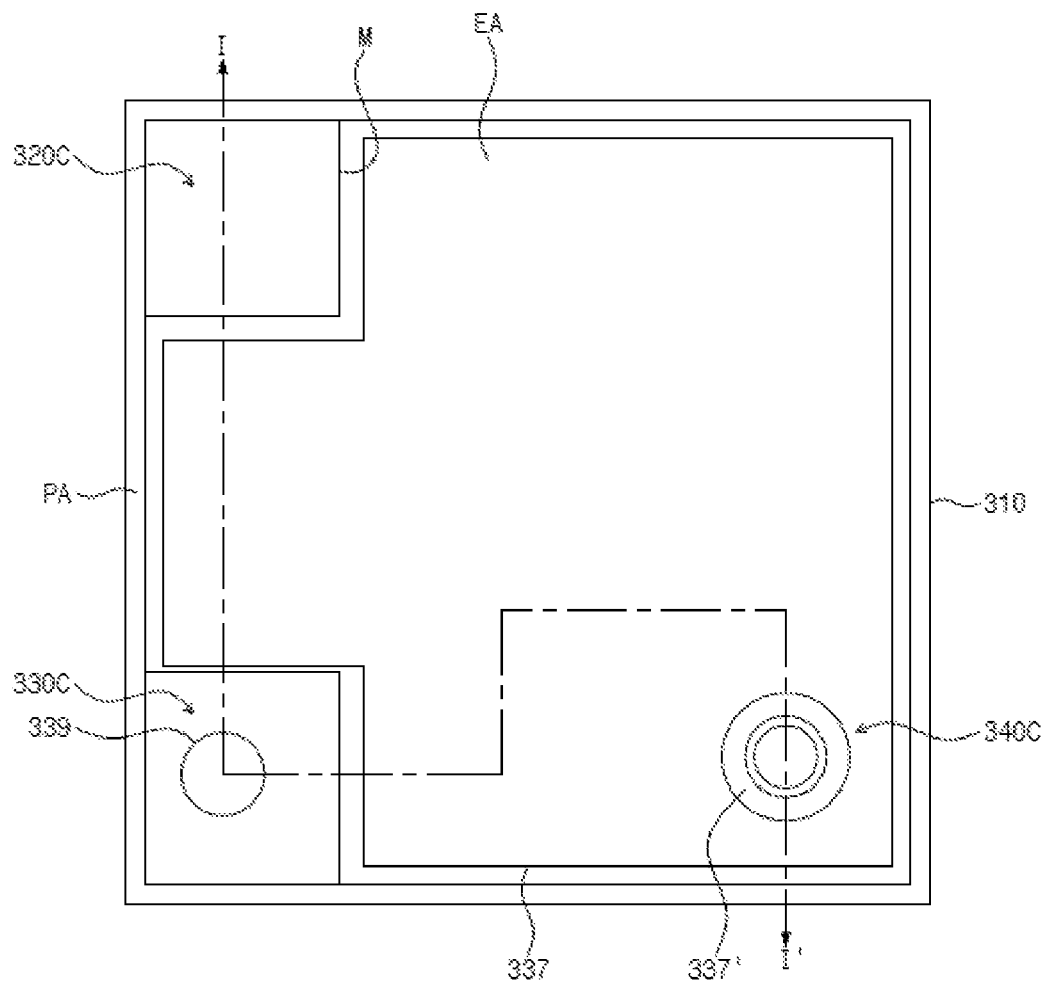
Figure 40B:
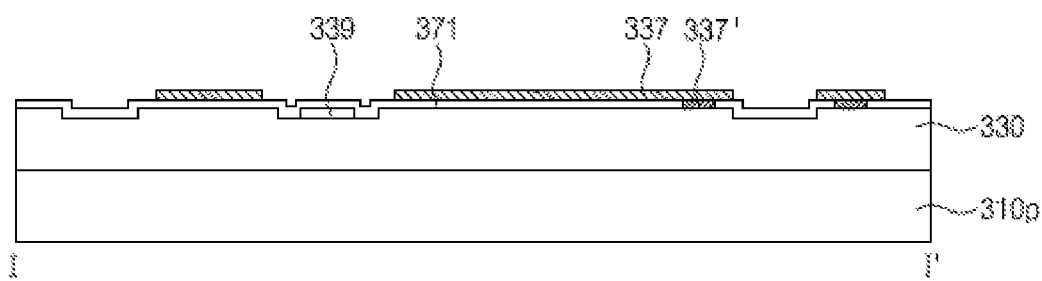

Referring to FIGS. 40A and 40B, the second p-type contact electrode 337 is formed above the first temporary substrate 310p on which the first insulating layer 371 is formed. The second p-type contact electrode 337 may include a reflection material and may be formed to cover the light emitting area EA. The second p-type contact electrode 337 may be formed by forming a reflection conductive material on substantially the entire surface of the first insulating layer 371 and the ohmic electrode 337', and patterning the reflection conductive material using a photolithography process or the like.

Figure 40C:
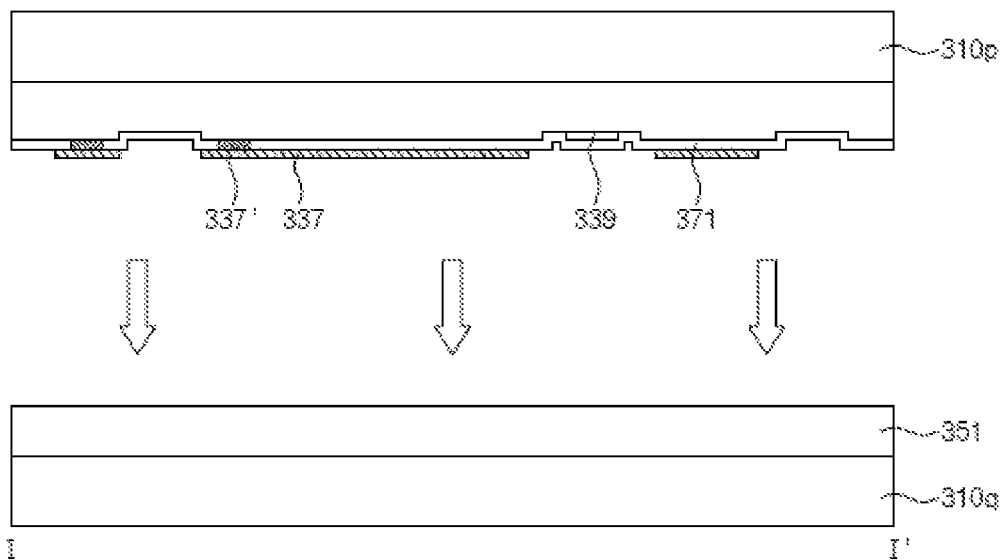

Referring to FIGS. 40A and 40C, the second epitaxial stack 330 on which the second p-type contact electrode 337 is formed is inversely attached to a second temporary substrate 310q with a temporary adhesive layer 351 interposed therebetween.

The temporary adhesive layer 351 attaches the second epitaxial stack 330 to the second temporary substrate 310q and is removed after a predetermined process is executed. Accordingly, the temporary adhesive layer 351 may be formed of a material selected from materials that are easy to remove while having a predetermined adhesion. The material for the temporary adhesive layer 351 is not particularly limited.

The second temporary substrate 310q may be a carrier substrate on which the second epitaxial stack 330 is temporarily attached, and the type of the second temporary substrate 310q is not particularly limited.

Figure 40D:
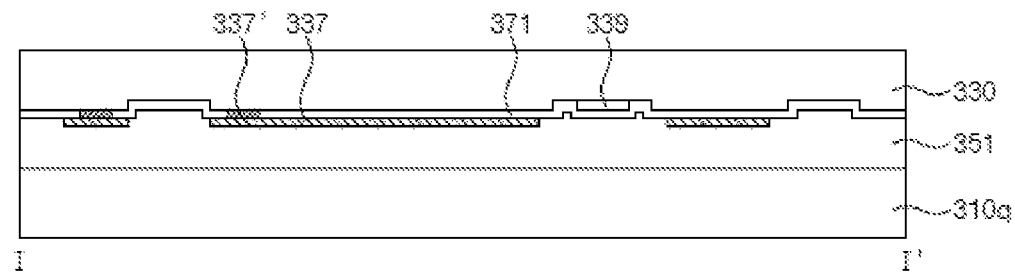

Referring to FIGS. 40A and 40D, the first temporary substrate 310p is removed after the second epitaxial stack 330 is attached to the second temporary substrate 310q. The first temporary substrate 310p may be removed by various methods, such as a wet etch process, a dry etch process, a physical removal process, or a laser lift-off process, without being limited thereto. In some exemplary embodiments, the first temporary substrate 310p may be removed by forming a sacrificial layer between the first temporary substrate 310p and the second epitaxial stack 330, and removing the sacrificial layer.

Figure 40E:
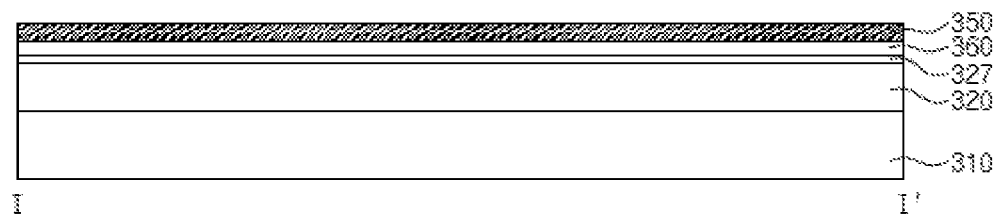

Referring to FIGS. 40A and 40E, the first epitaxial stack 320 is manufactured separately from the second epitaxial stack 330. The first epitaxial stack 320 may be manufactured by sequentially forming the n-type semiconductor layer, the active layer, and the p-type semiconductor layer on the substrate 310. The first p-type contact electrode 327, the long wavelength pass filter 360, and the adhesive layer 350 may be sequentially formed on the first epitaxial stack 320.

Figure 40F:
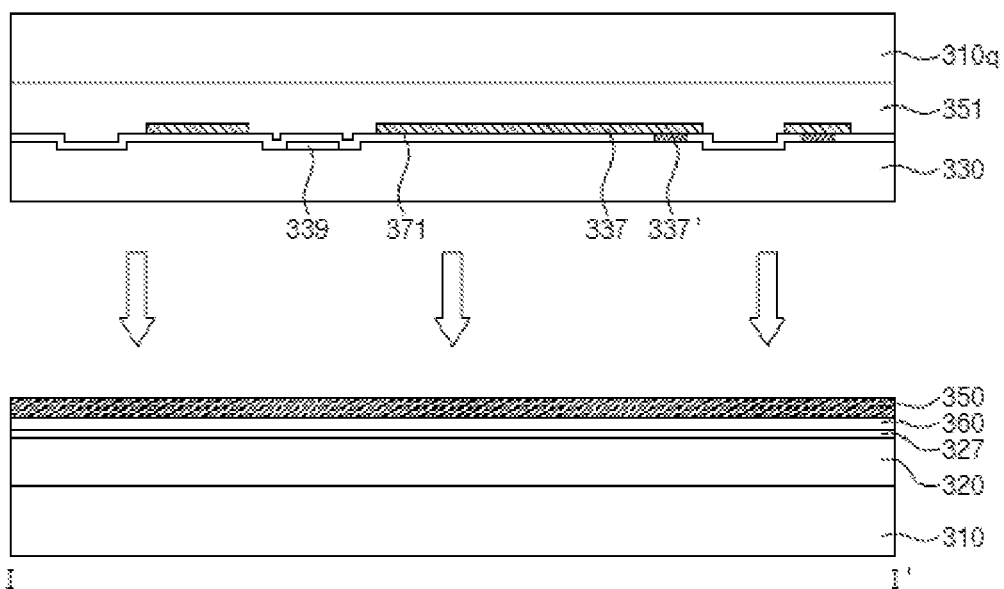

Referring to FIGS. 40A and 40F, the second epitaxial stack 330 formed on the second temporary substrate 310q is inversely attached to the first epitaxial stack 320 with the adhesive layer 350 interposed therebetween. In this case, the lower surface of the n-type semiconductor layer of the second epitaxial stack 330 is disposed to face the p-type semiconductor layer of the first epitaxial stack 320, and then the second epitaxial stack 330 is attached to the first epitaxial stack 320. The adhesive layer 350 may include a non-conductive material and may include a material having light transmitting property. For example, the optically clear adhesive may be used as the adhesive layer 350.

Figure 40G:
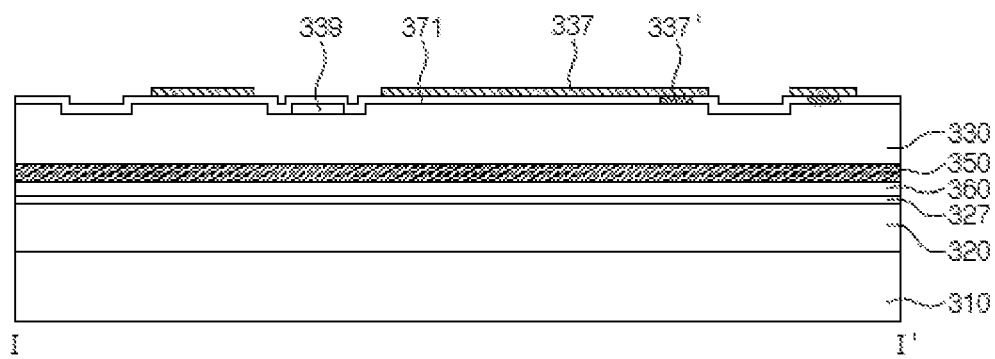

Referring to FIGS. 40A and 40G, the temporary adhesive layer 351 and the second temporary substrate 310q, which are disposed above the second epitaxial stack 330, are removed after the second epitaxial stack 330 is attached onto the first epitaxial stack 320. The second temporary substrate 310q may be removed by various methods. For example, when the second temporary substrate 310q is a sapphire substrate, the sapphire substrate may be removed by a laser lift-off process, a stress lift-off process, a chemical lift-off process, or a physical polishing process, or the like.

After the first epitaxial stack 320 and the second epitaxial stack 330 are formed on the substrate 310 as described above, the electrode part and the contact part are formed, which will be described in detail below.

Figure 41A:
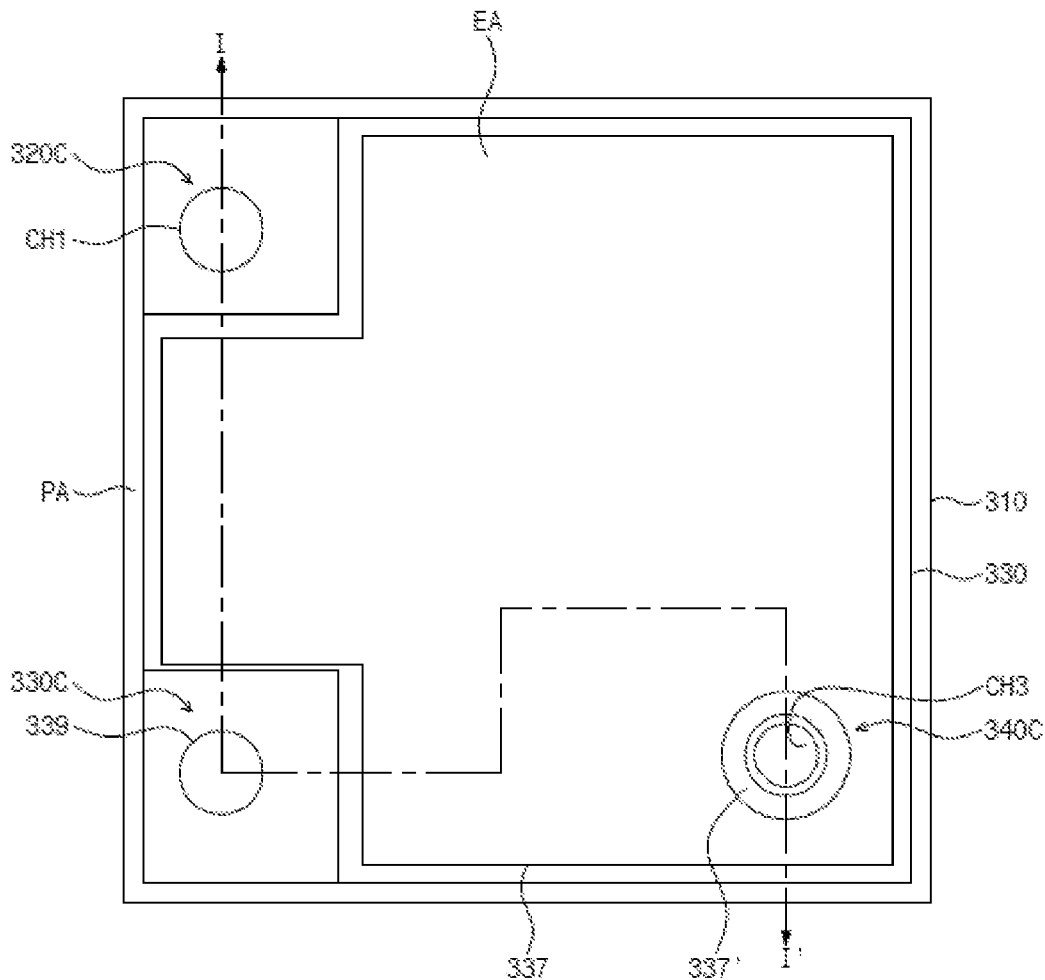
Figure 41B:
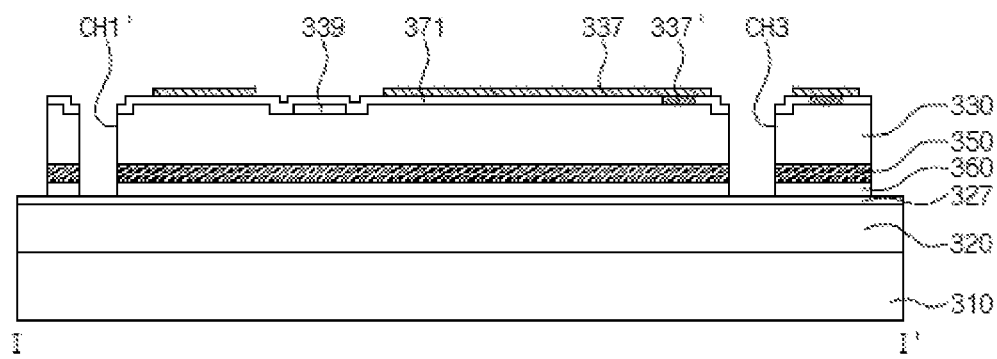

Referring to FIGS. 41A and 41B, the portions of the first insulating layer 371, the second epitaxial stack 330, the adhesive layer 350, and the long wavelength pass filter 360 are removed from the areas corresponding to the first contact part 320C and the third contact part 340C to form a first temporary contact hole CH1' and the third contact hole CH3, respectively. In this case, a recess portion is formed along a periphery of the light emitting stacked structure with the first temporary contact hole CH1' and the third contact hole CH3. The recess portion is formed to electrically and physically separate the light emitting stacked structures adjacent to each other when multiple light emitting stacked structures are formed.

The first temporary contact hole CH1', the third contact hole CH3, and the recess portion may be formed using a photolithography process, for example. The upper surface of the first p-type contact electrode 327 is exposed to the outside by the first temporary contact hole CH1', the third contact hole CH3, and the recess portion.

Figure 41C:
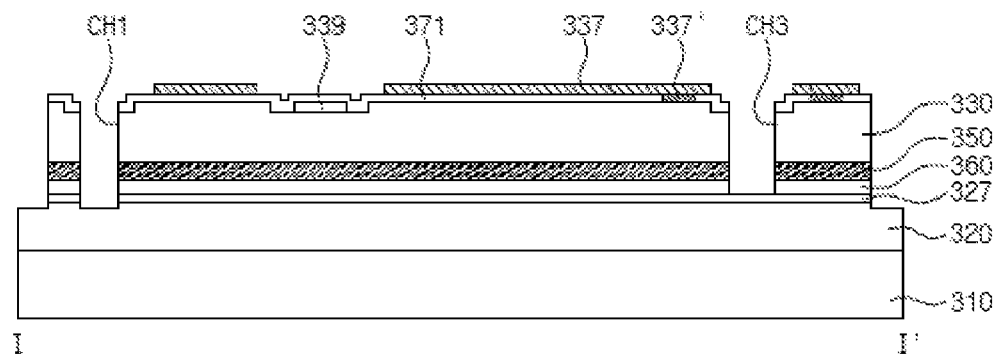

Referring to FIGS. 41A and 41C, portions of the first p-type contact electrode 327 and the first epitaxial stack 320, in detail, portions of the p-type semiconductor layer and the active layer of the first epitaxial stack 320, are removed from the area corresponding to the first contact part 320C to form the first contact hole CH1. In this case, the portions of the p-type semiconductor layer and the active layer of the first epitaxial stack 320 are removed along the periphery of the light emitting stacked structure, and thus, the recess portion is further etched.

The additional etching of the first contact hole CH1 and the recess portion may be executed by a photolithography process, for example. Accordingly, the upper surface of the n-type semiconductor layer of the first epitaxial stack 320 is exposed to the outside through the first contact hole CH1 in the area corresponding to the first contact part 320C and through the recess portion in the periphery of the light emitting stacked structure.

Figure 41D:
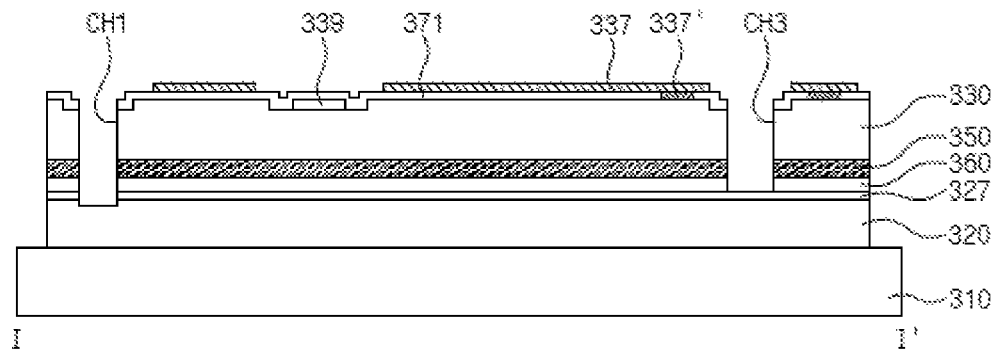

Referring to FIGS. 41A and 41D, the portion of the n-type semiconductor layer of the first epitaxial stack 320 is removed along the periphery of the light emitting stacked structure, and thus, the recess portion is further etched. This is to electrically and physically separate each light emitting stacked structure from adjacent light emitting stacked structures. The additional etching of the recess portion may be executed by the photolithography process, for example, and the upper surface of the substrate 310 is exposed in the periphery of the light emitting stacked structure.

Figure 42A:
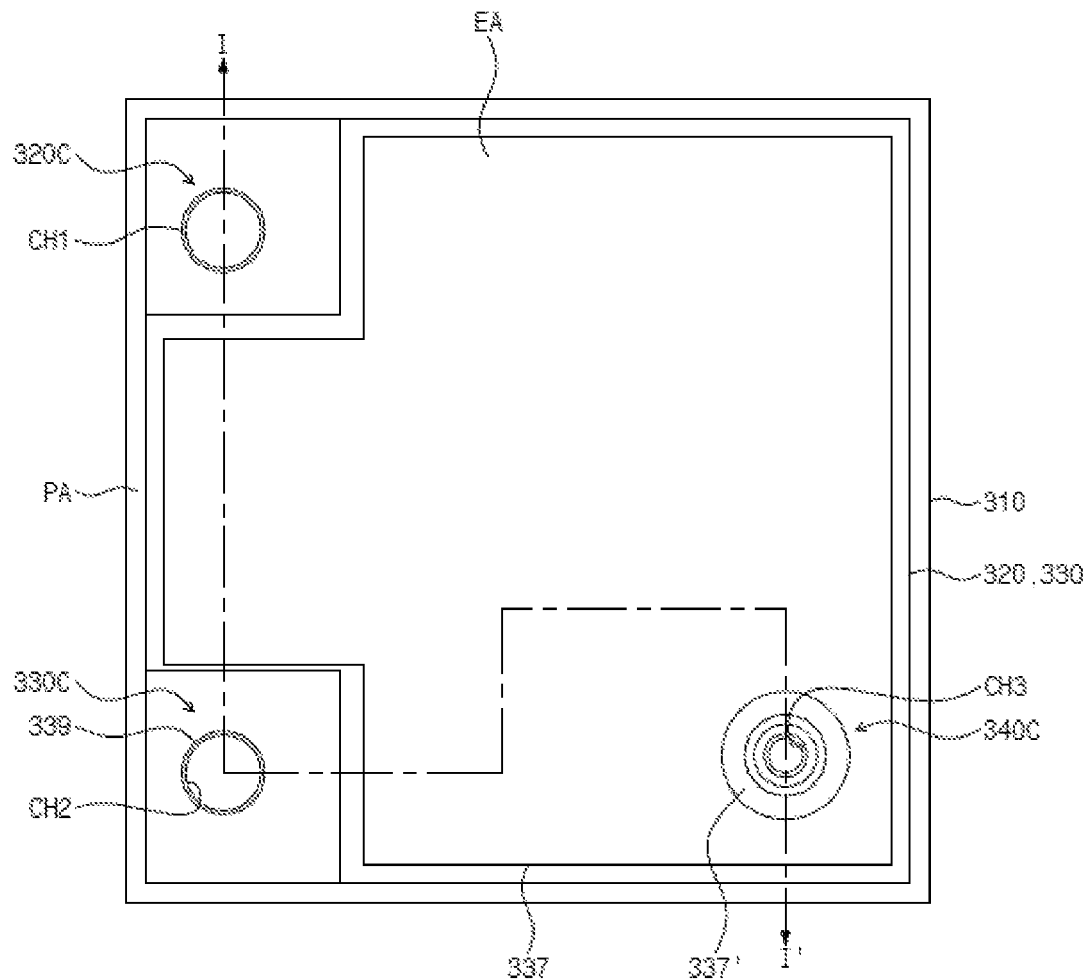
Figure 42B:
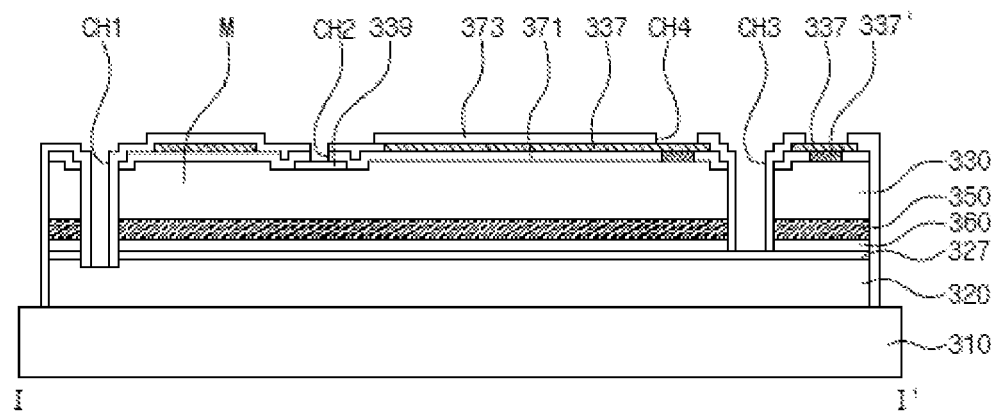

Referring to FIGS. 42A and 42B, the second insulating layer 373 is formed above substantially the entire surface of the substrate 310, and patterned to form the second contact hole CH2 and the fourth contact hole CH4 in the second contact part 330C and the third contact part 340C, respectively. The second insulating layer 373 covers not only components above the second epitaxial stack 330, but also the first and second epitaxial stacks 320 and 330 and the side surface of the light emitting stacked structure in which the recess portion is formed.

The second contact hole CH2 and the fourth contact hole CH4 may be formed by a photography process, for example.

When the second contact hole CH2 is formed, the first insulating layer 371 disposed under the second insulating layer 373 is patterned, and thus, the upper surface of the second n-type contact electrode 339 is exposed to the outside. The fourth contact hole CH4 is formed, such that a portion of the upper surface of the second p-type contact electrode 337 is exposed to the outside in the third contact part 340C. FIG. 42B shows that the area in which the fourth contact hole CH4 is formed overlaps with the area in which the ohmic electrode 337' is formed, however, the inventive concepts are not limited thereto.

In the illustrated exemplary embodiment, the second insulating layer 373 is formed in the first and third contact holes CH1 and CH3, and when the second insulating layer 373 is patterned, the second insulating layer 373 on the upper surface of the n-type semiconductor layer of the first epitaxial stack 320 and the second insulating layer 373 on the upper surface of the first p-type contact electrode 327 are removed, such that the exposure of the upper surface of the n-type semiconductor layer of the first epitaxial stack 320 and the upper surface of the first p-type contact electrode 327 is maintained. However, the second insulating layer 373 formed on sidewalls of the first and third contact holes CH1 and CH3 may be maintained without being removed.

Figure 43A:
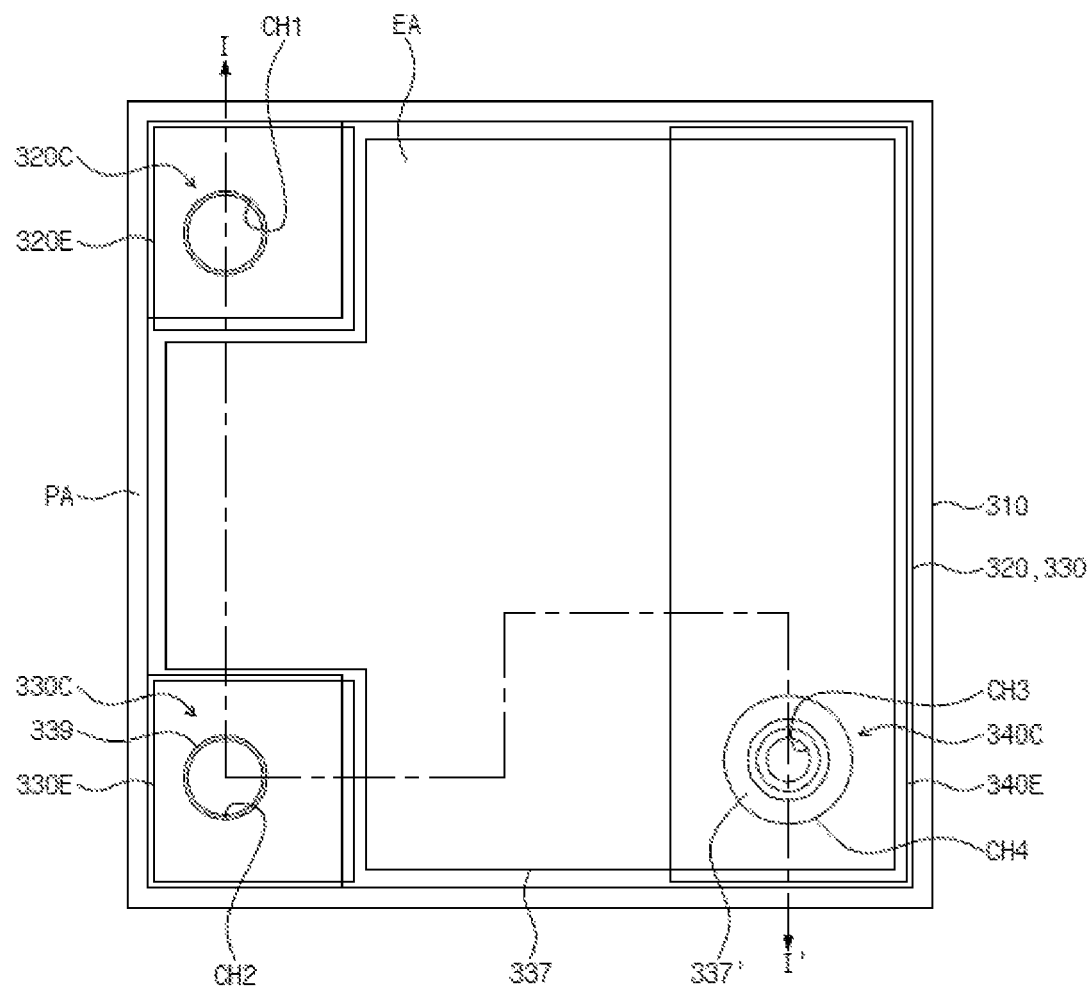
Figure 43B:
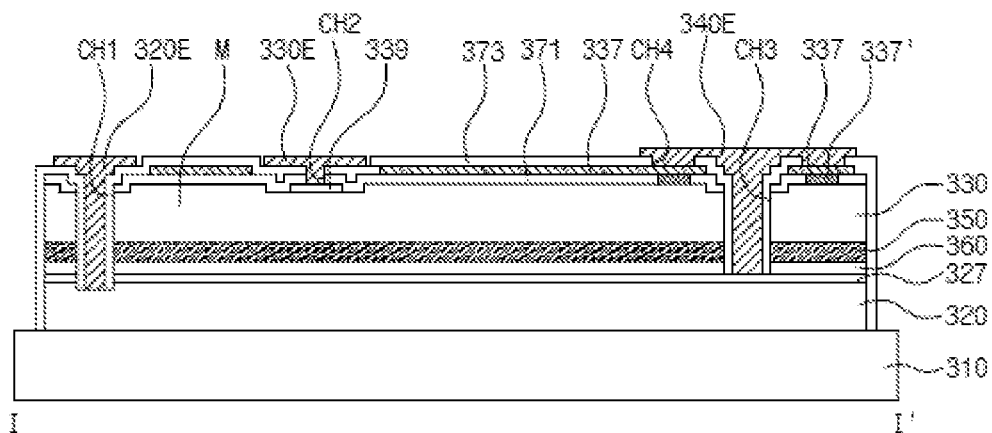

Referring to FIGS. 43A and 43B, the first signal electrode 320E, the second signal electrode 330E, and the common electrode 340E are formed on the substrate 310 in which the first, second, third, and fourth contact holes CH1, CH2, CH3, and CH4 are formed.

The first signal electrode 320E, the second signal electrode 330E, and the common electrode 340E may be formed by a photolithography process, for example, and the first signal electrode 320E, the second signal electrode 330E, and the common electrode 340E may be formed through a single process using one mask in an exemplary embodiment.

The first signal electrode 320E is formed in the area corresponding to the first contact part 320C, the second signal electrode 330E is formed in the area corresponding to the second contact part 330C, and the common electrode 340E is formed in the area corresponding to the third contact part 340C. Accordingly, the first signal electrode 320E is connected to the n-type semiconductor layer of the first epitaxial stack 320 through the first contact hole CH1, the second signal electrode 330E is directly connected to the second n-type contact electrode 339 through the second contact hole CH2, and the common electrode 340E is connected to the first p-type contact electrode 327 and the second p-type contact electrode 337 respectively through the third and fourth contact holes CH4.

Each light emitting stacked structure may be manufactured in the manner described above. When a plurality of light emitting stacked structures are substantially and simultaneously manufactured, a process for cutting the substrate 310 along the boundary of the light emitting stacked structure may be further executed. When the plural light emitting stacked structures are substantially and simultaneously manufactured using the substrate having wide area, which may be cut to divide the light emitting stacked structures into each light emitting stacked structure, a manufacturing efficiency of the light emitting stacked structure may be improved, and a manufacturing cost of the light emitting stacked structure may be reduced.

The light emitting stacked structure according to exemplary embodiments may further include various components to provide high efficiency uniform light. For example, the light emitting stacked structure according to an exemplary embodiment may include various concave-convex portions on a light emitting surface.

Figure 44:
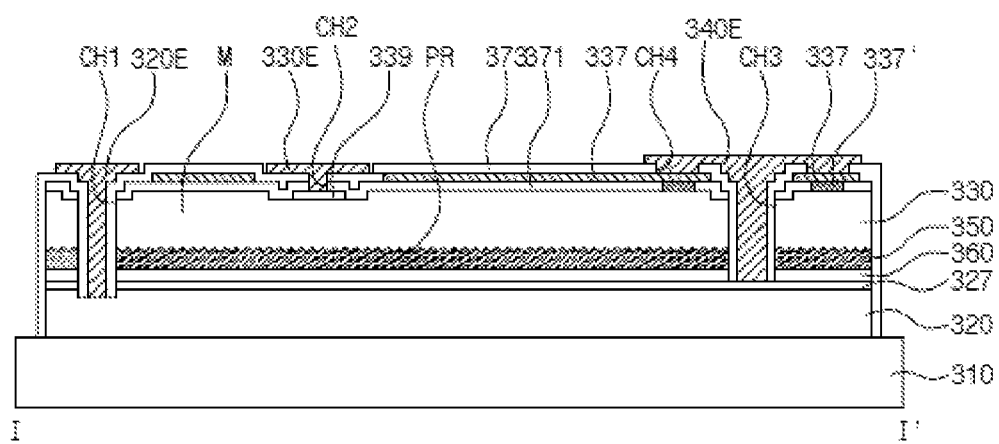
FIG. 44 is a cross-sectional view of a light emitting stacked structure according to an exemplary embodiment.

FIG. 44 is a cross-sectional view of a light emitting stacked structure according to an exemplary embodiment. In particular, FIG. 44 shows the concave-convex portion PR formed on the second epitaxial stack 330. Since the light emitting stacked structure described hereinafter includes substantially similar elements already described above, different features from those above will be mainly described in order to avoid redundancy.

The light emitting stacked structure according to an exemplary embodiment may include the concave-convex portion PR formed on the second epitaxial stack 330. In the illustrated exemplary embodiment, the concave-convex portion PR may be disposed on a lower surface of the n-type semiconductor layer corresponding to the light emitting surface of the second epitaxial stack 330.

The concave-convex portion PR is used to improve light emitting efficiency. The concavo-convex portion PR may be provided to have various shapes, such as a substantially polygonal pyramid shape, a substantially hemispherical shape, or a surface having a roughness, on which concavo-convex portions are randomly arranged. The concave-convex portion PR may be formed by texturing through various etching processes. For example, the concave-convex portion PR may be formed through various processes, such as a dry etch process using a microphotography, a wet etch process using crystal properties, a texturing process using a physical method such as a sandblast, an ion beam etch process, or a texturing process using an etching rate difference of block copolymer.

In an exemplary embodiment, there may be a difference in intensity between the first and second color lights from the first and second epitaxial stacks, and the intensity difference may cause a difference in color temperature when white light is generated. In an exemplary embodiment, the concave-convex portion is selectively formed on the light emitting surface of the first and second epitaxial stacks 320 and 330 to improve the light emitting efficiency, which may reduce the intensity difference of light between the first and second color lights. In particular, the color light corresponding to red color has a visibility lower than blue color, and the intensity difference of light may be reduced by texturing the second epitaxial stack 330.

Figure 45:
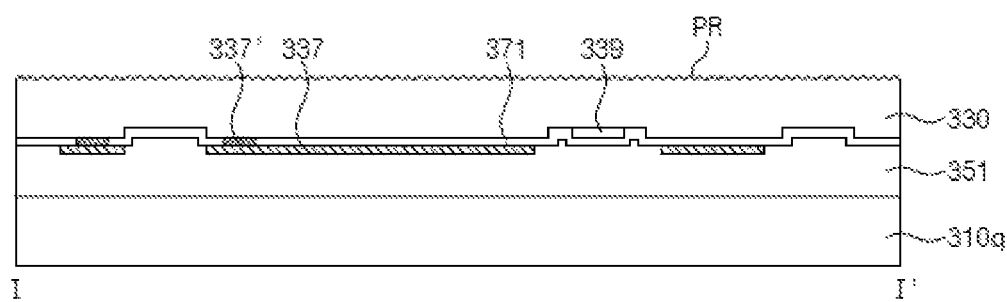
FIG. 45 is a cross-sectional view of a concave-convex portion formed on a second epitaxial stack according to an exemplary embodiment.

The process for forming the concave-convex portion on the lower surface of the n-type semiconductor layer of the second epitaxial stack 330 may be performed after the process shown in FIG. 40D, and FIG. 45 is a cross-sectional view of the concave-convex portion formed on the second epitaxial stack of FIG. 40D according to an exemplary embodiment.

Referring to FIG. 45, after the first temporary substrate 310p that makes contact with the n-type semiconductor layer of the second epitaxial stack 330 is removed, the texturing process is performed on the exposed n-type semiconductor layer to form the concave-convex portion PR.

According to an exemplary embodiment, the concave-convex portion may be provided to another epitaxial stack, and the substrate may be removed.

Figure 46:
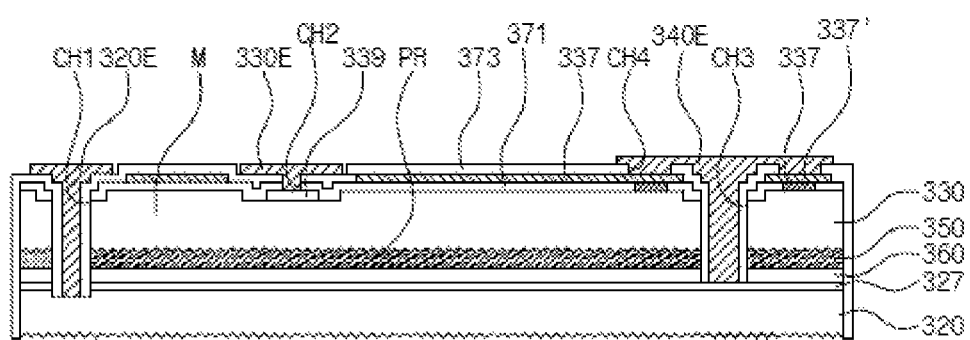
FIG. 46 is a cross-sectional view of a light emitting stacked structure according to an exemplary embodiment.

FIG. 46 is a cross-sectional view of a light emitting stacked structure according to an exemplary embodiment. In particular, FIG. 46 shows a structure in which the substrate 310 is removed and the concave-convex portion PR is formed on the first epitaxial stack 320 in addition to the second epitaxial stack 330.

Referring to FIG. 46, the light emitting stacked structure according to the illustrated exemplary embodiment may have a structure from which the substrate 310 is removed. Since the substrate 310 has a relatively thick thickness, a thickness of the light emitting stacked structure may be remarkably reduced when the substrate 310 is removed. Accordingly, when a predetermined device is manufactured by transferring the light emitting stacked structure, from which the substrate 310 is removed, onto a separate wiring substrate, the predetermined device may be formed to have a thin thickness.

According to an exemplary embodiment, the concave-convex portion PR may be disposed on the first epitaxial stack 320 to improve light efficiency. More particularly, the concave-convex portion PR may be disposed on the lower surface of the n-type semiconductor layer corresponding to the light emitting surface of the first epitaxial stack 320. In this case, when the patterned sapphire substrate is used as the substrate 310 and the patterned sapphire substrate is removed, the concave-convex portion PR may be easily formed on the light emitting surface of the first epitaxial stack 320.

According to an exemplary embodiment, the light emitting stacked structure may further include additional component for high color rendering index and wide correlated color temperature. For example, the light emitting stacked structure may further include a light conversion layer to convert at least a portion of light respectively emitted from the first and second epitaxial stacks to have a different wavelength.

Figure 47:
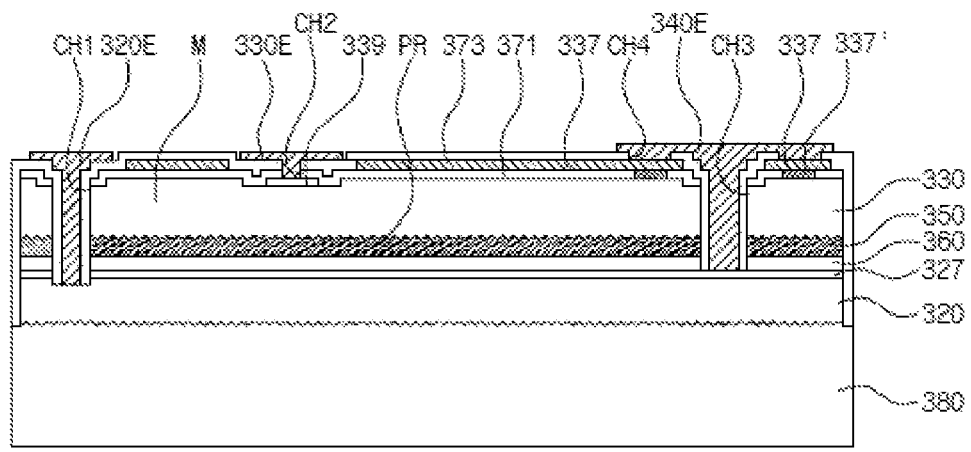
FIGS. 47 and 48 are cross-sectional views of a light emitting stacked structure with a light conversion layer according to an exemplary embodiment.
Figure 48:
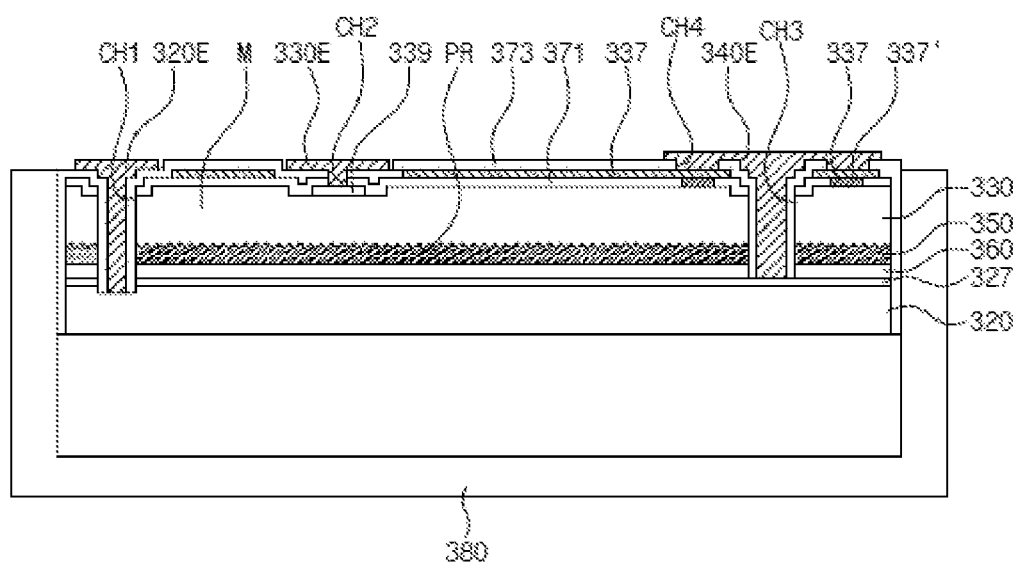

FIGS. 47 and 48 are cross-sectional views of a light emitting stacked structure with the light conversion layer according to an exemplary embodiment. FIG. 47 shows the light emitting stacked structure from which the substrate is removed, and FIG. 48 shows the light emitting stacked structure including the substrate.

Referring to FIG. 47, the light conversion layer 380 is further disposed on the lower surface corresponding to the light emitting surface of the first epitaxial stack 320. Referring to FIG. 48, the light conversion layer 380 is further disposed on the lower surface of the substrate 310, and the light conversion layer 380 may be provided to selectively cover the side surface of the light emitting stacked structure.

The light conversion layer 380 may include a nanostructure, such as a fluorescent substance and a quantum dot, an organic material capable of converting colors, or a combination thereof. For example, when the fluorescent substance is used as the material for the light conversion layer 380, the fluorescent substance may absorb light having a predetermined wavelength and may emit light having a wavelength longer than the predetermined wavelength of light. The fluorescent substance may be provided in a mixed form with a transparent or semi-transparent binder, such as PDMS (polydimethylsiloxane), PI (polyimide), PMMA (poly(methyl 2-methylpropenoate)), or ceramic.

In this manner, since the light emitting stacked structure includes the light conversion layer 380, the light emitting stacked structure may output light having a wavelength different from the first color light and/or the second color light in addition to the first and second color lights emitted from the first and second epitaxial stacks 320 and 330. Accordingly, high color rendering index and the wide correlated color temperature may be achieved by mixing lights output from the light emitting stacked structure.

The light emitting stacked structure according to the exemplary embodiments may be independently used, however, the inventive concepts are not limited thereto. For example, the light emitting stacked structure may be used as various types of light sources after being mounted on a base substrate, on which wirings are formed, for example, a printed circuit board.

Figure 49:
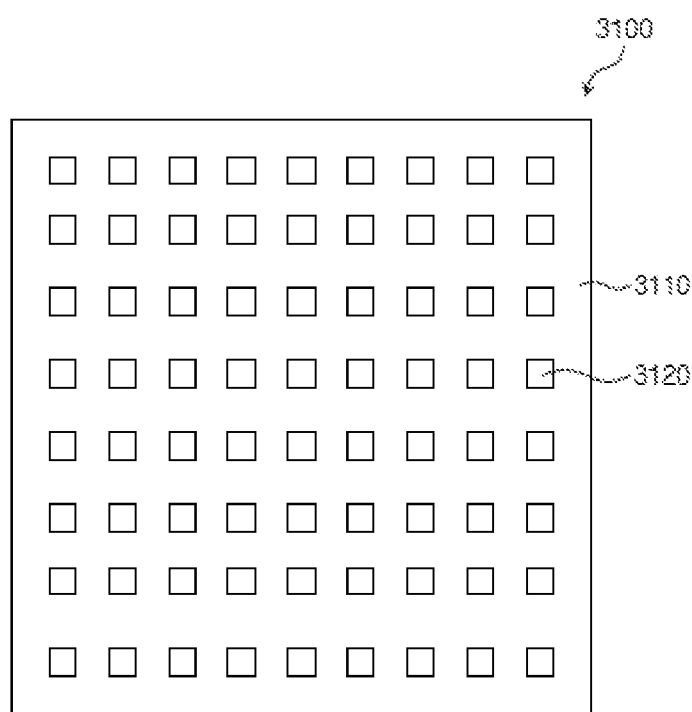
FIGS. 49 and 50 are plan views of a light emitting stacked structure mounted on a printed circuit board according to exemplary embodiments.
Figure 50:
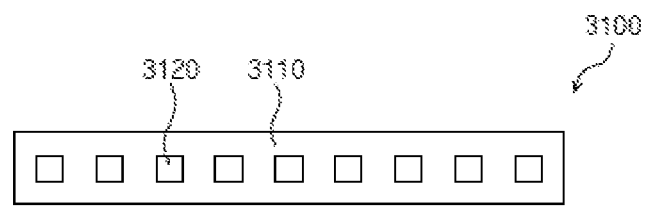

FIGS. 49 and 50 are plan views of a light emitting stacked structure mounted on a printed circuit board according to an exemplary embodiment.

Referring to FIG. 49, a plurality of light emitting stacked structures 3120 according to an exemplary embodiment may be arranged in a matrix form on the printed circuit board 3110 having a predetermined shape, such as a substantially rectangular shape with a predetermined area. Referring to FIG. 50, the light emitting stacked structures 3120 according to an exemplary embodiment may be arranged along a longitudinal direction on the printed circuit board 3110 extending in one direction. The shape of the printed circuit board 3110 and the arrangement of the light emitting stacked structures 3120 are not limited thereto, and may be varied in various ways. As such, the light emitting stacked structure may provide light in the form of a point light source, a linear light source, or a surface light source.

Terminals may be formed on the printed circuit board 3110 to apply the light emitting signal and the common voltage to the light emitting stacked structures, respectively, and the light emission of the light emitting stacked structure may be determined by the light emitting signal and the common voltage applied to the light emitting stacked structure through the terminals.

The light emitting stacked structure according to the exemplary embodiments may be used in various lighting devices that use white light. For example, the light emitting stacked structure may be used as a backlight unit included in a light receiving type display device, or indoor and/or outdoor lighting in everyday life.

Figure 51:
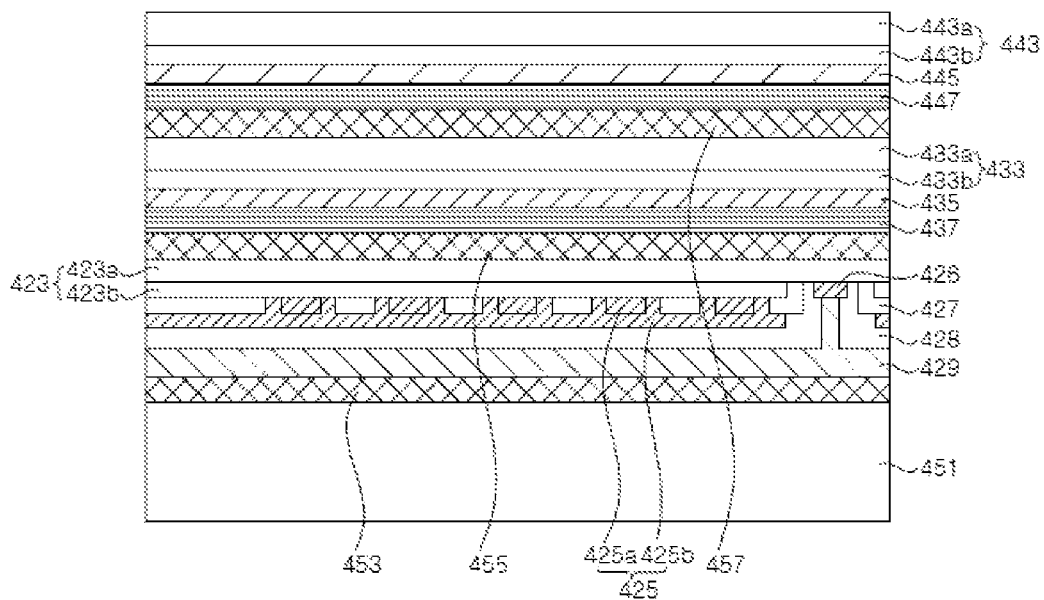
FIG. 51 is a schematic cross-sectional view of a light emitting diode stack for a display according to an exemplary embodiment.

FIG. 51 is a schematic cross-sectional view of a light emitting diode stack for a display according to an exemplary embodiment.

Referring to FIG. 51, the light emitting diode stack 400 includes a support substrate 451, a first LED stack 423, a second LED stack 433, a third LED stack 443, a reflective electrode 425, an ohmic electrode 426, a first insulation layer 427, a second insulation layer 428, an interconnection line 429, a second-p transparent electrode 435, a third-p transparent electrode 445, a first color filter 437, a second color filter 447, a first bonding layer 453, a second bonding layer 455, and a third bonding layer 457.

The support substrate 451 supports the LED stacks 423, 433, 443. The support substrate 451 may include a circuit on a surface thereof or therein, without being limited thereto. The support substrate 451 may include, for example, glass, a sapphire substrate, a Si substrate, or a Ge substrate.

Each of the first LED stack 423, the second LED stack 433, and the third LED stack 443 includes an n-type semiconductor layer 423a, 433a, and 443a, a p-type semiconductor layer 423b, 433b, and 443b, and an active layer interposed therebetween. The active layer may have a multi-quantum well structure in some exemplary embodiments.

For example, the first LED stack 423 may be an inorganic light emitting diode to emit red light, the second LED stack 433 may be an inorganic light emitting diode to emit green light, and the third LED stack 443 may be an inorganic light emitting diode to emit blue light. The first LED stack 423 may include a GaInP-based well layer, and each of the second LED stack 433 and the third LED stack 443 may include a GaInN-based well layer, for example.

In addition, both surfaces of each of the first to third LED stacks 423, 433, 443 are an n-type semiconductor layer and a p-type semiconductor layer, respectively. In the illustrated exemplary embodiment, each of the first conductivity type semiconductor layers 423a, 433a, 443a of the first to third LED stacks 423, 433, 443 is an n-type semiconductor layer, and each of the second conductivity type semiconductor layers 423b, 433b, 443b of the first to third LED stacks 423, 433, 443 is a p-type semiconductor layer. Since the third LED stack 443 has an n-type upper surface, in some exemplary embodiments, a roughened surface may be formed on the upper surface of the third LED stack 443 through chemical etching, for example. However, the inventive concepts are not limited thereto, and in some exemplary embodiments, the semiconductor types of the upper and lower surfaces of each of the LED stacks may be changed.

The first LED stack 423 is disposed near the support substrate 451, the second LED stack 433 is disposed on the first LED stack 423, and the third LED stack 443 is disposed on the second LED stack 433. Since the first LED stack 423 emits light having a longer wavelength than the second and third LED stacks 433, 443, light generated from the first LED stack 423 can be emitted to the outside through the second and third LED stacks 433, 443. In addition, since the second LED stack 433 emits light having a longer wavelength than the third LED stack 443, light generated from the second LED stack 433 can be emitted to the outside through the third LED stack 443.

The reflective electrode 425 forms ohmic contact with the second conductivity type semiconductor layer 423b of the first LED stack 423, and reflects light generated from the first LED stack 423. For example, the reflective electrode 425 may include an ohmic contact layer 425a and a reflective layer 425b.

The ohmic contact layer 425a partially contacts the second conductivity type semiconductor layer 423b, that is, a p-type semiconductor layer. In order to prevent absorption of light by the ohmic contact layer 425a, a region in which the ohmic contact layer 425a contacts the p-type semiconductor layer may not exceed 50% of the total area of the p-type semiconductor layer. The reflective layer 425b covers the ohmic contact layer 425a and the first insulation layer 427. As shown in the drawings, the reflective layer 425b may cover substantially the entire ohmic contact layer 425a, without being limited thereto. Alternatively, the reflective layer 425b may cover a portion of the ohmic contact layer 425a.

Since the reflective layer 425b covers the first insulation layer 427, an omnidirectional reflector can be formed by the stacked structure of the first LED stack 423 having a relatively high index of refraction, and the first insulation layer 427 having a relatively low index of refraction, and the reflective layer 425b. The reflective layer 425b covers 50% or more of the area of the first LED stack 423 or most of the first LED stack 423, thereby improving luminous efficacy.

The ohmic contact layer 425a and the reflective layer 425b may include metal layers containing Au. The ohmic contact layer 425a may be formed of, for example, Au—Zn alloys or Au—Be alloys. The reflective layer 425b may be formed of a metal, for example, Al, Ag, or Au, which have relatively high reflectance with respect to light generated from the first LED stack 423, for example, red light. More particularly, Au may have relatively low reflectance with respect to light generated from the second LED stack 433 and the third LED stack 443, for example, green light or blue light, and thus, may reduce interference of light emitted from the second and third LED stacks 433, 443 and traveling toward the support substrate 451 by absorbing light.

The first insulation layer 427 is interposed between the support substrate 451 and the first LED stack 423, and has openings that expose the first LED stack 423. The ohmic contact layer 425a is connected to the first LED stack 423 through the openings of the first insulation layer 427.

The ohmic electrode 426 forms ohmic contact with the first conductivity type semiconductor layer 423a of the first LED stack 423. The ohmic electrode 426 may be disposed on the first conductivity type semiconductor layer 423a exposed by partially removing the second conductivity type semiconductor layer 423b. Although a single ohmic electrode 426 is shown in FIG. 51, a plurality of ohmic electrodes 426 may be arranged in a plurality of regions on the support substrate 451. The ohmic electrode 426 may be formed of, for example, Au—Te alloys or Au—Ge alloys.

The second insulation layer 428 is interposed between the support substrate 451 and the reflective electrode 425, and covers the reflective electrode 425. The second insulation layer 428 has an opening that exposes the ohmic electrode 426.

The interconnection line 429 is interposed between the second insulation layer 428 and the support substrate 451, and is connected to the ohmic electrode 426 through the opening of the second insulation layer 428. The interconnection line 426 may connect the plurality of ohmic electrodes 426 to each other on the support substrate 451.

The second-p transparent electrode 435 forms ohmic contact with the second conductivity type semiconductor layer 4433b of the second LED stack 433, that is, a p-type semiconductor layer thereof. The second-p transparent electrode 435 may include a metal layer or a conducive oxide layer transparent with respect to red light and green light.

In addition, the third-p transparent electrode 445 forms ohmic contact with the second conductivity type semiconductor layer 443b of the third LED stack 443, that is, a p-type semiconductor layer thereof. The third-p transparent electrode 445 may include a metal layer or a conducive oxide layer transparent with respect to red light, green light, and blue light.

The reflective electrode 425, the second-p transparent electrode 435, and the third-p transparent electrode 445 may assist in current spreading through ohmic contact with the p-type semiconductor layer of each of the LED stacks.

The first color filter 437 may be interposed between the first LED stack 423 and the second LED stack 433. In addition, the second color filter 447 may be interposed between the second LED stack 433 and the third LED stack 443. The first color filter 437 transmits light generated from the first LED stack 423 while reflecting light generated from the second LED stack 433. The second color filter 447 transmits light generated from the first and second LED stacks 423, 433, while reflecting light generated from the third LED stack 443. As such, light generated from the first LED stack 423 can be emitted to the outside through the second LED stack 433 and the third LED stack 443, and light generated from the second LED stack 433 can be emitted to the outside through the third LED stack 443. Further, the light emitting diode stack can prevent the light generated from the second LED stack 433 from entering the first LED stack 423, and prevent the light generated from the third LED stack 443 from entering the second LED stack 433, thereby preventing light loss.

In some exemplary embodiments, the first color filter 437 may reflect light generated from the third LED stack 443.

The first and second color filters 437, 447 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 437, 447 may be formed by alternately stacking insulation layers having different refractive indices one above another. For example, each of the first and second color filters 437, 447 may be formed by alternately stacking $TiO_2$ and $SiO_2$ layers, $Ta_2O_5$ and $SiO_2$ layers, $Nb_2O_5$ and $SiO_2$ layers, $HfO_2$ and $SiO_2$ layers, or $ZrO_2$ and $SiO_2$ layers. Furthermore, the first and/or second color filters 437, 447 may include a distributed Bragg reflector (DBR). The distributed Bragg reflector may be formed by alternately stacking insulation layers having different refractive indices one above another. In addition, the stop band of the distributed Bragg reflector can be controlled by adjusting the thicknesses of $TiO_2$ and $SiO_2$ layers.

The first bonding layer 453 couples the first LED stack 423 to the support substrate 451. As shown in the drawings, the interconnection line 429 may adjoin the first bonding layer 453. In addition, the interconnection line 429 is disposed under some regions of the second insulation layer 428, such that the region of the second insulation layer 428 with no interconnection line 429 formed therebelow adjoins the first bonding layer 453. The first bonding layer 453 may be light transmissive or opaque. More particularly, a bonding layer formed of a black epoxy resin capable of absorbing light may be used as the first bonding layer 453, thereby improving a contrast of a display apparatus.

The second bonding layer 455 couples the second LED stack 433 to the first LED stack 423. As shown in the drawings, the second bonding layer 455 may adjoin the first LED stack 423 and the first color filter 437. The ohmic electrode 426 may be covered by the second bonding layer 455. The second bonding layer 455 transmits light generated from the first LED stack 423. The second bonding layer 455 may be formed of, for example, light transmissive spin-on-glass (SOG).

The third bonding layer 457 couples the third LED stack 443 to the second LED stack 433. As shown in the drawings, the third bonding layer 457 may adjoin the second LED stack 433 and the second color filter 447. However, the inventive concepts are not limited thereto. For example, a transparent conductive layer may be disposed on the second LED stack 433. The third bonding layer 457 transmits light generated from the first LED stack 423 and the second LED stack 433. The third bonding layer 457 may be formed of, for example, light transmissive spin-on-glass.

In an exemplary embodiment, the first to third bonding layers 453, 455, 457 may be formed of SOG. However, the inventive concepts are not limited thereto, and the first to third bonding layers may be formed of other transparent organic or inorganic materials. For example, the organic materials may include SUB, poly(methyl methacrylate) (PMMA), polyimide, Parylene, benzocyclobutene (BCB), or others, and the inorganic materials may include $Al_2O_3$, $SiO_2$, $SiN_x$, or others. The organic material layers may be bonded under high vacuum and high pressure conditions, and the inorganic material layers may be bonded under high vacuum condition after changing the surface energy using plasma through, for example, chemical mechanical polishing, to flatten the surfaces of the inorganic material layers.

FIGS. 52A, 52B, 52C, 52D and 52E are schematic cross-sectional views illustrating a method of manufacturing a light emitting diode stack for a display according to an exemplary embodiment.

Figure 52A:
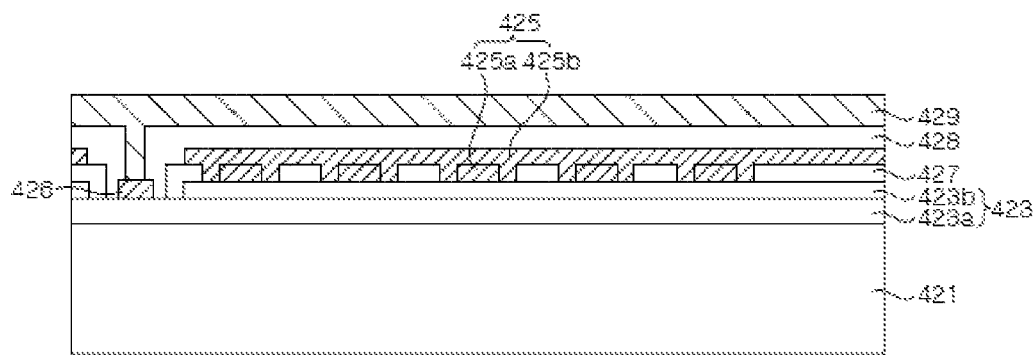
FIGS. 52A, 52B, 52C, 52D, and FIG. 52E are schematic cross-sectional views illustrating a method of manufacturing a light emitting diode stack for a display according to an exemplary embodiment.

Referring to FIG. 52A, first, a first LED stack 423 is grown on a first substrate 421. The first substrate 421 may be, for example, a GaAs substrate. In addition, the first LED stack 423 may be formed of AlGaInP-based semiconductor layers and include a first conductivity type semiconductor layer 423a, an active layer, and a second conductivity type semiconductor layer 423b.

Then, the first conductivity type semiconductor layer 423a is exposed by partially removing the second conductivity type semiconductor layer 423b. Although FIG. 52A illustrates a single pixel region, the first conductivity type semiconductor layer 423a may be partially exposed in each pixel region.

A first insulation layer 427 is formed on the first LED stack 423 and is subjected to patterning to form opening(s). For example, a $SiO_2$ layer is formed on the first LED stack 423 and a photoresist is deposited onto the $SiO_2$ layer, followed by photolithography and development processes to form a photoresist pattern. Then, the $SiO_2$ layer is subjected to patterning through the photoresist pattern used as an etching mask, thereby forming the first insulation layer 427. One of the openings formed in the first insulation layer 427 may be disposed on the first conductivity type semiconductor layer 423a and other openings may be disposed on the second conductivity type semiconductor layer 423b.

Then, an ohmic contact layer 425a and an ohmic electrode 426 are formed in the opening(s) of the first insulation layer 427. The ohmic contact layer 425a and the ohmic electrode 426 may be formed by a lift-off process, for example. The ohmic contact layer 425a may be formed before formation of the ohmic electrode 426, or vice versa. Further, in some exemplary embodiments, the ohmic electrode 426 and the ohmic contact layer 425a may be simultaneously formed with substantially the same material layer.

After the ohmic contact layer 425a is formed, a reflective layer 425b is formed to cover the ohmic contact layer 425a and the first insulation layer 427. The reflective layer 425b may be formed by a lift-off process, for example. The reflective layer 425b may cover a portion of the ohmic contact layer 425a or the entirety thereof, as shown in the drawings. The ohmic contact layer 425a and the reflective layer 425b form a reflective electrode 425.

The reflective electrode 425 forms ohmic contact with the p-type semiconductor layer of the first LED stack 423, and thus, will be referred to as a first-p reflective electrode 425. The reflective electrode 425 is separated from the ohmic electrode 426, and thus, is electrically insulated from the first conductivity type semiconductor layer 423a.

Then, a second insulation layer 428 is formed to cover the reflective electrode 425, and an opening is formed thereon to expose the ohmic electrode 426. The second insulation layer 428 may be formed of, for example, $SiO_2$ or SOG.

An interconnection line 429 is formed on the second insulation layer 428. The interconnection line 429 is connected to the ohmic electrode 426 through the opening of the second insulation layer 428 to be electrically connected to the first conductivity type semiconductor layer 423a.

Although FIG. 52A shows that the interconnection line 429 covering the overall surface of the second insulation layer 428, is some exemplary embodiments, the interconnection line 429 may be partially disposed on the second insulation layer 428, such that an upper surface of the second insulation layer 428 is exposed around the interconnection line 429.

Although a single pixel region is illustrated herein, the first LED stack 423 disposed on the first substrate 421 may cover a plurality of pixel regions, and the interconnection line 429 may be commonly connected to the ohmic electrodes 426 formed in the plurality of pixel regions. In some exemplary embodiments, a plurality of interconnection lines 429 may be formed on the first substrate 421.

Figure 52B:
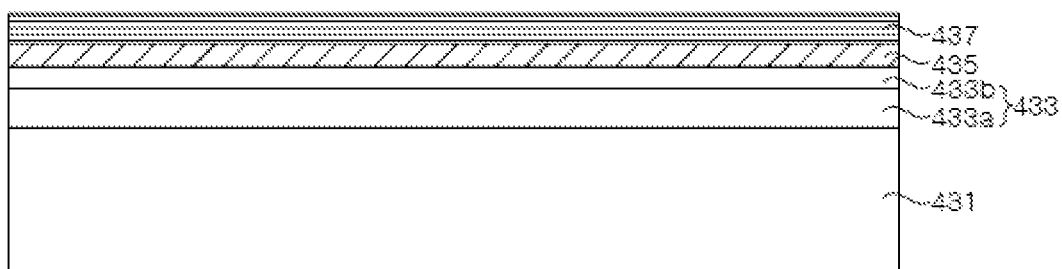

Referring to FIG. 52B, a second LED stack 433 is grown on a second substrate 431, and a second-p transparent electrode 435 and a first color filter 437 are formed on the second LED stack 433. The second LED stack 433 includes a GaN-based first conductivity type semiconductor layer 4433a, a second conductivity type semiconductor layer 4433b, and an active layer including a GaInN well layer interposed therebetween. The second substrate 431 is a substrate on which GaN-based semiconductor layers may be grown thereon, and may be different from the first substrate 421. The composition ratio of GaInN for the second LED stack 433 may be determined, such that the second LED stack 433 may emit green light, for example. The second-p transparent electrode 435 forms ohmic contact with the second conductivity type semiconductor layer 4433b.

The first color filter 437 may be formed on the second-p transparent electrode 435. The first color filter 437 is substantially the same as that described with reference to FIG. 51, and thus, repeated descriptions thereof will be omitted.

Figure 52C:
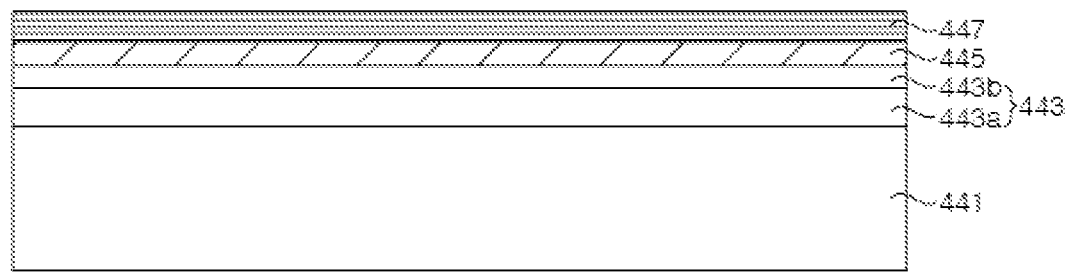

Referring to FIG. 52C, a third LED stack 443 is grown on a third substrate 441, and a third-p transparent electrode 445 and a second color filter 447 are formed on the third LED stack 443. The third LED stack 443 includes a GaN-based first conductivity type semiconductor layer 443a, a second conductivity type semiconductor layer 443b, and an active layer including a GaInN well layer interposed therebetween.

The third substrate 441 is a substrate on which GaN-based semiconductor layers may be grown thereon, and may be different from the first substrate 421. The composition ratio of GaInN for the third LED stack 443 may be determined, such that the third LED stack 443 may emit blue light, for example. The third-p transparent electrode 445 forms ohmic contact with the second conductivity type semiconductor layer 443b.

The second color filter 447 is substantially the same as that described with reference to FIG. 51, and thus, repeated descriptions thereof will be omitted.

As described above, the first LED stack 423, the second LED stack 433, and the third LED stack 443 are grown on different substrates, and the formation sequence thereof is not particularly limited.

Figure 52D:
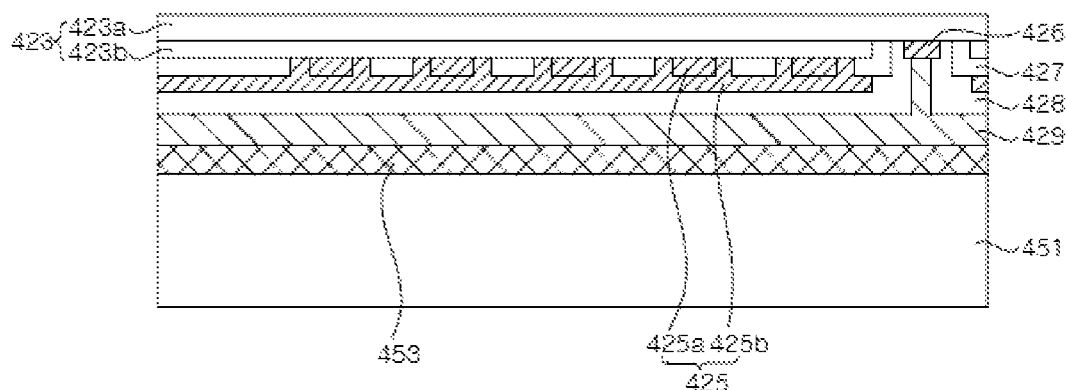

Referring to FIG. 52D, the first LED stack 423 is coupled to the support substrate 451 via a first bonding layer 453. Bonding material layers may be disposed on the support substrate 451 and the interconnection line 429, and are bonded to each other to form the first bonding layer 453. The interconnection line 429 is disposed to face the support substrate 451. The first substrate 421 is removed from the first LED stack 423 by chemical etching, for example. As such, an upper surface of the first conductivity type semiconductor layer of the first LED stack 423 is exposed. In some exemplary embodiments, the exposed surface of the first conductivity type semiconductor layer 423a may be subjected to texturing to improve light extraction efficiency. For example, a light extraction structure such as a roughened surface can be formed on the surface of the first conductivity type semiconductor layer 423a.

Figure 52E:
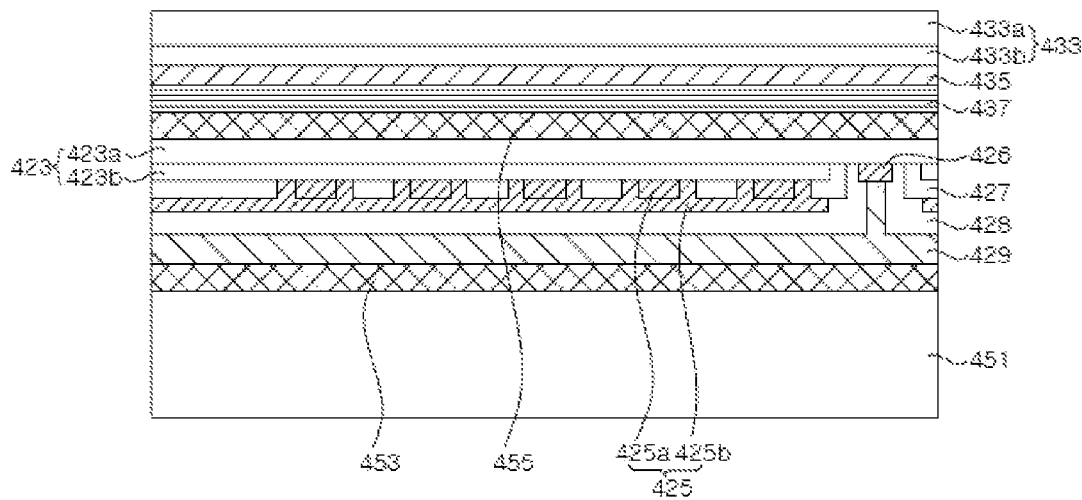

Referring to FIG. 52E, the second LED stack 433 is coupled to the first LED stack 423 via a second bonding layer 455. The first color filter 437 is disposed to face the first LED stack 423 and is bonded to the second bonding layer 455. Bonding material layers may be disposed on the first LED stack 423 and the first color filter 437, and are bonded to each other to form the second bonding layer 455. The second substrate 431 may be removed from the second LED stack 433 by a laser lift-off or chemical lift-off process. In addition, a roughened surface may be formed on the exposed surface of the first conductivity type semiconductor layer 4433a by surface texturing, for example, in order to improve light extraction efficiency.

Then, referring to FIG. 51 and FIG. 52C, the third LED stack 443 is coupled to the second LED stack 433 via a third bonding layer 457. The second color filter 447 is disposed to face the second LED stack 433 and bonded to the third bonding layer 457. Bonding material layers may be disposed on the second LED stack 433 and the third color filter 447, and are bonded to each other to form the third bonding layer 457.

The third substrate 441 may be separated from the third LED stack 443 by a laser lift-off or chemical lift-off process. As such, as shown in FIG. 51, a light emitting diode stack for a display, which has the first conductivity type semiconductor layer 443a of the third LED stack 443 exposed to the outside, is provided. In addition, a roughened surface may be formed on the exposed surface of the first conductivity type semiconductor layer 443a by surface texturing, for example.

A display apparatus may be provided by patterning the stack of the first to third LED stacks 423, 433, 443 on the support substrate 451 in pixel units, followed by connecting the first to third LED stacks to one another through interconnections. Hereinafter, exemplary embodiments of the display apparatus will be described.

Figure 53:
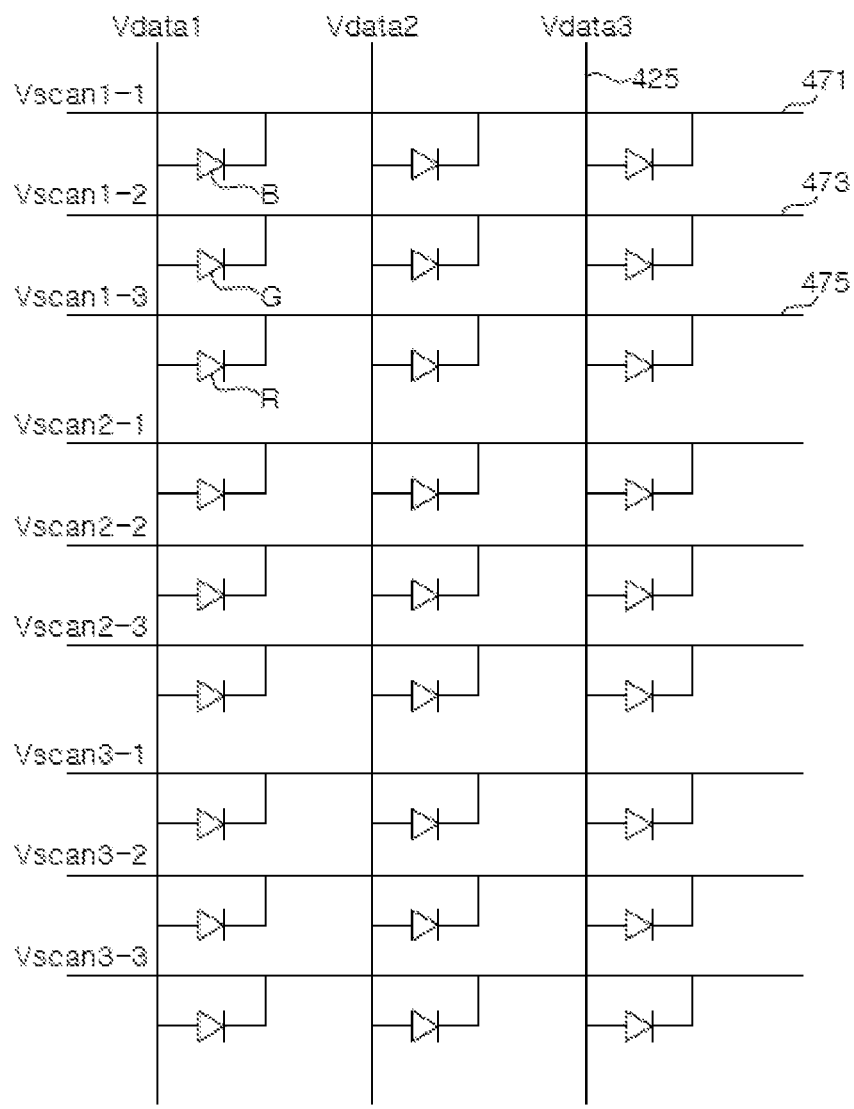
FIG. 53 is a schematic circuit diagram of a display apparatus according to an exemplary embodiment.
Figure 54:
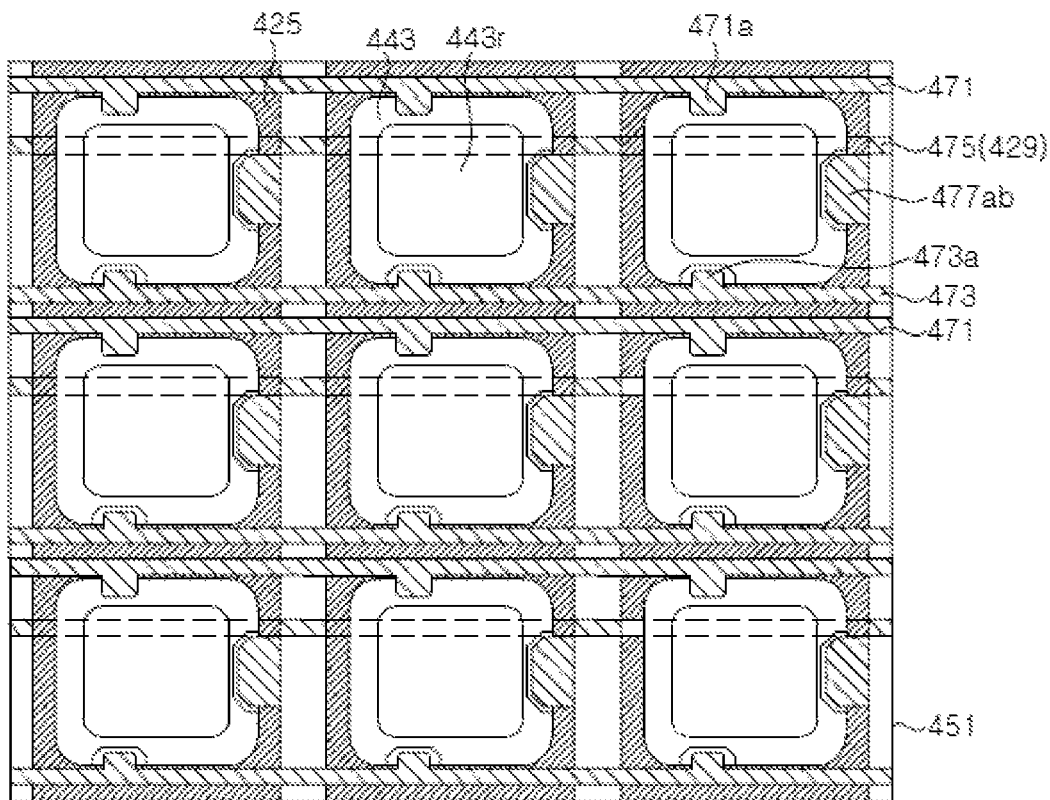
FIG. 54 is a schematic plan view of the display apparatus according to an exemplary embodiment.

FIG. 53 is a schematic circuit diagram of a display apparatus according to an exemplary embodiment, and FIG. 54 is a schematic plan view of the display apparatus according to an exemplary embodiment.

Referring to FIG. 53 and FIG. 54, the display apparatus according to the illustrated exemplary embodiment may be implemented to be operated in a passive matrix manner.

For example, since the light emitting diode stack for a display of FIG. 51 has the structure, in which the first to third LED stacks 423, 433, 443 are stacked in the vertical direction, one pixel includes three light emitting diodes R, G, B. Here, a first light emitting diode R corresponds to the first LED stack 423, a second light emitting diode G corresponds to the second LED stack 433, and a third light emitting diode B corresponds to the third LED stack 443.

In FIGS. 53 and 54, one pixel includes the first to third light emitting diodes R, G, B, each of which corresponds to a subpixel. Anodes of the first to third light emitting diodes R, G, B are connected to a common line, for example, a data line, and cathodes thereof are connected to different lines, for example, scan lines. For example, in the first pixel, the anodes of the first to third light emitting diodes R, G, B are commonly connected to a data line Vdata1 and the cathodes thereof are connected to scan lines Vscan1-3, Vscan1-2, Vscan1-1, respectively. In this manner, the light emitting diodes R, G, B in each pixel can be independently driven.

In some exemplary embodiments, each of the light emitting diodes R, G, B may be driven by pulse width modulation or by changing the magnitude of electric current to regulate the brightness of each subpixel.

Referring to FIG. 54, a plurality of pixels is formed by patterning the stack described with reference to FIG. 51, and each of the pixels is connected to the reflective electrodes 425 and the interconnection lines 471, 473, 475. As shown in FIG. 53, the reflective electrode 425 may be used as the data line Vdata, and the interconnection lines 471, 473, 475 may be formed as the scan lines. Here, the interconnection line 475 may be formed by the interconnection line 429. The reflective electrode 425 may electrically connect the first conductivity type semiconductor layers 423a, 433a, 443a of the first to third LED stacks 423, 433, 443 of the plurality of pixels, and the interconnection line 429 may be disposed to be substantially orthogonal to the reflective electrode 425 to electrically connect the first conductivity type semiconductor layers 423a of the plurality of pixels.

The pixels may be arranged in a matrix form, in which the anodes of the light emitting diodes R, G, B of each pixel are commonly connected to the reflective electrode 425, and the cathodes thereof are connected to the interconnection lines 471, 473, 475 separated from one another. Here, the interconnection lines 471, 473, 475 may be used as the scan lines Vscan.

Figure 55:
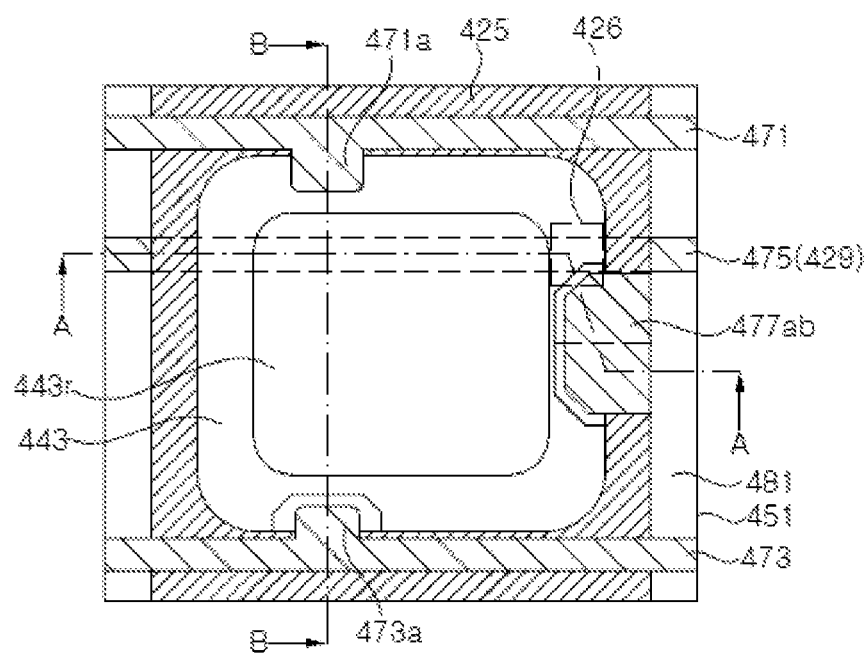
FIG. 55 is an enlarged plan view of one pixel of the display apparatus of FIG. 54.
Figure 56:
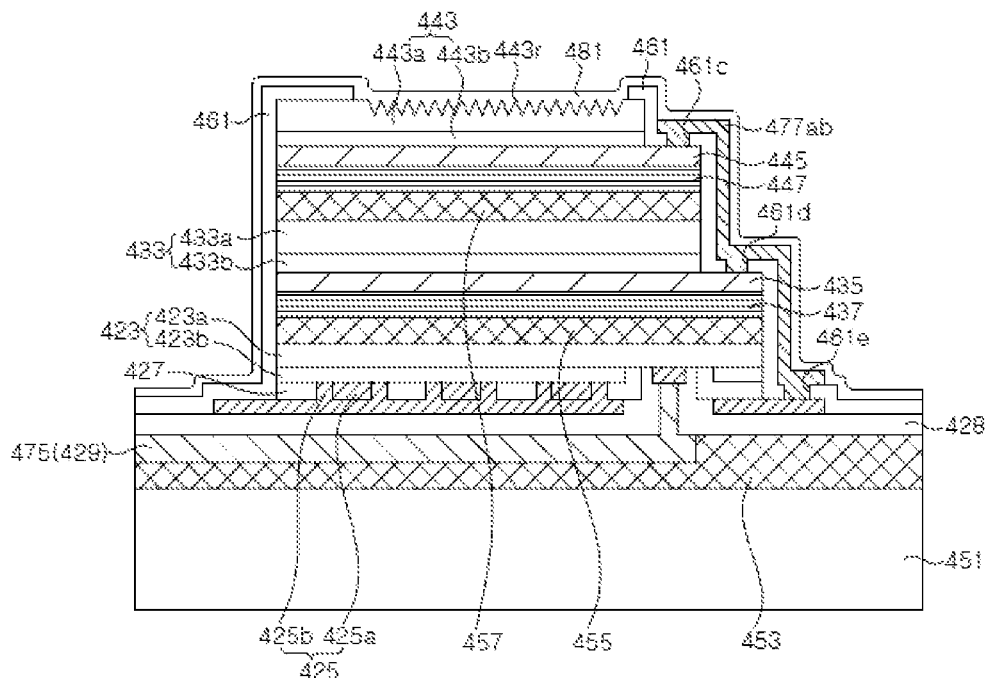
FIG. 56 is a schematic cross-sectional view taken along line A-A of FIG. 55.
Figure 57:
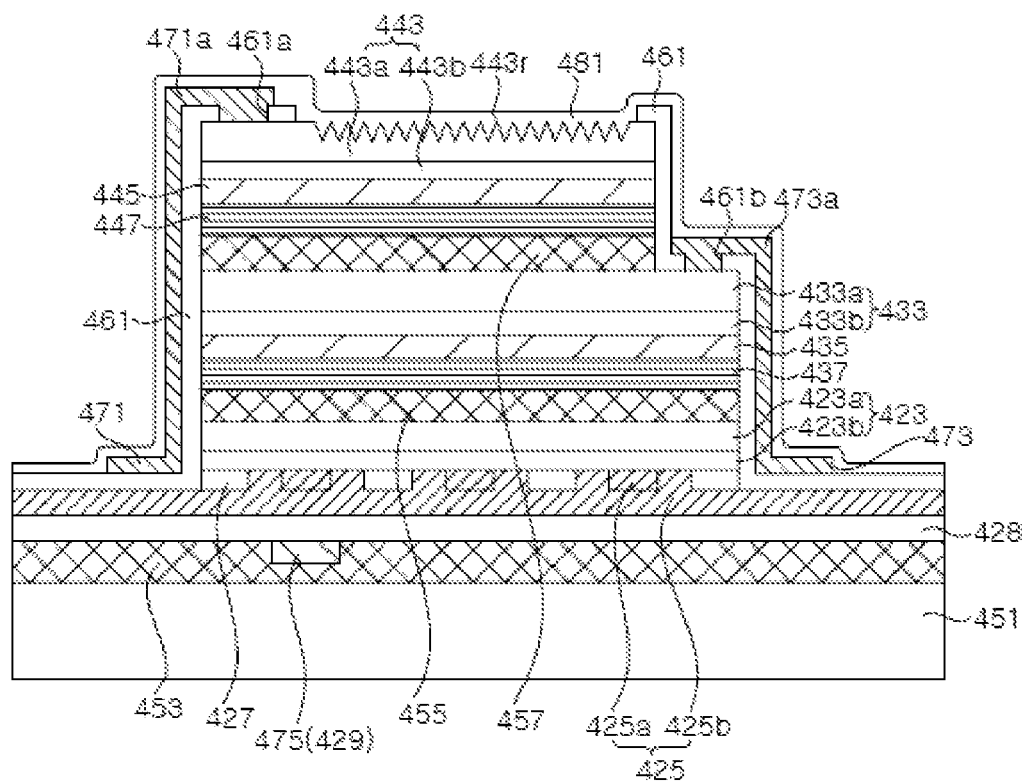
FIG. 57 is a schematic cross-sectional view taken along line B-B of FIG. 55.

FIG. 55 is an enlarged plan view of one pixel of the display apparatus of FIG. 54, FIG. 56 is a schematic cross-sectional view taken along line A-A of FIG. 55, and FIG. 57 is a schematic cross-sectional view taken along line B-B of FIG. 55.

Referring to FIG. 54, FIG. 55, FIG. 56, and FIG. 57, in each pixel, a portion of the reflective electrode 425, a portion of the second-p transparent electrode 435, a portion of the upper surface of the second LED stack 433, a portion of the third-p transparent electrode 445, and the upper surface of the third LED stack 443 are exposed to the outside.

The third LED stack 443 may have a roughened surface 443r on the upper surface thereof. The roughened surface 443r may be formed over substantially the entire upper surface of the third LED stack 443, or may be formed in some regions thereof, as shown in the drawings.

A lower insulation layer 461 may cover a side surface of each pixel. The lower insulation layer 461 may be formed of a light transmissive material, such as $SiO_2$. In this case, the lower insulation layer 461 may cover substantially the entire upper surface of the third LED stack 443. Alternatively, the lower insulation layer 461 may include a distributed Bragg reflector to reflect light traveling towards the side surfaces of the first to third LED stacks 423, 433, 443. In this case, the lower insulation layer 461 at least partially exposes the upper surface of the third LED stack 443.

The lower insulation layer 461 may include an opening 461a which exposes the upper surface of the third LED stack 443, an opening 461b which exposes the upper surface of the second LED stack 433, an opening 461c which exposes the third-p transparent electrode 445, an opening 461d which exposes the second-p transparent electrode 435, and openings 461e which expose the first-p reflective electrode 425. The upper surface of the first LED stack 423 may not be exposed.

The interconnection lines 471, 473 may be formed near the first to third LED stacks 423, 433, 443 on the support substrate 451, and may be disposed on the lower insulation layer 461 to be insulated from the first-p reflective electrode 425. A connecting portion 477ab connects the second-p transparent electrode 435 and the third-p transparent electrode 445 to the reflective electrode 425. As such, the anodes of the first LED stack 423, the second LED stack 433, and the third LED stack 443 are commonly connected to the reflective electrode 425.

The interconnection line 475 or 429 may be disposed under the reflective electrode 425 to be substantially orthogonal to the reflective electrode 425, and may be connected to the ohmic electrode 426 to be electrically connected to the first conductivity type semiconductor layer 423a. The ohmic electrode 426 is connected to the first conductivity type semiconductor layer 423a under the first LED stack 423. As shown in FIG. 55, the ohmic electrode 426 may be disposed outside a lower region of the roughened surface 443r of the third LED stack 443, thereby reducing light loss.

A connecting portion 471a connects the upper surface of the third LED stack 443 to the interconnection line 471, and a connecting portion 473a connects the upper surface of the second LED stack 433 to the interconnection line 473.

An upper insulation layer 481 may be disposed on the interconnection lines 471, 473 and the lower insulation layer 461 to protect the interconnection lines 471, 473, 475. The upper insulation layer 481 may have openings which expose the interconnection lines 471, 473, 475, such that bonding wires can be connected therethrough.

According to the illustrated exemplary embodiment, the anodes of the first to third LED stacks 423, 433, 443 are commonly connected to the reflective electrode 425, and the cathodes thereof are connected to the interconnection lines 471, 473, 475, respectively. In this manner, the first to third LED stacks 423, 433, 443 can be independently driven.

Although the electrodes of each pixel are above described as being connected to the data line and the scan lines, the inventive concepts are not limited thereto and various other implementations may be performed.

FIG. 58A to FIG. 58H are schematic plan views illustrating a method of manufacturing a display apparatus according to an exemplary embodiment. Herein, the following description will be given with reference to a method of forming the pixel of FIG. 55.

First, the light emitting diode stack 400 described in FIG. 51 is prepared.

Figure 58A:
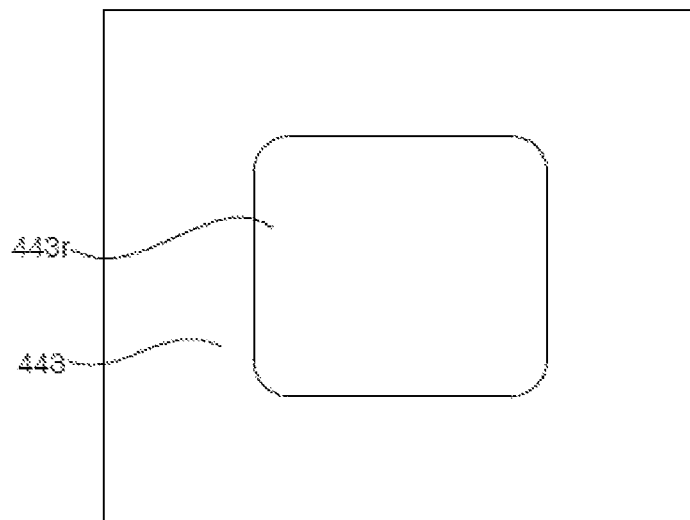
FIGS. 58A, 58B, 58C, 58D, 58E, 58F, 58G, and 58H are schematic plan views illustrating a method of manufacturing a display apparatus according to an exemplary embodiment.

Then, referring to FIG. 58A, a roughened surface 443r may be formed on the upper surface of the third LED stack 443. The roughened surface 443r may be formed on the upper surface of the third LED stack 443 so as to correspond to each pixel region. The roughened surface 443r may be formed by chemical etching, for example, photo-enhanced chemical etching (PEC).

The roughened surface 443r may be partially formed in each pixel region by taking into account a region of the third LED stack 443 to be etched in the subsequent process, without being limited thereto. In particular, the roughened surface 443r may be formed such that the ohmic electrode 426 is placed outside the roughened surface 443r. Alternatively, the roughened surface 443r may be formed over substantially the entire upper surface of the third LED stack 443.

Figure 58B:
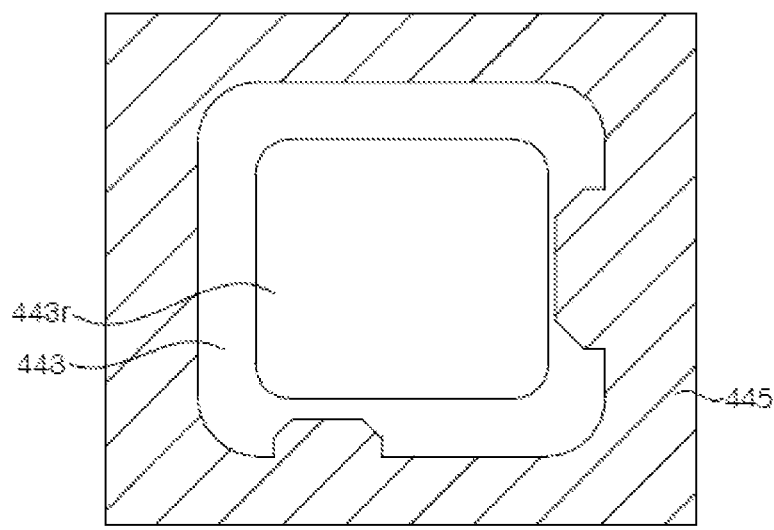

Referring to FIG. 58B, a surrounding region of the third LED stack 443 in each pixel is removed by etching to expose the third-p transparent electrode 445. As shown in the drawings, the third LED stack 443 may remained to have a substantially rectangular shape or a square shape, as shown in the drawings. The third LED stack 443 may have at least two depressions along an edge thereof. In addition, as shown in the drawings, one depression may be greater than the other depression.

Figure 58C:
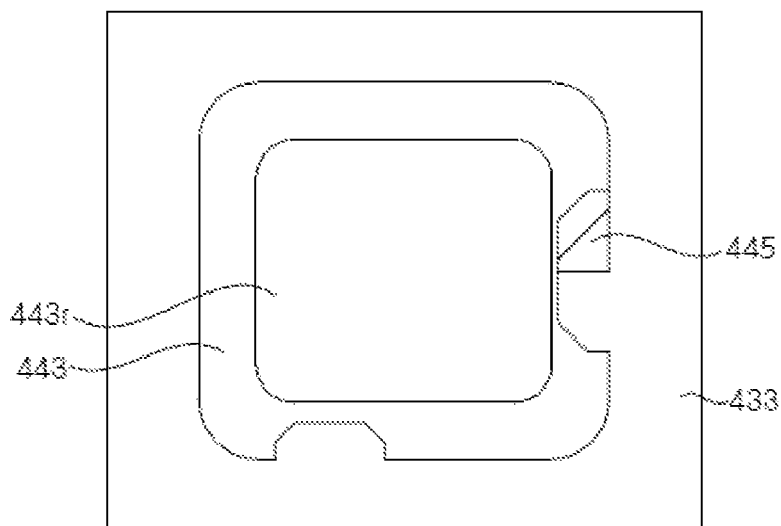

Referring to FIG. 58C, the upper surface of the second LED stack 433 is exposed by removing the third-p transparent electrode 445 exposed in other regions except a portion of the third-p transparent electrode 445 disposed in the depression having a larger size. Accordingly, the upper surface of the second LED stack 433 is exposed around the third LED stack 443 and in the other depression. In the depression having a larger size, an exposed region of the third-p transparent electrode 445 and an exposed region of the second LED stack 433 are formed.

Figure 58D:
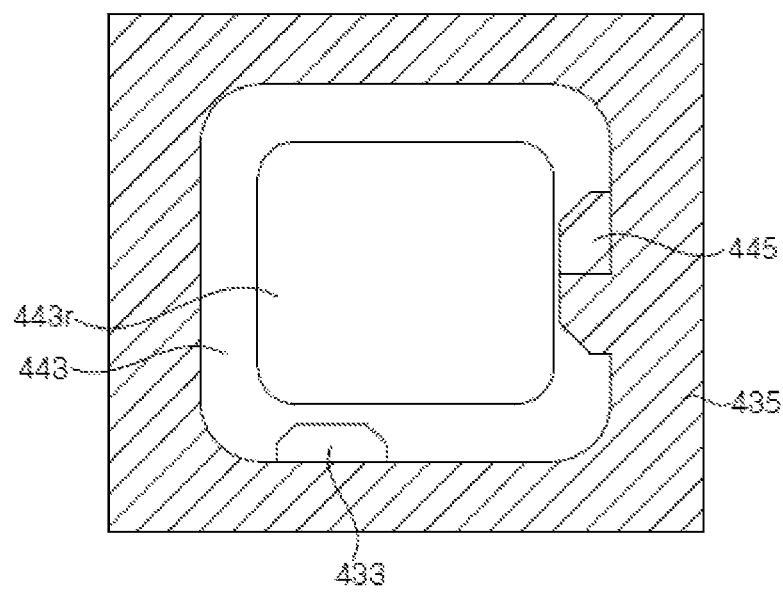

Referring to FIG. 58D, the second-p transparent electrode 435 is exposed by removing the second LED stack 433 exposed in other regions except a portion of the second LED stack 433 disposed in the depression having a smaller size. The second-p transparent electrode 435 is exposed around the third LED stack 443 and is partially exposed in the depression having a larger size.

Figure 58E:
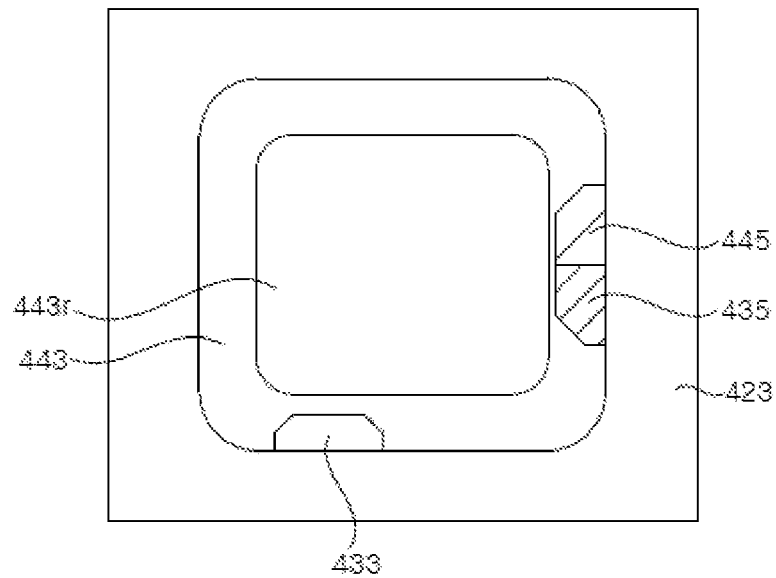

Referring to FIG. 58E, the upper surface of the first LED stack 423 is exposed by removing the second-p transparent electrode 435 exposed around the third LED stack 443 except a portion of the second-p transparent electrode 435 disposed in the depression having a larger size.

Figure 58F:
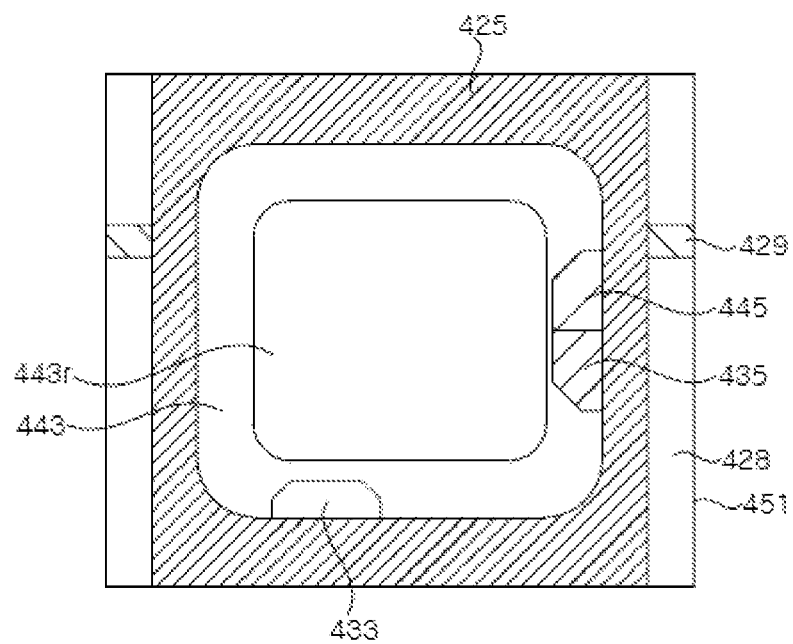

Referring to FIG. 58F, the reflective electrode 425 is exposed by removing the first LED stack 423 exposed around the third LED stack 443, followed by removing the first insulation layer 427. As such, the reflective electrode 425 is exposed around the third LED stack 443. Linear interconnection lines are formed by patterning the exposed reflective electrode 425 to have a substantially elongated shape in the vertical direction. The patterned reflective electrode 425 may be disposed over the plurality of regions in the vertical direction and be separated from adjacent pixels in the horizontal direction.

Although the reflective electrode 425 is described above as being subjected to patterning after removal of the first LED stack 423, in some exemplary embodiments, the reflective electrode 425 may be formed to have a patterned shape upon formation of the reflective electrode 425 on the first substrate 421. In this case, the process for patterning the reflective electrode 425 after removal of the first LED stack 423 may be omitted.

The second insulation layer 428 may be exposed by patterning the reflective electrode 425. The interconnection line 429 is disposed substantially orthogonal to the reflective electrode 425, and is insulated from the reflective electrode 425 by the second insulation layer 428.

Figure 58G:
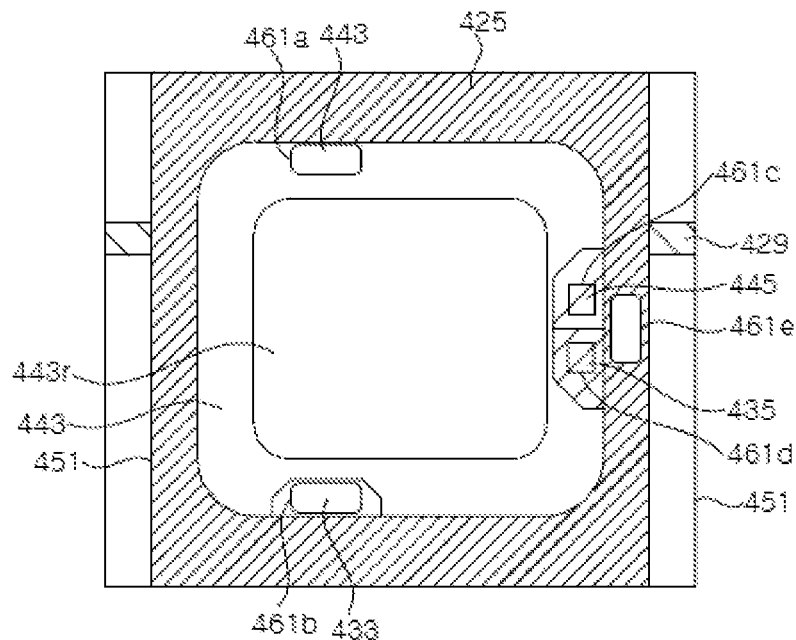

Referring to FIG. 58G, a lower insulation layer 461 (see FIG. 56 and FIG. 57) is formed to cover the pixels. The lower insulation layer 461 covers the reflective electrode 425 and side surfaces of the first to third LED stacks 423, 433, 443. In addition, the lower insulation layer 461 may at least partially cover the upper surface of the third LED stack 443. If the lower insulation layer 461 is a transparent layer such as a $SiO_2$ layer, the lower insulation layer 461 may cover substantially the entire upper surface of the third LED stack 443. Alternatively, the lower insulation layer 461 may include a distributed Bragg reflector. In this case, the lower insulation layer 461 may at least partially expose the upper surface of the third LED stack 443 so as to allow light to be emitted to the outside.

The lower insulation layer 461 may include an opening 461a which exposes the third LED stack 443, an opening 461b which exposes the second LED stack 433, an opening 461c which exposes the third-p transparent electrode 445, an opening 461d which exposes the second-p transparent electrode 435, and an opening 461e which exposes the reflective electrode 425. The opening 461e exposing the reflective electrode 425 may be formed singularly or in plural.

Figure 58H:
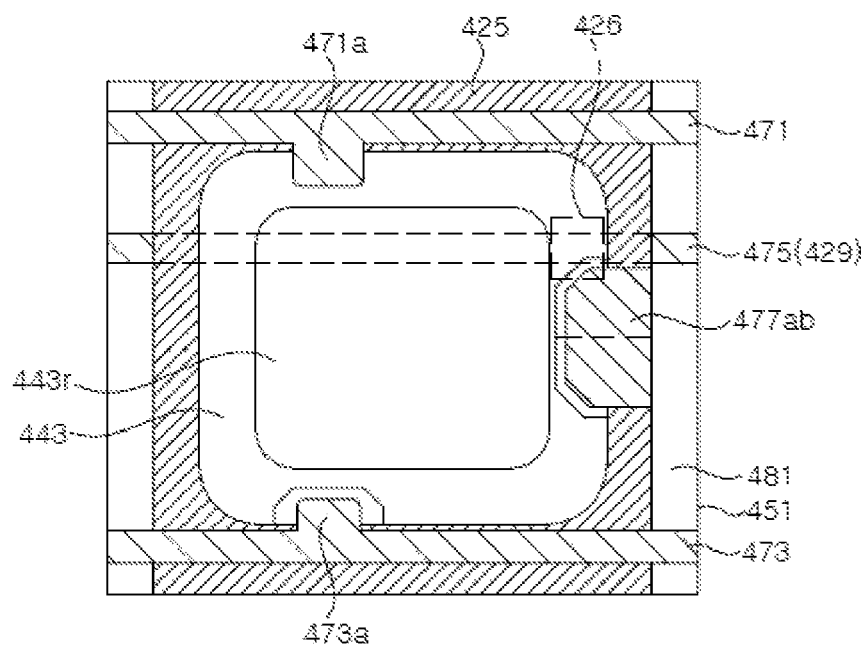

Referring to FIG. 58H, interconnection lines 471, 473, and connecting portions 471a, 473a, 477ab are formed, by a lift-off process, for example. The interconnection lines 471, 473 are insulated from the reflective electrode 425 by the lower insulation layer 461. The connecting portion 471a electrically connects the third LED stack 443 to the interconnection line 471, and the connecting portion 473a electrically connects the second LED stack 433 to the interconnection line 473. The connecting portion 477ab electrically connects the third-p transparent electrode 445 and the second-p transparent electrode 435 to the first-p reflective electrode 425.

The interconnection lines 471, 473 may be disposed to be substantially orthogonal to the reflective electrode 425 and may connect the plurality of pixels to each other.

Then, an upper insulation layer 481 (see FIG. 56 and FIG. 57) may be formed to cover the interconnection lines 471, 473 and the connecting portions 471a, 473a, 477ab. The upper insulation layer 481 may also cover substantially the entire upper surface of the third LED stack 443. The upper insulation layer 481 may be formed of, for example, silicon oxide or silicon nitride, and may include a distributed Bragg reflector. In addition, the upper insulation layer 481 may include a transparent insulation layer and a reflective metal layer, or a multilayered organic reflective layer formed on the transparent insulation layer to reflect light, or may include a light absorption layer formed of a black epoxy resin to block light.

When the upper insulation layer 481 reflects or blocks light, the upper insulation layer 481 is formed to at least partially expose the upper surface of the third LED stack 443 in order to allow light to be emitted to the outside. The upper insulation layer 481 may be partially removed to expose the interconnection lines 471, 473, 475 for electrical connection from the outside. In some exemplary embodiments, the upper insulation layer 481 may be omitted.

As such, a pixel region is provided as shown in FIG. 55. In addition, as shown in FIG. 54, a plurality of pixels may be formed on the support substrate 451 and may be connected to one another by the first-p the reflective electrode 425 and the interconnection lines 471, 473, 475 to be driven in a passive matrix manner.

Although a method of manufacturing a display apparatus adapted to be driven in a passive matrix manner has been described, the inventive concepts are not limited thereto. In particular, the display apparatus according to an exemplary embodiment may be manufactured in various ways to be driven in the passive matrix manner using the light emitting diode stack shown in FIG. 51.

Although the interconnection line 471 and the interconnection line 473 are described as being formed together on the lower insulation layer 461, in some exemplary embodiments, the interconnection line 471 may be formed on the lower insulation layer 461 and the interconnection line 473 may be formed on the upper insulation layer 481.

Referring back to FIG. 51, although the reflective electrode 425, the second-p transparent electrode 435, and the third-p transparent electrode 445 form ohmic contact with the second conductivity type semiconductor layer 423b, 433b, 443b of the first LED stack 423, the second LED stack 433, and the third LED stack 443, respectively, and the ohmic electrode 426 forms ohmic contact with the first conductivity type semiconductor layer 423a of the first LED stack 423, the first conductivity type semiconductor layer 433a, 433b of the second LED stack 433 and the third LED stack 443 may not be provided with a separate ohmic contact layer. When the pixels have a small size of 200 μm or less, there is no difficulty in current spreading even without the formation of a separate ohmic contact layer in the n-type semiconductor layer. However, a transparent electrode layer may be disposed on the n-type semiconductor layer of each of the second and third LED stacks in order to secure current spreading.

According to the exemplary embodiments, since a plurality of pixels may be formed at the wafer level using the light emitting diode stack 400 for a display, the steps for individual mounting light emitting diodes may be obviated. In addition, the light emitting diode stack according to the exemplary embodiments has the structure, in which the first to third LED stacks 423, 433, 443 are stacked in the vertical direction, thereby securing an area for subpixels in a limited pixel area. Furthermore, the light emitting diode stack according to the exemplary embodiments allows light generated from the first LED stack 423, the second LED stack 433, and the third LED stack 443 to be emitted to the outside therethrough, thereby reducing light loss.

Figure 59:
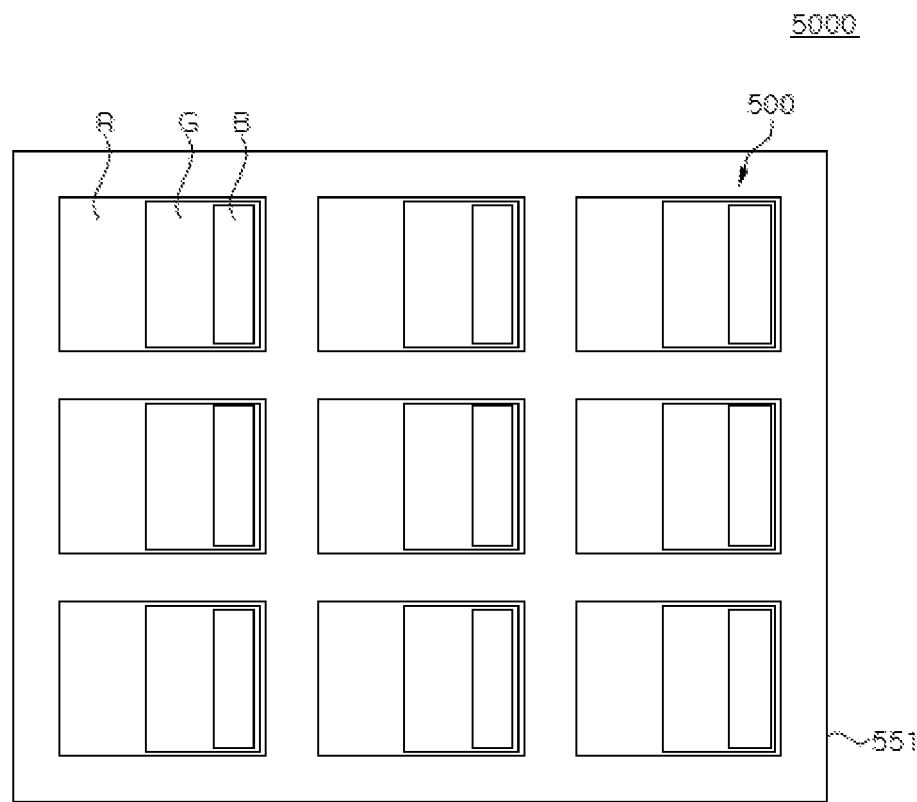
FIG. 59 is a schematic plan view of a display apparatus according to an exemplary embodiment.
Figure 60:
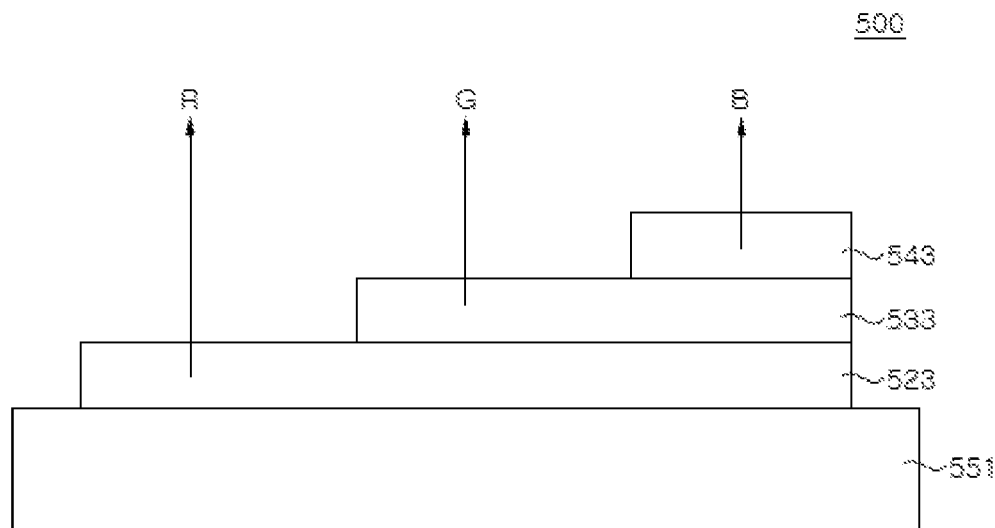
FIG. 60 is a schematic cross-sectional view of a light emitting diode pixel for a display according to an exemplary embodiment.

FIG. 59 is a schematic plan view of a display apparatus according to an exemplary embodiment, and FIG. 60 is a schematic cross-sectional view of a light emitting diode pixel for a display according to an exemplary embodiment.

Referring to FIG. 59, the display apparatus 5000 includes a support substrate 551 and a plurality of pixels 500 arranged on the support substrate 551. Each of the pixels 500 includes first to third subpixels R, G, B.

Referring to FIG. 60, the support substrate 551 supports LED stacks 523, 533, 543. The support substrate 551 may include a circuit on a surface thereof or therein, without being limited thereto. The support substrate 551 may include, for example, a Si substrate or a Ge substrate.

The first subpixel R includes a first LED stack 523, the second subpixel G includes a second LED stack 533, and the third subpixel B includes a third LED stack 543. The first subpixel R causes the first LED stack 523 to emit light, the second subpixel G causes the second LED stack 533 to emit light, and the third subpixel B causes the third LED stack 543 to emit light. The first to third LED stacks 523, 533, and 543 can be independently driven.

The first LED stack 523, the second LED stack 533, and the third LED stack 543 are stacked one above another in the vertical direction so as to overlap each other. Here, as shown in the drawings, the second LED stack 533 is disposed in some region on the first LED stack 523. As shown in the drawings, the second LED stack 533 may be disposed towards one side of the first LED stack 523. In addition, the third LED stack 543 is disposed in some region on the second LED stack 533. As shown in the drawings, the third LED stack 543 may be disposed towards one side on the second LED stack 533. Although the third LED stack 543 is shown to be disposed towards the right side in the drawings, the inventive concepts are not limited thereto, and in some exemplary embodiments, the second LED stack 533 may be disposed towards the left side.

Light R generated from the first LED stack 523 may be emitted through a region of the first LED stack 523 not covered by the second LED stack 533, and may also be emitted after passing through the second LED stack 533 and the third LED stack 543. Light G generated from the second LED stack 533 may be emitted through a region of the second LED stack 533 not covered by the third LED stack 543 and may also be emitted after passing through the third LED stack 543.

In general, a region of the first LED stack 523 covered by the second LED stack 533 can cause light loss, whereby the region of the first LED stack 523 not covered by the second LED stack 533 can emit light having higher luminous intensity per unit area. Accordingly, luminous intensity of light emitted from the first LED stack 523 may be controlled by adjusting the areas of the regions of the first LED stack 523 covered by the second LED stack 533 and not covered by the second LED stack 533 among the area of the first LED stack 523. Likewise, luminous intensity of light emitted from the second LED stack 533 may be controlled by adjusting the areas of the regions of the second LED stack 533 covered by the third LED stack 543 and not covered by the third LED stack 543 among the area of the second LED stack 533.

For example, when the first LED stack 523 emits red light, the second LED stack 533 emits green light, and the third LED stack 543 emits blue light, luminous intensity of green light may need to be reduced due to high visibility of green light. As such, the area of the second LED stack 533 not covered by the third LED stack 543 may be adjusted to be formed smaller than the area of the third LED stack 543. In addition, since red light has low visibility, luminous intensity of red light may need to be increased. As such, the area of the first LED stack 523 not covered by the second LED stack 533 may be adjusted to be formed greater than the area of the third LED stack 543.

Each of the first LED stack 523, the second LED stack 533, and the third LED stack 543 includes an n-type semiconductor layer, a p-type semiconductor layer, and an active layer interposed therebetween. The active layer may have a multi-quantum well layer structure. The first to third LED stacks 523, 533, and 543 may include different active layers to emit light having different wavelengths. For example, the first LED stack 523 may be an inorganic light emitting diode emitting red light, the second LED stack 533 may be an inorganic light emitting diode emitting green light, and the third LED stack 543 may be an inorganic light emitting diode emitting blue light. To this end, in an exemplary embodiment, the first LED stack 523 may include a GaInP-based well layer, and the second LED stack 533 and the third LED stack 543 may include GaInN-based well layers.

Figure 61:
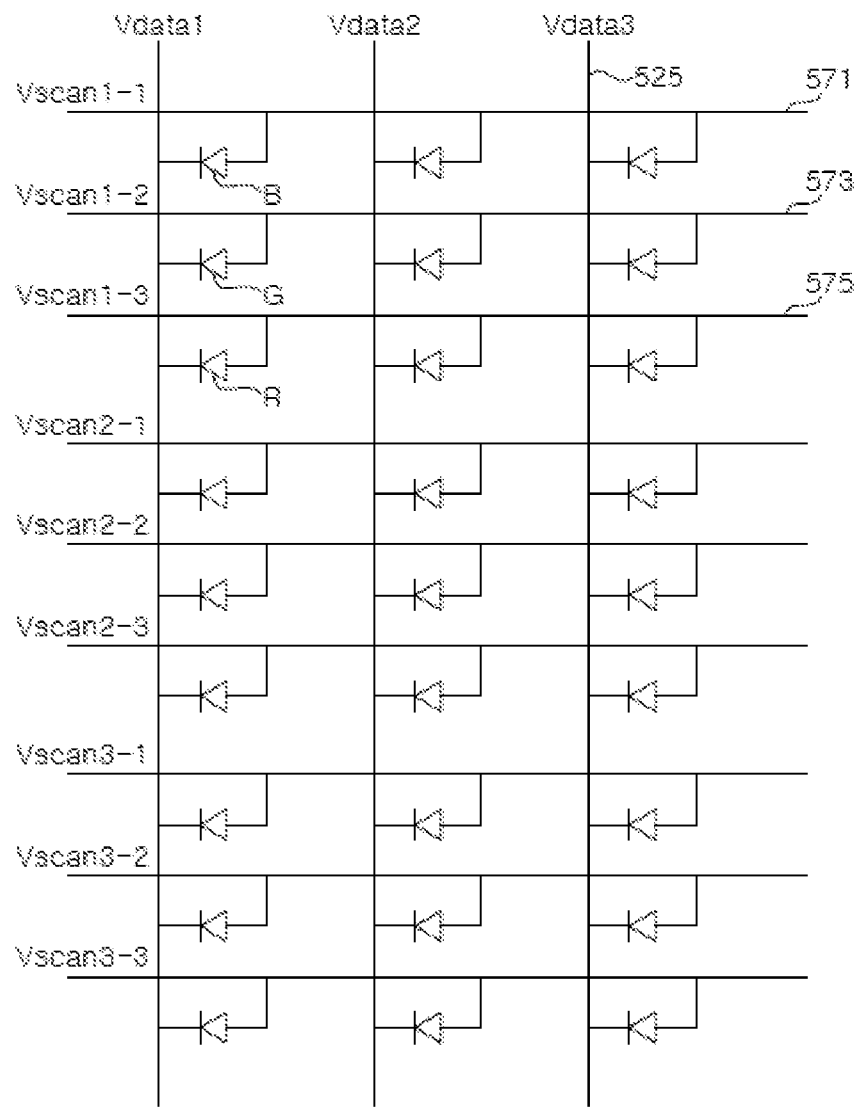
FIG. 61 is a schematic circuit diagram of a display apparatus according to an exemplary embodiment.

FIG. 61 is a schematic circuit diagram of a display apparatus according to an exemplary embodiment.

Referring to FIG. 61, the display apparatus according to the illustrated exemplary embodiment may be driven in a passive matrix manner. As described with reference to FIG. 59 and FIG. 60, one pixel includes first to third subpixels R, G, B. The first LED stack 523 of the first subpixel R emits light having a first wavelength, the second LED stack 533 of the second subpixel G emits light having a second wavelength, and the third LED stack 543 of the third subpixel B emits light having a third wavelength. Cathodes of the first to third subpixels R, G, B may be connected to a common line, for example, a data line Vdata, and anodes thereof may be connected to different lines, for example, scan lines Vscan.

For example, in the first pixel, the cathodes of the first to third subpixels R, G, B are commonly connected to the data line Vdata1, and the anodes thereof are connected to scan lines Vscan1-3, Vscan1-2, Vscan1-1, respectively. Accordingly, the subpixels R, G, B in the same pixel may be individually driven.

In some exemplary embodiments, each of the LED stacks 523, 533, and 543 may be driven by pulse width modulation or by changing the magnitude of electric current, to regulate the brightness of each subpixel. Furthermore, the brightness may be adjusted through adjustment of the areas of the first to third LED stacks 523, 533, and 543 and an area of a region in which the first to third LED stacks 523, 533, and 543 do not overlap.

Figure 62:
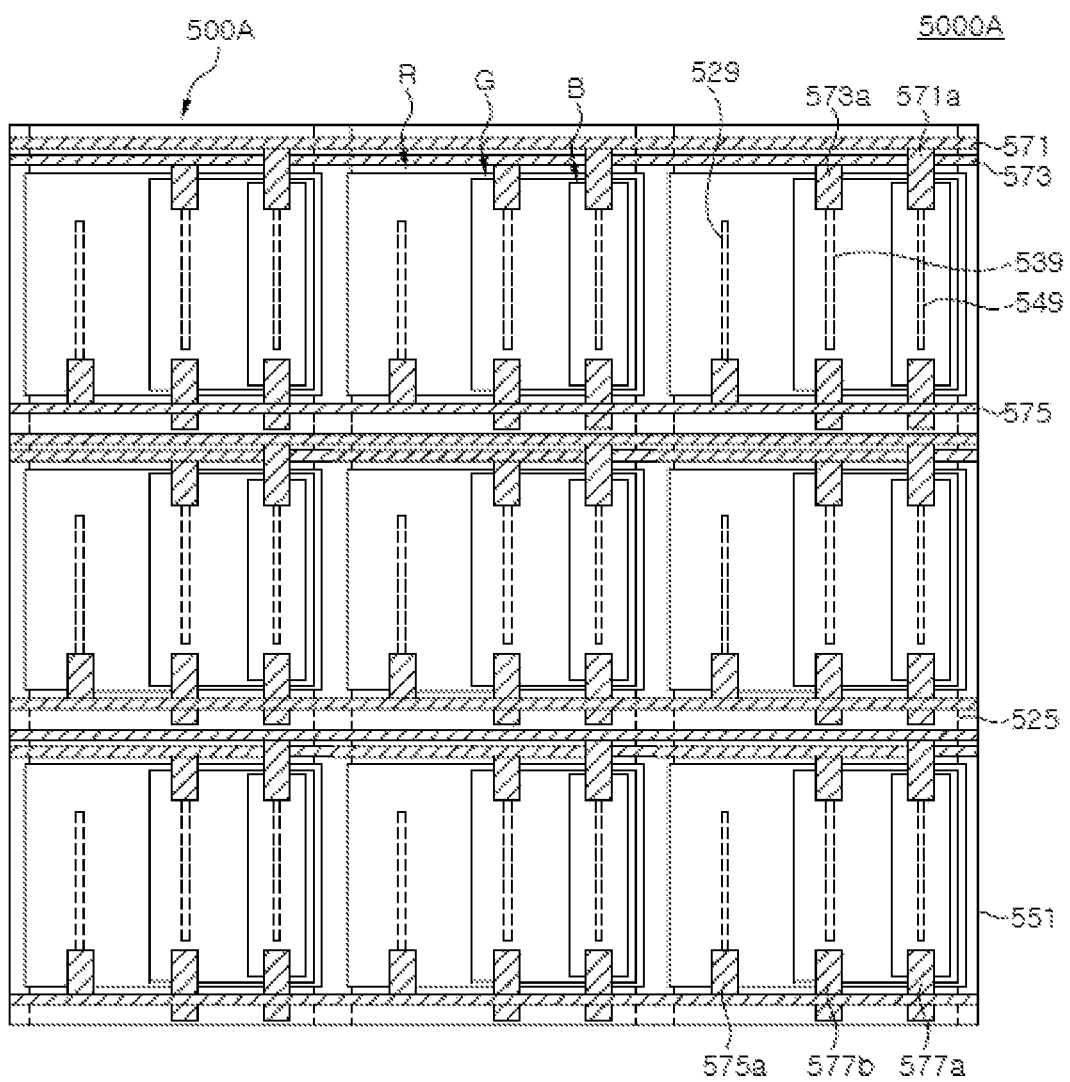
FIG. 62 is a schematic plan view of a display apparatus according to an exemplary embodiment.
Figure 63:
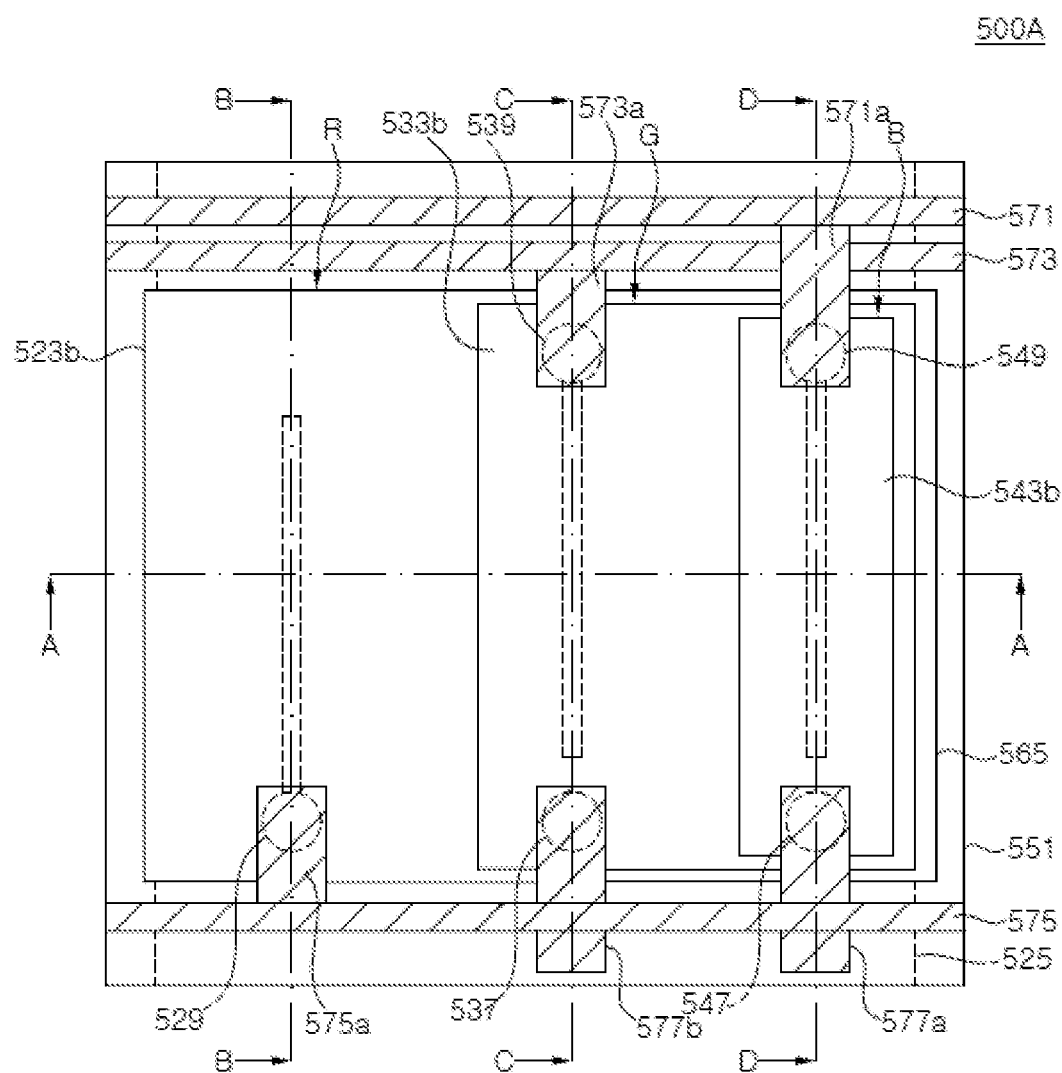
FIG. 63 is an enlarged plan view of one pixel of the display apparatus of FIG. 62.

FIG. 62 is a schematic plan view of a display apparatus according to an exemplary embodiment, in which a plurality of pixels 500A are arranged on a support substrate 551, as shown in the circuit diagram of FIG. 61. FIG. 63 is an enlarged plan view of one pixel 500A of the display apparatus of FIG. 62, and FIG. 64A, FIG. 64B, FIG. 64C and FIG. 64D are schematic cross-sectional views taken along lines A-A, B-B, C-C and D-D of FIG. 63.

Referring to FIG. 62, FIG. 63, FIG. 64A, FIG. 64B, FIG. 64C, and FIG. 64D, the display apparatus 5000A may include a support substrate 551, a plurality of pixels 500A, first to third subpixels R, G, B, a first LED stack 523, a second LED stack 533, a third LED stack 543, a reflective electrode (first-1 ohmic electrode) 525, a first-2 ohmic electrode 529, a second-1 ohmic electrode 537, a second-2 ohmic electrode 539, a third-1 ohmic electrode 547, a third-2 ohmic electrode 549, a first color filter 535, a second color filter 545, a first bonding layer 553, a second bonding layer 555, a third bonding layer 557, an insulation layer 527, a lower insulation layer 561, an upper insulation layer 563, interconnection lines 571, 573, and 575, and connecting portions 571a, 573a, 575a, 577a, and 577b.

Each of the subpixels R, G, B is connected to the reflective electrode 525 and the interconnection lines 571, 573, and 575. As shown in FIG. 61, the reflective electrode 525 may be used as a data line Vdata and the interconnection lines 571, 573, and 575 may be used as scan lines Vscan.

As shown in FIG. 62, the pixels may be arranged in a matrix form, in which the cathodes of the subpixels R, G, B in each pixel are commonly connected to the reflective electrode 525 and the anodes thereof are connected to the interconnection lines 571, 573, and 575 separated from each other. The connecting portions 571a, 573a, and 575a may connect the interconnection lines 571, 573, and 575 to the subpixels R, G, B.

The support substrate 551 supports the LED stacks 523, 533, and 543. The support substrate 551 may include a circuit on a surface thereof or therein, without being limited thereto. The support substrate 551 may include, for example, a glass substrate, a sapphire substrate, a Si substrate, or a Ge substrate.

The first LED stack 523 includes a first conductivity type semiconductor layer 523a and a second conductivity type semiconductor layer 523b. The second LED stack 533 includes a first conductivity type semiconductor layer 533a and a second conductivity type semiconductor layer 533b. The third LED stack 543 includes a first conductivity type semiconductor layer 543a and a second conductivity type semiconductor layer 543b. In addition, active layers may be interposed between the first conductivity type semiconductor layers 523a, 533a, and 543a and the second conductivity type semiconductor layers 523b, 533b, and 543b, respectively.

In an exemplary embodiment, each of the first conductivity type semiconductor layers 523a, 533a, and 543a may be an n-type semiconductor layer and each of the second conductivity type semiconductor layers 523b, 533b, and 543b may be a p-type semiconductor layer. In some exemplary embodiments, a roughened surface may be formed on a surface of at least one of the first conductivity type semiconductor layers 523a, 533a, and 543a by surface texturing, for example.

The first LED stack 523 is disposed near the support substrate 551, the second LED stack 533 is disposed above the first LED stack 523, and the third LED stack 543 is disposed above the second LED stack 533. In addition, the second LED stack 533 is disposed in some region on the first LED stack 523 such that the first LED stack 523 partially overlaps the second LED stack 533. In addition, the third LED stack 543 is disposed in some region on the second LED stack 533 such that second LED stack 533 partially overlaps the third LED stack 543. Accordingly, at least part of light generated from the first LED stack 523 may be emitted to the outside without passing through the second and third LED stacks 533 and 543. In addition, at least part of light generated from the second LED stack 533 may be emitted to the outside without passing through the third LED stack 543.

The first LED stack 523, the second LED stack 533, and the third LED stack 543 may include materials substantially the same as those described with reference to FIG. 60, and thus, repeated descriptions thereof will be omitted.

The reflective electrode 525 forms ohmic contact with a lower surface the first LED stack 523, that is, the first conductivity type semiconductor layer 523a thereof. The reflective electrode 525 includes a reflective layer to reflect light emitted from the first LED stack 523. As shown in the drawings, the reflective electrode 525 may cover substantially the entire lower surface of the first LED stack 523. Furthermore, the reflective electrode 525 may be commonly connected to the plurality of pixels 500A to be used as the data line Vdata.

The reflective electrode 525 may be formed of, for example, a material layer forming ohmic contact with the first conductivity type semiconductor layer 523a of the first LED stack 523, and may include a reflective layer that may reflect light generated from the first LED stack 523, for example, red light.

The reflective electrode 525 may include an ohmic reflective layer and may be formed of, for example, an Au—Te alloy or an Au—Ge alloy. These alloys have high reflectivity to light in the red range and form ohmic contact with the first conductivity type semiconductor layer 523a.

Figure 64A:
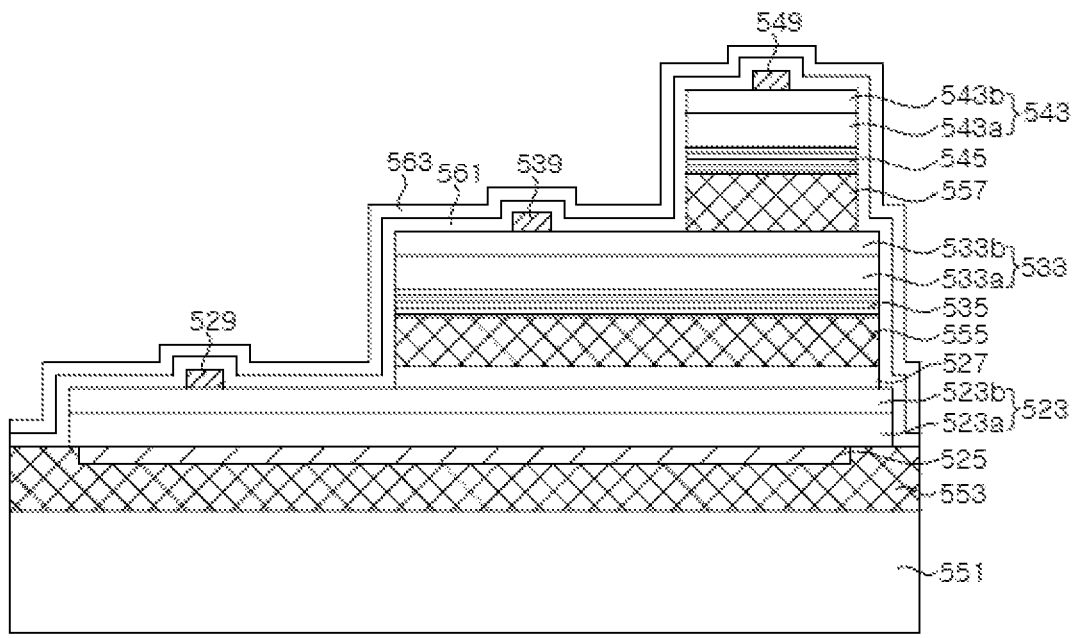
FIG. 64A is a schematic cross-sectional view taken along line A-A of FIG. 63.
Figure 64B:
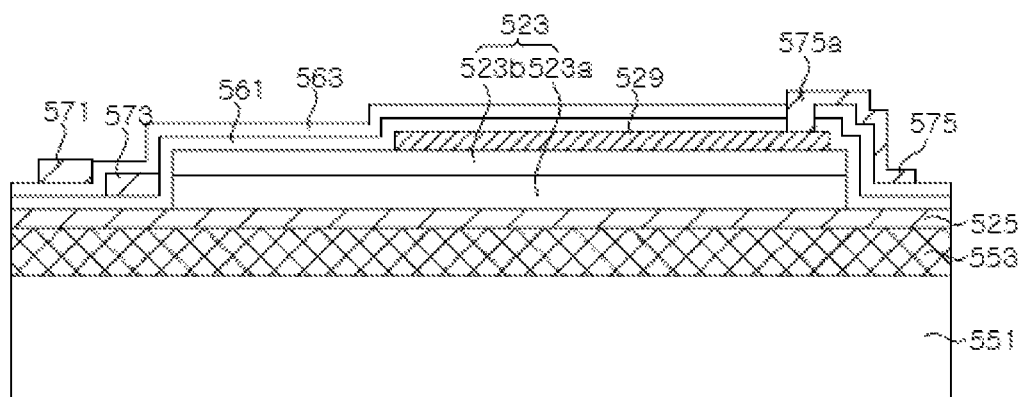
FIG. 64B is a schematic cross-sectional view taken along line B-B of FIG. 63.

The first-2 ohmic electrode 529 forms ohmic contact with the second conductivity type semiconductor layer 523b of the first LED stack 523. The first-2 ohmic electrode 529 may be formed of, for example, an Au—Zn alloy or an Au—Be alloy. The first-2 ohmic electrode 529 may include a pad region and an extended portion, and the connecting portion 575a may be connected to the pad region, as shown in FIG. 64B. The first-2 ohmic electrode 529 may be separated from a region in which the second LED stack 533 is disposed.

The second-1 ohmic electrode 537 forms ohmic contact with the first conductivity type semiconductor layer 533a of the second LED stack 533. The second-1 ohmic electrode 537 may be disposed on the first conductivity type semiconductor layer 533a. For example, the first conductivity type semiconductor layer 533a may be exposed by removing the second conductivity type semiconductor layer 533b and the active layer disposed on the first conductivity type semiconductor layer 533a, and the second-1 ohmic electrode 537 may be disposed on the exposed surface of the first conductivity type semiconductor layer 533a.

Figure 64C:
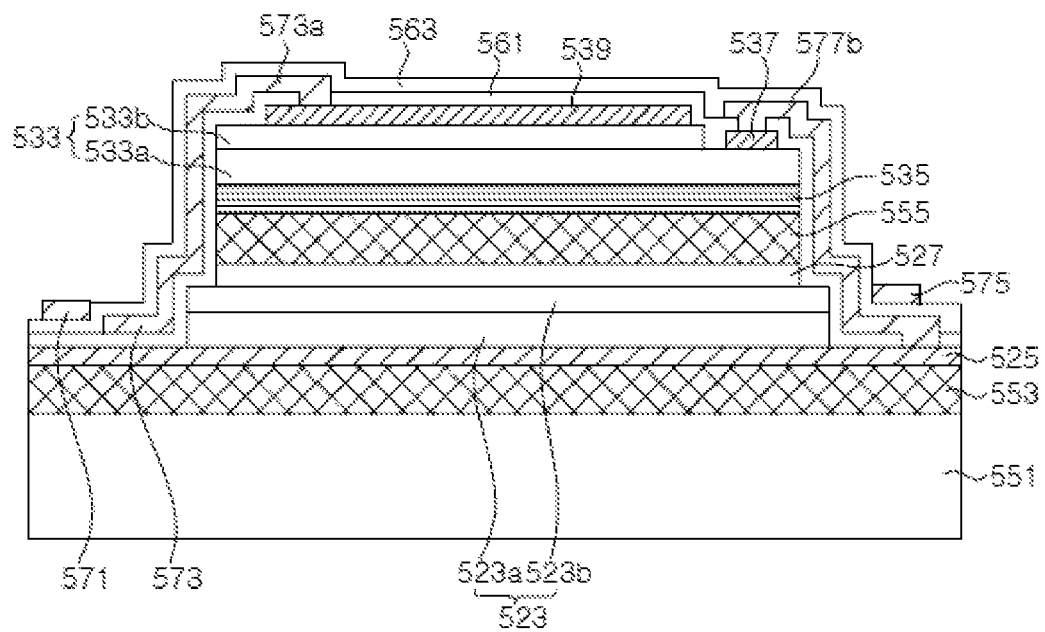
FIG. 64C is a schematic cross-sectional view taken along line C-C of FIG. 63.

As shown in FIG. 64C, the connecting portion 577b may electrically connect the second-1 ohmic electrode 537 to the reflective electrode 525. The second-1 ohmic electrode 537 may be separated from a region in which the third LED stack 543 is disposed.

The second-2 ohmic electrode 539 forms ohmic contact with the second conductivity type semiconductor layer 533b of the second LED stack 533. The second-2 ohmic electrode 539 may be disposed on the second conductivity type semiconductor layer 533b to be separated from the region in which the third LED stack 543 is disposed. The second-2 ohmic electrode 539 may include a pad region and an extended portion, as shown in FIG. 64C, and the connecting portion 573a may be connected to the pad region, as shown in FIG. 64C.

Figure 64D:
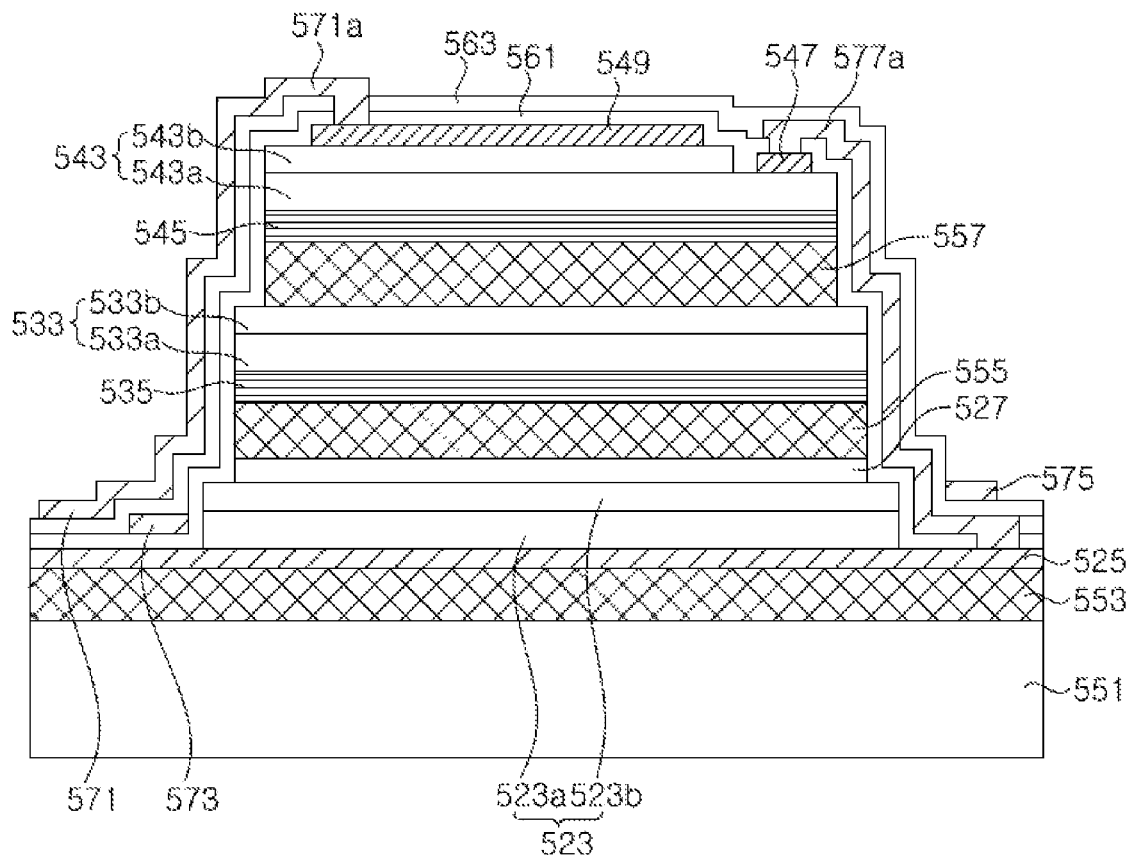
FIG. 64D is a schematic cross-sectional view taken along line D-D of FIG. 63.

The third-1 ohmic electrode 547 forms ohmic contact with the first conductivity type semiconductor layer 543a of the third LED stack 543. The third-1 ohmic electrode 547 may be disposed on the first conductivity type semiconductor layer 543a. For example, the first conductivity type semiconductor layer 543a may be exposed by removing the second conductivity type semiconductor layer 543b and the active layer disposed on the first conductivity type semiconductor layer 543a, and the third-1 ohmic electrode 547 may be disposed on the exposed surface of the first conductivity type semiconductor layer 543a. As shown in FIG. 64D, the connecting portion 577a may electrically connect the third-1 ohmic electrode 547 to the reflective electrode 525.

The third-2 ohmic electrode 549 forms ohmic contact with the second conductivity type semiconductor layer 543b of the third LED stack 543. The third-2 ohmic electrode 549 may also include a pad region and an extended portion, and the connecting portion 571a may be connected to the pad region of the third-2 ohmic electrode 549, as shown in FIG. 64D.

Each of the first-2 ohmic electrode 529, the second-2 ohmic electrode 539, and the third-2 ohmic electrode 549 may include an extended portion to assist in current spreading in each of the LED stacks.

The first color filter 535 may be interposed between the first LED stack 523 and the second LED stack 533. In addition, the second color filter 545 may be interposed between the second LED stack 533 and the third LED stack 543. The first color filter 535 transmits light generated from the first LED stack 523 while reflecting light generated from the second LED stack 533. The second color filter 545 transmits light generated from the first and second LED stacks 523 and 533, while reflecting light generated from the third LED stack 543. Accordingly, light generated from the first LED stack 523 may be emitted to the outside through the second LED stack 533 and the third LED stack 543, and light generated from the second LED stack 533 may be emitted to the outside through the third LED stack 543. Further, the light emitting diode pixel can prevent light generated from the second LED stack 533 from entering the first LED stack 523, and/or can prevent light generated from the third LED stack 543 from entering the second LED stack 533, thereby preventing light loss.

In some exemplary embodiments, the first color filter 535 may reflect light generated from the third LED stack 543.

The first and second color filters 535 and 545 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 537 and 545 may be formed by alternately stacking insulation layers having different refractive indices one above another, for example, by alternately stacking $TiO_2$ and $SiO_2$ layers. In particular, the first and second color filters 535 and 545 may include distributed Bragg reflectors (DBRs). The stop band of the distributed Bragg reflector may be controlled by adjusting the thicknesses of $TiO_2$ and $SiO_2$ layers. The low pass filter and the band pass filter may also be formed by alternately stacking insulation layers having different refractive indices one above another.

The first bonding layer 553 couples the first LED stack 523 to the support substrate 551. As shown in the drawings, the reflective electrode 525 may adjoin the first bonding layer 553. The first bonding layer 553 may be a light transmissive or opaque layer. The first bonding layer 553 may be formed of organic or inorganic materials. For example, the organic materials may include SUB, poly (methyl methacrylate) (PMMA), polyimide, Parylene, benzocyclobutene (BCB), or others, and the inorganic materials may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. In particular, a bonding layer formed of a black epoxy resin capable of absorbing light may be used as the first bonding layer 553, thereby improving the contrast of a display apparatus. The first bonding layer 553 may also be formed of spin-on-glass.

The second bonding layer 555 couples the first LED stack 523 to the second LED stack 533. The second bonding layer 555 may be interposed between the first LED stack 523 and the first color filter 535. The second bonding layer 555 transmits light generated from the first LED stack 523 and may be formed of a light transmissive bonding material, as in the first bonding layer 553.

The insulation layer 527 may be interposed between the second bonding layer 555 and the first LED stack 523. The insulation layer 527 may adjoin the second conductivity type semiconductor layer 523b. The insulation layer 527 may be formed of, for example, $SiO_2$, thereby improving bonding strength of the second bonding layer 555.

The third bonding layer 557 couples the second LED stack 533 to the third LED stack 543. The third bonding layer 557 may be interposed between the second LED stack 533 and the second color filter 545 to bond the second LED stack 533 to the second color filter 545. The third bonding layer 557 transmits light generated from the first and second LED stacks 523, 533, and may be formed of a light transmissive bonding material, as in the first bonding layer 553.

The lower insulation layer 561 may cover the first to third LED stacks 523, 533, and 543. The lower insulation layer 561 covers the reflective electrode 525 exposed around the first LED stack 523. In particular, the lower insulation layer 561 may have openings to provide electrical connection passages.

The upper insulation layer 563 covers the lower insulation layer 561. The upper insulation layer 563 may have openings to provide electrical connection passages.

The lower insulation layer 561 and the upper insulation layer 563 may be formed of any insulation materials, for example, silicon oxide or silicon nitride, without being limited thereto.

As shown in FIG. 62 and FIG. 63, the interconnection lines 571, 573, and 575 may be disposed to be substantially orthogonal to the reflective electrode 525. The interconnection line 571 and the interconnection line 575 are disposed on the upper insulation layer 563 and may be connected to the third-2 ohmic electrode 549 and the first-2 ohmic electrode 529 through the connecting portions 571a and 575a, respectively. As such, the upper insulation layer 563 and the lower insulation layer 561 may have openings that expose the third-2 ohmic electrode 549 and the first-2 ohmic electrode 529.

The interconnection line 573 is disposed on the lower insulation layer 561 and insulated from the reflective electrode 525. The interconnection line 573 may be disposed between the lower insulation layer 561 and the upper insulation layer 563, and connected to the second-2 ohmic electrode 539 through the connecting portion 573a. As such, the lower insulation layer 561 has an opening that exposes the second-2 ohmic electrode 539.

The connecting portions 577a and 577b are disposed between the lower insulation layer 561 and the upper insulation layer 563, and electrically connect the third-1 ohmic electrode 547 and the second-1 ohmic electrode 537 to the reflective electrode 525, respectively. As such, the lower insulation layer 561 may have openings that expose the third-1 ohmic electrode 547 and the second-1 ohmic electrode 537.

The interconnection line 571 and the interconnection line 573 are insulated from each other by the upper insulation layer 563, and thus may be disposed to overlap in the vertical direction.

Although the electrodes of each pixel are described above as being connected to the data line and the scan lines, the inventive concepts are not limited thereto. In particular, the interconnection lines 571 and 575 described above are formed on the lower insulation layer 561, and the interconnection line 573 is disposed between the lower insulation layer 561 and the upper insulation layer 563. However, in some exemplary embodiments, all of the interconnection lines 571, 573, and 575 may be formed on the lower insulation layer 561 and may be covered by the upper insulation layer 563, and the connecting portions 571a and 575a may be formed on the upper insulation layer 563.

Next, a method of manufacturing the display apparatus 5000A according an exemplary embodiment will be described.

FIG. 65A to FIG. 77 are schematic plan views and cross-sectional views illustrating a method of manufacturing a display apparatus according to an exemplary embodiment. Each of these cross-sectional views is taken along line A-A of the corresponding plan view.

Figure 65A:
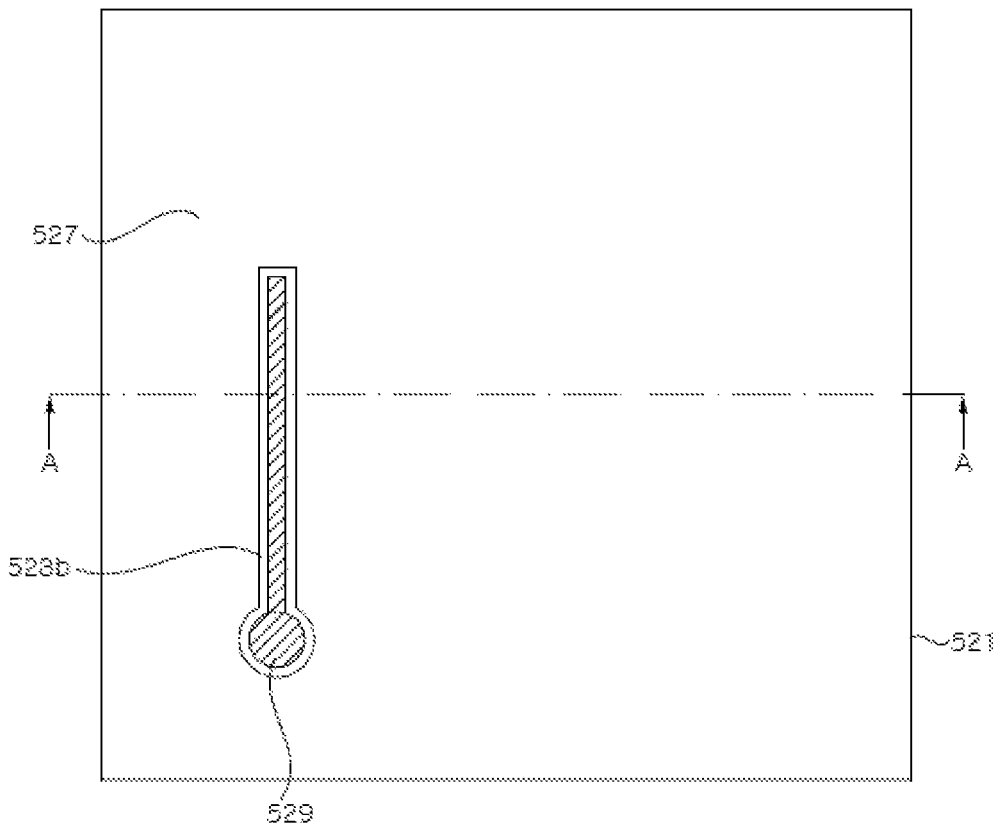
FIGS. 65A, 65B, 66A, 66B, 67A, 67B, 67C, 68A, 68B, 68C, 69A, 69B, 70A, 70B, 71A, 71B, 72A, 72B, 73A, 73B, 74A, 74B, 75, 76A, 76B, and 77 are schematic plan views and cross-sectional views illustrating a method of manufacturing a display apparatus according to an exemplary embodiment.
Figure 65B:
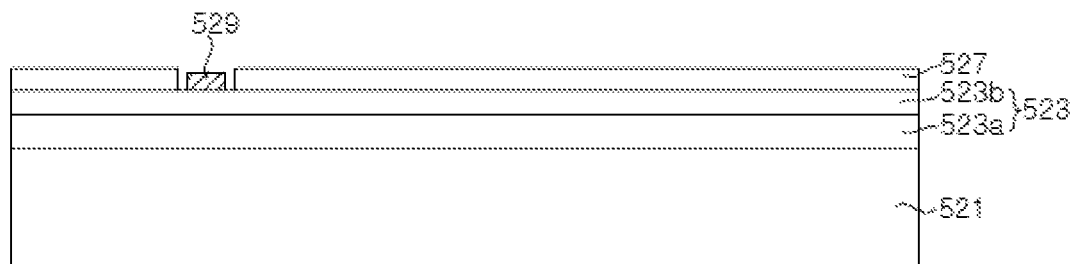

First, referring to FIG. 65A and FIG. 65B, a first LED stack 523 is grown on a first substrate 521. The first substrate 521 may be, for example, a GaAs substrate. In addition, the first LED stack 523 may be formed of AlGaInP-based semiconductor layers, and includes a first conductivity type semiconductor layer 523a, an active layer, and a second conductivity type semiconductor layer 523b.

Then, an insulation layer 527 may be formed on the first LED stack 523. The insulation layer 527 may be subjected to patterning to form an opening that exposes the second conductivity type semiconductor layer 523b. The insulation layer 527 may be formed of a hydrophilic material, for example, $SiO_2$. In some exemplary embodiments, the insulation layer 527 may be omitted.

A first-2 ohmic electrode 529 may be formed inside the opening of the insulation layer 527. The first-2 ohmic electrode 529 may be formed of, for example, an Au—Zn alloy or an Au—Be alloy. The first-2 ohmic electrode 529 may be formed to have a pad region and an extended portion. The first-2 ohmic electrode 529 may be formed by a lift-off process, for example, to be placed in each pixel region. The first-2 ohmic electrode 529 may be disposed towards to one side in each pixel region, as shown in FIG. 65A.

Figure 66A:
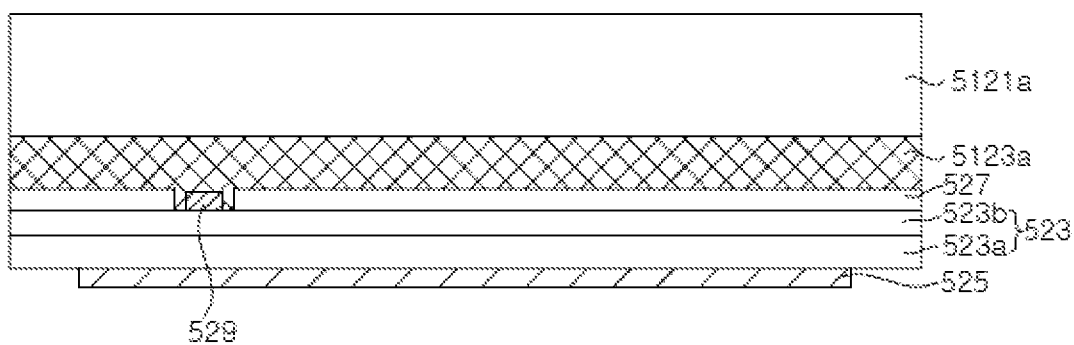

Then, referring to FIG. 66A, a preliminary substrate 5121a may be attached to an upper side of the first LED stack 523 through a bonding layer 5123a. The preliminary substrate 5121a is not limited to a particular substrate and may be selected from any substrates capable of supporting the first LED stack 523. The first substrate 521 is removed from the first LED stack 523 by chemical etching, for example. As such, an upper surface of the first conductivity type semiconductor layer 523a of the first LED stack 523 is exposed. In some exemplary embodiments, a roughened surface may be formed on the exposed upper surface of the first conductivity type semiconductor layer 523a by surface texturing, for example.

Then, a first-1 ohmic electrode (reflective electrode) 525 is formed on the exposed surface of the first LED stack 523. The reflective electrode 525 may be formed of, for example, an Au—Te alloy or an Au—Ge alloy. The reflective electrode 525 may be formed by a lift-off process, for example, and may be subjected to patterning to have a particular shape. For example, the reflective electrode 525 may be patterned to have a linearly extending shape for connecting a plurality of pixels to each other. However, the inventive concepts are not limited thereto, and the reflective electrode 525 may be subjected to patterning after being formed over substantially the entire upper surface of the first LED stack 523 without patterning. The reflective electrode 525 may form ohmic contact with the first conductivity type semiconductor layer 523a of the first LED stack 523, that is, the n-type semiconductor layer thereof.

Figure 66B:
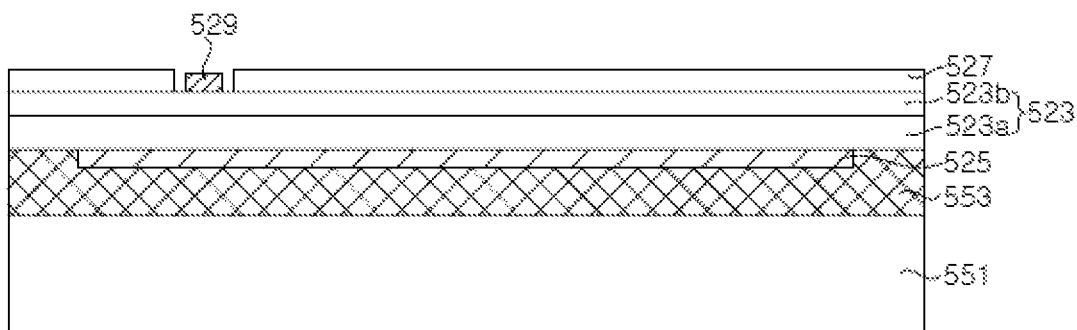

Referring to FIG. 66B, a support substrate 551 is coupled to the first LED stack 523 via the first bonding layer 553. The reflective electrode 525 on the first LED stack 523 may be disposed to face the support substrate 551 and bonded thereto. Accordingly, the first bonding layer 553 may adjoin the reflective electrode 525 and the first conductivity type semiconductor layer 523a.

After the support substrate 551 is bonded thereto, the preliminary substrate 5121a and the bonding layer 5123a may be removed. As such, the insulation layer 527 and the first-2 ohmic electrode 529 may be exposed.

Figure 67A:
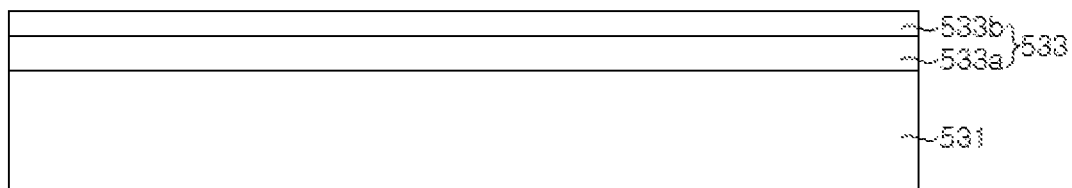

Referring to FIG. 67A, a second LED stack 533 is grown on a second substrate 531. The second LED stack 533 may be formed of GaN-based semiconductor layers, and may include a first conductivity type semiconductor layer 533a, a GaInN well layer, and a second conductivity type semiconductor layer 533b. The second substrate 531 may be a substrate capable of growing the GaN-based semiconductor layers thereon and may be different from the first substrate 521. The GaInN composition of the second LED stack 533 may be determined such that the second LED stack 533 can emit green light, for example.

Figure 67B:
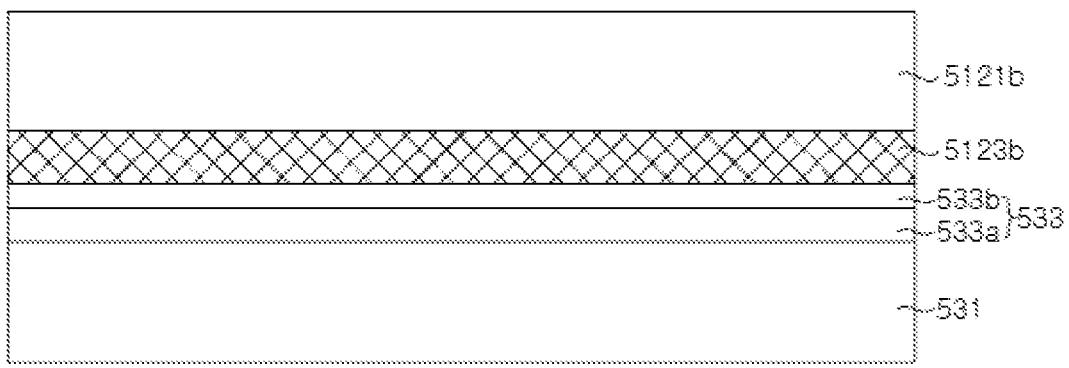

Referring to FIG. 67B, a preliminary substrate 5121b may be attached to an upper side of the second LED stack 533 through a bonding layer 5123b. The preliminary substrate 5121b is not limited to a particular substrate and may be selected from any substrates capable of supporting the second LED stack 533.

Figure 67C:
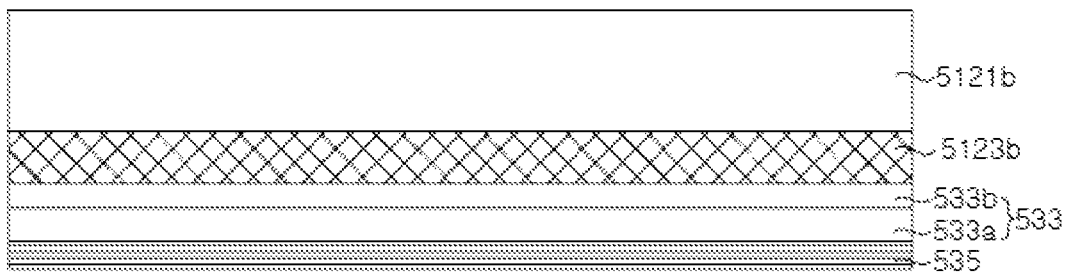

Referring to FIG. 67C, the second substrate 531 is removed. The second substrate 531 may be removed from the second LED stack 533 by laser lift-off or chemical etching, for example. As a result, an upper surface of the first conductivity type semiconductor layer 533a of the second LED stack 533 is exposed. In some exemplary embodiments, a roughened surface may be formed on the exposed upper surface of the first conductivity type semiconductor layer 533a by surface texturing, for example.

A first color filter 535 may be formed on the exposed surface of the first conductivity type semiconductor layer 533a. The first color filter 535 may adjoin the first conductivity type semiconductor layer 533a. The first color filter 535 may be substantially the same as that described with reference to FIG. 64A, and thus, repeated descriptions thereof will be omitted.

Figure 68A:
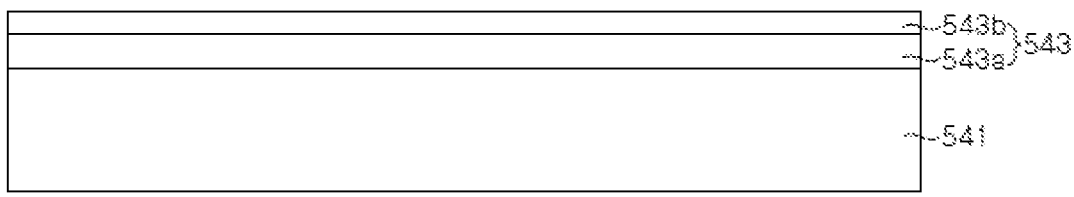

Referring to FIG. 68A, a third LED stack 543 is grown on a third substrate 541. The third LED stack 543 may be formed of GaN-based semiconductor layers, and may include a first conductivity type semiconductor layer 543a, a GaInN well layer, and a second conductivity type semiconductor layer 543b. The third substrate 541 may be a substrate capable of growing the GaN-based semiconductor layers thereon and may be different from the first substrate 521. The GaInN composition of the third LED stack 543 may be determined such that the third LED stack 543 can emit blue light, for example.

Figure 68B:
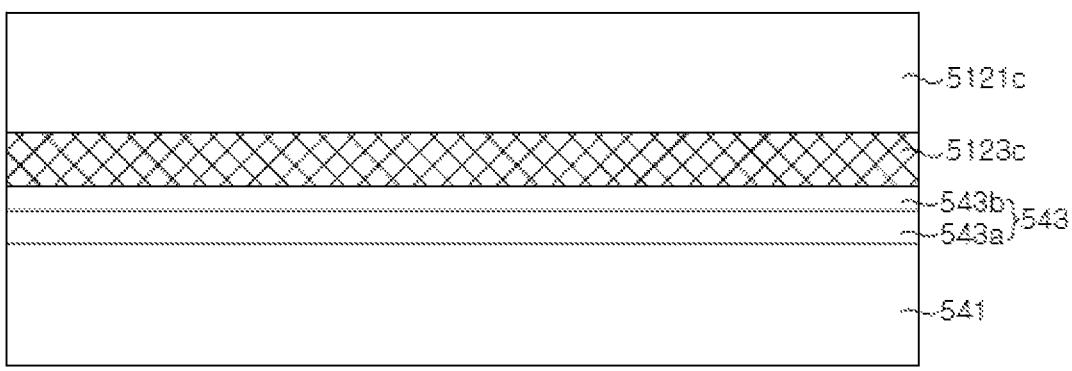

Referring to FIG. 68B, a preliminary substrate 5121c may be attached to an upper side of the third LED stack 543 through a bonding layer 5123c. The preliminary substrate 5121c is not limited to a particular substrate and may be selected from any substrates capable of supporting the third LED stack 543.

Figure 68C:
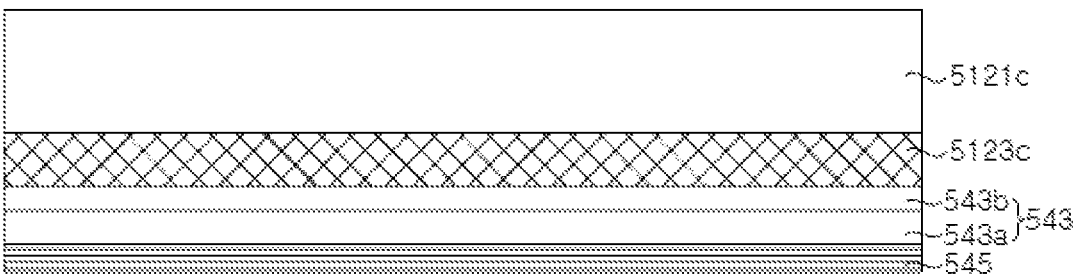

Referring to FIG. 68C, the third substrate 541 is removed. The third substrate 541 may be removed from the third LED stack 543 by laser lift-off or chemical etching, for example. As such, an upper surface of the first conductivity type semiconductor layer 543a of the third LED stack 543 is exposed. In some exemplary embodiments, a roughened surface may be formed on the exposed upper surface of the first conductivity type semiconductor layer 543a by surface texturing, for example.

A second color filter 545 may be formed on the exposed surface of the first conductivity type semiconductor layer 543a. The second color filter 545 may adjoin the first conductivity type semiconductor layer 543a. The second color filter 545 may be substantially the same as that described with reference to FIG. 64A, and thus, repeated descriptions thereof will be omitted.

Since the first LED stack 523, the second LED stack 533, and the third LED stack 543 are grown on different substrates, the sequence of forming the first to third LED stacks is not particularly limited.

Figure 69A:
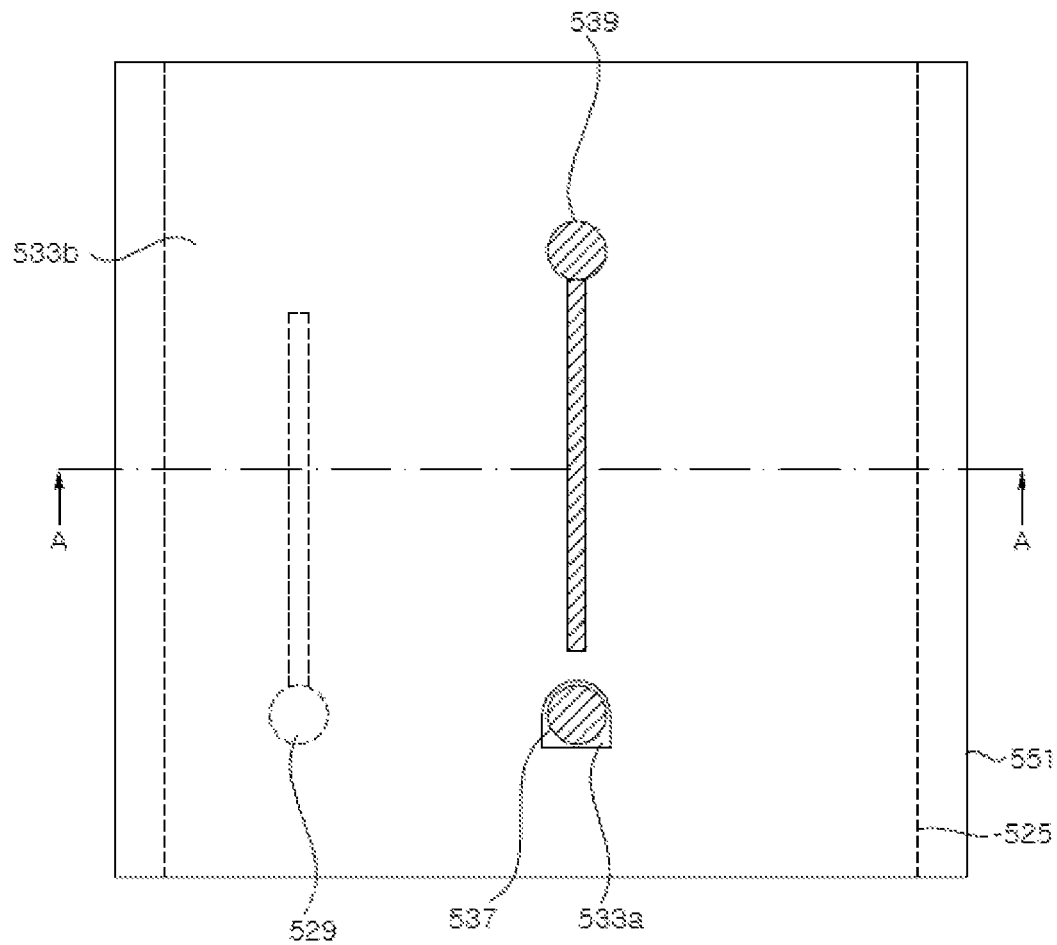
Figure 69B:
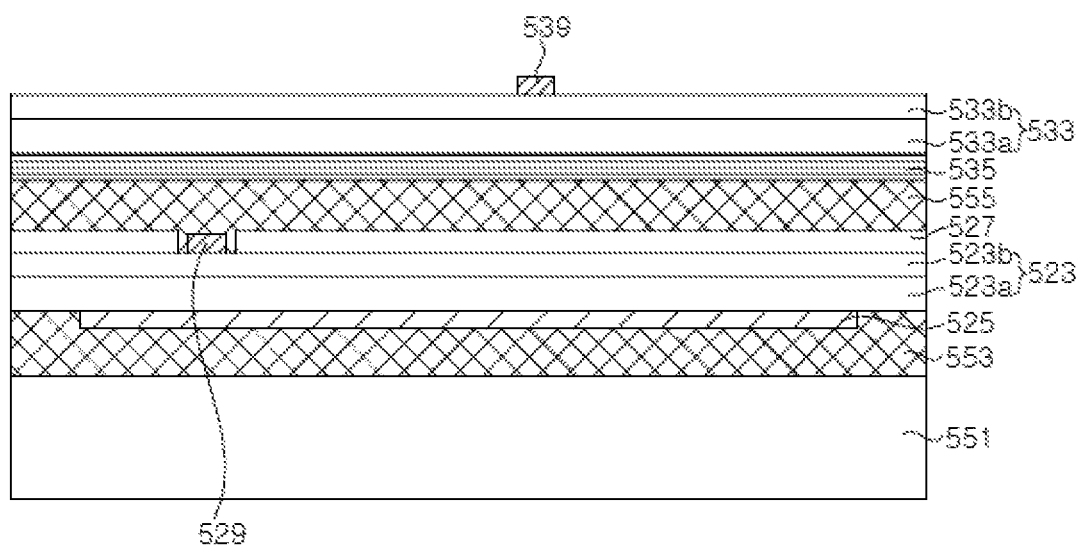

Referring to FIG. 69A and FIG. 69B, the second LED stack 533 of FIG. 67C is bonded to the insulation layer 527 and the exposed first-2 ohmic electrode 529 of FIG. 66B via the second bonding layer 555.

The first color filter 535 is disposed to face the support substrate 551 and bonded to the insulation layer 527 via the second bonding layer 555. The second bonding layer 555 may be formed of a light transmissive material.

Then, the preliminary substrate 5121b and the bonding layer 5123b are removed to expose the surface of the second conductivity type semiconductor layer 533b, and a second-2 ohmic electrode 539 is formed on the exposed surface of the second conductivity type semiconductor layer 533b.

As shown in FIG. 69A, the second-2 ohmic electrode 539 may include a pad region and an extended portion. The extended portion may extend in a longitudinal direction of the reflective electrode 525. The second-2 ohmic electrode 539 may be disposed to be separated from the first-2 ohmic electrode 529 in the horizontal direction. The second-2 ohmic electrode 539 forms ohmic contact with the second conductivity type semiconductor layer 533b.

Then, as shown in FIG. 69A, the second conductivity type semiconductor layer 533b and the active layer may be partially removed to expose the first conductivity type semiconductor layer 533a. The second conductivity type semiconductor layer 533b and the active layer may be partially removed by mesa etching, for example.

Thereafter, a second-1 ohmic electrode 537 may be formed on the exposed surface of the first conductivity type semiconductor layer 533a. The second-1 ohmic electrode 537 forms ohmic contact with the first conductivity type semiconductor layer 533a.

Although the second-2 ohmic electrode 539 is formed prior to the second-1 ohmic electrode 537 in the illustrated exemplary embodiment, in some exemplary embodiments, the sequence of forming the second-2 ohmic electrode 539 and the second-1 ohmic electrode 537 may be changed.

Figure 70A:
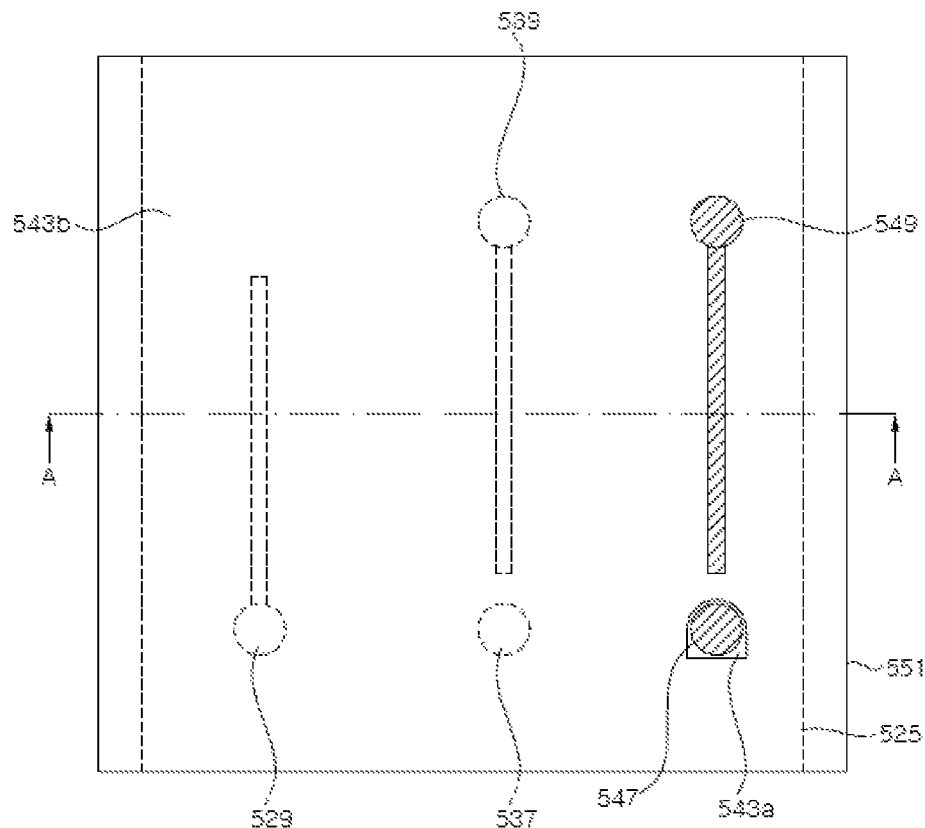
Figure 70B:
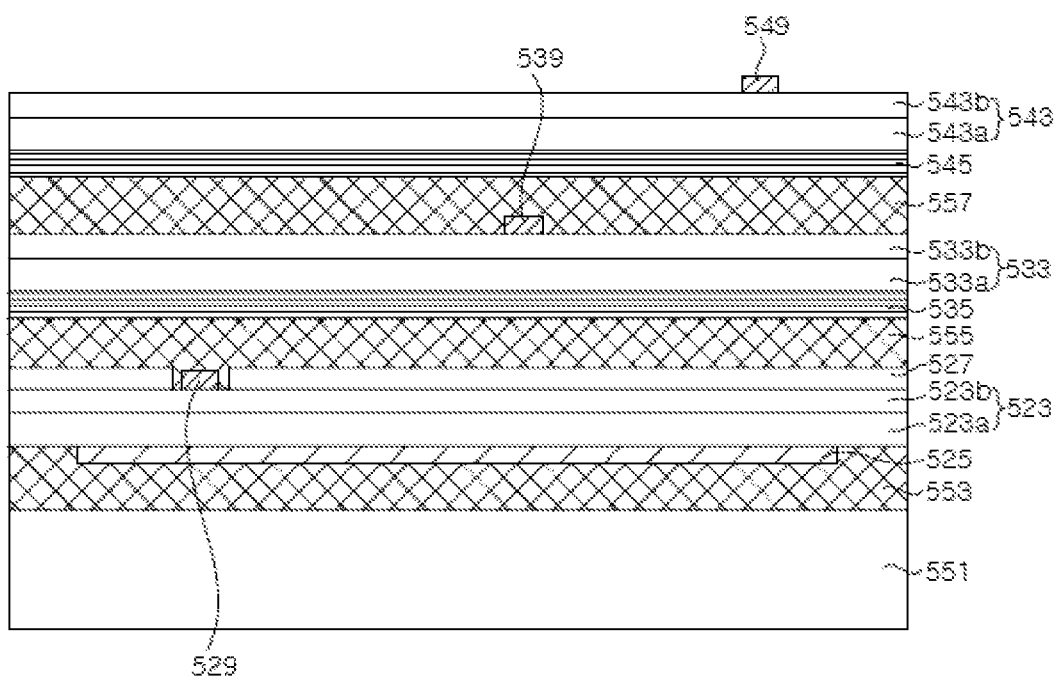

Then, referring to FIG. 70A and FIG. 70B, the third LED stack 543 of FIG. 68 is bonded to the second LED stack 533, on which the second-1 ohmic electrode 537 and the second-2 ohmic electrode 539 are formed, via a third bonding layer 557.

The second color filter 545 may be disposed to face the second LED stack 533 and bonded to the second LED stack 533 through the third bonding layer 557. The third bonding layer 557 may be formed of a light transmissive material.

Then, the preliminary substrate 5121c and the bonding layer 5123c may be removed to expose the surface of the second conductivity type semiconductor layer 543b, and a third-2 ohmic electrode 549 is formed on the exposed surface of the second conductivity type semiconductor layer 543b.

As shown in FIG. 70A, the third-2 ohmic electrode 549 may include a pad region and an extended portion. The extended portion may extend in the longitudinal direction of the reflective electrode 525. The third-2 ohmic electrode 549 may be disposed to be separated from the first-2 ohmic electrode 529 and the second-2 ohmic electrode 539 in the horizontal direction. The third-2 ohmic electrode 549 forms ohmic contact with the second conductivity type semiconductor layer 543b.

As shown in FIG. 70A, the second conductivity type semiconductor layer 543b and the active layer may be partially removed to expose the first conductivity type semiconductor layer 543a. The second conductivity type semiconductor layer 543b and the active layer may be partially removed by mesa etching.

Then, a third-1 ohmic electrode 547 may be formed on the exposed surface of the first conductivity type semiconductor layer 543a. The third-1 ohmic electrode 547 forms ohmic contact with the first conductivity type semiconductor layer 543a.

Although the third-2 ohmic electrode 549 is formed prior to the third-1 ohmic electrode 547 in the illustrated exemplary embodiment, in some exemplary embodiments, the sequence of forming the third-2 ohmic electrode 549 and the third-1 ohmic electrode 547 may be changed.

Figure 71A:
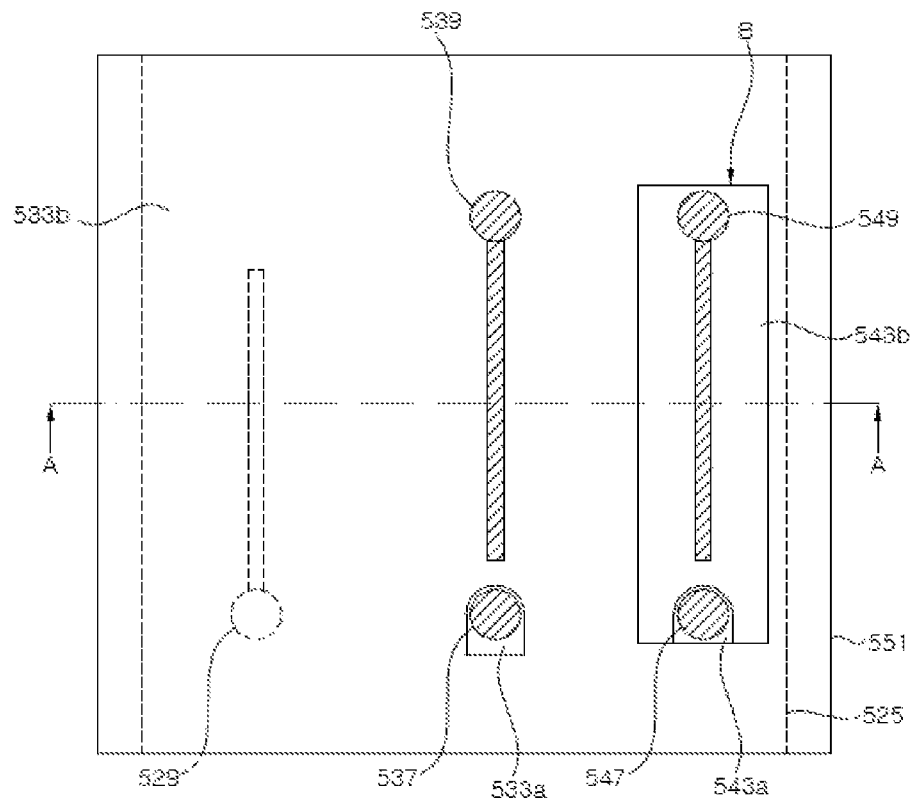
Figure 71B:
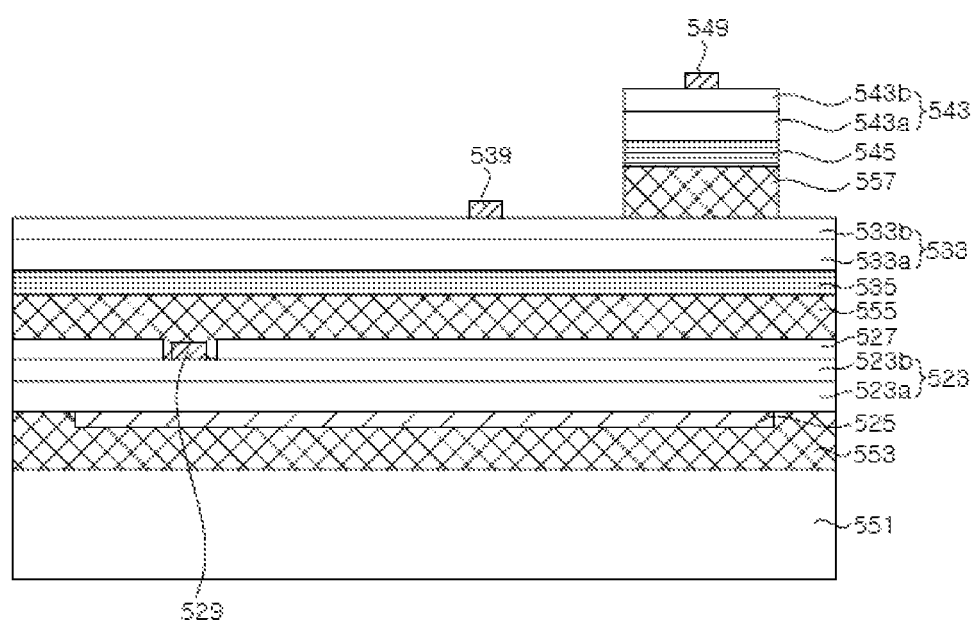

Referring to FIG. 71A and FIG. 71B, in each pixel region, the third LED stack 543 is subjected to patterning to remove the third LED stack 543 except a portion for a third subpixel B. As such, the third subpixel B is defined. Further, the second color filter 545 and the third bonding layer 557 may also be removed together, thereby exposing the second conductivity type semiconductor layer 533b, the second-1 ohmic electrode 537, and the second-2 ohmic electrode 539 of the second LED stack 533, as shown in the drawings.

Figure 72A:
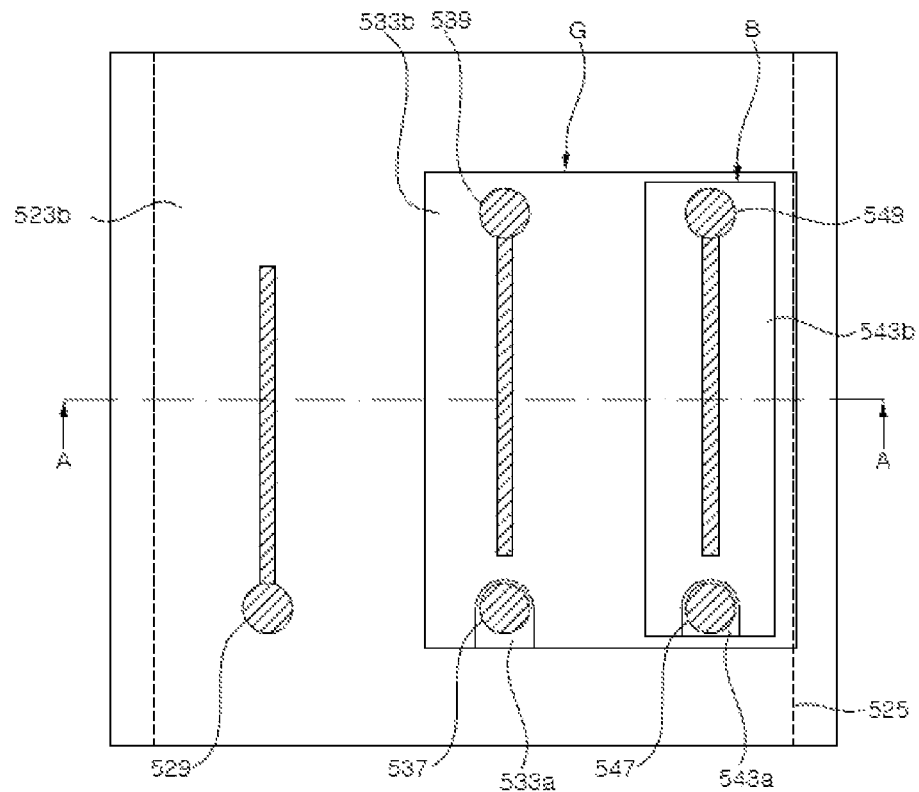
Figure 72B:
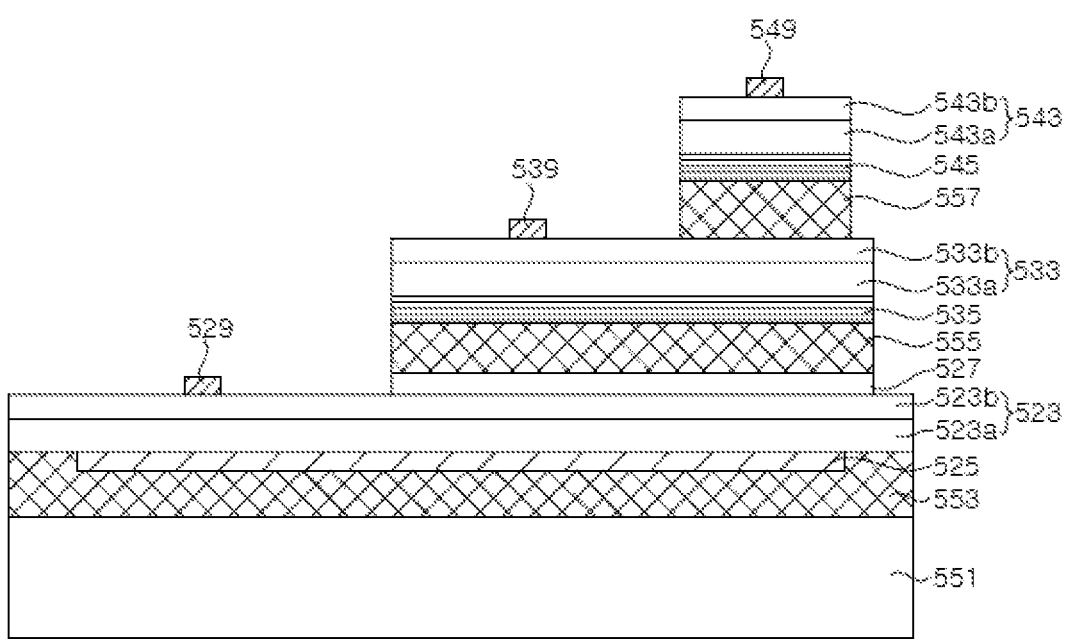

Referring to FIG. 72A and FIG. 72B, the second LED stack 533 is subjected to patterning to remove the second LED stack 533 except a portion for a second subpixel G in each pixel region. As such, the second subpixel G is defined. In the region for the second subpixel G, the second LED stack 533 partially overlaps the third LED stack 543. In particular, the second LED stack 533 is subjected to patterning such that the third LED stack 543 is disposed in some region on the second LED stack 533.

The first color filter 535, the second bonding layer 555, and the insulation layer 527 may also be removed together, thereby exposing the second conductivity type semiconductor layer 523b and the first-2 ohmic electrode 529 of the first LED stack 523, as shown in the drawings.

Figure 73A:
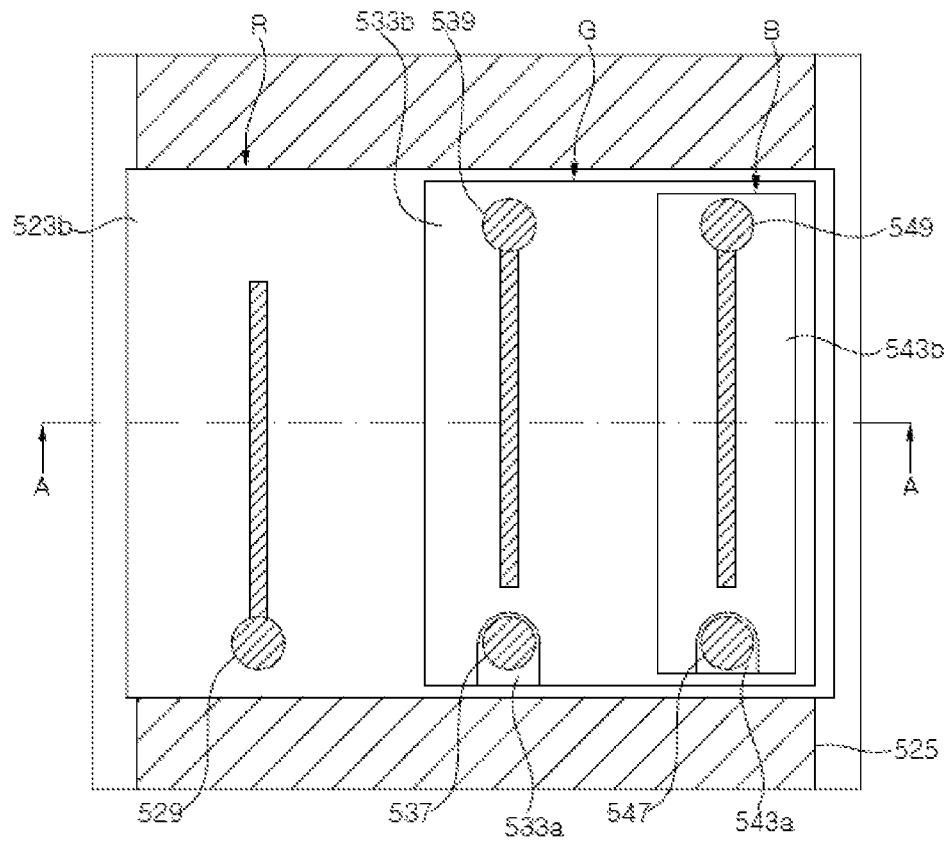
Figure 73B:
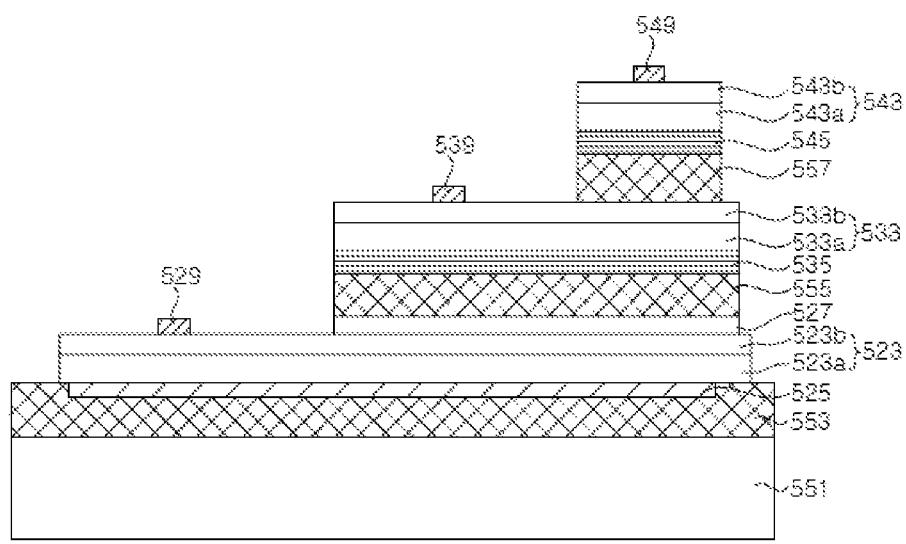

Referring to FIG. 73A and FIG. 73B, the first LED stack 523 is subjected to patterning to remove the first LED stack 523 except a portion for a first subpixel R. The first-2 ohmic electrode 529 may be remained in the region for the first subpixel R. The first LED stack 523 partially overlaps the second LED stack 533 and the third LED stack 543. More particularly, the second LED stack 533 and the third LED stack 543 are disposed in an upper region of the first LED stack 523.

As the first LED stack 523 is subjected to patterning, the reflective electrode 525 may be exposed and the surface of the first bonding layer 553 may also be partially exposed. In other exemplary embodiments, an insulation layer may be disposed on the first bonding layer 553 and exposed by patterning the first LED stack 523, instead of exposing the surface of the first bonding layer 553.

Figure 74A:
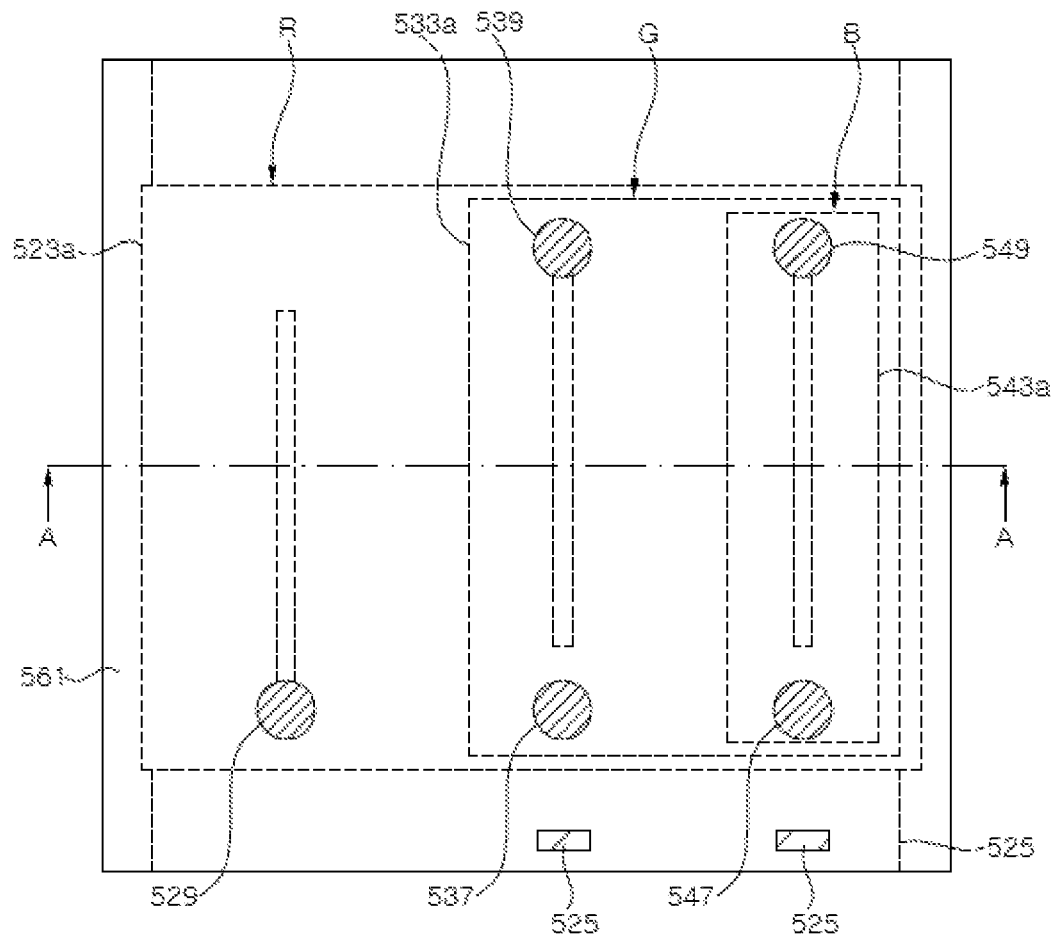
Figure 74B:
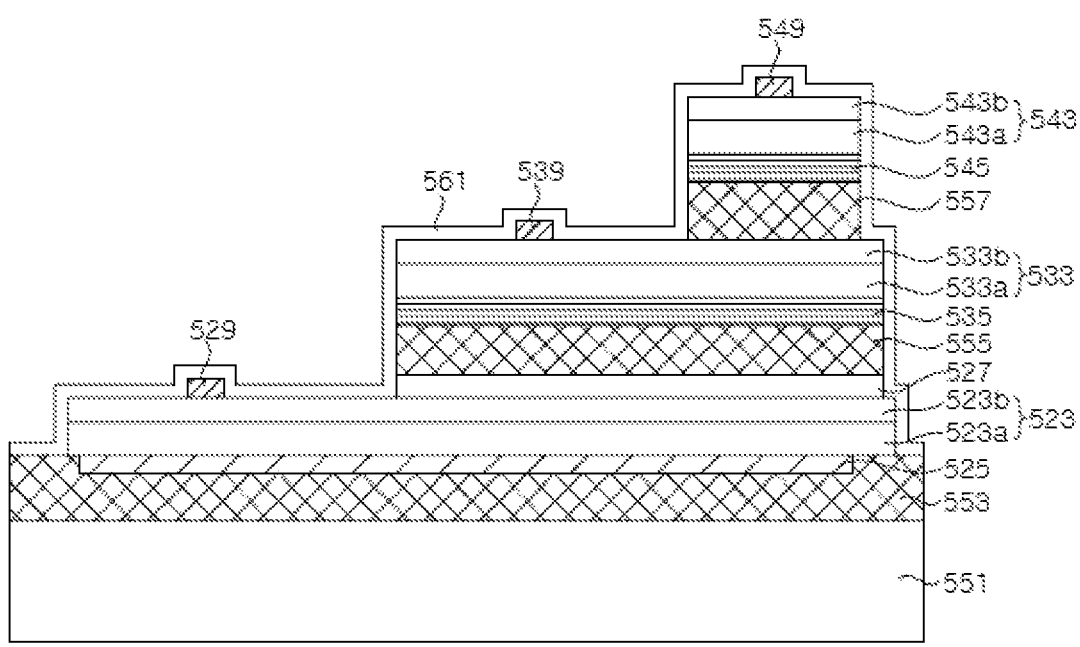

Referring to FIG. 74A and FIG. 74B, a lower insulation layer 561 is formed. The lower insulation layer 561 may cover the first to third LED stacks 523, 533, and 543 and may also cover the reflective electrode 525 and the first bonding layer 553. In the meantime, the lower insulation layer 561 may be patterned to form openings, which expose the first-2 ohmic electrode 529, the second-1 ohmic electrode 537, the second-2 ohmic electrode 539, the third-1 ohmic electrode 547, the third-2 ohmic electrode 549, and the reflective electrode 525.

Figure 75:
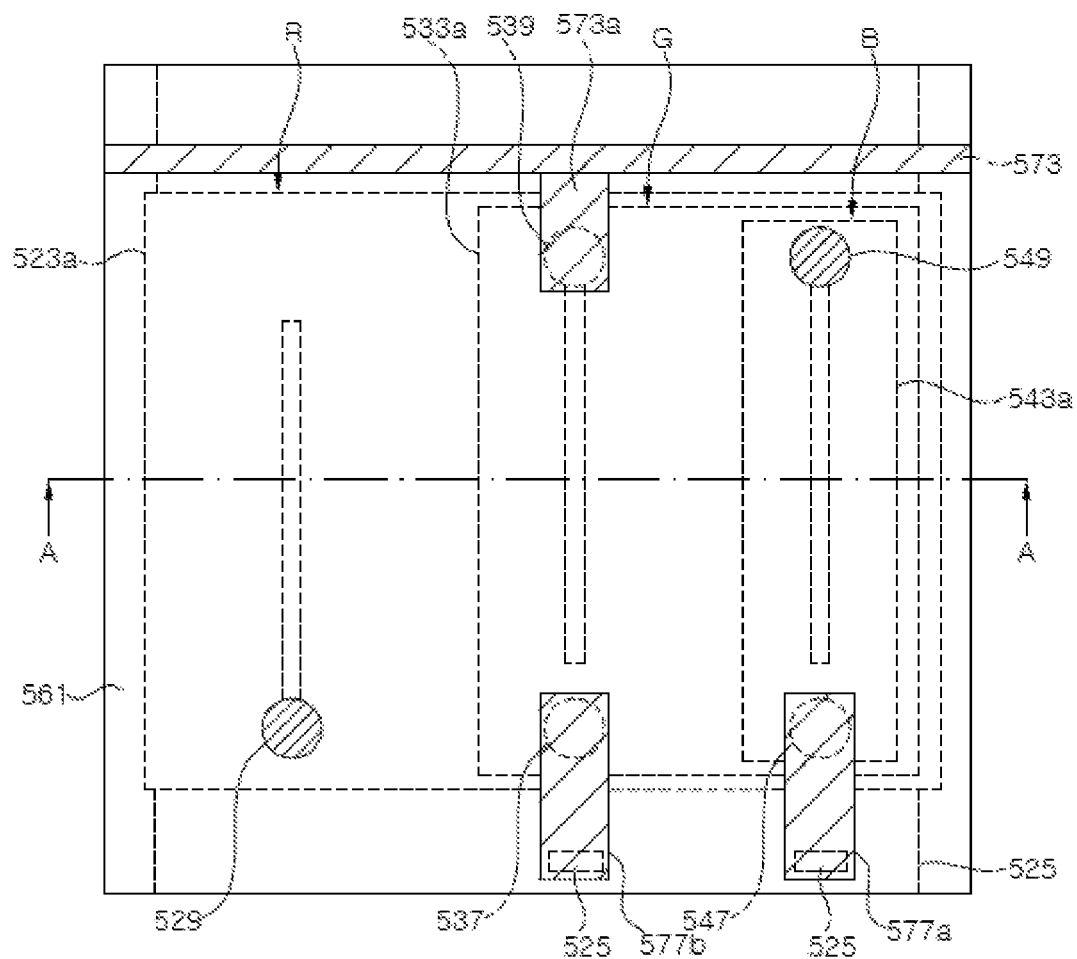

Referring to FIG. 75, an interconnection line 573 and connecting portions 573a, 577a, and 577b are formed on the lower insulation layer 561. The connecting portion 573a connects the second-2 ohmic electrode 539 to the interconnection line 573, the connecting portion 577a connects the third-1 ohmic electrode 547 to the reflective electrode 525, and the connecting portion 577b connects the second-1 ohmic electrode 537 to the reflective electrode 525. A cross-sectional view taken along line A-A of FIG. 75 is substantially the same as FIG. 74B, and thus, will be omitted.

Figure 76A:
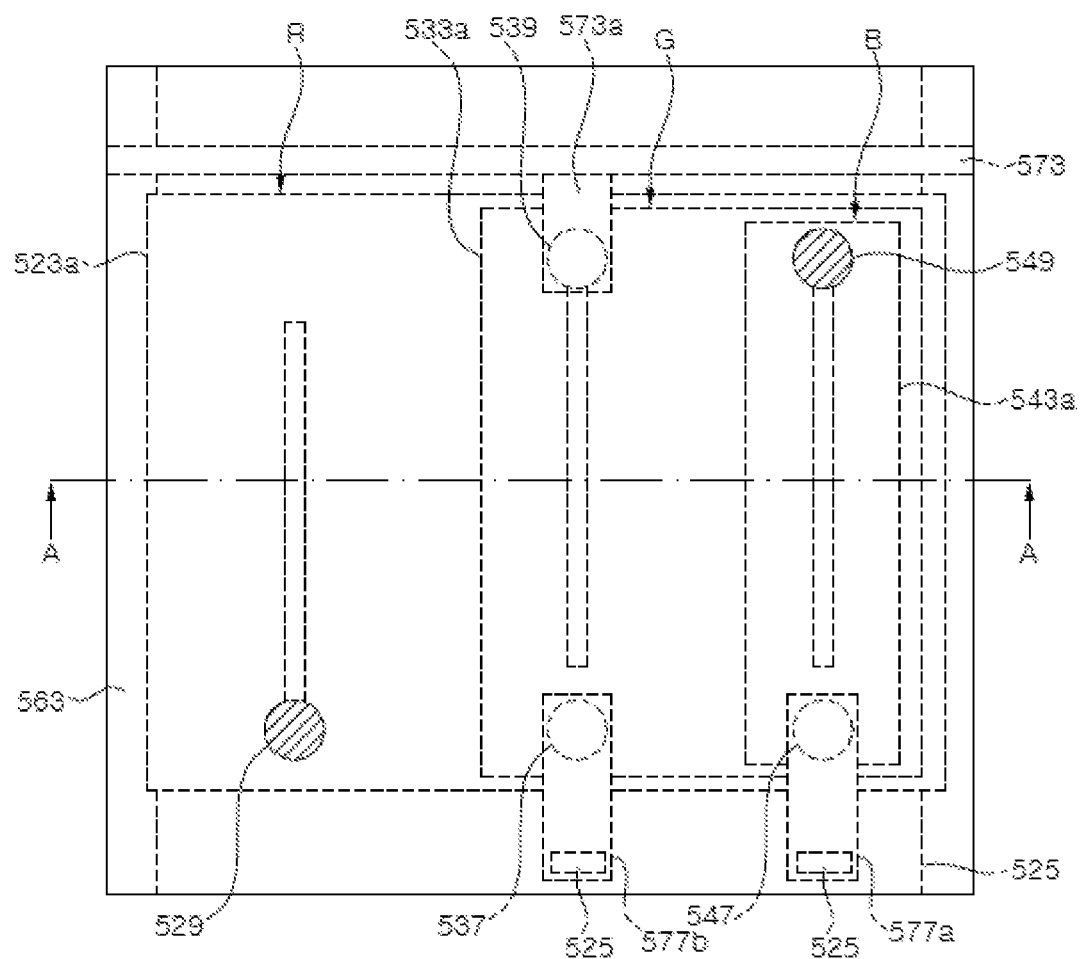
Figure 76B:
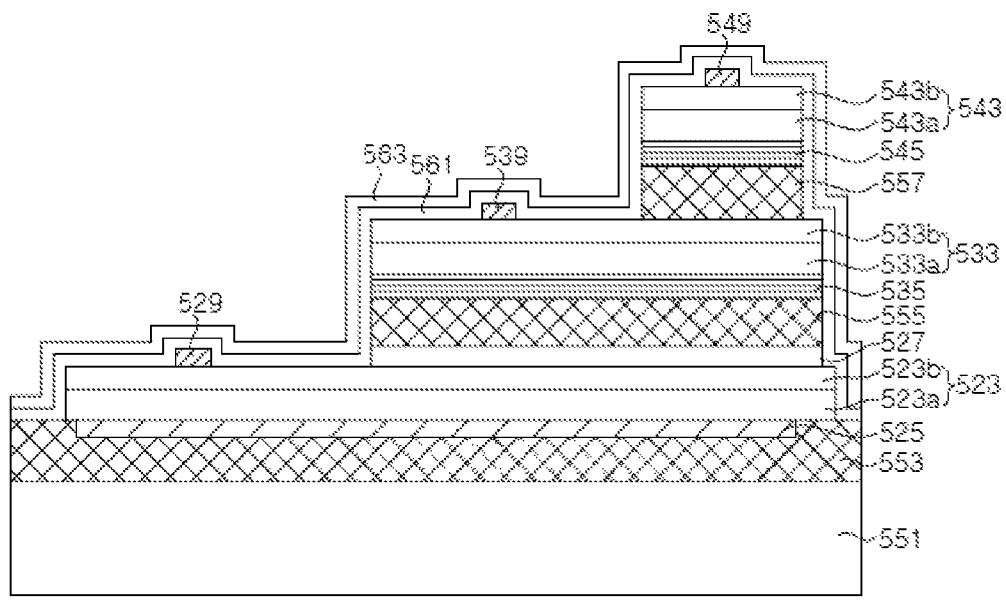

Then, referring to FIG. 76A and FIG. 76B, an upper insulation layer 563 is formed. The upper insulation layer 563 covers the interconnection line 573 and the connecting portions 573a, 577a, and 577b. Here, the upper insulation layer 563 may be subjected to patterning to expose the pad regions of the first-2 ohmic electrode 529 and the third-2 ohmic electrode 549.

Figure 77:
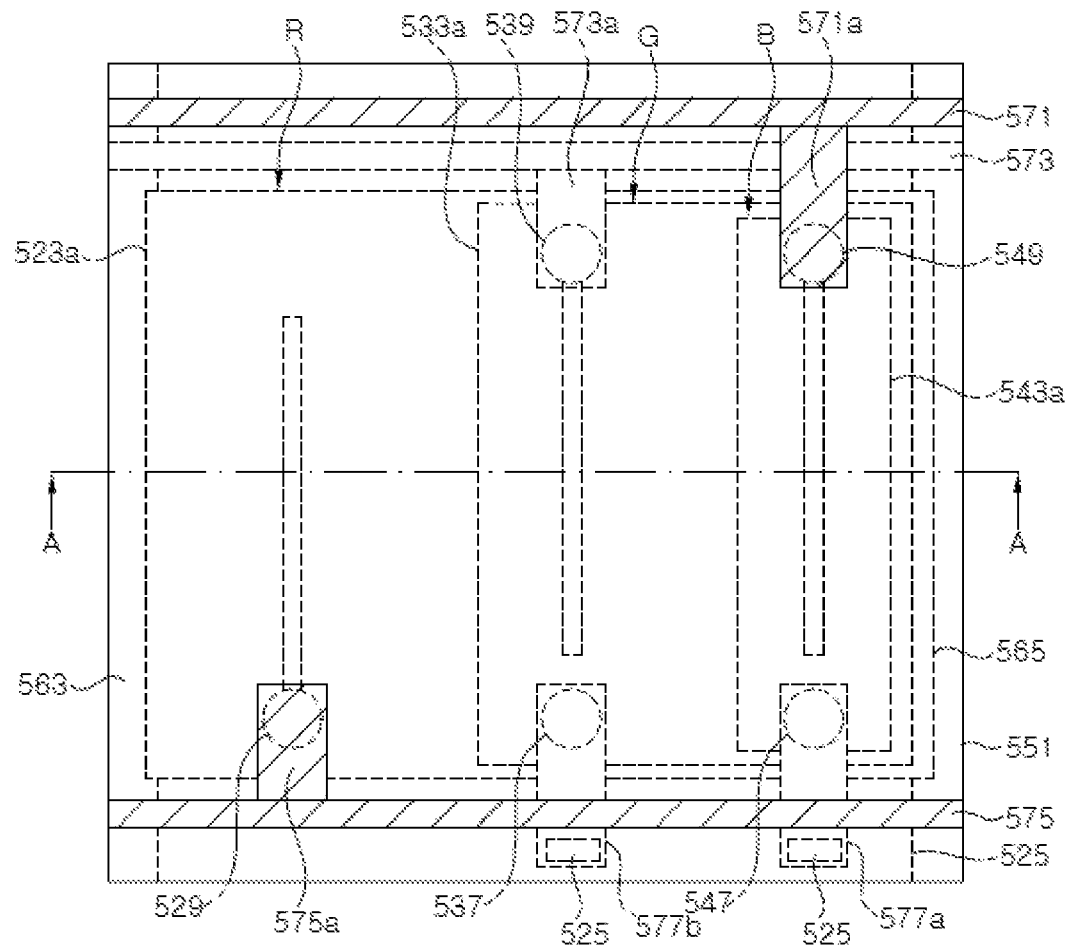

Then, referring to FIG. 77, interconnection lines 571 and 575 and connecting portions 571a and 575a are formed on the upper insulation layer 563. The connecting portion 571a connects the interconnection line 571 to the third-2 ohmic electrode 549, and the connecting portion 575a connects the interconnection line 575 to the first-2 ohmic electrode 529.

In this manner, the display apparatus 5000A described with reference to FIG. 62 and FIG. 63 is provided. A cross-sectional view taken along line A-A of FIG. 77 is substantially the same as FIG. 76B, and thus, will be omitted.

In the above exemplary embodiment, the pixels to be driven in a passive matrix manner have been described, however, the inventive concepts are not limited thereto. For example, the pixels according to another exemplary embodiment may be driven in an active matrix manner.

Figure 78:
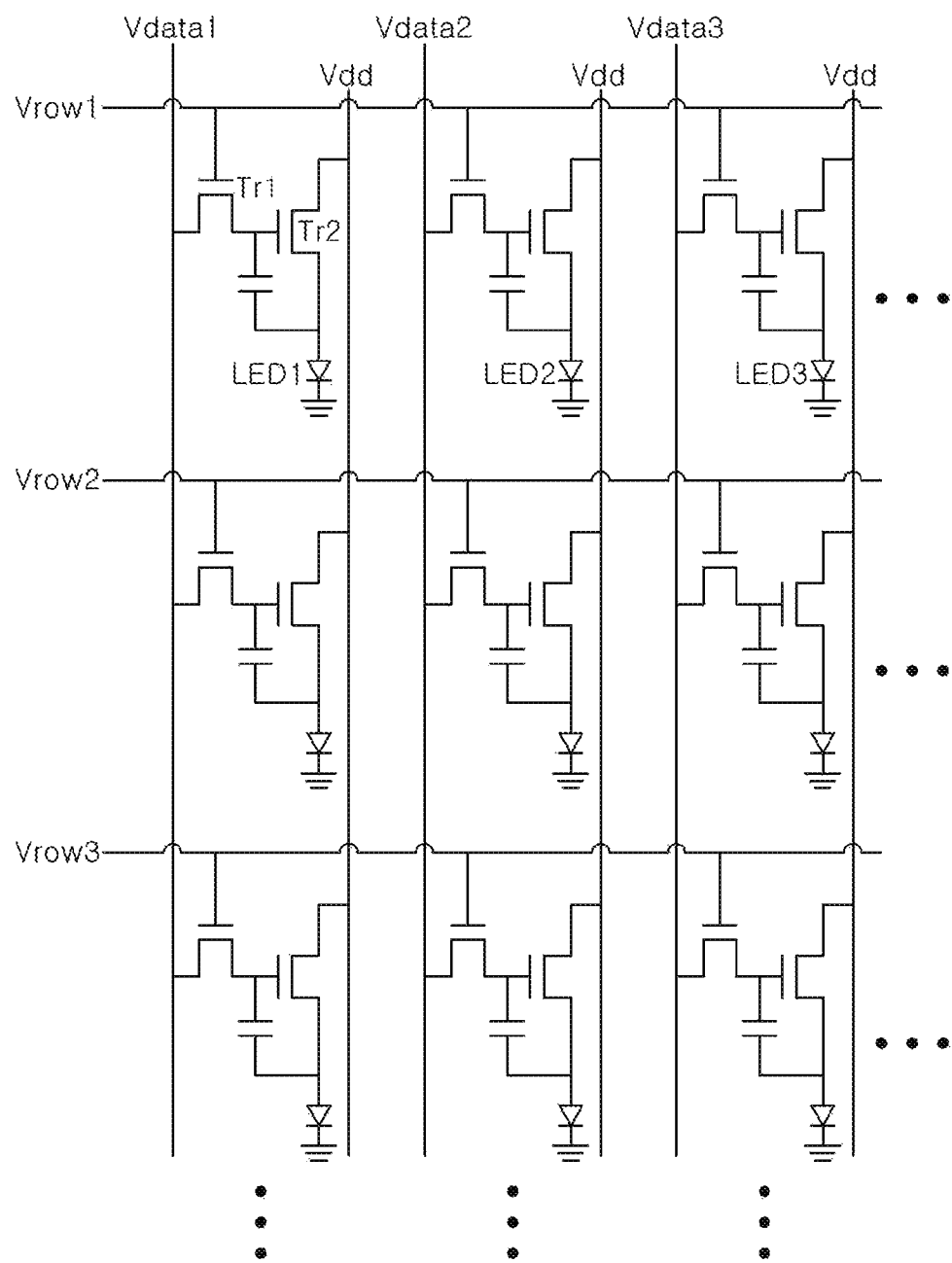
FIG. 78 is a schematic circuit diagram of a display apparatus according to an exemplary embodiment.

FIG. 78 is a schematic circuit diagram of a display apparatus according to an exemplary embodiment. In the illustrated exemplary embodiment, the display apparatus may be driven in the active matrix manner.

Referring to FIG. 78, the drive circuit according to the illustrated exemplary embodiment includes at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitor is charged according to the values of data lines Vdata1 to Vdata3. Since a turned-on state of the transistor Tr2 can be maintained by the charged voltage of the capacitor, the voltage of the capacitor can be maintained and applied to the light emitting diodes LED1 to LED3 even when power supplied to the selection line Vrow1 is cut off. In addition, electric current flowing in the light emitting diodes LED1 to LED3 can be changed depending upon the values of data lines Vdata1 to Vdata3. As such, an electric current can be continuously supplied through current supplies Vdd, thereby enabling continuous light emission.

The transistors Tr1 and Tr2 and the capacitor may be formed inside the support substrate 551. Connection pads for connection to the transistor and the capacitor may be formed on the surface of the support substrate 551. In addition, selection lines and data lines may be formed inside the support substrate 551 or on the surface thereof. In this case, the interconnection lines 571, 573, and 575 may be omitted.

The light emitting diodes LED1 to LED3 correspond to the first to third LED stacks 523, 533, and 543 in each pixel. The anodes of the first to third LED stacks 523, 533, and 543 are connected to the transistor Tr2 and the cathodes thereof may be connected to the ground. The first-2 ohmic electrode 529, the second-2 ohmic electrode 539, and the third-2 ohmic electrode 549 may be connected to the connection pads on the support substrate 551 through the connecting portions, and the reflective electrode 525 may be connected to the ground through connection to the connection pad on the support substrate 551.

In an exemplary embodiment, the first to third LED stacks 523, 533, and 543 may be connected to the ground by being commonly connected to the reflective electrode 525. Furthermore, the reflective electrode 525 may be continuously disposed over two or more or all pixels. Accordingly, the reflective electrode 525 may be commonly connected to all LED stacks in the display apparatus. The reflective electrode 525 is disposed between the pixels and the support substrates 551 to reduce or remove noise of the active matrix circuit.

Although the illustrated exemplary embodiment relates to the circuit for active matrix driving, other types of circuits may also be used in some exemplary embodiments.

According to the exemplary embodiments, a plurality of pixels may be formed at the wafer level using wafer bonding, thereby obviating the process of individually mounting of light emitting diodes.

Figure 79:
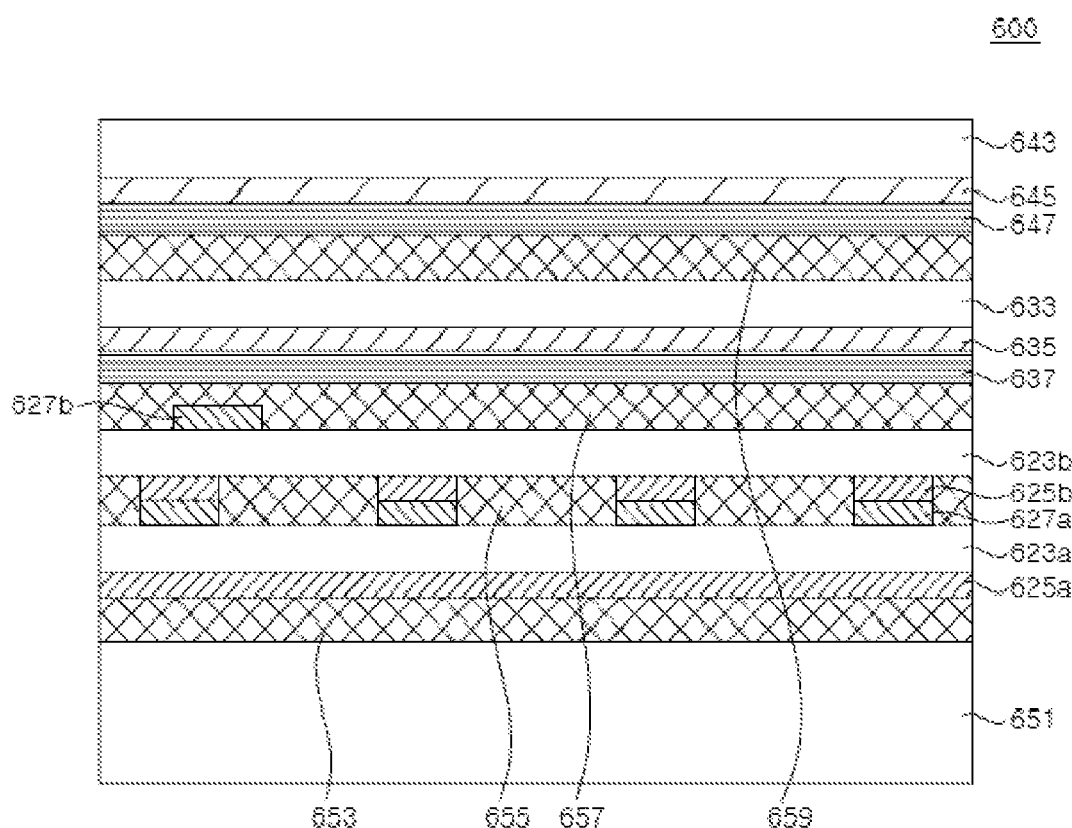
FIG. 79 is a schematic cross-sectional view of a light emitting diode stack for a display according to an exemplary embodiment.

FIG. 79 is a schematic cross-sectional view of a light emitting diode stack for a display according to an exemplary embodiment.

Referring to FIG. 79, the light emitting diode stack 600 may include a support substrate 651, a first-1 LED stack 623a, a first-2 LED stack 623b, a second LED stack 633, a third LED stack 643, a first-1 lower ohmic electrode 625a, a first-1 upper ohmic electrode 627a, a first-2 lower ohmic electrode 625b, a first-2 upper ohmic electrode 627b, a second transparent electrode 635, a third transparent electrode 645, a first color filter 637, a second color filter 647, a first bonding layer 653, a second bonding layer 655, a third bonding layer 657, and a fourth bonding layer 659.

The support substrate 651 supports the LED stacks 623a, 623b, 633, 643. The support substrate 651 may include a circuit on a surface thereof or therein, without being limited thereto. The support substrate 651 may include, for example, a Si substrate or a Ge substrate.

Each of the first-1 LED stack 623a, the first-2 LED stack 623b, the second LED stack 633, and the third LED stack 643 includes an n-type semiconductor layer, a p-type semiconductor layer, and an active layer interposed therebetween. The active layer may have a multi-quantum well structure.

The first-1 LED stack 623a and the first-2 LED stack 623b may be inorganic light emitting diodes to emit red light, the second LED stack 633 may be an inorganic light emitting diode to emit green light, and the third LED stack 643 may be an inorganic light emitting diode to emit blue light. The first-1 LED stack 623a and the first-2 LED stack 623b may include AlGaInP-based well layers and the second LED stack 633 may include an AlGaInP or AlGaInN-based well layer. The third LED stack 643 may include an AlGaInN-based well layer. The first-1 LED stack 623a and the first-2 LED stack 623b may have substantially the same structure and substantially the same composition, without being limited thereto. For example, the first-1 LED stack 623a may emit red light having a longer wavelength than the first-2 LED stack 623b.

In addition, both surfaces of each of the LED stacks 623a, 623b, 633, and 643 are an n-type semiconductor layer and a p-type semiconductor layer, respectively. In the illustrated exemplary embodiment, each of LED stacks 623a, 623b, 633, 643 has an n-type upper surface and a p-type lower surface. Since the third LED stack 643 has an n-type upper surface, a roughened surface may be formed on the upper surface of the third LED stack 643 through chemical etching, for example. However, the inventive concepts are not limited thereto, and in some exemplary embodiments, the semiconductor types of the upper and lower surfaces of each of the LED stacks may be changed.

The first-1 LED stack 623a is disposed near the support substrate 651, the first-2 LED stack 623b is disposed on the first-1 LED stack 623a, the second LED stack 633 is disposed on the first-2 LED stack 623b, and the third LED stack 643 is disposed on the second LED stack 633. Since the first-1 LED stack 623a and the first-2 LED stack 623b emit light having a longer wavelength than the second and third LED stacks 633, 643, light generated from the first-1 and first-2 LED stacks 623a, 623b may be emitted to the outside through the second and third LED stacks 633, 643. In addition, since the second LED stack 633 emits light having a longer wavelength than the third LED stack 643, light generated from the second LED stack 633 can be emitted to the outside through the third LED stack 643.

The first-1 lower ohmic electrode 625a forms ohmic contact with the lower surface of the first-1 LED stack 623a, for example, the p-type semiconductor layer thereof, and reflects light generated from the first-1 LED stack 623a. The first-1 lower ohmic electrode 625a may include an ohmic reflective layer formed of, for example, an Au—Zn alloy or an Au—Be alloy.

The first-1 upper ohmic electrode 627a forms ohmic contact with the upper surface of the first-1 LED stack 623a, for example, the n-type semiconductor layer thereof. The first-1 upper ohmic electrode 627a may include an ohmic layer formed of, for example, an Au—Te alloy or an Au—Ge alloy.

The first-2 lower ohmic electrode 625b forms ohmic contact with the lower surface of the first-2 LED stack 623b, that is, the p-type semiconductor layer thereof. The first-2 lower ohmic electrode 625b may include an ohmic layer formed of, for example, an Au—Zn alloy or an Au—Be alloy. The first-2 lower ohmic electrode 625b has a narrower area than the first-1 lower ohmic electrode 625a and provides a path through which light can pass.

In addition, the first-2 lower ohmic electrode 625b may be electrically connected to the first-1 upper ohmic electrode 627a. As shown in FIG. 79, the first-2 lower ohmic electrode 625b may directly contact the first-1 upper ohmic electrode 627a, without being limited thereto. Alternatively, the first-2 lower ohmic electrode 625b may be electrically connected to the first-1 upper ohmic electrode 627a through a transparent conductive bonding layer 655, which will be described below.

As the first-2 lower ohmic electrode 625b is electrically connected to the first-1 upper ohmic electrode 627a, the first-1 LED stack 623a and the first-2 LED stack 623b may be electrically connected to each other in series.

The first-2 upper ohmic electrode 627b forms ohmic contact with the upper surface of the first-2 LED stack 623b, for example, the n-type semiconductor layer thereof. The first-2 upper ohmic electrode 627b may include an ohmic layer formed of, for example, an Au—Te alloy or an Au—Ge alloy.

The second transparent electrode 635 forms ohmic contact with the p-type semiconductor layer of the second LED stack 633. The second transparent electrode 635 may include a metal layer or a conductive oxide layer transparent with respect to red light and green light.

The third transparent electrode 645 forms ohmic contact with the p-type semiconductor layer of the third LED stack 643. The third transparent electrode 645 may include a metal layer or a conducive oxide layer transparent with respect to red light, green light, and blue light.

The first-1 lower ohmic electrode 625a, the first-2 lower ohmic electrode 625b, the second transparent electrode 635, and the third transparent electrode 645 may assist in current spreading through making an ohmic contact with the p-type semiconductor layer of each of the LED stacks.

The first color filter 637 is interposed between the first-2 LED stack 623b and the second LED stack 633. In addition, the second color filter 647 is interposed between the second LED stack 633 and the third LED stack 643. The first color filter 637 transmits light generated from the first-1 and first-2 LED stacks 623a, 623b while reflecting light generated from the second LED stack 633. The second color filter 647 transmits light generated from the first-1, first-2, and second LED stacks 623a, 623b, 633 while reflecting light generated from the third LED stack 643. As such, light generated from the first-1 LED stack 623a and the first-2 LED stack 623b can be emitted to the outside through the second LED stack 633 and the third LED stack 643, and light generated from the second LED stack 633 can be emitted to the outside through the third LED stack 643. Further, the light emitting diode stack can prevent light generated from the second LED stack 633 from entering the first-2 LED stack 623b, and/or can prevent light generated from the third LED stack 643 from entering the second LED stack 633, thereby preventing light loss.

In some exemplary embodiments, the first color filter 637 may reflect light generated from the third LED stack 643.

The first and second color filters 637, 647 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 637, 647 may include a distributed Bragg reflector (DBR). The distributed Bragg reflector (DBR) reflects light in a particular wavelength band (stop band) while transmitting light in other wavelength ranges. The distributed Bragg reflector may be formed by alternately stacking insulation layers having different refractive indices one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 653 couples the first-1 LED stack 623a to the support substrate 651. As shown in the drawings, the first-1 lower ohmic electrode 625a may adjoin the first bonding layer 653. The first bonding layer 653 may be a light transmissive or opaque layer.

The first bonding layer 653 may be formed of organic or inorganic materials. For example, the organic materials may include SUB, poly(methyl methacrylate) (PMMA), polyimide, Parylene, benzocyclobutene (BCB), or others, and the inorganic materials may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. In particular, a bonding layer formed of a black epoxy resin capable of absorbing light may be used as the first bonding layer 653, thereby improving the contrast of a display apparatus. The first bonding layer 653 may also be formed of spin-on-glass in some exemplary embodiments.

The second bonding layer 655 couples the first-2 LED stack 623*b* to the first-1 LED stack 623*a*. As shown in the drawings, the first-1 upper ohmic electrode 627*a* and the first-2 lower ohmic electrode 625*b* may be disposed inside the second bonding layer 655.

The second bonding layer 655 may be a light transmissive layer and include organic or inorganic materials as in the first bonding layer 653. In addition, the second bonding layer 655 may be an insulation layer or a conductive layer. For example, the second bonding layer 655 may be formed of a transparent conductive oxide, such as ITO, IZO, ZnO, or others.

When the second bonding layer 655 is an insulation layer, the first-1 upper ohmic electrode 627*a* and the first-2 lower ohmic electrode 625*b* may be directly electrically connected to each other. Alternatively, when the second bonding layer 655 is a conductive layer, the first-1 upper ohmic electrode 627*a* and the first-2 lower ohmic electrode 625*b* may be electrically connected to each other through the second bonding layer 655, instead of being directly connected to each other. In this case, the first-1 upper ohmic electrode 627*a* and the first-2 lower ohmic electrode 625*b* may not need to be aligned, thereby simplifying the process of manufacturing the light emitting diode stack 600.

The third bonding layer 657 couples the second LED stack 633 to the first-2 LED stack 623*b*. As shown in the drawings, the third bonding layer 657 may adjoin the first-2 LED stack 623*b* and the first color filter 637.

The third bonding layer 657 transmits light generated from the first-1 and first-2 LED stacks 623*a*, 623*b*. As in the first bonding layer 653, the third bonding layer 657 may be formed of, for example, a transparent inorganic material, a transparent organic material, spin-on-glass, or a transparent conductive material.

The fourth bonding layer 659 couples the third LED stack 643 to the second LED stack 633. As shown in the drawings, the fourth bonding layer 659 may adjoin the second LED stack 633 and the second color filter 647. However, the inventive concepts are not limited thereto. For example, a transparent conductive layer may be disposed on the second LED stack 633. The fourth bonding layer 659 transmits light generated from the first-1, first-2, and second LED stacks 623*a*, 623*b*, 633. As in the first bonding layer 653, the fourth bonding layer 659 may be formed of, for example, a transparent inorganic material, a transparent organic material, spin-on-glass, or a transparent conductive material.

FIG. 80A, FIG. 80B, FIG. 80C, and FIG. 80D are schematic cross-sectional views illustrating a method of manufacturing a light emitting diode stack for a display according to an exemplary embodiment.

Figure 80A:
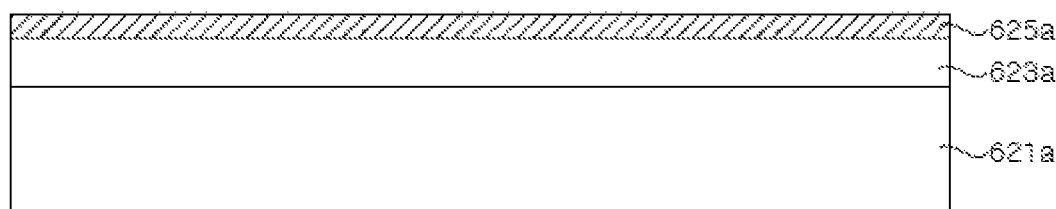
FIGS. 80A, 80B, 80C, and 80D are schematic cross-sectional views illustrating a method of manufacturing a light emitting diode stack for a display according to an exemplary embodiment.

Referring to FIG. 80A, first, a first-1 LED stack 623*a* is grown on a first-1 substrate 621*a*, and a first-1 lower ohmic electrode 625*a* is formed on the first-1 LED stack 623*a*.

The first-1 substrate 621*a* may be, for example, a GaAs substrate. In addition, the first-1 LED stack 623*a* may be formed of AlGaInP-based semiconductor layers, and includes an n-type semiconductor layer, an active layer and, a p-type semiconductor layer. The first-1 lower ohmic electrode 625*a* forms ohmic contact with the p-type semiconductor layer. The first-1 lower ohmic electrode 625*a* may cover substantially the entire area of the first-1 LED stack 623*a*.

Figure 80B:
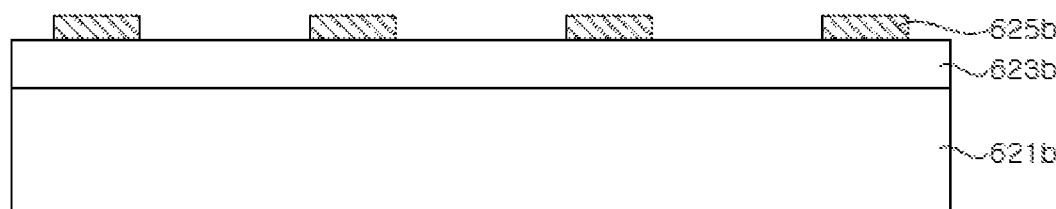

Referring to FIG. 80B, a first-2 LED stack 623*b* is grown on a first-2 substrate 621*b*, and a first-2 lower ohmic electrode 625*b* is formed on the first-2 LED stack 623*b*.

The first-2 substrate 621*b* may be, for example, a GaAs substrate. In addition, the first-2 LED stack 623*b* may be formed of AlGaInP-based semiconductor layers, and includes an n-type semiconductor layer, an active layer, and a p-type semiconductor layer. The first-2 lower ohmic electrode 625*b* forms ohmic contact with the p-type semiconductor layer. The first-2 lower ohmic electrode 625*b* partially contacts the first-2 LED stack 623*b*.

Figure 80C:
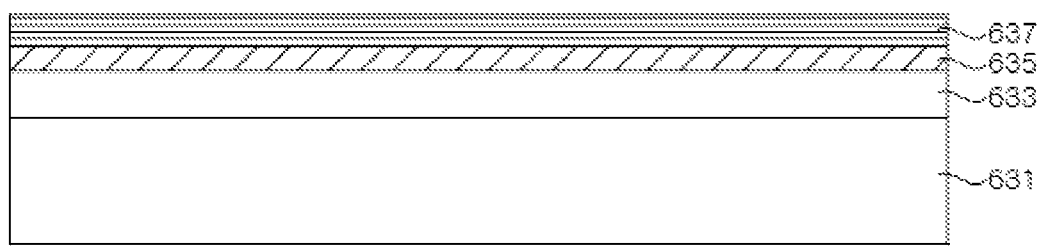

Referring to FIG. 80C, a second LED stack 633 is grown on a second substrate 631, and a second transparent electrode 635 and a first color filter 637 are formed on the second LED stack 633. The second LED stack 633 may be formed of AlGaInP or AlGaInN-based semiconductor layers, and may include an AlGaInP or AlGaInN-based well layer. The second substrate 631 may be a substrate capable of growing the AlGaInP-based semiconductor layers thereon, for example, a GaAs substrate, or a substrate capable of growing GaN-based semiconductor layers thereon, for example, a sapphire substrate. The composition ratio of Al, Ga, and In of the second LED stack 633 may be determined such that the second LED stack 633 can emit green light, for example. The second transparent electrode 635 forms ohmic contact with the p-type semiconductor layer.

Figure 80D:
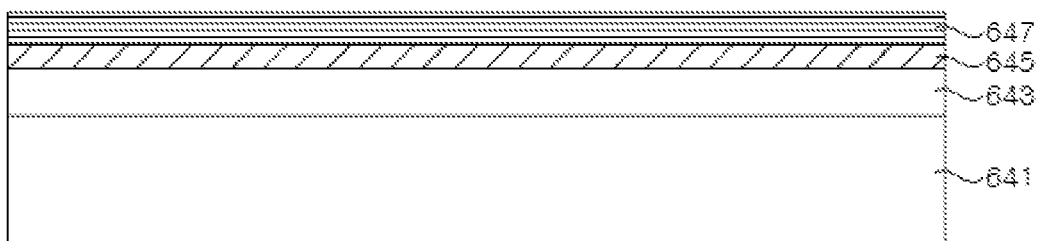

Referring to FIG. 80D, a third LED stack 643 is grown on a third substrate 641, and a third transparent electrode 645 and a second color filter 647 are formed on the third LED stack 643. The third LED stack 643 may be formed of GaN-based semiconductor layers and may include an AlGaInN-based well layer. The third substrate 641 is a substrate capable of growing GaN-based semiconductor layers thereon and may be different from the first-1 substrate 621*a*. The composition ratio of Al, Ga, and In of the third LED stack 643 may be determined such that the third LED stack 643 can emit blue light, for example. The third transparent electrode 645 forms ohmic contact with the p-type semiconductor layer.

A first color filter 637 and a second color filter 647 are substantially the same as those described with reference to FIG. 79, and thus, repeated descriptions thereof will be omitted.

Referring to FIG. 79 and FIG. 80A, first, the first-1 LED stack 623*a* is coupled to a support substrate 651 via a first bonding layer 653. The first-1 lower ohmic electrode 625*a* may be disposed to face the support substrate 651 and bonded to the support substrate 651 through the first bonding layer 653. The first-1 substrate 621*a* is then removed from the first-1 LED stack 623*a* by chemical etching, for example. In some exemplary embodiments, a roughened surface may be formed on the exposed surface of the first-1 LED stack 623*a* by surface texturing, for example.

As shown in FIG. 79, a first-1 upper ohmic electrode 627*a* is formed on the exposed surface of the first-1 LED stack 623*a*.

Then, referring to FIG. 79 and FIG. 80B, the first-2 LED stack 623*b* is coupled to the first-1 LED stack 623*a* via a second bonding layer 655. The first-2 lower ohmic electrode 625*b* may be disposed to face the first-1 LED stack 623*a* and bonded to the first-1 LED stack 623*a*.

The second bonding layer 655 may be, for example, a transparent conductive oxide layer and thus may electrically connect the first-1 upper ohmic electrode 627a and the first-2 lower ohmic electrode 625b to each other. Alternatively, when the second bonding layer 655 is an insulation layer, the first-2 lower ohmic electrode 625b is aligned with the first-1 upper ohmic electrode 627a to directly contact each other.

When the second bonding layer 655 is a transparent conductive oxide layer, transparent conductive oxide layers are respectively deposited on the first-1 LED stack 623a and the first-2 LED stack 623b and bonded to each other to form the second bonding layer 655. The transparent conductive oxide layers formed on the surfaces of the first-1 LED stack 623a and the first-2 LED stack 623b may be flattened by chemical mechanical polishing. Alternatively, the transparent conductive oxide layers formed on the first-1 upper ohmic electrode 627a and the first-1 LED stack 623a are processed to be flush with each other, and the transparent conductive oxide layers formed on the surfaces of the first-2 lower ohmic electrode 625b and the first-2 LED stack 623b are processed to be flush with each other, followed by bonding the transparent conductive oxide layers.

Referring to FIG. 79 and FIG. 80C, the second LED stack 633 is coupled to the first-2 LED stack 623b via a third bonding layer 657. The first color filter 637 may be disposed to face the first-2 LED stack 623b and bonded to the first-2 LED stack 623b through the third bonding layer 657. The second substrate 631 may be separated from the second LED stack 633 by laser lift-off, chemical lift-off, or chemical etching. In some exemplary embodiments, after separation of the second substrate 631, a roughened surface may be formed on the surface of the second LED stack 633 by surface texturing, for example.

Referring to FIG. 79 and FIG. 80D, the third LED stack 643 is coupled to the second LED stack 633 via a fourth bonding layer 659. The second color filter 647 may be disposed to face the second LED stack 633 and bonded to the second LED stack 633 through the fourth bonding layer 659.

The third LED stack 643 may then be separated from the third substrate 641 by laser lift-off, chemical lift-off, or chemical etching. As such, as shown in FIG. 79, a light emitting diode stack for a display, in which the n-type semiconductor layer of the third LED stack 643 is exposed, may be provided. In some exemplary embodiments, a roughened surface may be formed on the surface of the third LED stack 643 by surface texturing, for example.

A display apparatus may be provided by patterning the stack of the first-1, first-2, second, and third LED stacks 623a, 623b, 633, 643 on the support substrate 651 in pixel units, followed by connecting the first-1, first-2, second, and third LED stacks to one another through interconnection lines. Hereinafter, the display apparatus according to exemplary embodiments will be described.

Figure 81:
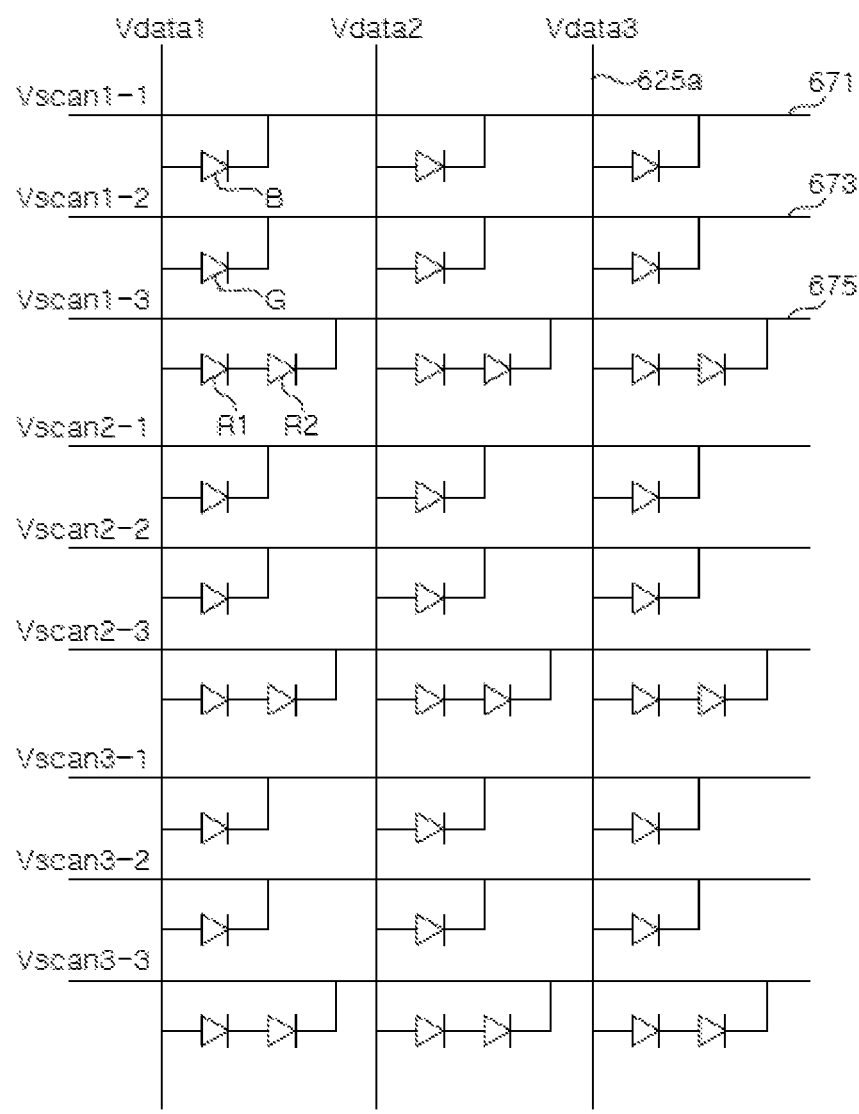
FIG. 81 is a schematic circuit diagram of a display apparatus according to an exemplary embodiment.
Figure 82:
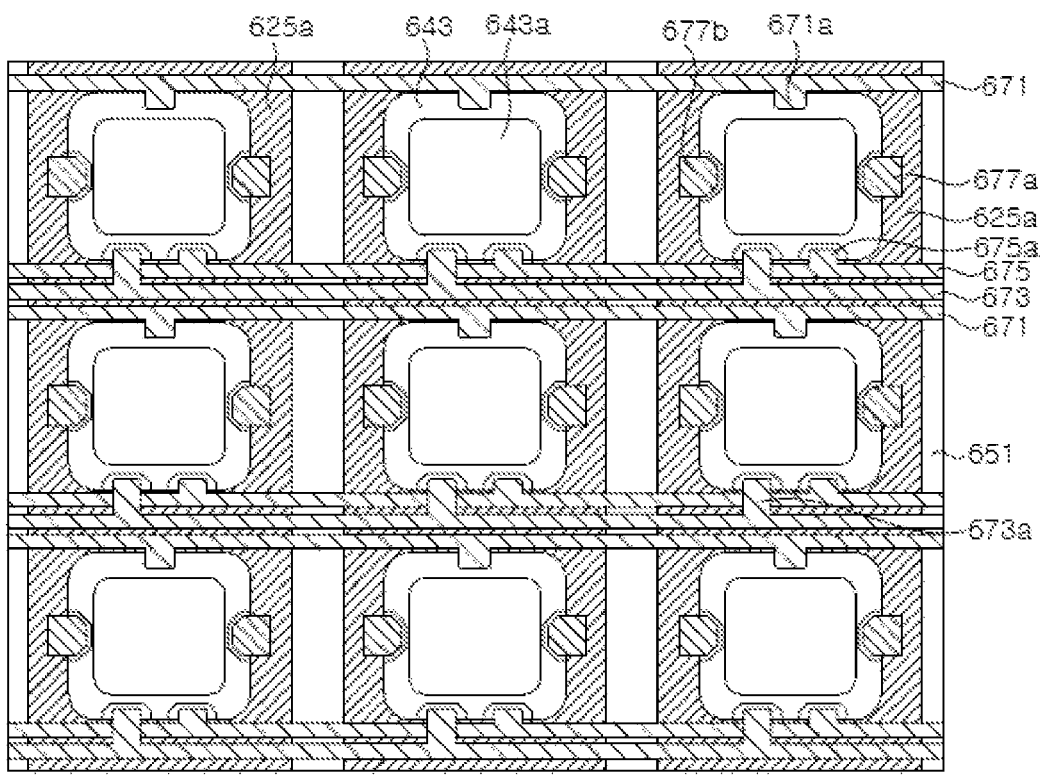
FIG. 82 is a schematic plan view of the display apparatus according to an exemplary embodiment.

FIG. 81 is a schematic circuit diagram of a display apparatus according to an exemplary embodiment, and FIG. 82 is a schematic plan view of the display apparatus according to an exemplary embodiment.

First, referring to FIG. 81 and FIG. 82, the display apparatus according to the illustrated exemplary embodiment may be implemented to be driven in a passive matrix manner.

For example, since the light emitting diode stack for a display described with reference to FIG. 79 has the structure, in which the LED stacks 623a, 623b, 633, 643 are stacked in the vertical direction, one pixel includes at least four light emitting diodes R1, R2, G, B. Here, a first-1 light emitting diode R1 corresponds to the first-1 LED stack 623b, a first-2 light emitting diode R2 corresponds to the first-2 LED stack 623a, a second light emitting diode G corresponds to the second LED stack 633, and a third light emitting diode B corresponds to the third LED stack 643.

In FIGS. 81 and 82, one pixel includes the first-1, first-2, second, and third light emitting diodes R1, R2, G, B, in which the first-1 and first-2 light emitting diodes correspond to a subpixel emitting red light, and the second and third light emitting diodes G, B correspond to subpixels emitting green light and blue light, respectively.

Here, the first-1 light emitting diode R1 is connected to the first-2 light emitting diode R2 in series. Anodes of the first-1 and first-2 light emitting diodes R1, R2 are connected to a common line, for example a data line, and cathodes thereof are connected to scan lines. On the other hand, anodes of the second and third light emitting diodes G, B are connected to a common line, for example, a data line, and cathodes thereof are connected to different lines, for example, scan lines.

For example, in the first pixel, the first-1 light emitting diode R1 and the first-2 light emitting diode R2 are connected to each other in series. Here, the anodes thereof, that is, the anode of the first-1 light emitting diode R1 is commonly connected to a data line Vdata1 together with the anodes of the second and third light emitting diodes G, B. The cathodes of the first-2 light emitting diode R2, the second light emitting diode G, and the third light emitting diodes G, B are connected to scan lines Vscan1-3, Vscan1-2, Vscan1-1, respectively. Accordingly, the first-1 light emitting diode R1 and the first-2 light emitting diode R2 may be driven together, and the second light emitting diode G and the third light emitting diode B may be driven independently of the first-1 light emitting diode R1 and the first-2 light emitting diode R2.

In addition, in some exemplary embodiments, each of the light emitting diodes R1, R2, G, B may be driven by pulse width modulation or by changing the magnitude of electric current to regulate the brightness of each subpixel. Furthermore, in the illustrated exemplary embodiment, both of the first-1 light emitting diode R1 and the first-2 light emitting diode R2 emit red light, which generally has low visibility, thereby improving luminosity of red light.

Referring again to FIG. 82, a plurality of pixels is formed by patterning the stack described with reference to FIG. 79, and each of the pixels is connected to the first-1 lower ohmic electrode 625a and interconnection lines 671, 673, 675. As shown in FIG. 81, the first-1 lower ohmic electrode 625a may be used as the data line Vdata and the interconnection lines 671, 673, 675 may be formed as the scan lines.

The pixels may be arranged in a matrix form, in which the anodes of the light emitting diodes R1, G, B of each pixel are commonly connected to the first-1 lower ohmic electrode 625a, and the cathodes the light emitting diodes R2, G, B of each pixel are connected to the interconnection lines 671, 673, 675 separated from one another. Here, the interconnection lines 671, 673, 675 may be used as the scan lines Vscan.

Figure 83:
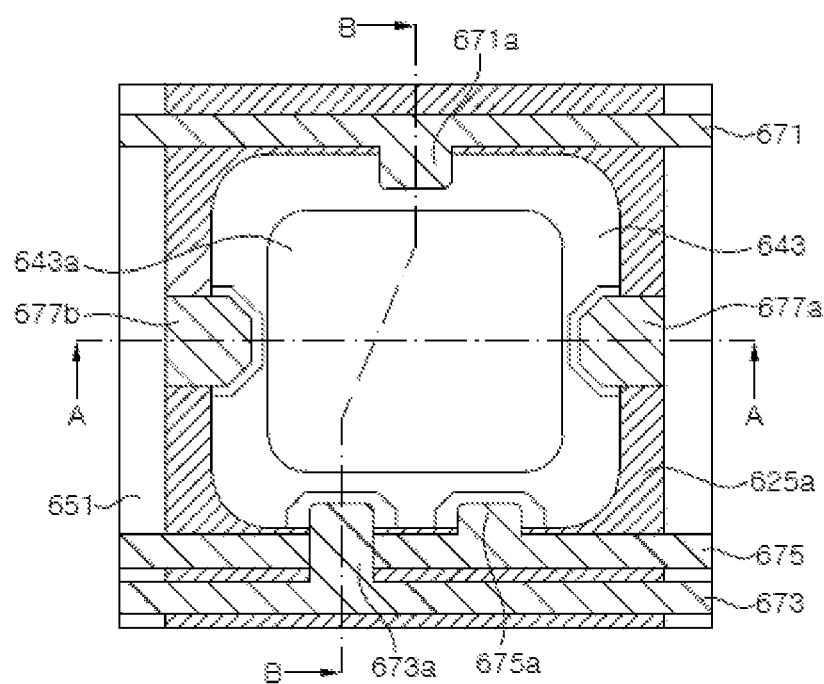
FIG. 83 is an enlarged plan view of one pixel of the display apparatus of FIG. 82.
Figure 84:
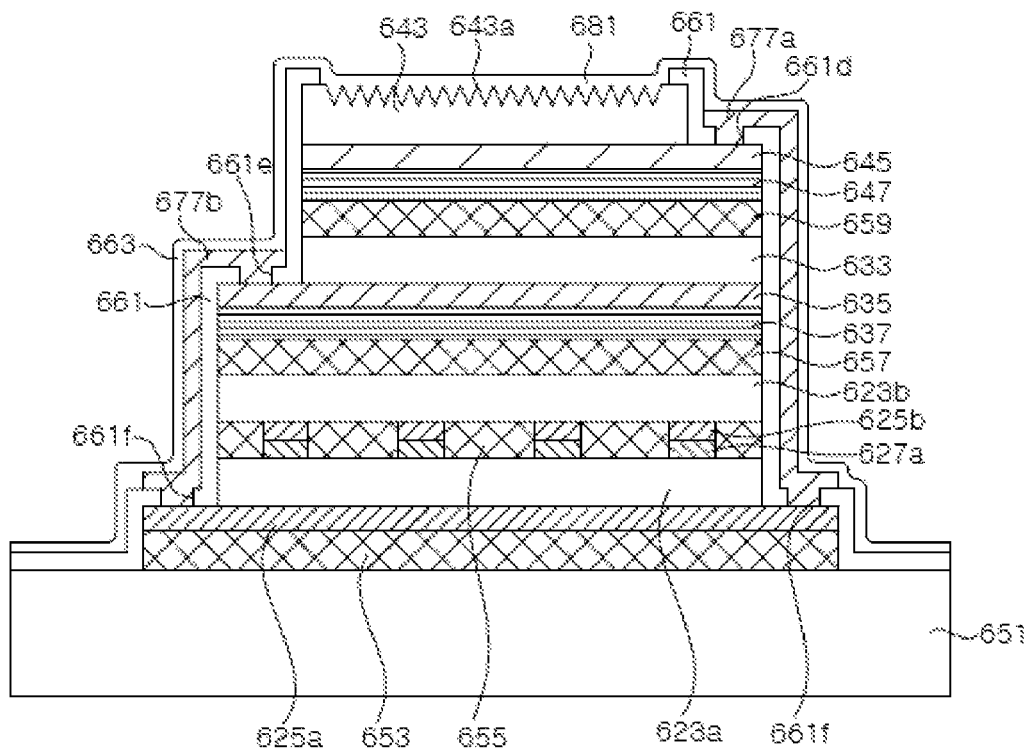
FIG. 84 is a schematic cross-sectional view taken along line A-A of FIG. 83.
Figure 85:
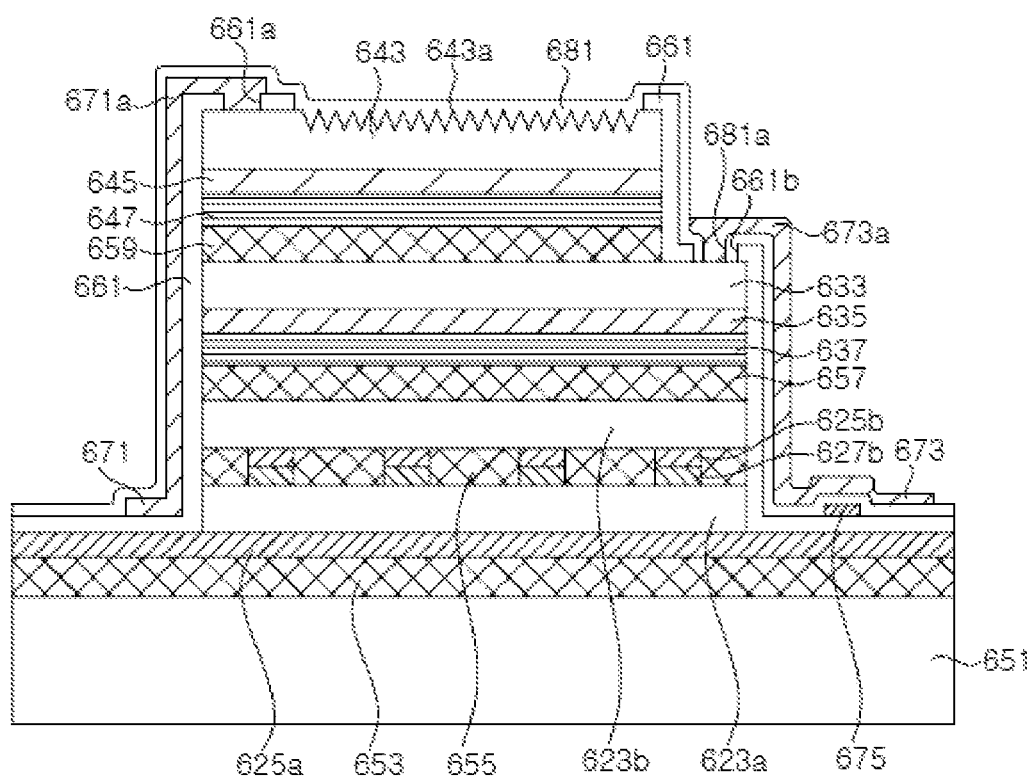
FIG. 85 is a schematic cross-sectional view taken along line B-B of FIG. 83.

FIG. 83 is an enlarged plan view of one pixel of the display apparatus of FIG. 82, FIG. 84 is a schematic cross-sectional view taken along line A-A of FIG. 83, and FIG. 85 is a schematic cross-sectional view taken along line B-B of FIG. 83.

Referring to FIG. 82, FIG. 83, FIG. 84, and FIG. 85, in each pixel, a portion of the first-1 lower ohmic electrode 625a, the upper surface of the first-2 upper ohmic electrode 627b, a portion of the second transparent electrode 635, a portion of the upper surface of the second LED stack 633, a portion of the third transparent electrode 645, and the upper surface of the third LED stack 643 may be exposed to the outside.

The third LED stack 643 may have a roughened surface 643a on the upper surface thereof. The roughened surface 643a may be formed over substantially the entire upper surface of the third LED stack 643, or may be formed in some regions thereof, as shown in the drawings.

A lower insulation layer 661 may cover a side surface of each pixel. The lower insulation layer 661 may be formed of a light transmissive material, such as $SiO_2$. In this case, the lower insulation layer 661 may cover substantially the entire upper surface of the third LED stack 643. Alternatively, the lower insulation layer 661 may include a distributed Bragg reflector to reflect light traveling towards the side surfaces of the first-1 to third LED stacks 623a, 623b, 633, 643. In this case, the lower insulation layer 661 at least partially exposes the upper surface of the third LED stack 643.

The lower insulation layer 661 may include an opening 661a which exposes the upper surface of the third LED stack 643, an opening 661b which exposes the upper surface of the second LED stack 633, an opening 661c (see FIG. 86H) which exposes the upper surface of the first-2 upper ohmic electrode 627b, an opening 661d which exposes the third transparent electrode 645, an opening 661e which exposes the second transparent electrode 635, and an opening 661f which exposes the first-1 lower ohmic electrode 625a.

The interconnection lines 671 and 675 may be formed near the LED stacks 623a, 623b, 633, and 643 on the support substrate 651, and may be disposed on the lower insulation layer 661 to be insulated from the first-1 lower ohmic electrode 625a. A connecting portion 677a connects the third transparent electrode 645 to the first-1 lower ohmic electrode 625a, and a connecting portion 677b connects the second transparent electrode 635 to the first-1 lower ohmic electrode 625a such that the anodes of the first-1 LED stack 623a, the second LED stack 633, and the third LED stack 643 are commonly connected to the first-1 lower ohmic electrode 625a.

A connecting portion 671a connects the upper surface of the third LED stack 643 to the interconnection line 671, and a connecting portion 675a connects the upper surface of the first-2 upper ohmic electrode 627b to the interconnection line 675.

An upper insulation layer 681 may be disposed on the interconnection lines 671, 675 and the lower insulation layer 661 to cover the upper surface of the third LED stack 643. The upper insulation layer 681 may have an opening 681a which partially exposes the upper surface of the second LED stack 633.

The upper insulation layer 681 may be formed of, for example, silicon oxide or silicon nitride, and include a distributed Bragg reflector. In addition, the upper insulation layer 681 may include a transparent insulation layer and a reflective metal layer, or a multilayered organic reflective layer formed on the transparent insulation layer to reflect light, or may include a light absorption layer formed of a black epoxy resin to block light.

When the upper insulation layer 681 reflects or blocks light, the upper insulation layer 681 is formed to at least partially expose the upper surface of the third LED stack 643 in order to allow light to be emitted to the outside. The upper insulation layer 681 may be partially removed to expose the interconnection lines 671, 673, 675 for electrical connection from the outside. Alternatively, in some exemplary embodiments, the upper insulation layer 681 may be omitted.

The interconnection line 673 may be disposed on the upper insulation layer 681, and a connecting portion 673a may connect the upper surface of the second LED stack 633 to the interconnection line 673. The connecting portion 673a may cross the interconnection line 675 and is insulated from the interconnection line 675 by the upper insulation layer 681.

Although the electrodes of each pixel are illustrated above as being connected to the data line and the scan lines in the illustrated exemplary embodiment, the inventive concepts are not limited thereto. In the illustrated exemplary embodiments, the interconnection lines 671, 675 are formed on the lower insulation layer 661 and the interconnection line 673 is formed on the upper insulation layer 681. However, in some exemplary embodiments, all of the interconnection lines 671, 673, and 675 may be formed on the lower insulation layer 661 and may be covered by the upper insulation layer 681, which may have openings exposing the interconnection line 673. In this case, the connecting portions 673a may connect the upper surface of the second LED stack 633 to the interconnection line 673 through the openings of the upper insulation layer 681.

Alternatively, the interconnection lines 671, 673, and 675 may be formed inside the support substrate 651, and the connecting portions 671a, 673a, and 675a on the lower insulation layer 661 may connect the cathodes of the LED stacks 623a, 633, and 643 to the interconnection lines 671, 673, and 675.

FIG. 86A to FIG. 86K are schematic plan views illustrating a method of manufacturing a display apparatus according to an exemplary embodiment. Hereinafter, the following descriptions will be given with reference to a method of forming the pixel of FIG. 83.

First, the light emitting diode stack 600 described in FIG. 79 is prepared.

Figure 86A:
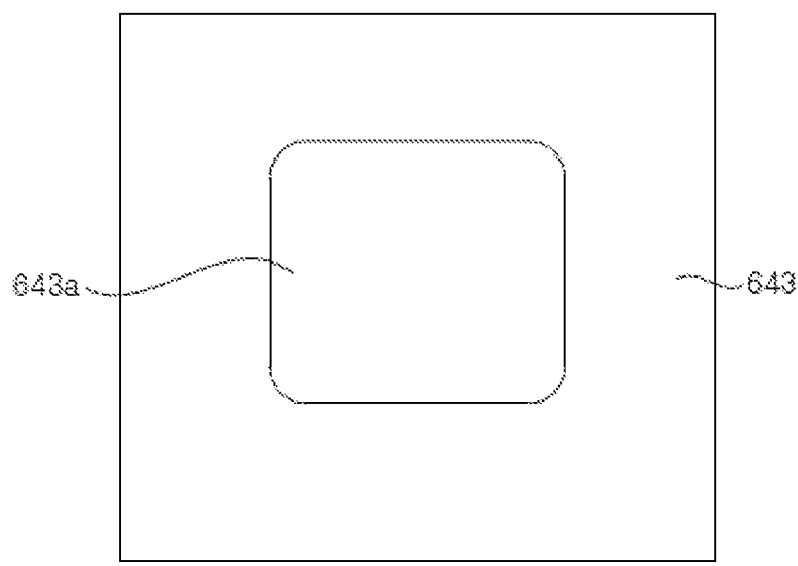
FIGS. 86A, 86B, 86C, 86D, 86E, 86F, 86G, 86H, 86I, 86J, and 86K are schematic plan views illustrating a method of manufacturing a display apparatus according to an exemplary embodiment.

Then, referring to FIG. 86A, a roughened surface 643a may be formed on the upper surface of the third LED stack 643. The roughened surface 643a may be formed on the upper surface of the third LED stack 643 so as to correspond to each pixel region. The roughened surface 643a may be formed by chemical etching, for example, photo-enhanced chemical etching (PEC).

The roughened surface 643a may be partially formed in each pixel region by considering a region of the third LED stack 643 to be etched in the subsequent process, without being limited thereto. Alternatively, the roughened surface 643a may be formed over substantially the entire upper surface of the third LED stack 643.

Figure 86B:
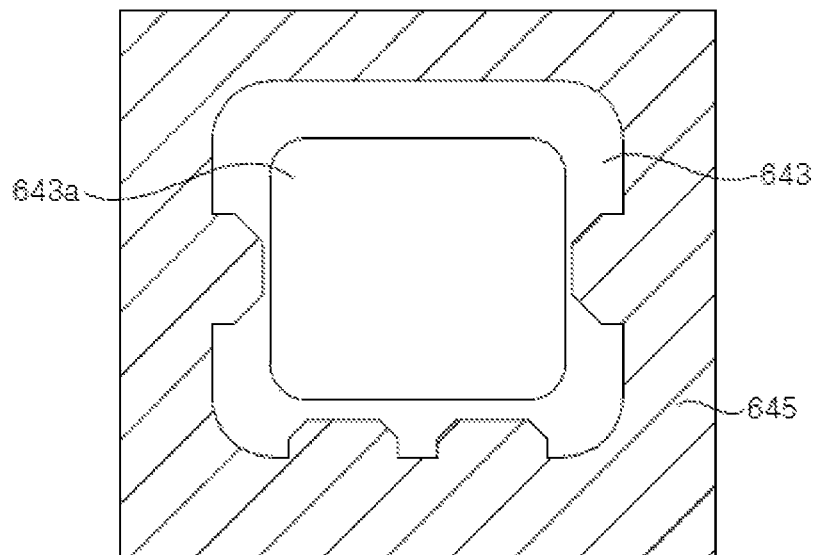

Referring to FIG. 86B, a surrounding region of the third LED stack 643 in each pixel is removed by etching to expose the third transparent electrode 645. The third LED stack 643 may have a substantially rectangular shape or a square shape, as shown in the drawings. A plurality of depressions may be formed along edges of the third LED stack 643.

Figure 86C:
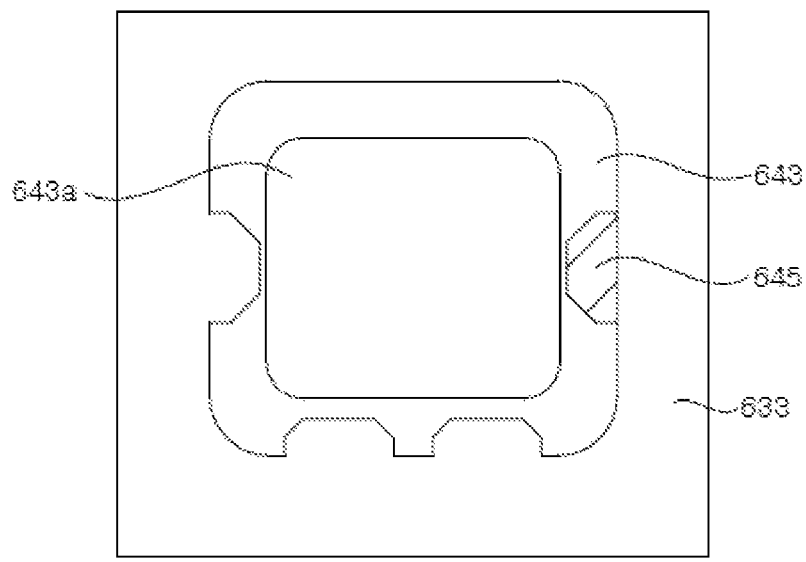

Referring to FIG. 86C, the upper surface of the second LED stack 633 is exposed by removing the exposed third transparent electrode 645 in regions other than a portion thereof disposed in one depression, followed by sequentially removing the second color filter 647 and the fourth bonding layer 659. Accordingly, the upper surface of the second LED stack 633 is exposed around the third LED stack 643 and in other depressions except in the depression ne in which the third transparent electrode 645 is remained.

Figure 86D:
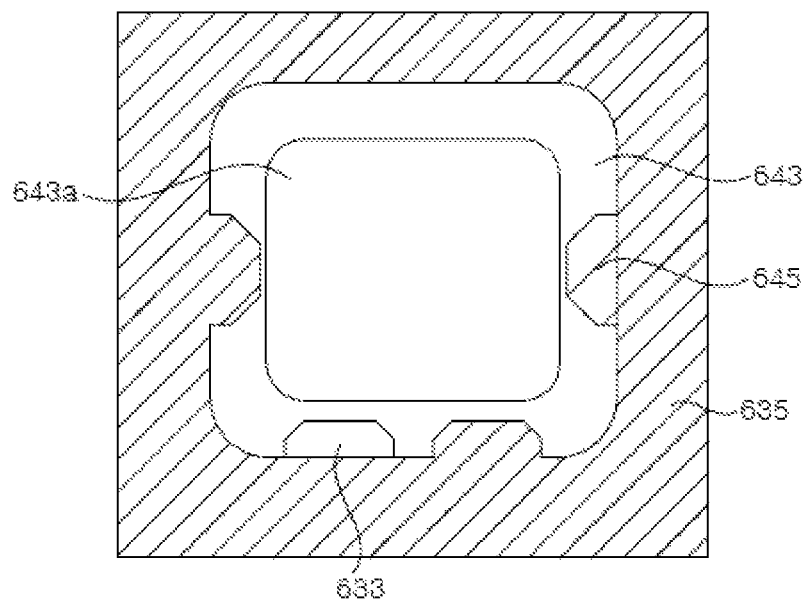

Referring to FIG. 86D, the second transparent electrode 635 is exposed by removing the exposed second LED stack 633 in regions other than that disposed in one depression.

Figure 86E:
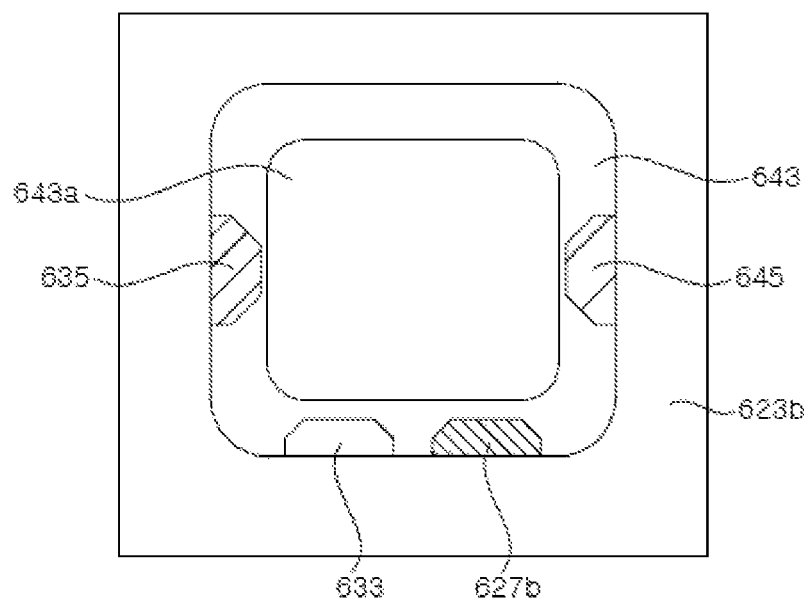

Referring to FIG. 86E, the upper surface of the first-2 LED stack 623b is exposed by removing the exposed second transparent electrode 635 in other regions except the a portion disposed in one depression, followed by sequentially removing the first color filter 637 and the third bonding layer 657. Accordingly, the upper surface of the first-2 LED stack 623b is exposed around the third LED stack 643. As the upper surface of the first-2 LED stack 623b is exposed, the first-2 upper ohmic electrode 627b is also exposed. As shown in the drawings, the first-2 upper ohmic electrode 627b may be exposed in at least one of the depressions of the third LED stack 643.

Figure 86F:
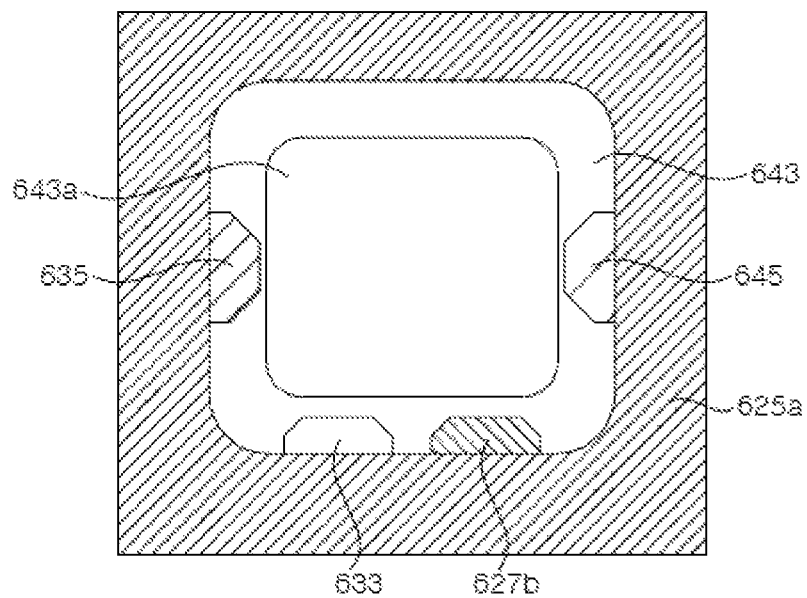

Referring to FIG. 86F, the first-1 lower ohmic electrode 625a is exposed by removing the first-2 LED stack 623b exposed around the third LED stack 643, followed by sequentially removing the second bonding layer 655 and the first-1 LED stack 623a. The first-1 lower ohmic electrode 625a is exposed around the third LED stack 643.

Figure 86G:
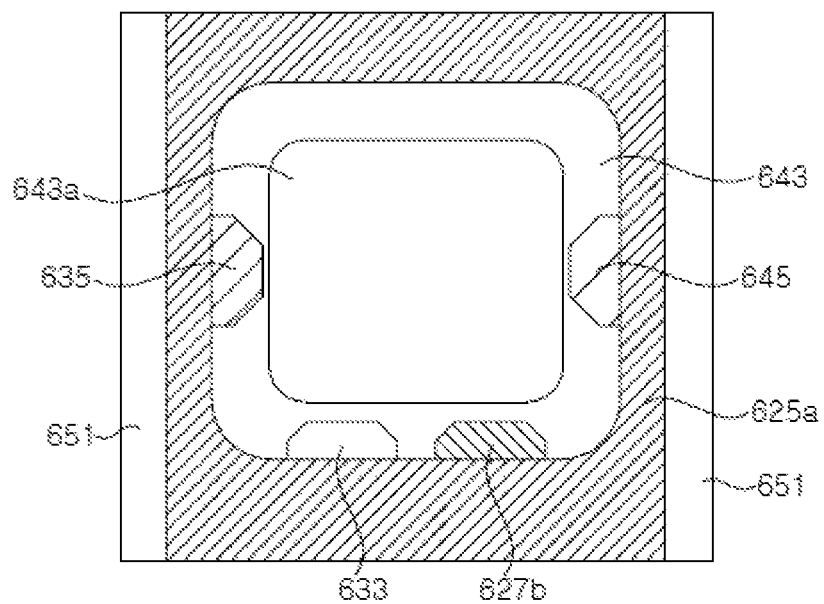

Referring to FIG. 86G, linear interconnection lines are formed by patterning the first-1 lower ohmic electrode 625a. As such, the support substrate 651 may be exposed. The first-1 lower ohmic electrode 625a may connect pixels arranged in one row to each other among pixels arranged in a matrix (see FIG. 82).

Figure 86H:
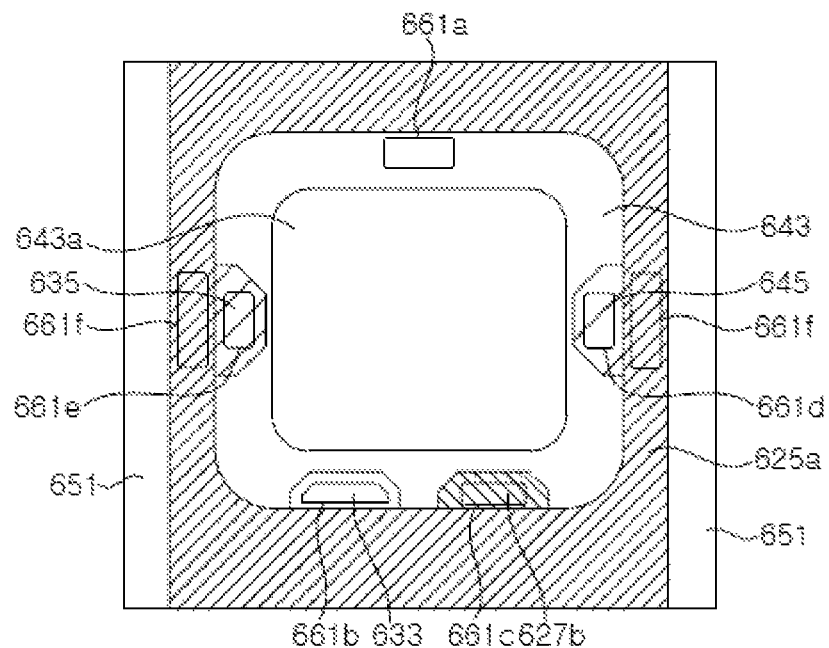

Referring to FIG. 86H, a lower insulation layer 661 (see FIG. 84 and FIG. 85) is formed to cover the pixels. The lower insulation layer 661 covers the first-1 lower ohmic electrode 625a and the side surfaces of the LED stacks 623a, 623b, 633, and 643. In addition, the lower insulation layer 661 may at least partially cover the upper surface of the third LED stack 643. When the lower insulation layer 661 is a transparent layer, such as a $SiO_2$ layer, the lower insulation layer 661 may cover substantially the entire upper surface of the third LED stack 643. Alternatively, the lower insulation layer 661 may include a distributed Bragg reflector. In this case, the lower insulation layer 661 may at least partially expose the upper surface of the third LED stack 643 so as to allow light to be emitted to the outside.

The lower insulation layer 661 may include an opening 661a which exposes the third LED stack 643, an opening 661b which exposes the second LED stack 633, an opening 661c which exposes the first-2 upper ohmic electrode 627b, an opening 661d which exposes the third transparent electrode 645, an opening 661e which exposes the second transparent electrode 635, and an opening 661f which exposes the first-1 lower ohmic electrode 625a. At least two openings 661f exposing the first-1 lower ohmic electrode 625a may be formed.

Figure 86I:
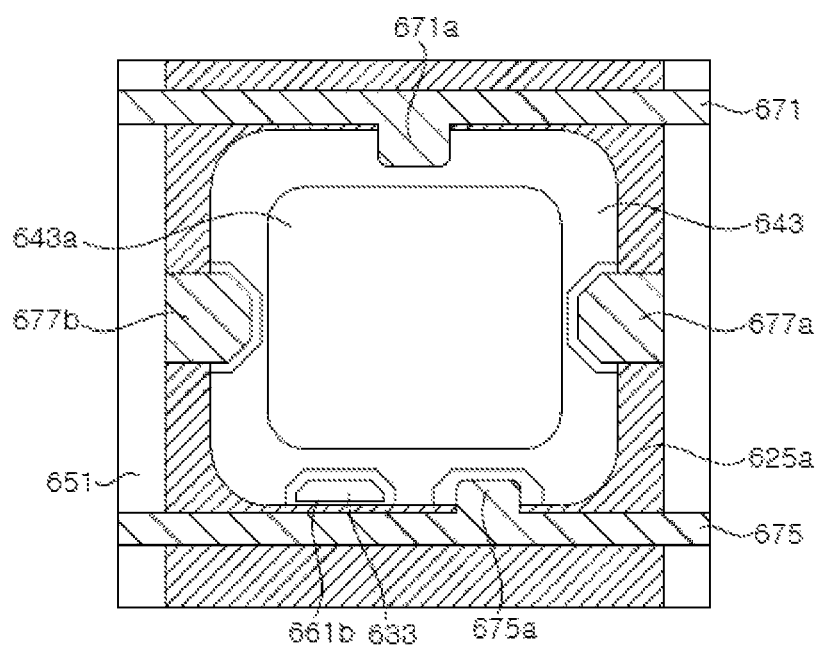

Referring to FIG. 86I, interconnection lines 671, 675 and connecting portions 671a, 675a, 677a, and 677b are formed by a lift-off process, for example. The interconnection lines 671 and 675 are insulated from the first-1 lower ohmic electrode 625a by the lower insulation layer 661. The connecting portion 671a electrically connects the third LED stack 643 to the interconnection line 671, and the connecting portion 675a electrically connects the first-2 upper ohmic electrode 627b to the interconnection line 675. The connecting portion 677a electrically connects the third transparent electrode 645 to the first-1 lower ohmic electrode 625a, and the connecting portion 677b electrically connects the second transparent electrode 635 to the first-1 lower ohmic electrode 625a.

Figure 86J:
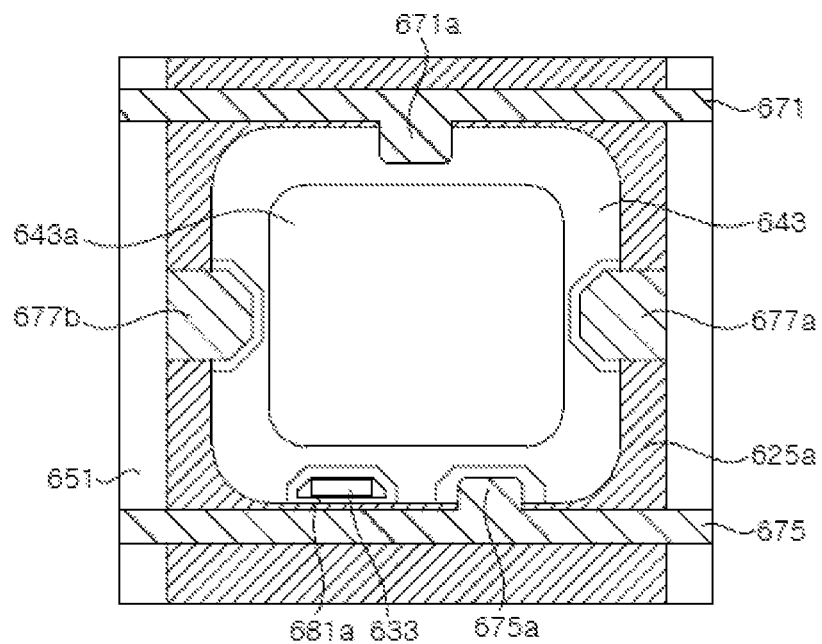

Referring to FIG. 86J, an upper insulation layer 681 (see FIG. 84 and FIG. 85) covers the interconnection lines 671 and 675 and the connecting portions 671a, 675a, 677a, and 677b. The upper insulation layer 681 may also cover substantially the entire upper surface of the third LED stack 643. The upper insulation layer 681 has an opening 681a which exposes the upper surface of the second LED stack 633. The upper insulation layer 681 may be formed of, for example, silicon oxide or silicon nitride, and may include a distributed Bragg reflector. When the upper insulation layer 681 includes the distributed Bragg reflector, the upper insulation layer 681 is formed to expose at least part of the upper surface of the third LED stack 643 in order to allow light to be emitted to the outside.

Figure 86K:
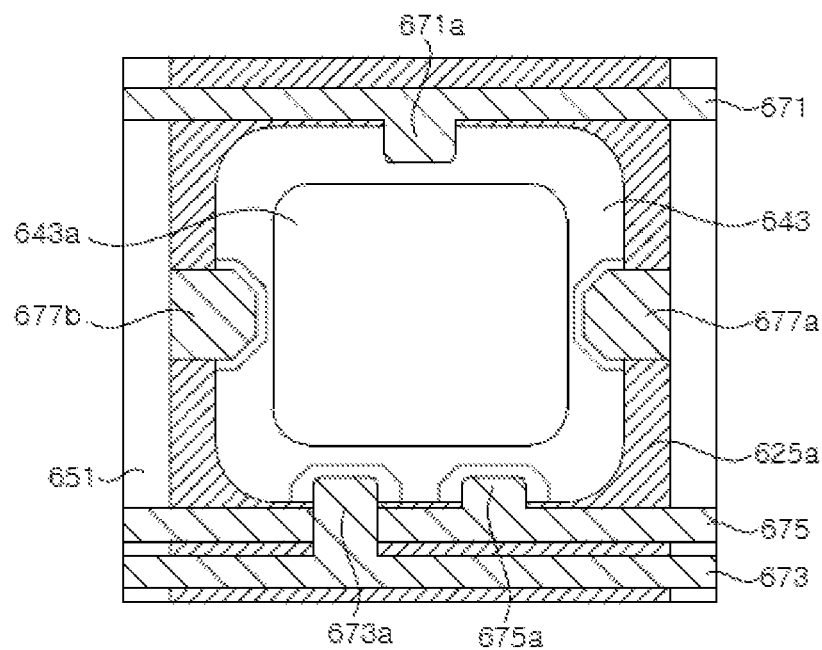

Referring to FIG. 86K, an interconnection line 673 and a connecting portion 673a are formed. An interconnection line 673 and a connecting portion 673a may be formed by a lift-off process, for example. The interconnection line 673 is disposed on the upper insulation layer 681 and is insulated from the first-1 lower ohmic electrode 625a and the interconnection lines 671, 675. The connecting portion 673a electrically connects the second LED stack 633 to the interconnection line 673. The connecting portion 673a may cross the interconnection line 675 and is insulated from the interconnection line 675 by the upper insulation layer 681.

As such, a pixel region is provided, as shown in FIG. 83. In addition, as shown in FIG. 82, a plurality of pixels may be formed on the support substrate 651 and may be connected to one another by the first-1 lower ohmic electrode 625a and the interconnection lines 671, 673, and 675 to be driven in a passive matrix manner.

Although a method of manufacturing the display apparatus configured to be driven in the passive matrix manner has been described above in the illustrated exemplary embodiment, the inventive concepts are not limited thereto. For example, the display apparatus may be manufactured in various other ways to be driven in the passive matrix manner using the light emitting diode stack shown in FIG. 79.

For example, although the interconnection line 673 is illustrated above as being formed on the upper insulation layer 681, in some exemplary embodiments, the interconnection line 673 may be formed together with the interconnection lines 671 and 675 on the lower insulation layer 661, and the connecting portion 673a may be formed on the lower insulation layer 661 to connect the second LED stack 633 to the interconnection line 673. Alternatively, the interconnection lines 671, 673, and 675 may be disposed inside the support substrate 651.

Figure 87:
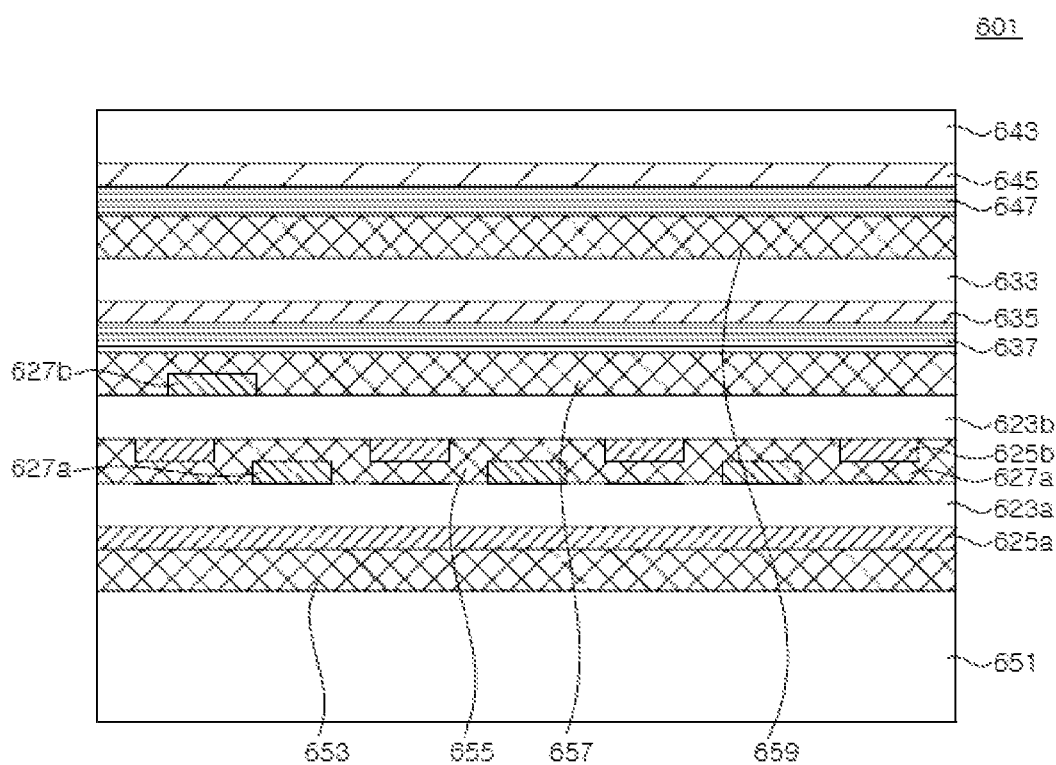
FIG. 87 is a schematic cross-sectional view of a display apparatus according to an exemplary embodiment.

FIG. 87 is a schematic cross-sectional view of a light emitting diode stack for a display apparatus according to an exemplary embodiment.

Referring to FIG. 87, the light emitting diode stack 601 according to the illustrated exemplary embodiment is generally similar to the light emitting diode stack 600 described with reference to FIG. 79, except that the first-1 upper ohmic electrode 627a and the first-2 lower ohmic electrode 625b are insulated from each other.

More particularly, the first-1 upper ohmic electrode 627a and the first-2 lower ohmic electrode 625b are separated from each other and are electrically insulated from each other. As such, the second bonding layer 655 is formed of a light transmissive insulation layer.

A plurality of pixels may be formed on the support substrate 651 by patterning light emitting diode stack 601, and the first-1 LED stack 623a and the first-2 LED stack 623b may be connected to each other in parallel through connecting portions.

Figure 88:
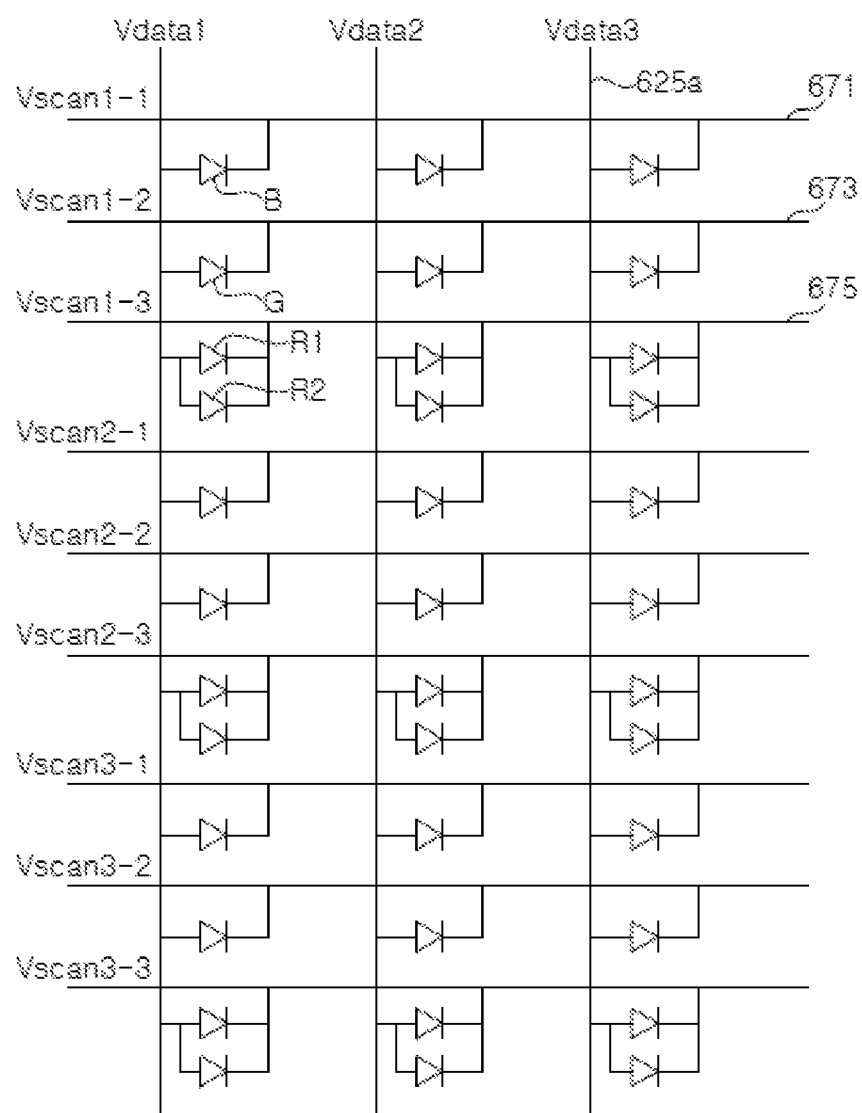
FIG. 88 is a schematic circuit diagram of a display apparatus according to an exemplary embodiment.

FIG. 88 is a schematic circuit diagram of a display apparatus according to an exemplary embodiment. In the illustrated exemplary embodiment, the first-1 LED stack 623a and the first-2 LED stack 623b are connected to each other in parallel to form a passive matrix.

Referring to FIG. 88, the display apparatus according to the illustrated exemplary embodiment is generally similar to the display apparatus described with reference to FIG. 81, except that the first-1 light emitting diode R1 and the first-2 light emitting diode R2 are connected to each other in parallel.

In particular, the first-2 upper ohmic electrode 627b of FIG. 87 is electrically connected to the first-1 upper ohmic electrode 627a, and the first-2 lower ohmic electrode 625b is electrically connected to the first-1 lower ohmic electrode 625a.

The first-1 lower ohmic electrode 625a may be used as a common line, and the first-2 lower ohmic electrode 625b is electrically connected to the first-1 lower ohmic electrode 625a through a connecting portion. The first-2 upper ohmic electrode 627b is connected together with the first-1 upper ohmic electrode 627a to the interconnection line 675.

In this manner, a display apparatus may include pixels each having the first-1 light emitting diode R1 and the first-2 light emitting diode R2 are connected to each other in parallel.

According the exemplary embodiments, a plurality of pixels may be formed at the wafer level using the light emitting diode stack 600 or 601 for a display, an individual mounting process of light emitting diodes may be obviated. In addition, the light emitting diode stack according to the exemplary embodiments has the structure, in which the LED stacks 623a, 623b, 633, 643 are stacked one above another in the vertical direction, thereby securing an area for sub-pixels in a restricted pixel area. Furthermore, the multiple LED stacks emitting light having low visibility are stacked one above another, thereby improving the brightness of red light, for example, without significant change in current density in the restricted area.

Although the first-1 LED stack 623a, the first-2 LED stack 623b, the second LED stack 633, and the third LED stack 643 have been described above as overlapping each other with a generally similar luminous area, the inventive concepts are not limited to the LED stacks having a similar luminous area. For example, the second LED stack 633 may be disposed in some region on the first-2 LED stack 623b, and the third LED stack 643 may be disposed in some region on the second LED stack 633. Furthermore, in some exemplary embodiments, the first-2 LED stack 623b may also be disposed in some region on the first-1 LED stack 623a. In this manner, the first-1 and first-2 LED stacks 623a, 623b emitting light having low visibility may have larger luminous areas than the second and third LED stacks 633, 643, thereby further improving the brightness. Furthermore, at least part of light generated from the first-1 and first-2 LED stacks 623a, 623b may be emitted to the outside without passing through the second LED stack 633 and the third LED stack 643, and at least part of light generated from the second LED stack 633 may be emitted outside without passing through the third LED stack 643, thereby further improving luminous efficacy.

Figure 89A:
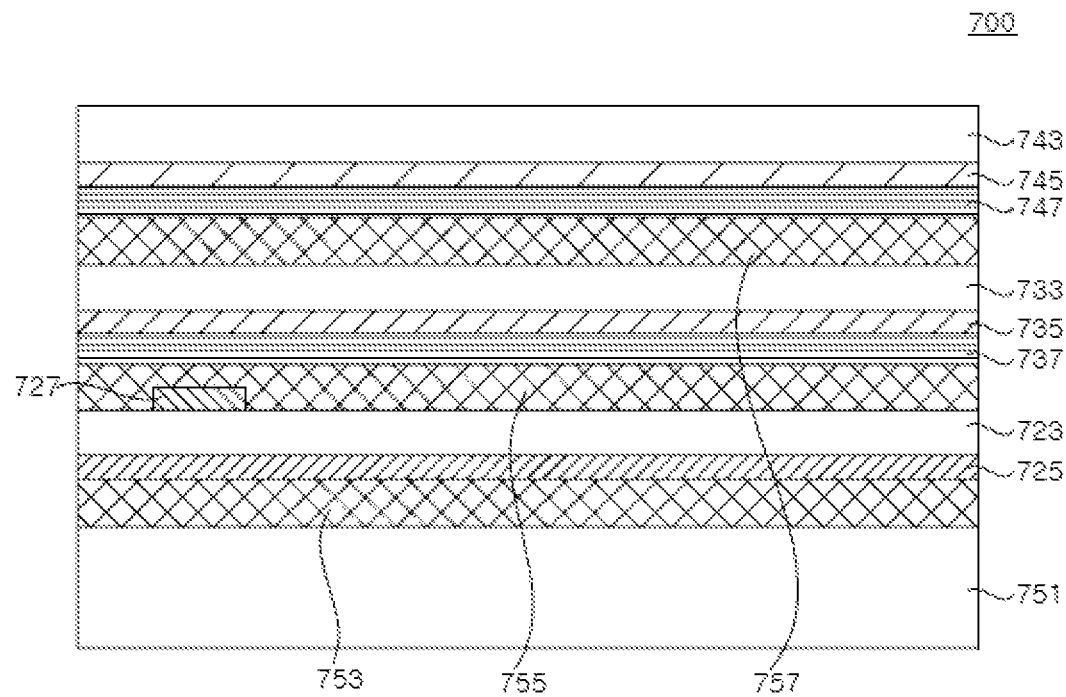
FIG. 89A is a schematic cross-sectional view of a light emitting diode stack for a display according to an exemplary embodiment.
Figure 89B:
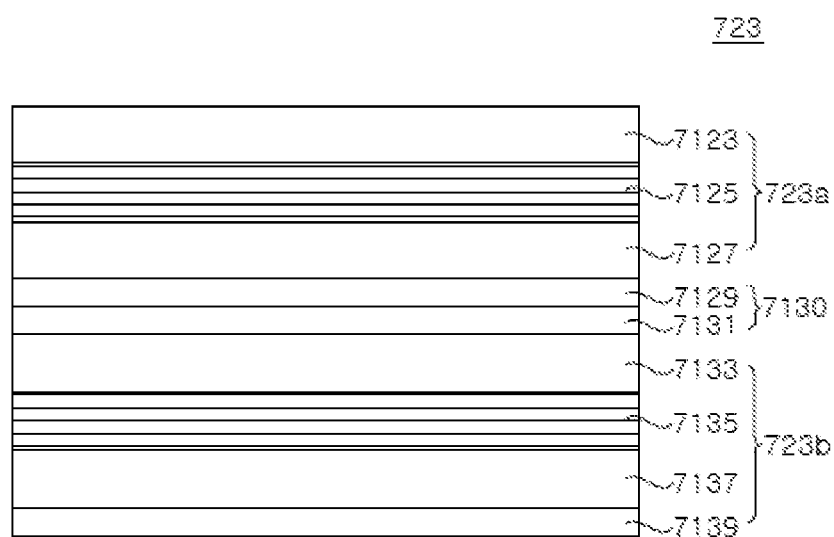
FIG. 89B is an enlarged cross-sectional view of a first LED stack of FIG. 89A.

FIG. 89A is a schematic cross-sectional view of a light emitting diode stack for a display according to an exemplary embodiment, and FIG. 89B is an enlarged cross-sectional view of a first LED stack 723 of FIG. 89A.

Referring to FIG. 89A and FIG. 89B, the light emitting diode stack 700 may include a support substrate 751, a first LED stack 723, a second LED stack 733, a third LED stack 743, a first reflective electrode 725, a first ohmic electrode 727, a second transparent electrode 735, a third transparent electrode 745, a first color filter 737, a second color filter 747, a first bonding layer 753, a second bonding layer 755, and a third bonding layer 757.

The support substrate 751 supports the LED stacks 723, 733, 743. The support substrate 751 may include a circuit on a surface thereof or therein, without being limited thereto. The support substrate 751 may include, for example, a Si substrate or a Ge substrate.

In an exemplary embodiment, the first LED stack 723 may be an inorganic light emitting diode to emit light having a longer wavelength, for example, red light, than the second LED stack 733 and the third LED stack 743. The second LED stack 733 may be an inorganic light emitting diode to emit light having a longer wavelength, for example, green light, than the third LED stack 743, and the third LED stack 743 may be an inorganic light emitting diode to emit blue light. However, the inventive concepts are not limited thereto.

In the illustrated exemplary embodiment, the first LED stack 723 may have a multi junction LED stack structure, and may include, for example, a first-1 LED stack 723a, a first-2 LED stack 723b, and a tunnel junction layer 7130, as shown in FIG. 89B.

The first-1 LED stack 723a may include an n-type semiconductor layer 7123, an active layer 7125, and a p-type semiconductor layer 7127. The n-type semiconductor layer 7123 may be formed of a single layer or multiple layers. For example, the n-type semiconductor layer 7123 may include an AlGaInP-based n-type clad layer and an n-type window layer. The p-type semiconductor layer 7127 may include, for example, an AlGaInP-based p-type clad layer. The active layer 7125 may have a multi-quantum well layer structure and may include an AlGaInP-based well layer.

The first-2 LED stack 723b may include an n-type semiconductor layer 7133, an active layer 7135, a p-type semiconductor layer 7137, and a high density p-contact layer 7139. The n-type semiconductor layer 7133 may include an AlGaInP-based n-type clad layer. The p-type semiconductor layer 7137 may be formed of a single layer or multiple layers, and may include, for example, an AlGaInP-based p-type clad layer and a p-type window layer. The active layer 7135 may have a multi-quantum well layer structure and may include an AlGaInP-based well layer. The high density p-contact layer 7139 may be formed of, for example, high density p-GaP.

The tunnel junction layer 7130 may include an AlGaInP-based high density-doped p-type layer 7129 and a high density-doped n-type layer 7131. Current can be conducted through the tunnel junction layer 7130, in which the high density-doped n-type layer 7131 is bonded to the high density-doped p-type layer 7129.

In the illustrated exemplary embodiment, the two LED stacks 723a, 723b are bonded to each other through one tunnel junction layer 7130. However, the inventive concepts are not limited thereto, and in some exemplary embodiments, the LED stacks may be bonded to each other through two or more tunnel junction layers.

With the multi junction LED stack structure, the light emitting diode stack can increase luminous intensity of light having low visibility without increasing the area and current density.

In the illustrated exemplary embodiment, the first LED stack 723 has an n-type upper surface and a p-type lower surface. However, the inventive concepts are not limited thereto and the semiconductor types of the upper and lower surfaces of the first LED stack 723 may be changed.

Each of the second LED stack 733 and the third LED stack 743 includes an n-type semiconductor layer, a p-type semiconductor layer, and an active layer interposed therebetween. The active layer may have a multi-quantum well structure. The second LED stack 733 may include an AlGaInP or AlGaInN-based well layer, and the third LED stack 743 may include an AlGaInN-based well layer.

In addition, both surfaces of each of the second and third LED stacks 733 or 743 are an n-type semiconductor layer and a p-type semiconductor layer, respectively. In the illustrated exemplary embodiment, each of the second and third LED stacks 733, 743 has an n-type upper surface and a p-type lower surface. Since the third LED stack 743 has an n-type upper surface, in some exemplary embodiments, a roughened surface may be formed on the upper surface of the third LED stack 743 through chemical etching, for example. However, the inventive concepts are not limited thereto, and the semiconductor types of the upper and lower surfaces of each of the LED stacks 733, 743 may be changed.

The first LED stack 723 is disposed near the support substrate 751, the second LED stack 733 is disposed on the first LED stack 723, and the third LED stack 743 is disposed on the second LED stack 733. Since the first LED stack 723 emits light having a longer wavelength than the second and third LED stacks 733, 743, light generated from the first LED stack 723 can be emitted to the outside through the second and third LED stacks 733, 743. In addition, since the second LED stack 733 emits light having a longer wavelength than the third LED stack 743, light generated from the second LED stack 733 can be emitted outside to the through the third LED stack 743.

The first reflective electrode 725 forms ohmic contact with the lower surface of the first LED stack 723, for example, the p-type semiconductor layer thereof, and reflects light generated from the first LED stack 723. For example, the first reflective electrode 725 may include an ohmic reflective layer formed of, for example, an Au—Zn alloy or an Au—Be alloy.

The first ohmic electrode 727 forms ohmic contact with the upper surface of the first LED stack 723, for example, the n-type semiconductor layer thereof. The first ohmic electrode 727 may include an ohmic layer formed of, for example, an Au—Te alloy or an Au—Ge alloy. The first ohmic electrode 727 may be formed in each pixel region.

The second transparent electrode 735 forms ohmic contact with the lower surface of the second LED stack 733, for example, the p-type semiconductor layer thereof. The second transparent electrode 735 may include a metal layer or a conductive oxide layer transparent with respect to red light and green light, for example.

The third transparent electrode 745 forms ohmic contact with the lower surface of the third LED stack 743, for example, the p-type semiconductor layer thereof. The third transparent electrode 745 may include a metal layer or a conducive oxide layer transparent with respect to red light, green light, and blue light, for example.

The first reflective electrode 725, the second transparent electrode 735, and the third transparent electrode 745 may assist in current spreading in the p-type semiconductor layers thereof through ohmic contact with the p-type semiconductor layer of each of the LED stacks.

The first color filter 737 is interposed between the first LED stack 723 and the second LED stack 733. In addition, the second color filter 747 is interposed between the second LED stack 733 and the third LED stack 743. The first color filter 737 transmits light generated from the first LED stack 723 while reflecting light generated from the second LED stack 733. The second color filter 747 transmits light generated from the first and second LED stacks 723, 733 while reflecting light generated from the third LED stack 743. As such, light generated from the first LED stack 723 can be emitted to the outside through the second LED stack 733 and the third LED stack 743, and light generated from the second LED stack 733 can be emitted to the outside through the third LED stack 743. Further, the light emitting diode stack can prevent light generated from the second LED stack 733 from entering the first LED stack 723 and/or can prevent light generated from the third LED stack 743 from entering the second LED stack 733, thereby preventing light loss.

In some exemplary embodiments, the first color filter 737 may reflect light generated from the third LED stack 743.

The first and second color filters 737, 747 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 737, 747 may include a distributed Bragg reflector (DBR). The distributed Bragg reflector (DBR) reflects light in a particular wavelength band (stop band) while transmitting light in other wavelength ranges. The distributed Bragg reflector may be formed by alternately stacking insulation layers having different refractive indices one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 753 couples the first LED stack 723 to the support substrate 751. As shown in the drawings, the first reflective electrode 725 may adjoin the first bonding layer 753. The first bonding layer 753 may be a light transmissive or opaque layer. The first bonding layer 753 may be formed of organic or inorganic materials. For example, the organic materials may include SUB, poly (methyl methacrylate) (PMMA), polyimide, Parylene, benzocyclobutene (BCB), or others, and the inorganic materials may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. More particularly, a bonding layer formed of a black epoxy resin capable of absorbing light may be used as the first bonding layer 753, thereby improving the contrast of a display apparatus. The first bonding layer 753 may also be formed of spin-on-glass or a transparent conductive material.

The second bonding layer 755 couples the second LED stack 733 to the first LED stack 723. As shown in the drawings, the second bonding layer 755 may adjoin the first LED stack 723 and the first color filter 737. The second bonding layer 755 may cover the first ohmic electrode 727.

The second bonding layer 755 may be formed of a light transmissive material, as in the first bonding layer 753. The second bonding layer 755 may be, for example, a transparent inorganic insulation layer, a transparent organic insulation layer, or a transparent conductive layer, or may be formed of light transmissive spin-on-glass.

The third bonding layer 757 couples the third LED stack 743 to the second LED stack 733. As shown in the drawings, the third bonding layer 757 may adjoin the second LED stack 733 and the second color filter 747. However, the inventive concepts are not limited thereto, and in some exemplary embodiments, a transparent conducive layer may be disposed on the second LED stack 733. The third bonding layer 757 transmits light generated from the first LED stack 723 and the second LED stack 733. The third bonding layer 757 may be formed of a light transmissive material, as in the first bonding layer 753. The third bonding layer 757 may be, for example, a transparent inorganic insulation layer, a transparent organic insulation layer, or a transparent conductive layer, or may be formed of light transmissive spin-on-glass.

Figure 90A:
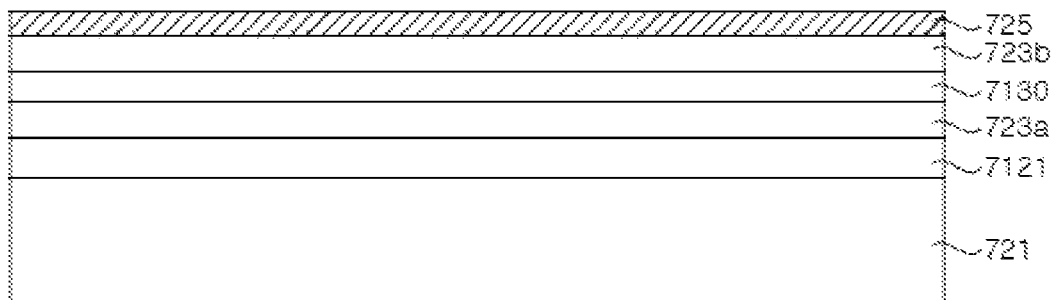
FIGS. 90A, 90B, and 90C are schematic cross-sectional views illustrating a method of manufacturing a light emitting diode stack for a display according to an exemplary embodiment.
Figure 90B:
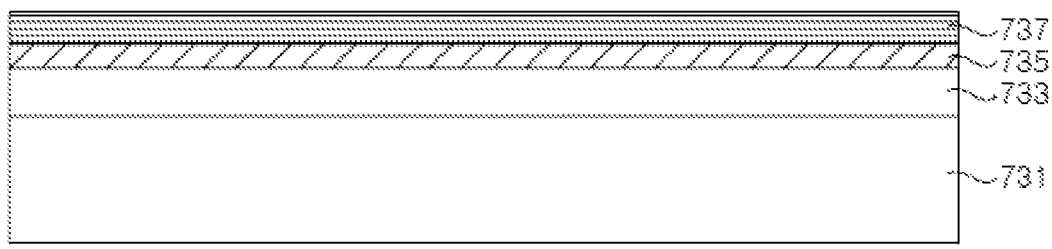
Figure 90C:
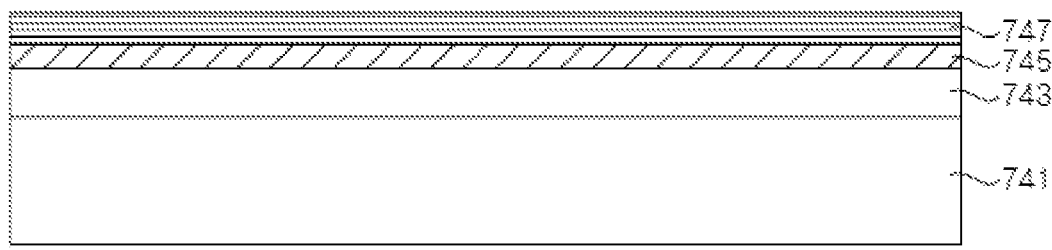

FIG. 90A, FIG. 90B, and FIG. 90C are schematic cross-sectional views illustrating a method of manufacturing a light emitting diode stack for a display according to an exemplary embodiment.

Referring to FIG. 90A, first, an n-type GaAs layer 7121 is grown on a first substrate 721, a first LED stack 723 is grown on the n-type GaAs layer 7121, and a first reflective electrode 725 is grown on the first LED stack 723. In some exemplary embodiments, the n-type GaAs layer 7121 may be omitted.

The first substrate 721 may be, for example, a GaAs substrate. In addition, the first LED stack 723 may have a multi junction LED stack structure, and includes a first-1 LED stack 723a, a tunnel junction layer 7130, and a first-2 LED stack 723b. The first-1 LED stack 723a and the first-2 LED stack 723b may be continuously connected to each other through the tunnel junction layer 7130. The first LED stack 723 of FIG. 90A has an inversed structure of the first LED stack 723 of FIG. 89B, and thus, repeated descriptions thereof will be omitted.

A first reflective electrode 725 forms ohmic contact with an upper surface of the first-2 LED stack 723b. The first reflective electrode 725 may form ohmic contact with, for example, the p-contact layer 7139 (see FIG. 89B).

Referring to FIG. 90B, a second LED stack 733 is grown on a second substrate 731, and a second transparent electrode 735 and a first color filter 737 are formed on the second LED stack 733. The second LED stack 733 may be formed of AlGaInP or AlGaInN-based semiconductor layers, and may include an n-type semiconductor layer, a p-type semiconductor layer, and a well layer. The second substrate 731 may be a substrate capable of growing the AlGaInP-based semiconductor layers thereon, for example, a GaAs substrate, or a substrate capable of growing GaN-based semiconductor layers thereon, for example, a sapphire substrate. The composition ratio of Al, Ga, and In of the second LED stack 733 may be determined such that the second LED stack 733 can emit green light, for example. The second transparent electrode 735 forms ohmic contact with the p-type semiconductor layer.

Referring to FIG. 90C, a third LED stack 743 is grown on a third substrate 741, and a third transparent electrode 745 and a second color filter 747 are formed on the third LED stack 743. The third LED stack 743 may be formed of GaN-based semiconductor layers, and may include an n-type semiconductor layer, a p-type semiconductor layer, and an AlGaInN-based well layer. The third substrate 741 is a substrate capable of growing GaN-based semiconductor layers thereon, and may be different from the first substrate 721. The composition ratio of Al, Ga, and In of the third LED stack 743 may be determined such that the third LED stack 743 can emit blue light, for example. The third transparent electrode 745 forms ohmic contact with the p-type semiconductor layer.

A first color filter 737 and a second color filter 747 are substantially the same as those described with reference to FIG. 89A, and thus, repeated descriptions thereof will be omitted.

Referring to FIG. 89A and FIG. 90A, first, the first LED stack 723 is coupled to a support substrate 751 via a first bonding layer 753. The first reflective electrode 725 may be disposed to face the support substrate 751 and bonded to the support substrate 751 through the first bonding layer 753. The first substrate 721 and the n-type GaAs layer 7121 may then be removed from the first LED stack 723 by chemical etching, for example. As such, the surface of the first-1 LED stack 723a may be exposed. In some exemplary embodiments, a roughened surface may be formed on the exposed surface of the first-1 LED stack 723a by surface texturing, for example.

Then, the second LED stack 733 is coupled to the first LED stack 723 via a second bonding layer 755. The first color filter 737 may be disposed to face the first LED stack 723 and bonded to the first LED stack 723. The second substrate 731 may be removed from the second LED stack 733 by laser lift-off, chemical lift-off, or chemical etching. After removal of the second substrate 731, in some exemplary embodiments, a roughened surface may be formed on the surface of the second LED stack 733 by surface texturing, for example.

Then, the third LED stack 743 is coupled to the second LED stack 733 via a third bonding layer 757. The second color filter 747 may be disposed to face the second LED stack 733 and bonded thereto through the third bonding layer 757.

The third substrate 741 may be removed from the third LED stack 743 by a laser lift-off or chemical lift-off process. As such, as shown in FIG. 89A, a light emitting diode stack for a display in which the n-type semiconductor layer of the third LED stack 743 is exposed is provided. Furthermore, in some exemplary embodiments, a roughened surface may be formed on the surface of the third LED stack 743 by surface texturing.

A display apparatus may be provided by patterning the stack of the first to third LED stacks 723, 733, 743 on the support substrate 751 in pixel units, followed by connecting the first to third LED stacks 723, 733, 743 to one another through interconnection lines. Hereinafter, exemplary embodiments of the display apparatus will be described.

Figure 91:
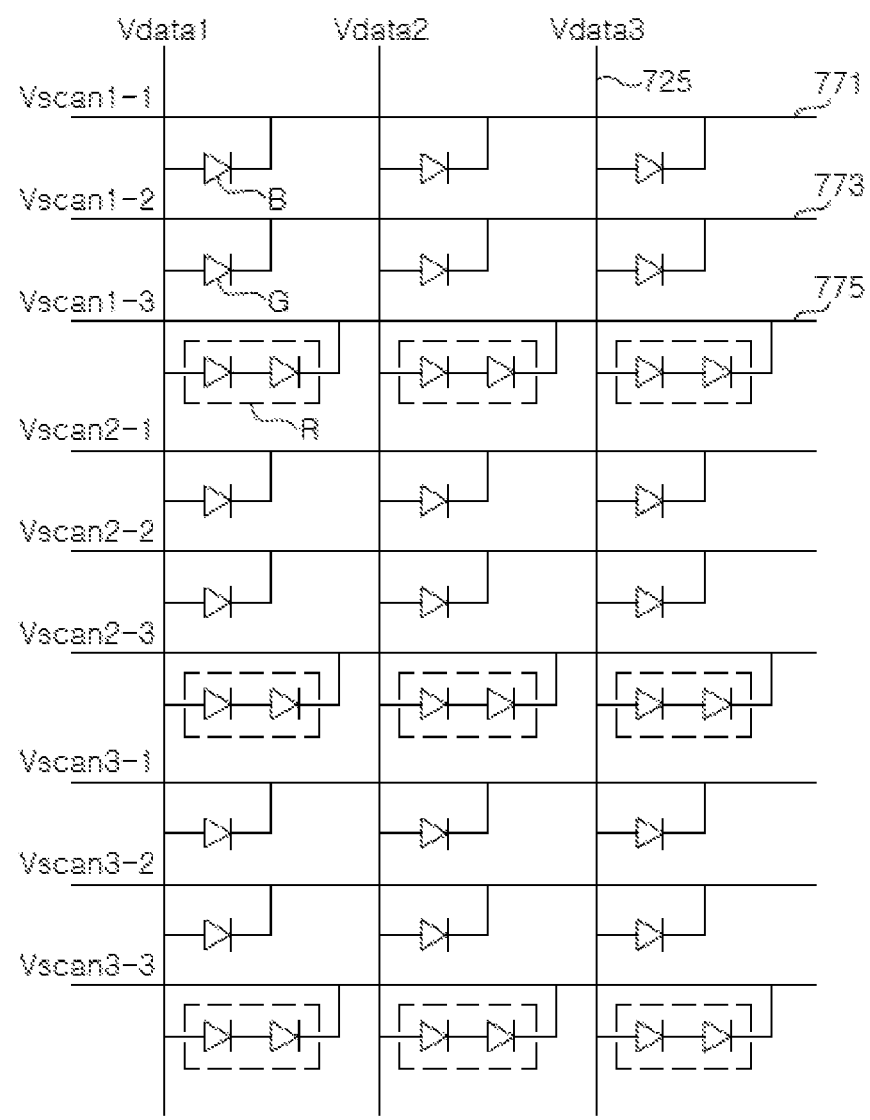
FIG. 91 is a schematic circuit diagram of a display apparatus according to an exemplary embodiment.
Figure 92:
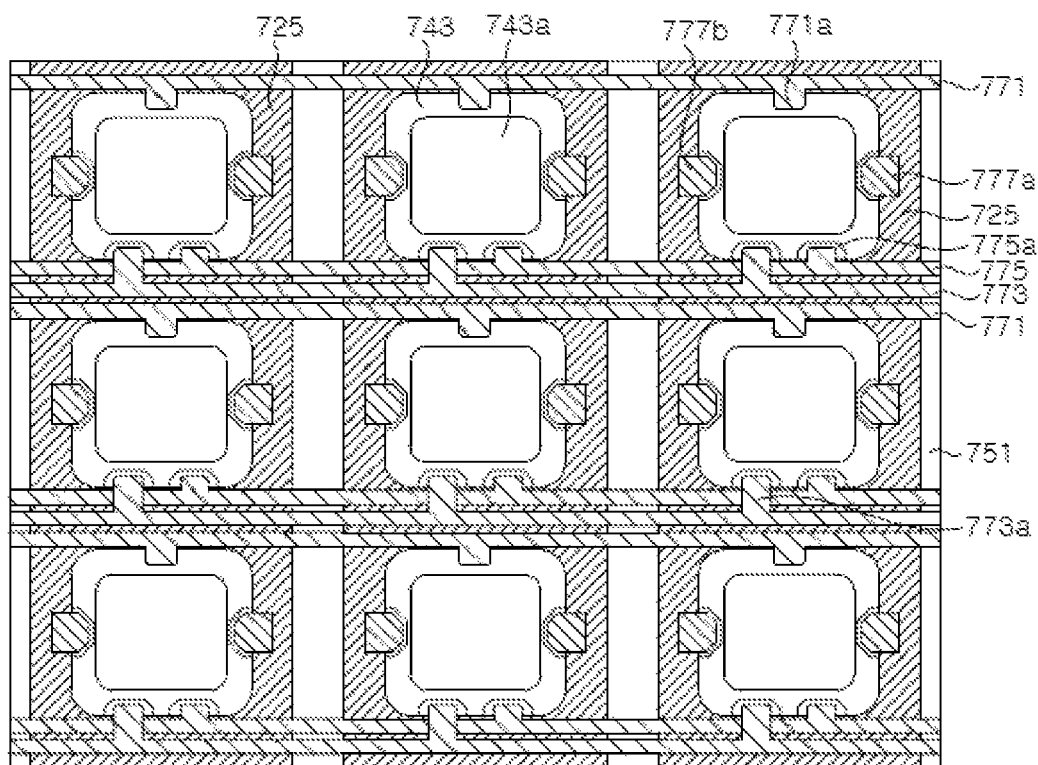
FIG. 92 is a schematic plan view of the display apparatus according to an exemplary embodiment.

FIG. 91 is a schematic circuit diagram of a display apparatus according to an exemplary embodiment, and FIG. 92 is a schematic plan view of the display apparatus according to an exemplary embodiment.

First, referring to FIG. 91 and FIG. 92, the display apparatus according to the illustrated exemplary embodiment may be implemented to be driven in a passive matrix manner.

For example, since the light emitting diode stack 700 described with reference to FIG. 89A has the structure, in which the first to third LED stacks 723, 733, 743 are stacked in the vertical direction, one pixel includes three light emitting diodes R, G, B. Here, a first light emitting diode R corresponds to the first LED stack 723, a second light emitting diode G corresponds to the second LED stack 733, and a third light emitting diode B corresponds to the third LED stack 743. Furthermore, the first light emitting diode R has a multi junction LED stack structure, in which at least two light emitting diodes are connected to each other in series.

In FIGS. 91 and 92, one pixel includes the first to third light emitting diodes R, G, B, each of which corresponds to a subpixel. Anodes of the first to third light emitting diodes R, G, B are connected to a common line, for example, a data line, and cathodes thereof are connected to different lines, for example, scan lines. For example, in the first pixel, the anodes of the first to third light emitting diodes R, G, B are commonly connected to a data line Vdata1, and the cathodes thereof are connected to scan lines Vscan1-3, Vscan1-2, Vscan1-1, respectively. In this manner, the light emitting diodes R, G, B in each pixel can be independently driven.

In addition, in some exemplary embodiments, each of the light emitting diodes R, G, B may be driven by pulse width modulation or by changing the magnitude of electric current, to regulate the brightness of each subpixel. Furthermore, although the first light emitting diode R may emit red light having low visibility, the multi junction LED stack structure of the first light emitting diode R can improve luminous intensity of red light emitted therefrom.

Referring back to FIG. 92, a plurality of pixels is formed by patterning the light emitting diode stack 700 described with reference to FIG. 89A, and each of the pixels is connected to the first reflective electrodes 725 and interconnection lines 771, 773, 775. As shown in FIG. 91, the first reflective electrode 725 may be used as the data line Vdata, and the interconnection lines 771, 773, 775 may be formed as the scan lines.

The pixels may be arranged in a matrix form in which the anodes of the light emitting diodes R, G, B of each pixel are commonly connected to the first reflective electrode 725, and the cathodes thereof are connected to the interconnection lines 771, 773, and 775 separated from one another. Here, the interconnection lines 771, 773, and 775 may be used as the scan lines Vscan.

Figure 93:
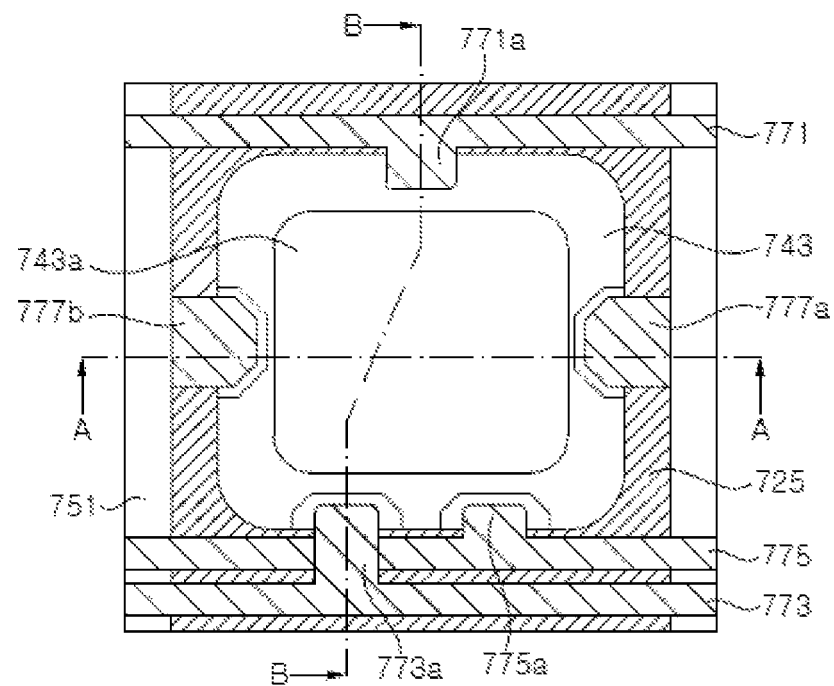
FIG. 93 is an enlarged plan view of one pixel of the display apparatus of FIG. 92.
Figure 94:
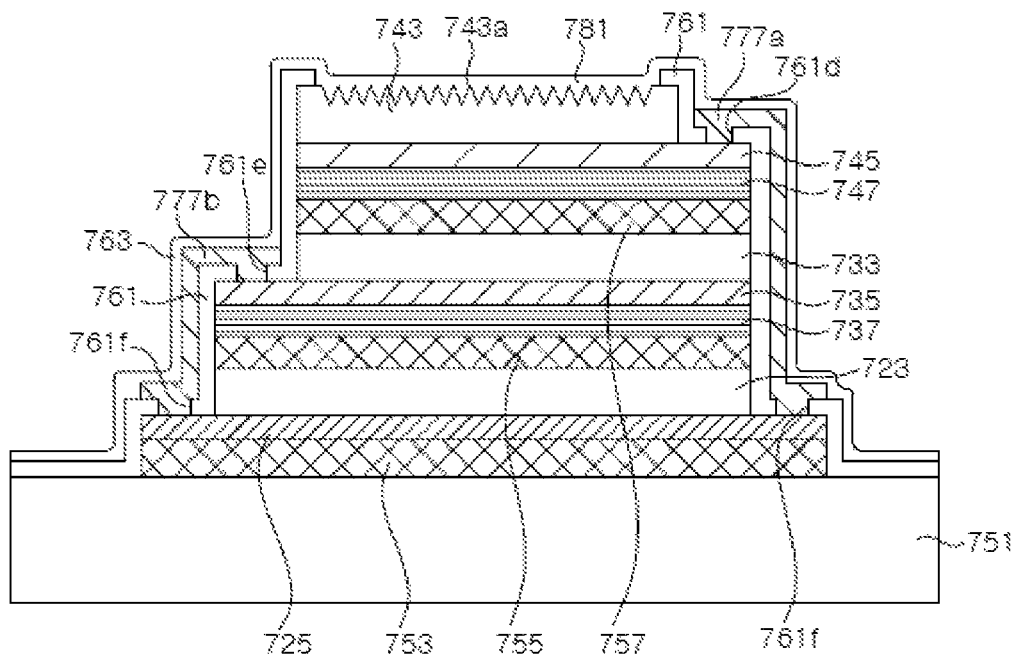
FIG. 94 is a schematic cross-sectional view taken along line A-A of FIG. 93.
Figure 95:
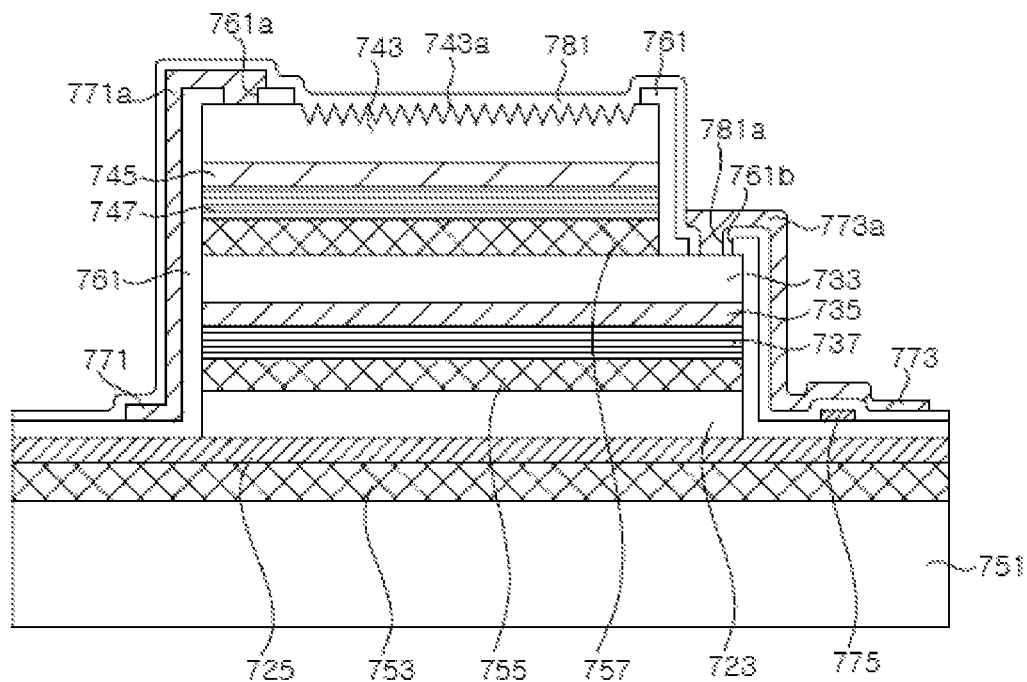
FIG. 95 is a schematic cross-sectional view taken along line B-B of FIG. 93.

FIG. 93 is an enlarged plan view of one pixel of the display apparatus of FIG. 92, FIG. 94 is a schematic cross-sectional view taken along line A-A of FIG. 93, and FIG. 95 is a schematic cross-sectional view taken along line B-B of FIG. 93.

Referring to FIG. 92, FIG. 93, FIG. 94, and FIG. 95, in each pixel, a portion of the first reflective electrode 725, the upper surface of the first ohmic electrode 727, a portion of the second transparent electrode 735, a portion of the upper surface of the second LED stack 733, a portion of the third transparent electrode 745, and the upper surface of the third LED stack 743 are exposed to the outside.

The third LED stack 743 may have a roughened surface 743a on the upper surface thereof. The roughened surface 743a may be formed over substantially the entire upper surface of the third LED stack 743 or may be formed in some regions thereof, as shown in the drawings.

A lower insulation layer 761 may cover a side surface of each pixel. The lower insulation layer 761 may be formed of a light transmissive material, such as $SiO_2$. In this case, the lower insulation layer 761 may cover substantially the entire upper surface of the third LED stack 743. Alternatively, the lower insulation layer 761 may include a distributed Bragg reflector to reflect light traveling towards the side surfaces of the first to third LED stacks 723, 733, and 743. In this case, the lower insulation layer 761 at least partially exposes the upper surface of the third LED stack 743.

The lower insulation layer 761 may include an opening 761a which exposes the upper surface of the third LED stack 743, an opening 761b which exposes the upper surface of the second LED stack 733, an opening 761c (see FIG. 96H) which exposes the upper surface of the first ohmic electrode 727, an opening 761d which exposes the third transparent electrode 745, an opening 761e which exposes the second transparent electrode 735, and openings 761f which expose the first reflective electrode 725.

The interconnection lines 771, 775 may be formed near the first to third LED stacks 723, 733, 743 on the support substrate 751, and may be disposed on the lower insulation layer 761 to be insulated from the first reflective electrode 725. A connecting portion 777a connects the third transparent electrode 745 to the first reflective electrode 725, and a connecting portion 777b connects the second transparent electrode 735 to the first reflective electrode 725 such that the anodes of the first LED stack 723, the second LED stack 733, and the third LED stack 743 are commonly connected to the first reflective electrode 725.

A connecting portion 771a connects the upper surface of the third LED stack 743 to the interconnection line 771, and a connecting portion 775a connects the first ohmic electrode 727 to the interconnection line 775.

An upper insulation layer 781 may be disposed on the interconnection lines 771, 775 and the lower insulation layer 761 to cover the upper surface of the third LED stack 743. The upper insulation layer 781 may have an opening 781a which partially exposes the upper surface of the second LED stack 733.

The interconnection line 773 may be disposed on the upper insulation layer 781, and the connecting portion 773a may connect the upper surface of the second LED stack 733 to the interconnection line 773. The connecting portion 773a may cross the interconnection line 775 and is insulated from the interconnection line 775 by the upper insulation layer 781.

Although the electrodes of each pixel are described as being connected to the data line and the scan lines in the illustrated exemplary embodiment, the interconnection lines 771, 775 are described as being formed on the lower insulation layer 761, and the interconnection line 773 is described as being formed on the upper insulation layer 781 in the illustrated exemplary embodiment, the inventive concepts are not limited thereto. For example, all of the interconnection lines 771, 773, and 775 may be formed on the lower insulation layer 761 and may be covered by the upper insulation layer 781, which may have openings configured to expose the interconnection line 773. In this case, the connecting portion 773a may connect the upper surface of the second LED stack 733 to the interconnection line 773 through the openings of the upper insulation layer 781.

Alternatively, the interconnection lines 771, 773, and 775 may be formed inside the support substrate 751, and the connecting portions 771a, 773a, and 775a on the lower insulation layer 761 may connect the upper surfaces of the first to third LED stacks 722, 733, and 743 to the interconnection lines 771, 773, and 775.

FIG. 96A to FIG. 96K are schematic plan views illustrating a method of manufacturing a display apparatus according to an exemplary embodiment. Hereinafter, the following description will be given of a method of forming the pixel of FIG. 93.

First, the light emitting diode stack 700 described in FIG. 89A is prepared.

Figure 96A:
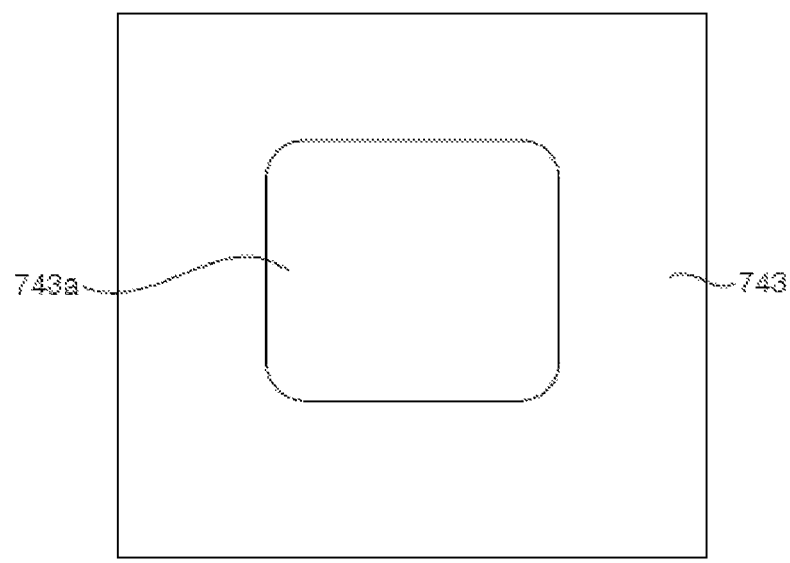
FIGS. 96A, 96B, 96C, 96D, 96E, 96F, 96G, 96H, 96I, 96J, and 96K are schematic plan views illustrating a method of manufacturing a display apparatus according to an exemplary embodiment.

Then, referring to FIG. 96A, a roughened surface 743a may be formed on the upper surface of the third LED stack 743. The roughened surface 743a may be formed on the upper surface of the third LED stack 743 so as to correspond to each pixel region. The roughened surface 743a may be formed by chemical etching, for example, photo-enhanced chemical etching (PEC).

The roughened surface 743a may be partially formed in each pixel region by considering a region of the third LED stack 743 to be etched in the subsequent process, without being limited thereto. Alternatively, the roughened surface 743a may be formed over substantially the entire upper surface of the third LED stack 743.

Figure 96B:
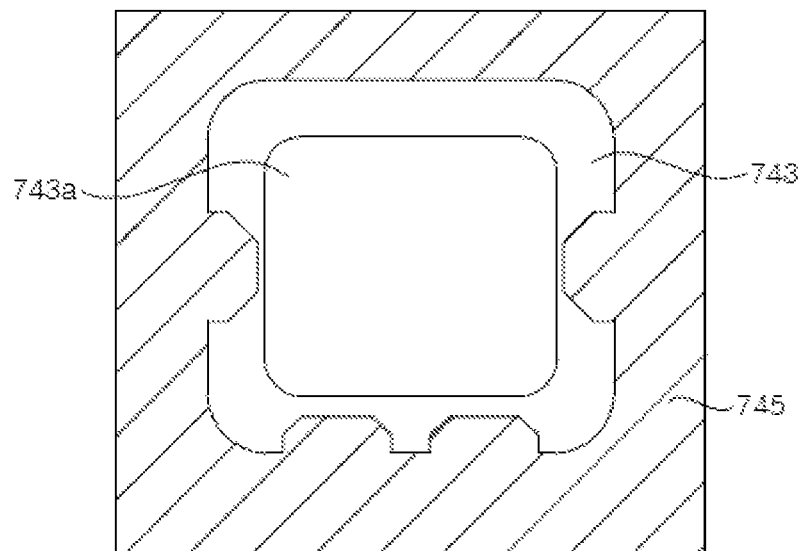

Referring to FIG. 96B, a surrounding region of the third LED stack 743 in each pixel is removed by etching to expose the third transparent electrode 745. The third LED stack 743 may have a substantially rectangular shape or a square shape, as shown in the drawings. The third LED stack 743 may have a plurality of depressions formed along an edge thereof.

Figure 96C:
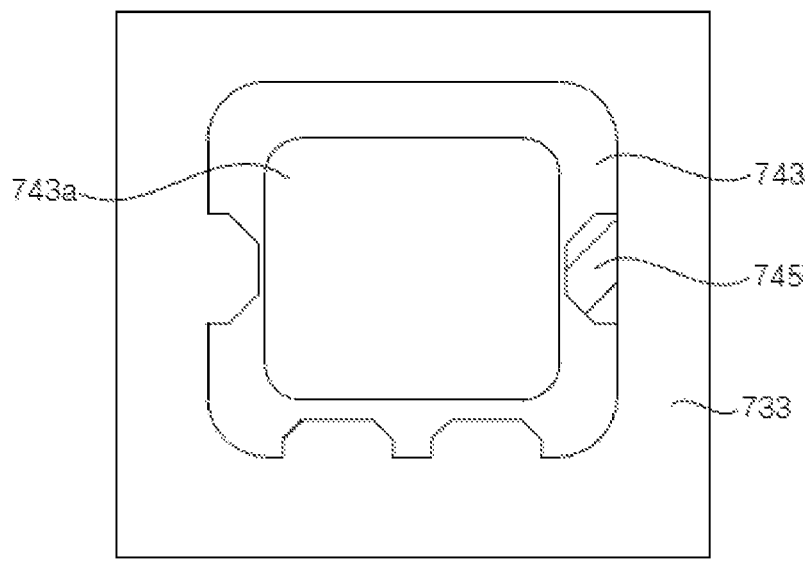

Referring to FIG. 96C, the upper surface of the second LED stack 733 is exposed by removing the exposed third transparent electrode 745 except a portion thereof disposed in one depression. Accordingly, the upper surface of the second LED stack 733 is exposed around the third LED stack 743 and in other depressions except the one in which the third transparent electrode 745 partially remains.

Figure 96D:
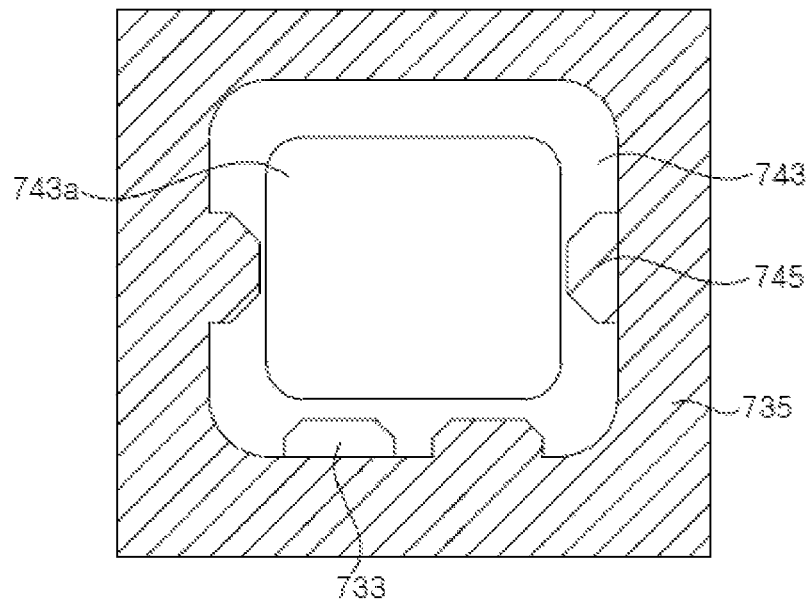

Referring to FIG. 96D, the second transparent electrode 735 is exposed by removing the exposed second LED stack 733 in other regions except a portion thereof disposed in one depression.

Figure 96E:
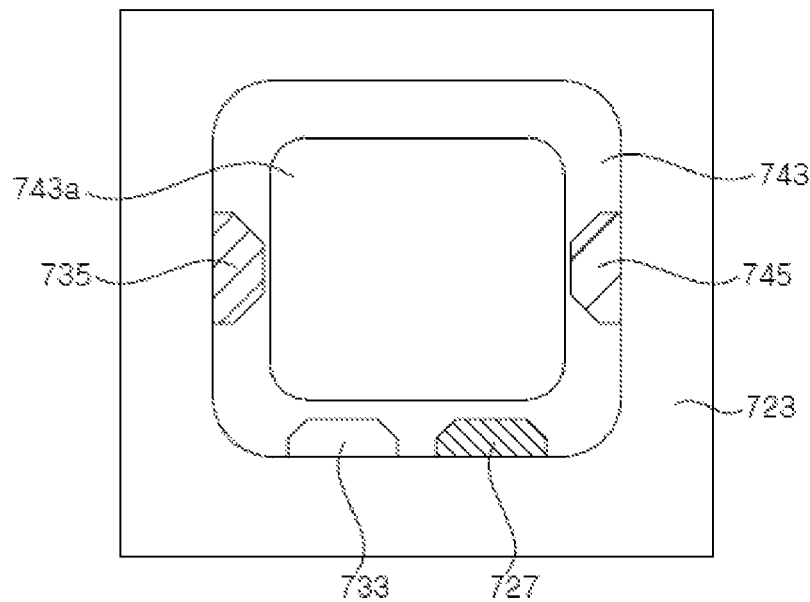

Referring to FIG. 96E, the first ohmic electrode 727 is exposed together with the upper surface of the first LED stack 723 by removing the second transparent electrode 735 except the portion disposed in one depression. Accordingly, the upper surface of the first LED stack 723 is exposed around the third LED stack 743, and the upper surface of the first ohmic electrode 727 is exposed in at least one of the depressions formed in the third LED stack 743.

Figure 96F:
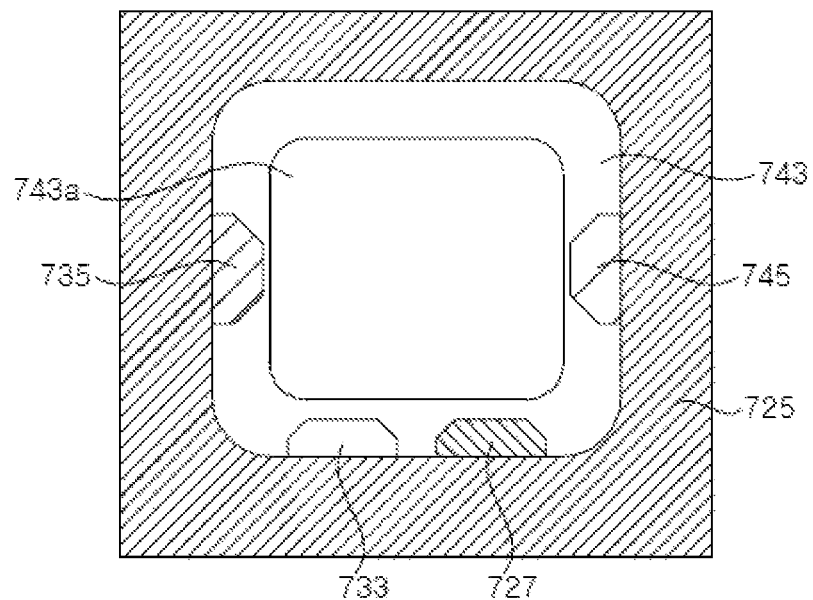

Referring to FIG. 96F, the first reflective electrode 725 is exposed by removing an exposed portion of the first LED stack 723 around the third LED stack 743. The first reflective electrode 725 is exposed around the third LED stack 743.

Figure 96G:
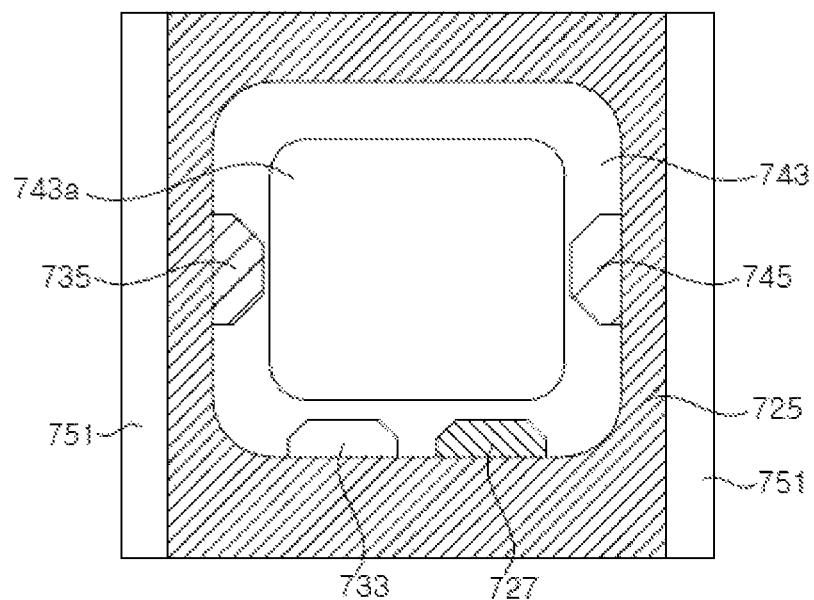

Referring to FIG. 96G, linear interconnection lines are formed by patterning the first reflective electrode 725. The first bonding layer 753 may also be removed to expose the support substrate 751. The first reflective electrode 725 may connect pixels arranged in one row to each other among pixels arranged in a matrix (see FIG. 92).

Figure 96H:
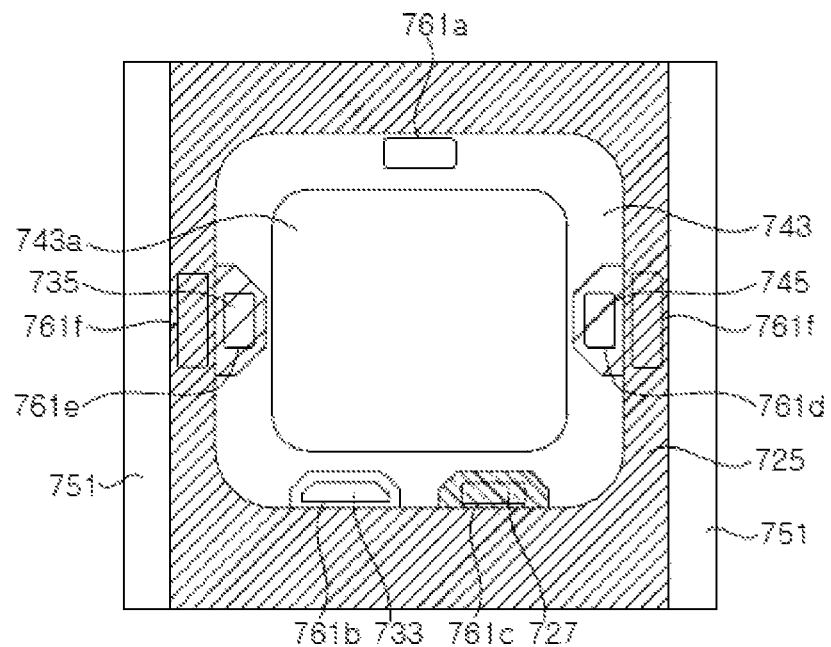

Referring to FIG. 96H, a lower insulation layer 761 (see FIG. 94 and FIG. 95) is formed to cover the pixels. The lower insulation layer 761 covers the first reflective electrode 725 and side surfaces of the first to third LED stacks 723, 733, and 743. In addition, the lower insulation layer 761 may at least partially cover the upper surface of the third LED stack 743. When the lower insulation layer 761 is a transparent layer, such as a SiO$_2$ layer, the lower insulation layer 761 may cover substantially the entire upper surface of the third LED stack 743. Alternatively, the lower insulation layer 761 may include a distributed Bragg reflector. In this case, the lower insulation layer 761 may at least partially expose the upper surface of the third LED stack 743 so as to allow light to be emitted to the outside.

The lower insulation layer 761 may include an opening 761a which exposes the third LED stack 743, an opening 761b which exposes the second LED stack 733, an opening 761c which exposes the first ohmic electrode 727, an opening 761d which exposes the third transparent electrode 745, an opening 761e which exposes the second transparent electrode, and an opening 761f which exposes the first reflective electrode 725. The opening 761f exposing the first reflective electrode 725 may be formed singularly or in plural, as shown in the drawings.

Figure 96I:
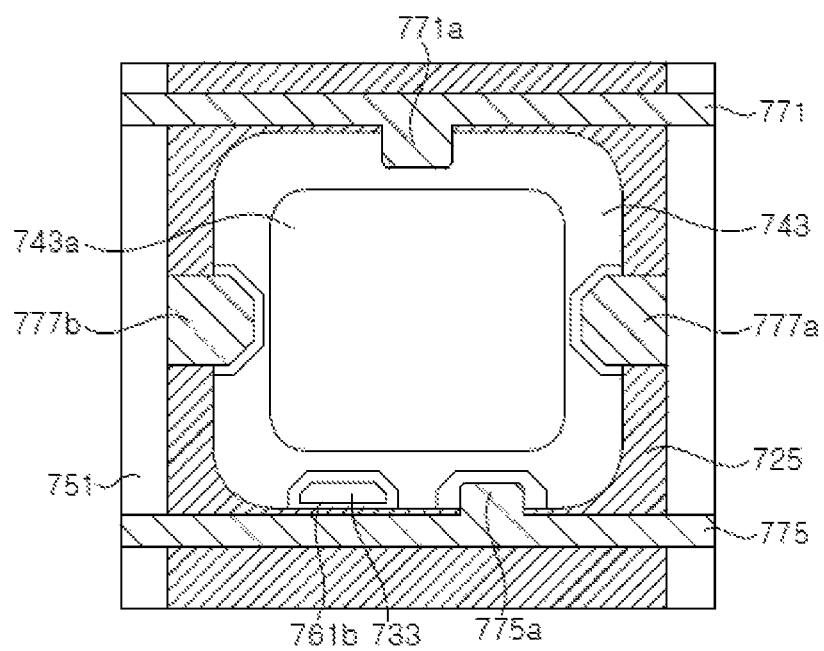

Referring to FIG. 96I, interconnection lines 771 and 775 and connecting portions 771a, 775a, 777a, and 777b are formed by a lift-off process, for example. The interconnection lines 771 and 775 are insulated from the first reflective electrode 725 by the lower insulation layer 761. The connecting portion 771a electrically connects the third LED stack 743 to the interconnection line 771, and the connecting portion 775a electrically connects the first ohmic electrode 727 to the interconnection line 775. The connecting portion 777a electrically connects the third transparent electrode 745 to the first reflective electrode 725, and the connecting portion 777b electrically connects the second transparent electrode 735 to the first reflective electrode 725.

Figure 96J:
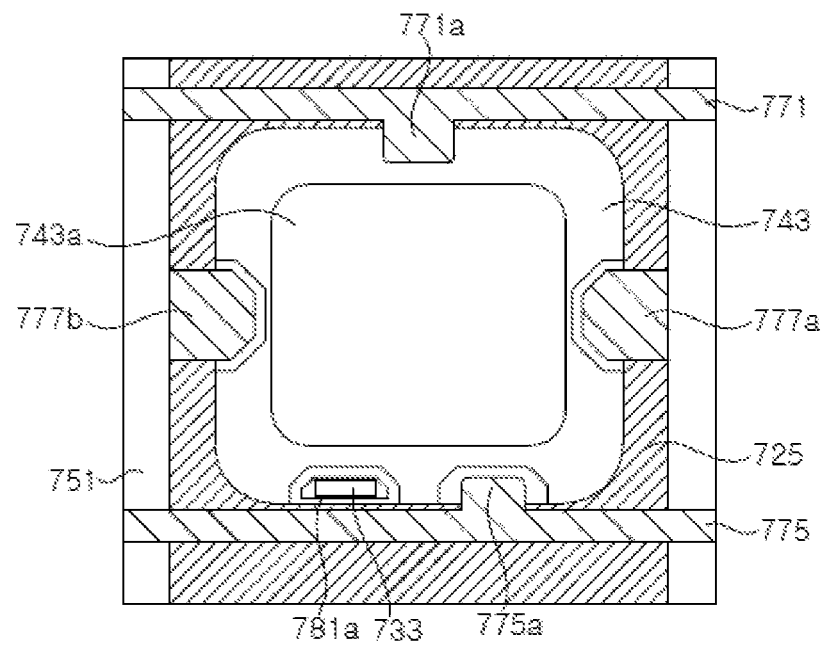

Referring to FIG. 96J, an upper insulation layer 781 (see FIG. 94 and FIG. 95) covers the interconnection lines 771 and 775 and the connecting portions 771a, 775a, 777a, and 777b. The upper insulation layer 781 may also cover substantially the entire upper surface of the third LED stack 743. The upper insulation layer 781 has an opening 781a which exposes the upper surface of the second LED stack 733. The upper insulation layer 781 may be formed of, for example, silicon oxide or silicon nitride, and may include a distributed Bragg reflector. When the upper insulation layer 781 includes the distributed Bragg reflector, the upper insulation layer 781 is formed to expose at least part of the upper surface of the third LED stack 743 in order to allow light to be emitted to the outside.

Figure 96K:
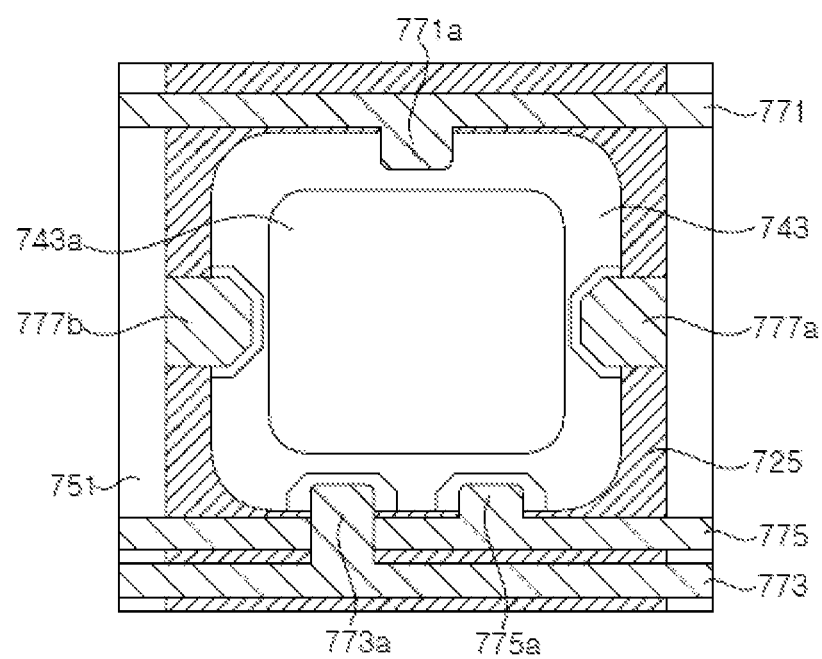

Referring to FIG. 96K, an interconnection line 773 and a connecting portion 773a are formed. An interconnection line 773 and a connecting portion 7773a may be formed by a lift-off process, for example. The interconnection line 773 is disposed on the upper insulation layer 781 and is insulated from the first reflective electrode 725 and the interconnection lines 771 and 775. The connecting portion 773a electrically connects the second LED stack 733 to the interconnection line 773. The connecting portion 773a may cross the interconnection line 775 and is insulated from the interconnection line 775 by the upper insulation layer 781.

As such, a pixel region is provided as shown in FIG. 93. In addition, as shown in FIG. 92, a plurality of pixels may be formed on the support substrate 751, and may be connected to one another by the first the reflective electrode 725 and the interconnection lines 771, 773, and 775 to be driven in a passive matrix manner.

Although the method of manufacturing a display apparatus configured to be driven in the passive matrix manner has been illustrated above, the inventive concepts are not limited thereto. For example, the display apparatus according to the exemplary embodiments may be manufactured in various ways so as to be operated in the passive matrix manner using the light emitting diode stack 700 shown in FIG. 89A.

For example, although the interconnection line 773 is illustrated as being formed on the upper insulation layer 781 in the illustrated exemplary embodiment, the interconnection line 773 may be formed together with the interconnection lines 771 and 775 on the lower insulation layer 761, and the connecting portion 773a may be formed on the lower insulation layer 761 to connect the second LED stack 733 to the interconnection line 773. Furthermore, the interconnection lines 771, 773, and 775 may be disposed inside the support substrate 751 in some exemplary embodiments.

Figure 97:
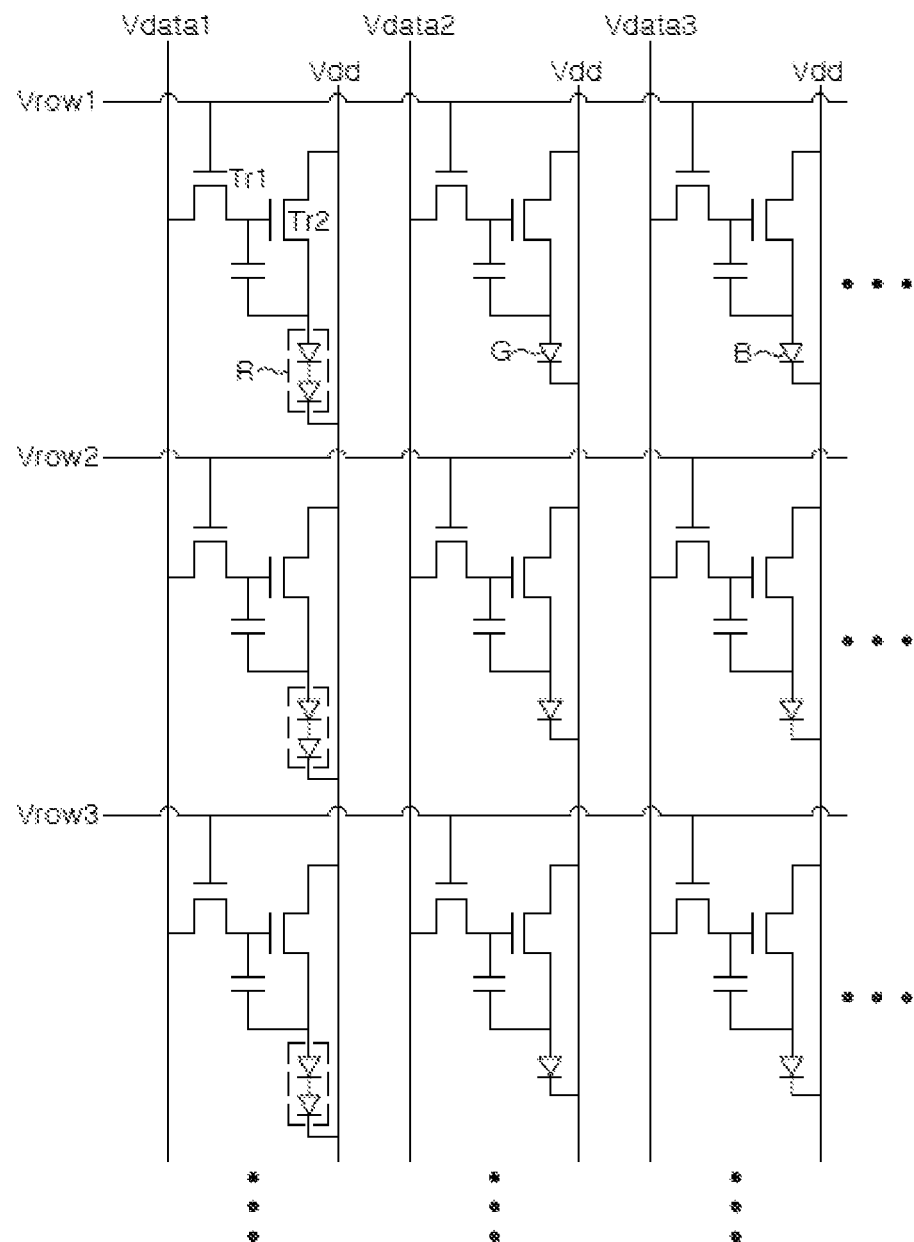
FIG. 97 is a schematic circuit diagram illustrating operation of a display apparatus according to an exemplary embodiment.

FIG. 97 is a schematic circuit diagram of a display apparatus according to an exemplary embodiment. The display apparatus according to the illustrated exemplary embodiment may be driven in an active matrix manner.

Referring to FIG. 97, the drive circuit according to the illustrated exemplary embodiment includes at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitor is charged according to the values of data lines Vdata1 to Vdata3. Since a turned-on state of a transistor Tr2 can be maintained by the charged voltage of the capacitor, the voltage of the capacitor can be maintained and applied to the light emitting diodes R, G, B even when power supplied to the selection line Vrow1 is cut off. In addition, electric current flowing in the light emitting diodes R, G, B can be changed depending upon the values of data lines Vdata1 to Vdata3. Electric current can be continuously supplied through current supplies Vdd, thereby enabling continuous light emission.

The transistors Tr1, Tr2 and the capacitor may be formed inside the support substrate 751. For example, thin film transistors formed on a silicon substrate may be used for active matrix driving.

The light emitting diodes R, G, B may correspond to the first to third LED stacks 723, 733, and 743 stacked in one pixel, respectively. In addition, the first LED stack 523 includes the first-1 LED stack 723a, the first-2 LED stack 723b, and the tunnel junction layer 7130 interposed therebetween. The anodes of the first to third LED stacks 723, 733, and 743 are connected to the transistor Tr2 and the cathodes thereof are connected to the ground.

Although the circuit for active matrix driving is exemplarily illustrated in the illustrated exemplary embodiment, in some exemplary embodiments, other types of circuits may also be used. In addition, although the anodes of the light emitting diodes R, G, B are described as being connected to different transistors Tr2, and the cathodes thereof are described as being connected to the ground in the illustrated exemplary embodiment, in some exemplary embodiments, the anodes of the light emitting diodes may be connected to current supplies Vdd and the cathodes thereof may be connected to different transistors in other exemplary embodiments.

Figure 98:
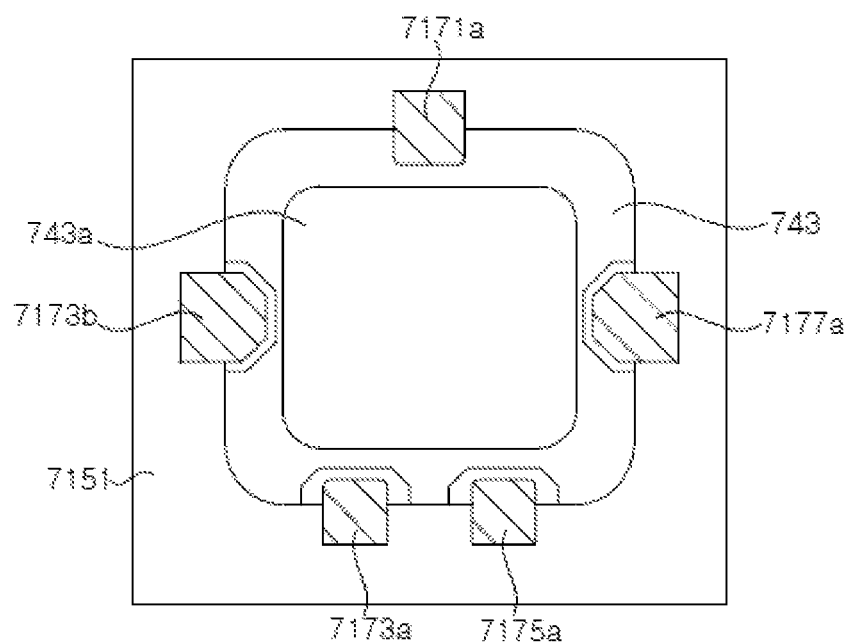
FIG. 98 is a schematic plan view of a display apparatus according to an exemplary embodiment.

FIG. 98 is a schematic plan view of a display apparatus according to an exemplary embodiment. Hereinafter, the following description will be given of one pixel among a plurality of pixels arranged on the support substrate 7151.

Referring to FIG. 98, the pixel according to the illustrated exemplary embodiment is substantially similar to the pixel described with reference to FIG. 92 to FIG. 95 except that the support substrate 7151 is a thin film transistor panel including transistors and capacitors, and the first reflective electrode 725 is disposed in a lower region of the first LED stack 723.

The cathode of the third LED stack 743 is connected to the support substrate 7151 through the connecting portion 7171a. For example, as shown in FIG. 97, the cathode of the third LED stack 743 may be connected to the ground through electrical connection to the support substrate 7151. The cathodes of the second LED stack 733 and the first LED stack 723 may also be connected to the ground through electrical connection to the support substrate 7151 via connecting portions 7173a, 7175a.

The first reflective electrode 725 is connected to the transistors Tr2 (see FIG. 97) inside the support substrate 7151. The third transparent electrode 745 and the second transparent electrode 735 are also connected to the transistors Tr2 (see FIG. 97) inside the support substrate 7151 through the connecting portions 7177a, and 7173b.

In this manner, the first to third LED stacks 723, 733, and 743 are connected to one another, thereby forming a circuit for active matrix driving, as shown in FIG. 97.

Although a pixel configured to be driven in active matrix has been exemplarily shown in the illustrated exemplary embodiment, the inventive concepts are not limited thereto, and the circuit for the display apparatus can be modified into various circuits for active matrix driving in various ways.

In addition, although the first reflective electrode 725, the second transparent electrode 735, and the third transparent electrode 745 shown in FIG. 89 form ohmic contact with the p-type semiconductor layers of the first LED stack 723, the second LED stack 733, and the third LED stack 743, respectively, the n-type semiconductor layers thereof may not be provided with a separate ohmic contact layer. When the pixels have a small size of 200 μm or less, there is no difficulty in current spreading even without formation of a separate ohmic contact layer in the n-type semiconductor layer. However, in some exemplary embodiments, a transparent electrode layer may be disposed on the n-type semiconductor layer of each of the LED stacks in order to secure current spreading.

In addition, although the first to third LED stacks 723, 733, and 743 are sequentially coupled to one another in the illustrated exemplary embodiment, the first to third LED stacks 723, 733, and 743 may be connected to one another in various sequences using a wafer bonding technique in other exemplary embodiments, and the locations of the n-type semiconductor layer and the p-type semiconductor layer may be changed.

According to exemplary embodiments, a plurality of pixels is formed at the wafer level using the light emitting diode stack 700 for a display, and thus, an individual mounting process of light emitting diodes may be obviated. In addition, the light emitting diode stack according to the exemplary embodiments has the structure, in which the first to third LED stacks 723, 733, and 743 are stacked in the vertical direction, thereby securing an area for subpixels in a portion of the pixel area. Furthermore, in the light emitting diode stack according to the exemplary embodiments, the first LED stack 723 has the multi junction LED stack structure, thereby improving the brightness of red light without significant change in current density in a restricted area.

Although the first LED stack is illustrated as having the multi junction LED stack structure in the above exemplary embodiments, in some exemplary embodiments, the second LED stack and/or the third LED stack may have the multi junction LED stack structure. When an LED structure having low visibility is formed to have the multi junction LED stack structure, the light emitting diode stack allows the first to third LED stacks to emit light with similar brightness without adjusting the luminous area or current density.

Although the first LED stack 723, the second LED stack 733, and the third LED stack 743 are illustrated as overlapping each other with a generally similar luminous area in the above exemplary embodiments, the inventive concepts are not limited thereto. In some exemplary embodiments, the second LED stack 733 may be disposed in some region on the first LED stack 723 and the third LED stack 743 may be disposed in some region on the second LED stack 733. In this manner, the first LED stack 723 having low visibility has a larger luminous area than the second and third LED stacks 733 and 743, thereby further improving the brightness. Furthermore, at least part of light generated from the first LED stack 723 may be emitted to the outside without passing through the second LED stack 733 and the third LED stack 743, and at least part of light generated from the second LED stack 733 may be emitted to the outside without passing through the third LED stack 743, thereby further improving luminous efficacy.

Although some exemplary embodiments have been described herein, it should be understood that these embodiments are provided for illustration only and are not to be construed in any way as limiting the invention. It should be understood that features or components of one exemplary embodiment can also be applied to other exemplary embodiments without departing from the spirit and scope of the invention.

What is claimed is:

1. A light emitting diode pixel for a display, comprising:
a first LED sub-unit having a thickness in a first direction;
a second LED sub-unit disposed on a portion of the first LED sub-unit in the first direction;
a third LED sub-unit disposed on a portion of the second LED sub-unit in the first direction, each of the first, second, and third LED sub-units comprising an n-type semiconductor layer and a p-type semiconductor layer;
a reflective electrode disposed adjacent to the first LED sub-unit and forming ohmic contact with the n-type semiconductor layer of the first LED sub-unit; and
a first ohmic electrode forming ohmic contact with the p-type semiconductor layer of the first LED sub-unit, the first ohmic electrode not overlapping with the second and third LED sub-units in the first direction,
wherein:
each of the n-type semiconductor layers of the first, second, and third LED sub-units is electrically connected to the reflective electrode; and
the first LED sub-unit, the second LED sub-unit, and the third LED sub-unit are configured to be independently driven.

2. The light emitting diode pixel of claim 1, wherein:
the first, second, and third LED sub-units comprise a first LED stack, a second LED stack, and a third LED stack, respectively; and
the first LED stack, the second LED stack, and the third LED stack are configured to emit light having different wavelengths from each other.

3. The light emitting diode pixel of claim 2, wherein the first LED stack, the second LED stack, and the third LED stack are configured to emit red light, green light, and blue light, respectively.

4. The light emitting diode pixel of claim 1, wherein:
the first, second, and third LED sub-units comprise a first LED stack, a second LED stack, and a third LED stack, respectively; and
the p-type semiconductor layers of the first to third LED stacks are disposed on the n-type semiconductor layers thereof, respectively.

5. The light emitting diode pixel of claim 4, further comprising:
a first color filter interposed between the first LED stack and the second LED stack; and
a second color filter interposed between the second LED stack and the third LED stack,
wherein:
the first color filter is configured to transmit light generated from the first LED stack and reflect light generated from the second LED stack; and
the second color filter is configured to transmit light generated from the second LED stack and reflect light generated from the third LED stack.

6. The light emitting diode pixel of claim 5, wherein the first color filter is adjacent to the n-type semiconductor layer of the second LED stack, and the second color filter is adjacent to the n-type semiconductor layer of the third LED stack.

7. The light emitting diode pixel of claim 5, further comprising:
a first bonding layer interposed between the first LED stack and the first color filter; and
a second bonding layer interposed between the second LED stack and the second color filter,
wherein the first bonding layer is configured to transmit light generated from the first LED stack, and the second bonding layer is configured to transmit light generated from the second LED stack.

8. The light emitting diode pixel of claim 4, further comprising:
a lower second ohmic electrode contacting the n-type semiconductor layer of the second LED stack;
an upper second ohmic electrode contacting the p-type semiconductor layer of the second LED stack;
a lower third ohmic electrode contacting the n-type semiconductor layer of the third LED stack; and
an upper third electrode contacting the p-type semiconductor layer of the third LED stack,
wherein:
the first LED stack, the second LED stack, and the third LED stack are sequentially stacked to overlap one over another in the first direction; and
the lower second ohmic electrode and the upper second ohmic electrode contact the n-type and p-type semiconductor layers of the second LED stack in a portion of the second LED stack not overlapping the third LED stack along the first direction, respectively.

9. The light emitting diode pixel of claim 8, wherein:
the lower third ohmic electrode contacts the n-type semiconductor layer of the third LED stack, and the upper third ohmic electrode contacts the p-type semiconductor layer of the third LED stack; and
the lower third ohmic electrode and the upper third ohmic electrode do not overlap each other in the first direction.

10. The light emitting diode pixel of claim 9, further comprising connecting portions electrically connecting the lower second ohmic electrode and the lower third ohmic electrode to the reflective electrode, respectively.

11. The light emitting diode pixel of claim 1, wherein:
the first LED sub-unit, the second LED sub-unit, and the third LED sub-unit are sequentially stacked to overlap one over another in the first direction; and
an area of the first LED sub-unit not overlapping the second LED sub-unit along the first direction, an area of the second LED sub-unit not overlapping the third LED sub-unit along the first direction, and an area of the third LED sub-unit are different from one another.

12. A display apparatus comprising a plurality of pixels arranged on a support substrate, each of the pixels comprising:
a first LED sub-unit having a thickness in a first direction;
a second LED sub-unit disposed on a portion of the first LED sub-unit in the first direction;
a third LED sub-unit disposed on a portion of the second LED sub-unit in the first direction, each of the first to third LED sub-units comprising an n-type semiconductor layer and a p-type semiconductor layer;
a reflective electrode disposed adjacent to the first LED sub-unit and forming ohmic contact with the n-type semiconductor layer of the first LED sub-unit; and
a first ohmic electrode forming ohmic contact with the p-type semiconductor layer of the first LED sub-unit, the first ohmic electrode not overlapping with the second and third LED sub-units in the first direction, wherein:
each of the n-type semiconductor layers of the first, second, and third LED sub-units is electrically connected to the reflective electrode; and
the first, second, and third LED sub-units are configured to be independently driven.

13. The display apparatus of claim 12, wherein:
the first, second, and third LED sub-units comprise a first LED stack, a second LED stack, and a third LED stack, respectively; and
the first LED stack, the second LED stack, and the third LED stack are configured to emit light having different wavelengths from each other.

14. The display apparatus of claim 12, wherein:
the n-type semiconductor layers of the first, second, and third LED sub-units are electrically connected to a common line; and
the p-type semiconductor layers of the first, second, and third LED sub-units are electrically connected to different lines.

15. The display apparatus of claim 13, wherein
the p-type semiconductor layers of the first, second, and third LED stacks are disposed on the n-type semiconductor layers thereof, respectively.

16. The display apparatus of claim 15, wherein each of the pixels further comprises:
a first color filter interposed between the first LED stack and the second LED stack to transmit light generated from the first LED stack and reflect light generated from the second LED stack; and
a second color filter interposed between the second LED stack and the third LED stack to transmit light generated from the second LED stack and reflect light generated from the third LED stack.

17. The display apparatus of claim 16, wherein each of the pixels further comprises:
a first bonding layer interposed between the support substrate and the reflective electrode;
a second bonding layer interposed between the first LED stack and the first color filter; and
a third bonding layer interposed between the second LED stack and the second color filter.

18. The display apparatus of claim 15, wherein each of the pixels further comprises:
a lower second ohmic electrode contacting the n-type semiconductor layer of the second LED stack;
an upper second ohmic electrode contacting the p-type semiconductor layer of the second LED stack;
a lower third ohmic electrode contacting the n-type semiconductor layer of the third LED stack; and
an upper third ohmic electrode contacting the p-type semiconductor layer of the third LED stack,
wherein the first LED stack, the second LED stack, and the third LED stack are sequentially disposed along the first direction, and
wherein the lower second and the upper second ohmic electrodes contact the n-type and p-type semiconductor layers of the second LED stack in a portion of the second LED stack not overlapping the third LED stack along the first direction.

19. The display apparatus of claim 18, wherein:
the lower third ohmic electrode contacts the n-type semiconductor layer of the third LED stack;
the upper third ohmic electrode contacts the p-type semiconductor layer of the third LED stack in a portion of the third LED stack not overlapping the lower third ohmic electrode along the first direction; and
each of the pixels further comprises connecting portions electrically connecting the lower second ohmic electrode and the lower third ohmic electrode to the reflective electrode, respectively.

20. The display apparatus of claim 12, wherein at least one of the pixels comprises a micro LED having a surface area less than about 10,000 square µm.

* * * * *